United States Patent
Sarayama et al.

(10) Patent No.: US 8,888,912 B2
(45) Date of Patent: Nov. 18, 2014

(54) METHOD OF PRODUCING GROUP III NITRIDE CRYSTAL, APPARATUS FOR PRODUCING GROUP III NITRIDE CRYSTAL, AND GROUP III NITRIDE CRYSTAL

(75) Inventors: Seiji Sarayama, Miyagi (JP); Hirokazu Iwata, Miyagi (JP); Akihiro Fuse, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 1846 days.

(21) Appl. No.: 11/914,193

(22) PCT Filed: May 12, 2006

(86) PCT No.: PCT/JP2006/309552
§ 371 (c)(1),
(2), (4) Date: Jan. 23, 2009

(87) PCT Pub. No.: WO2006/121152
PCT Pub. Date: Nov. 16, 2006

(65) Prior Publication Data
US 2009/0249997 A1  Oct. 8, 2009

(30) Foreign Application Priority Data

| May 12, 2005 | (JP) | 2005-139451 |
| Aug. 10, 2005 | (JP) | 2005-231877 |
| Aug. 10, 2005 | (JP) | 2005-231966 |

(51) Int. Cl.
  C30B 9/00 (2006.01)
  C30B 11/00 (2006.01)
  C30B 17/00 (2006.01)
  C30B 21/02 (2006.01)
  C30B 28/06 (2006.01)
  C30B 29/40 (2006.01)
  C30B 35/00 (2006.01)
  C30B 9/12 (2006.01)

(52) U.S. Cl.
  CPC ........... *C30B 9/12* (2013.01); *C30B 29/403* (2013.01); *C30B 35/00* (2013.01)
  USPC .................................. 117/73; 117/206

(58) Field of Classification Search
  USPC ................................... 117/73, 206
  IPC ......................................... C30B 29/38
  See application file for complete search history.

(56) References Cited

U.S. PATENT DOCUMENTS

| 5,868,837 A | 2/1999 | DiSalvo et al. |
| 6,592,663 B1 | 7/2003 | Sarayama et al. |

(Continued)

FOREIGN PATENT DOCUMENTS

| JP | 2000-12900 | 1/2000 |
| JP | 2001-58900 | 3/2001 |

(Continued)

OTHER PUBLICATIONS

Masato, Aoki, et al. (2002), "Conditions for seeded growth of GaN crystals by the Na flux method," Materials Letters, vol. 56, pp. 660-664.

(Continued)

Primary Examiner — Kaj K Olsen
Assistant Examiner — Ross J Christie
(74) Attorney, Agent, or Firm — Cooper & Dunham LLP

(57) ABSTRACT

In a method of producing a group III nitride crystal in which a melt holding vessel where a melt containing a group III metal and flux is held is accommodated in a reaction vessel and a group III nitride crystal is produced as a substance containing nitrogen is supplied from an outside to the reaction vessel through a pipe, the method includes a step of forming an accumulated part of a liquid in the pipe to thereby temporarily close the pipe before growing the group III nitride crystal in the melt holding vessel.

18 Claims, 72 Drawing Sheets

(56) References Cited

U.S. PATENT DOCUMENTS

| | | |
|---|---|---|
| 6,780,239 B2 | 8/2004 | Sarayama et al. |
| 6,949,140 B2 | 9/2005 | Sarayama et al. |
| 7,381,268 B2 | 6/2008 | Minemoto et al. |
| 7,462,238 B2 | 12/2008 | Sarayama et al. |
| 2005/0026318 A1* | 2/2005 | Sarayama et al. .............. 438/22 |

FOREIGN PATENT DOCUMENTS

| | | |
|---|---|---|
| JP | 2001-64097 | 3/2001 |
| JP | 2001-64098 | 3/2001 |
| JP | 2001-102316 | 4/2001 |
| JP | 2001-119103 | 4/2001 |
| JP | 2002-128586 | 5/2002 |
| JP | 2002-128587 | 5/2002 |
| JP | 2002-201100 | 7/2002 |
| JP | 2002-326898 | 11/2002 |
| JP | 2002-338397 | 11/2002 |
| JP | 2003-12400 | 1/2003 |
| JP | 2003-81696 | 3/2003 |
| JP | 2003-160398 | 6/2003 |
| JP | 2003-160399 | 6/2003 |
| JP | 2003-178984 | 6/2003 |
| JP | 2003-206198 | 7/2003 |
| JP | 2003-212696 | 7/2003 |
| JP | 2003-238296 | 8/2003 |
| JP | 2003-286098 | 10/2003 |
| JP | 2003-286099 | 10/2003 |
| JP | 2003-292400 | 10/2003 |
| JP | 2003-300798 | 10/2003 |
| JP | 2003-300799 | 10/2003 |
| JP | 2003-313098 | 11/2003 |
| JP | 2003-313099 | 11/2003 |
| JP | 2004-168650 | 6/2004 |
| JP | 2004-189590 | 7/2004 |
| JP | 2004-231447 | 8/2004 |
| JP | 2004-277224 | 10/2004 |
| JP | 2004-281670 | 10/2004 |
| JP | 2004-281671 | 10/2004 |
| JP | 2004-307322 | 11/2004 |
| JP | 2005-89257 | 4/2005 |
| JP | 2005089257 A * | 4/2005 |
| JP | 4192220 | 12/2008 |
| TW | 519551 | 2/2003 |
| WO | WO2005/103341 A1 | 11/2005 |

OTHER PUBLICATIONS

Seiji Sarayama et al. (Dec. 2004), "High Quality Crystal Growth of Gallium Nitride by Flux Method", Ricoh Technical Report No. 30.

Seiji Sarayama et al., "High quality crystal growth of Gallium Nitride by Flux Method", Ricoh Technical Report No. 30, Dec. 2004, pp. 9-19.

Aug. 30, 2011 Japanese official action in connection with counterpart Japanese patent application No. 2005-231877.

Aug. 30, 2011 Japanese official action in connection with counterpart Japanese patent application No. 2005-231966.

* cited by examiner

METHOD OF PRODUCING GROUP III NITRIDE CRYSTAL, APPARATUS FOR PRODUCING GROUP III NITRIDE CRYSTAL, AND GROUP III NITRIDE CRYSTAL

CROSS-REFERENCE TO RELATED APPLICATIONS

This application is a Section 371 national phase of International Application No. PCT/JP2006/309552 filed May 12, 2006 which is based on and claims the benefit of priority of Japanese patent application No. 2005-139451, filed on May 12, 2005, Japanese patent application No. 2005-231877, filed on Aug. 10, 2005, and Japanese patent application No. 2005-231966, filed on Aug. 10, 2005.

TECHNICAL FIELD

This disclosure relates to methods of producing group III nitride crystals, apparatuses for producing group III nitride crystals, and group III nitride crystals and, more specifically, to a method of producing a group III nitride crystal with a flux method, a production apparatus suitable for carrying out the method, and a group III nitride crystal produced by using the production apparatus.

BACKGROUND ART

Presently, InGaAlN system (group III nitride) devices used as light sources of the colors from purple to blue and those from blue to green are manufactured by growing crystals on mainly a sapphire substrate or a SiC substrate using a MO-CVD (metal-organic chemical vapor deposition) method, a MBE (molecular beam epitaxy) method, or the like. Examples of problems when sapphire or SiC is used as a substrate include increased crystal defects caused by a large thermal expansion coefficient difference and lattice constant difference between the substrate and the group III nitride. Therefore, device characteristics are degraded, resulting in disadvantages such as a difficulty of lengthening the service life of light-emitting devices or increasing the operating power.

Furthermore, since the sapphire substrate has insulation properties, it is impossible to take out an electrode from the substrate as in typical light emitting devices and necessary to take it out from the front surface of crystal-grown nitride semiconductors. As a result, the device area becomes large and high costs result. Furthermore, in the group III nitride semiconductor device manufactured on the sapphire substrate, it is difficult to separate a chip by cleavage and not easy to obtain a resonator end face necessary for laser diodes (LDs) by cleavage. Therefore, a dry etching technique is used to obtain the resonator end face, or the sapphire substrate is polished to a thickness equal to or smaller than 100 μm to obtain the resonator end face in the same manner as the cleavage. In this case also, it is difficult to obtain the resonator end face and separate the chip in a single process as in typical LDs, causing complicated processes and high costs.

In order to solve these problems, GaN substrates have been earnestly desired, and so Patent Documents 1 and 2 have proposed a method of forming a thick film on a GaAs substrate and a sapphire substrate using a HVPE (hydride vapor phase epitaxy) method and removing these substrates later.

Although the GaN independent substrate is obtained by these methods, different kinds of materials such as GaAs or sapphire are basically used to obtain the substrate. Therefore, high-density crystal defects remain in the substrate due to the thermal expansion coefficient difference and the lattice constant difference between the group III nitride and the substrate materials. Even if the defective density could be reduced, it would fall in a range only from $10^5$ to $10^6$ cm$^{-2}$. It is necessary to further reduce the defective density to achieve high-performance (high power and long service life) semiconductor devices. Furthermore, in order to manufacture one piece of substrate of group III nitride crystal, it is necessary to provide at least one piece of GaAs substrate or sapphire substrate as a ground substrate and remove the same. Accordingly, manufacturing costs are high due to the necessity of growing the thick film of several hundred μm by the vapor phase epitaxy, undergoing the complicated processes, and providing the extra ground substrate.

On the other hand, Patent Document 3 discloses a method of encapsulating sodium azide (NaN$_3$) and the metal Ga as materials in a stainless-steel reaction vessel (size of the vessel: 7.5 mm in inner diameter, 100 mm in length) in a nitrogen atmosphere and holding the reaction vessel at temperatures of 600 through 800° C. for 24 through 100 hours so as to grow GaN crystals. Patent Document 3 characterizes practical growth conditions such as a possibility of growing crystals at relatively low temperatures of 600 through 800° C. and a relatively low in-vessel pressure of about 100 kg/cm$^2$ at most. However, this method has a problem in that the obtained crystals are small in size not to reach 1 mm.

The present inventors have keenly studied how to achieve high-quality group III nitride crystals by reacting a mixed melt consisting of an alkaline metal and a group III metal with a group V material containing nitrogen. The inventions related to this are disclosed in Patent Documents 4 through 36. This method is called a flux method.

The flux method exhibits a possibility of growing extremely high-quality group III nitride crystals. There have been made inventions that improve and devise a method of growing high-quality group III nitride crystals and an apparatus for growing the same to achieve an increase in size and higher quality of the crystals. Examples of present technical problems include a further increase in size of the crystals.

As an inhibition to increasing the crystals in size, the vaporization of flux has to be taken into consideration. An alkaline metal is mainly used as the flux. As the alkaline metal is vaporized from the mixed melt containing the group III metal and the alkaline metal, the amount ratio of the flux to the group III metal fluctuates. This results in a variation in the crystal quality and an inhibition to increasing the crystal size.

The present inventors have improved the vaporization of flux in Patent Documents 9, 18, and 26.

Patent Document 9 discloses that an alkaline metal is confined in the reaction vessel by controlling the temperature above the front surface of a mixed melt and devising the introduction direction of a nitrogen material gas. Patent Document 18 discloses that the vaporization of an alkaline metal is suppressed by controlling the pressure of gas in the reaction vessel and devising the shape of a cover of a mixed melt holding vessel. Patent Document 26 discloses that a reduced alkaline metal is replenished by introducing another alkaline metal from the outside.

Thus, it is possible to suppress the fluctuation in the amount ratio of the flux to the group III metal. As a result, it is possible to stably grow crystals and achieve the reduction of the variation in the crystal quality and the increase in the crystal size.

However, in the typical flux method in which the mixed melt consisting of an alkaline metal and a group III metal is reacted with the group V material containing nitrogen so as to obtain GaN crystals, it is difficult to prevent the vaporization of the alkaline metal from the mixed melt to the outside, and it is difficult to control the fluctuation in the molar ratio of the alkaline metal to the group III metal which causes inhibition to increasing the crystal size.

BRIEF SUMMARY

In an aspect of this disclosure, there is provided a method of producing group III nitride crystals while preventing the vaporization of flux from a mixed melt to the outside.

In another aspect, there is provided an apparatus for producing group III nitride crystals while preventing the vaporization of flux from a mixed melt.

In another aspect, there are provided group III nitride crystals produced by using the apparatus for producing group III nitride crystals while preventing the vaporization of flux from a mixed melt.

According to another aspect of this disclosure, there is provided a method of producing a group III nitride crystal in which a melt holding vessel where a melt containing a group III metal and flux is held is accommodated in a reaction vessel and a group III nitride crystal is produced as a substance containing nitrogen is supplied from an outside to the reaction vessel through a pipe, the method comprising a step of forming an accumulated part of a liquid in the pipe to thereby temporarily close the pipe before growing the group III nitride crystal in the melt holding vessel, and a group III nitride crystal produced using the production method involved.

According to another aspect, there is provided an apparatus for producing a group III nitride crystal comprising a reaction vessel capable of being closed; a melt holding vessel that is accommodated in the reaction vessel and holds a melt containing a group III metal and flux; heating means that is arranged on an outside of the reaction vessel and heats the reaction vessel; and a pipe that connects a supply source for a substance containing nitrogen arranged on the outside of the reaction vessel and the reaction vessel to each other; wherein the pipe has a structure capable of internally holding a liquid.

According to another aspect, there is provided a crystal production apparatus comprising a melt holding vessel that holds a mixed melt of an alkaline metal and a group III metal; a backflow prevention unit that suppresses an outflow of an alkali metal vapor in a vessel space in contact with the mixed melt in the melt holding vessel to an outer space by a differential pressure between the vessel space and the outer space or by its own weight and introduces a nitrogen material gas supplied from an outside into the melt holding vessel by the differential pressure; and a heater that heats the mixed melt to a crystal growth temperature.

Further, according to another aspect, there is provided a production method for producing a group III nitride crystal using a crystal production apparatus, wherein the crystal production apparatus includes a melt holding vessel that holds a mixed melt of an alkaline metal and a group III metal; and a backflow prevention unit that suppresses an outflow of an alkali metal vapor in a vessel space in contact with the mixed melt in the melt holding vessel to an outer space by a differential pressure between the vessel space and the outer space or by its own weight and introduces a nitrogen material gas supplied from an outside into the melt holding vessel by the differential pressure; the production method comprises a first step of putting the alkaline metal and the group III metal in the melt holding vessel in an inert-gas or a nitrogen-gas atmosphere; a second step of supplying the nitrogen material gas into the vessel space; a third step of heating the melt holding vessel to a crystal growth temperature; a fourth step of keeping a temperature of the melt holding vessel at the crystal growth temperature for a predetermined time; and a fifth step of supplying the nitrogen material gas to the melt holding vessel through the backflow prevention unit so that a pressure in the vessel space is kept at a predetermined pressure.

Further, according to another aspect, there is provided a crystal production apparatus comprising a melt holding vessel that holds a mixed melt of an alkaline metal and a group III metal; a suppression/introduction vessel that suppresses an outflow of an alkali metal vapor in a vessel space in contact with the mixed melt in the melt holding vessel to an outer space and introduces a nitrogen material gas supplied from an outside into the melt holding vessel by a differential pressure between the vessel space and the outer space; and a heater that heats the mixed melt to a crystal growth temperature.

Further, according to another aspect, there is provided a production method for producing a group III nitride crystal using a crystal production apparatus, wherein the crystal production apparatus includes a melt holding vessel that holds a mixed melt of an alkaline metal and a group III metal; a suppression/introduction vessel that suppresses an outflow of an alkali metal vapor in a vessel space in contact with the mixed melt in the melt holding vessel to an outer space and introduces a nitrogen material gas supplied from an outside into the melt holding vessel by a differential pressure between the vessel space and the outer space; and the production method comprises a first step of putting the alkaline metal and the group III metal in the melt holding vessel in an inert-gas or a nitrogen-gas atmosphere; a second step of supplying the nitrogen material gas into the vessel space; a third step of heating the melt holding vessel to a crystal growth temperature; a fourth step of keeping a temperature of the melt holding vessel at the crystal growth temperature for a predetermined time; a fifth step of supplying the nitrogen material gas to the melt holding vessel through the suppression/introduction vessel so that a pressure in the vessel space is kept at a predetermined pressure.

Thus, group III nitride crystals are grown while an accumulated part of a liquid is formed between a melt, which is held in the melt holding vessel and contains a group III metal and flux, and the outside.

Further, group III nitride crystals can be produced while preventing the vaporization of the flux from the melt to the outside. As a result, it is possible to produce large-sized group III nitride crystals of higher quality at lower cost compared with typical methods.

BEST MODE FOR CARRYING OUT THE INVENTION

Figure 1:
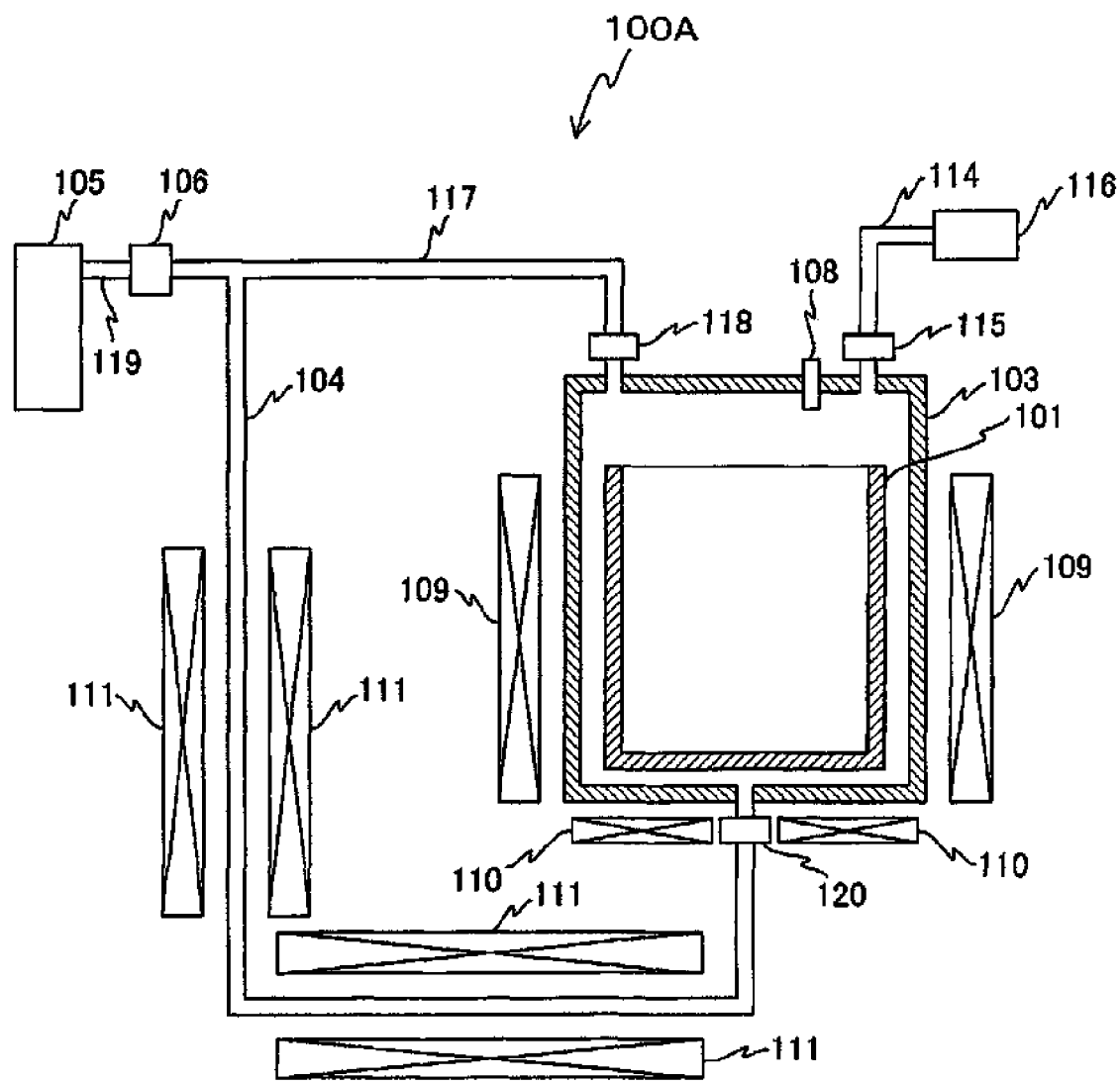
FIG. 1 is a drawing for describing a schematic configuration of a production apparatus for GaN crystals according to an embodiment 1 of the present invention.

According to first and second aspects of the present invention, a group III nitride crystal from a melt, which is held in a melt holding vessel and containing a group III metal and flux, is grown while an accumulated part of a liquid is formed between the melt and the outside.

Preferably, the substance containing nitrogen is gas. The accumulated area of a liquid has at least two interfaces in contact with the gas. The method of producing a group III nitride crystal further comprises a step of setting, out of the at least two interfaces, a temperature of one interface positioned closest to the melt holding vessel higher than a temperature of the other interface.

Preferably, the method of producing a group III nitride crystal further comprises a step of setting, out of the at least two interfaces, the temperature of the at least one interface other than the interface positioned closest to the melt holding vessel at a temperature at which substantial vaporization of the liquid is suppressed.

Preferably, the method of producing a group III nitride crystal further comprises a step of setting, out of the at least two interfaces, the temperature of the at least one interface other than the interface positioned closest to the melt holding vessel and a pressure of the gas in contact with the at least one interface at a temperature and a pressure, respectively, at which substantial vaporization of the liquid is suppressed.

Preferably, the method of producing a group III nitride crystal further comprises a step of setting, out of the at least two interfaces, the temperature of the interface positioned closest to the melt holding vessel at a temperature at which reduction of the flux in the melt held in the melt holding vessel is prevented; and a step of setting, out of the at least two interfaces, the temperature of the at least one interface other than the interface positioned closest to the melt holding vessel at a temperature at which substantial vaporization of the liquid is suppressed.

Preferably, the method of producing a group III nitride crystal further comprises a step of setting, out of the at least two interfaces, the temperature of the interface positioned closest to the melt holding vessel at a temperature at which a vapor pressure of flux vaporized from the accumulated part is approximately equalized to a vapor pressure of the flux vaporized from the melt held in the melt holding vessel; and a step of setting, out of the at least two interfaces, the temperature of the at least one interface other than the interface positioned closest to the melt holding vessel at a temperature at which substantial vaporization of the liquid is suppressed.

Preferably, an alkaline metal is used as the liquid in the step of closing the pipe.

Preferably, the flux is an alkaline metal. In the step of closing the pipe, some of the alkaline metal contained in the melt in the melt holding vessel is vaporized to be transferred to the pipe and liquidized in the pipe to form the accumulated part.

Preferably, if a pressure in the reaction vessel becomes lower than a pressure suitable for growing the group III nitride crystal in the melt holding vessel as the growth of the group III nitride crystal makes progress in the reaction vessel, its differential pressure causes the liquid of the accumulated part to be moved to the reaction vessel to open the pipe.

Furthermore, according to the present invention, an apparatus for producing a group III nitride crystal comprises a reaction vessel, a melt holding vessel, heating means, and a pipe. The reaction vessel is capable of being closed. The melt holding vessel is accommodated in the reaction vessel and holds a melt containing a group III metal and flux. The heating means is arranged on an outside of the reaction vessel and heats the reaction vessel. The pipe connects a supply source for a substance containing nitrogen arranged on the outside of the reaction vessel and the reaction vessel to each other. The pipe has a structure capable of internally holding a liquid.

Preferably, the liquid is held only in the pipe.

Preferably, the apparatus for producing a group III nitride crystal further comprises another heating means. The other heating means sets, out of at least two gas-liquid interfaces of the liquid held in the pipe, a temperature of one gas-liquid interface positioned closest to the melt holding vessel at a temperature at which reduction of the flux in the melt held in the melt holding vessel is prevented.

Preferably, the other heating means sets the temperature of the interface positioned closest to the melt holding vessel at a temperature at which a vapor pressure of flux vaporized from an accumulated part is approximately equalized to a vapor pressure of the flux vaporized from the melt held in the melt holding vessel.

Preferably, the reaction vessel has a structure capable of internally holding the liquid. The liquid is held in the pipe and the reaction vessel.

Preferably, the apparatus for producing a group III nitride crystal further comprises a pressure vessel accommodates the reaction vessel and the heating means and is capable of being closed.

Preferably, the apparatus for producing a group III nitride crystal further comprises temperature gradient imparting means. The temperature gradient imparting means imparts to the pipe a temperature gradient to suppress substantial vaporization of the liquid held in the pipe.

Preferably, the substance containing nitrogen is gas. An interface where the liquid held in the pipe comes in contact with the gas from the supply source is smaller in size than an inner diameter of the pipe.

Preferably, the apparatus for producing a group III nitride crystal further comprises a float. The float is arranged in the pipe, has a specific gravity lower than that of the liquid, and defines a size of the interface.

Preferably, the apparatus for producing a group III nitride crystal further comprises a secondary pipe. The secondary pipe connects a supply source for gas other than nitrogen arranged on the outside of the reaction vessel and the reaction vessel to each other. The secondary pipe has a structure capable of internally holding the liquid.

Preferably, the apparatus for producing a group III nitride crystal further comprising temperature gradient imparting means. The temperature gradient imparting means imparts to the secondary pipe a temperature gradient to suppress substantial vaporization of the liquid held in the secondary pipe.

Preferably, the gas other than nitrogen is an inert gas.

Preferably, the liquid is an alkaline metal.

Moreover, according to the present inventions a group III nitride crystal is produced by the method according to any one of claims 11 through 23.

Embodiment 1

Referring next to FIGS. 1 to 5, a description is made of an embodiment 1 of the present invention. FIG. 1 shows a schematic configuration of a crystal production apparatus 100A for GaN crystals as an apparatus for producing group III nitride crystals according to the embodiment 1 of the present invention. Here, nitrogen gas ($N_2$ gas) is used as a substance containing nitrogen.

The crystal production apparatus 100A as shown in FIG. 1 is composed of a reaction vessel 103, a melt holding vessel 101, heaters 109, 110, and 111, a nitrogen-gas supply source (nitrogen gas cylinder) 105, gas supply pipes 104, 117, and 119, valves 115, 118, and 120, a pressure sensor 108, an exhaust pipe 114, a vacuum pump 116, a pressure regulator 106, and the like.

The reaction vessel 103 is a stainless-steel closed vessel. The melt holding vessel 101 is accommodated in the reaction vessel 103. Note that when the melt holding vessel 101 is accommodated in the reaction vessel 103, a predetermined-sized gap is formed between the lower part of the melt holding vessel 101 and the bottom surface of the reaction vessel 103.

The melt holding vessel 101 uses, as an example, P-BN (pyrolytic boron nitride) as its material and can be taken out from the reaction vessel 103. A mixed melt 102 containing sodium (Na) as flux and metal gallium (Ga) as a group III metal is poured into the melt holding vessel 101.

The heaters 109 are adjacently arranged on the outside of the reaction vessel 103 and heat the reaction vessel 103 from its side surfaces.

The heaters 110 are adjacently arranged on the outside of the reaction vessel 103 and heat the reaction vessel 103 from its bottom surface. In other words, the reaction vessel 103 is heated by the heaters 109 and 110. The melt holding vessel 101 is thus heated through the reaction vessel 103.

The pressure sensor 108 is provided at the top of the reaction vessel 103 and used to monitor the pressure of the gas in the reaction vessel 103.

The exhaust pipe 114 exhausts the gas in the reaction vessel 103. The exhaust pipe 114 has one end connected to the vacuum pump 116 and the other end connected to an opening provided at the top of the reaction vessel 103.

The valve 115 is on the exhaust pipe 114 and provided near the reaction vessel 103. When the vacuum pump 116 is in operation and the valve 115 is opened, the gas in the reaction vessel 103 is evacuated.

The gas supply pipes 104, 117, and 119 are pipes to supply nitrogen gas into the reaction vessel 103. One end of the gas supply pipe 119 is connected to the nitrogen gas cylinder 105. The other end of the gas supply pipe 119 branches into two parts, one part of which is connected to one end of the gas supply pipe 104 and the other part of which is connected to the gas supply pipe 117.

The other end of the gas supply pipe 117 is connected to an opening provided at the top of the reaction vessel 103.

The other end of the gas supply pipe 104 is connected to the opening provided at the bottom of the reaction vessel 103.

The valve 118 is on the gas supply pipe 117 and provided near the reaction vessel 103. Nitrogen gas is supplied to the reaction vessel 103 when the valve 118 is opened, while the supply of nitrogen gas to the reaction vessel 103 is interrupted when the valve 118 is closed.

The gas supply pipe 104 has a U-shaped portion. The heaters 111 have plural heating portions, one arranged adjacent to the rising portion separated from the reaction vessel 103 of the gas supply pipe 104 and the other arranged adjacent to the bottom portion thereof, and impart a temperature gradient to the U-shaped portion so as to suppress substantial vaporization of a metal Na melt (liquid) held in the U-shaped portion of the gas supply pipe 104.

The valve 120 is on the gas supply pipe 104 and provided near the reaction vessel 103.

The pressure regulator 106 is provided on the gas supply pipe 119 and used to regulate the pressure of nitrogen gas to be supplied to the reaction vessel 103.

Figure 2:
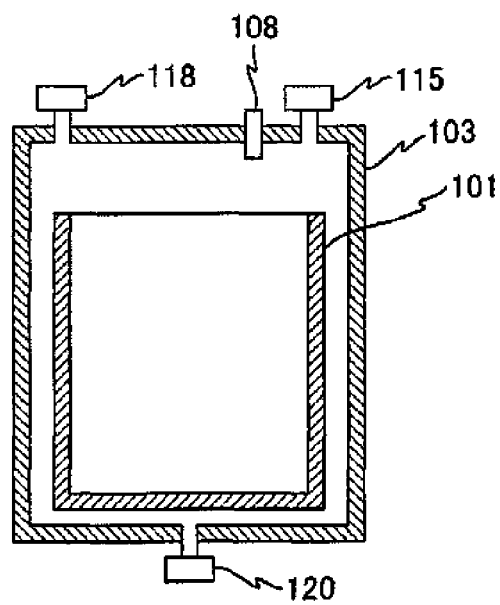
FIG. 2 is a drawing (1) for describing a production method using the production apparatus of FIG. 1.

Furthermore, the reaction vessel 103 having each valve attached thereto is separable from each pipe as shown in FIG. 2 and can be moved to a glove box, not shown, so as to perform an operation.

Next, a description is made of a method of producing GaN crystals using the crystal production apparatus 100A configured in the above manner.

(1) Close each valve.

(2) Separate the reaction vessel 103 from each pipe and put it in the glove box in an argon (Ar) atmosphere.

(3) Open the cover of the reaction vessel 103 and take out the melt holding vessel 101 from the reaction vessel 103. Then, the mixed melt 102 containing the metal Ga as a material and the metal Na as flux is poured into the melt holding vessel 101. Here, the molar ratio of Na to Ga in the mixed melt 102 is 5:5 as an example.

(4) Pour the metal Na melt 112 in the reaction vessel 103.

(5) Accommodate the melt holding vessel 101 in a predetermined position of the reaction vessel 103. Accordingly, as exemplified in FIG. 3, a gap between the reaction vessel 103 and the melt holding vessel 101 is filled with the metal Na melt 112. Note that treating Ga and Na in an Ar atmosphere makes it possible to prevent their reactions with oxygen and moisture.

(6) Close the cover of the reaction vessel 103. Note that the space other than that occupied by the mixed melt 102 in the melt holding vessel 101 and the space in the reaction vessel 103 are in communication with each other, and they have almost the same atmosphere and pressure. Hereinafter, these two spaces are collectively referred to as a space 107 of the reaction vessel 103. Here, the space 107 in the reaction vessel 103 is in an Ar atmosphere.

(7) Take out the reaction vessel 103 from the glove box and connect it to each pipe. At this time, connect the reaction vessel to each pipe while supplying, for example, nitrogen gas to each gas supply pipe so as not to leave air therein. Accordingly, each gas supply pipe is filled with the nitrogen gas.

(8) Operate the vacuum pump 116.

(9) Open the valve 115. Accordingly, the Ar (argon) gas contained in the space 107 in the reaction vessel 103 is evacuated. In other words, the gas in the reaction vessel 103 is purged.

(10) Refer to the pressure sensor 108, and close the valve 115 when the pressure in the space 107 in the reaction vessel 103 reaches a predetermined pressure.

(11) Open the valve 118 and supply the nitrogen gas to the reaction vessel 103. At this time, refer to the pressure sensor 108 and regulate the pressure regulator 106 so that the pressure of the nitrogen gas in the reaction vessel 103 becomes almost 15 times atmospheric pressure. When the pressure in the reaction vessel 103 becomes 15 times atmospheric pressure, close the valve 118. Note that the above steps are performed at a temperature at which the metal Na melt between the melt holding vessel 101 and the reaction vessel 103 is kept in a liquid state and at a temperature at which substantial vaporization of Na is suppressed (for example, 100° C.).

(12) Open the valve 120. Accordingly, as exemplified in FIG. 4, some of the metal Na melt 112 filling in the gap between the reaction vessel 103 and the melt holding vessel 101 is caused to flow into the U-shaped portion of the gas supply pipe 104. At this time, the metal Na melt 112 has a gas-liquid interface A in the reaction vessel 103 and a gas-liquid interface B in the gas supply pipe 104. Here, since the pressure in the space 107 in the reaction vessel 103 and that in a space 113 in the gas supply pipe 104 are almost the same, the level L1 of the gas-liquid interface A and the level L2 of the gas-liquid interface B almost are equalized to each other.

(13) Energize the heaters 109 and 110 to raise the temperature in the reaction vessel 103 up to 800° C. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, the heaters 111 are controlled to keep Na in a liquid state and suppress substantial vaporization of Na at the gas-liquid interface B. Here, the "suppress substantial vaporization" refers to the degree in which even if Na is diffused to the space 113 on the nitrogen cylinder side of the gas supply pipe 104 from the gas-liquid interface B, the diffused amount does not adversely affect crystal growth within time (several tens to several hundreds of hours) during the crystal growth. For example, when the heaters 111 are controlled to keep the temperature at the gas-liquid interface B at 150° C., a liquid state is of course kept because it exceeds the melting point (98° C.) of Na. Accordingly, the vapor pressure becomes $7.6 \times 10^{-9}$ of atmospheric pressure in which reduction of the metal Na melt 112 hardly occurs within the time of the crystal growth. Note that the vapor pressures of Na at 300° C. and 400° C. are respectively $1.8 \times 10^{-5}$ of atmospheric pressure and $4.7 \times 10^{-4}$ of atmospheric pressure, and the reduction of the metal Na melt 112 is negligible even in these conditions.

Accordingly, the temperature at the gas-liquid interface A becomes higher than that at the gas-liquid interface B, causing a temperature gradient between the gas-liquid interface A and the gas-liquid interface B.

Note that in this temperature raising process of the reaction vessel 103, the pressure is raised up to 40 times atmospheric pressure with the pressure regulator 106 so that the pressure in the space 107 in the reaction vessel 103 and that in the space 113 on the nitrogen cylinder side of the gas supply pipe 104 become almost the same.

(15) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

Figure 4:
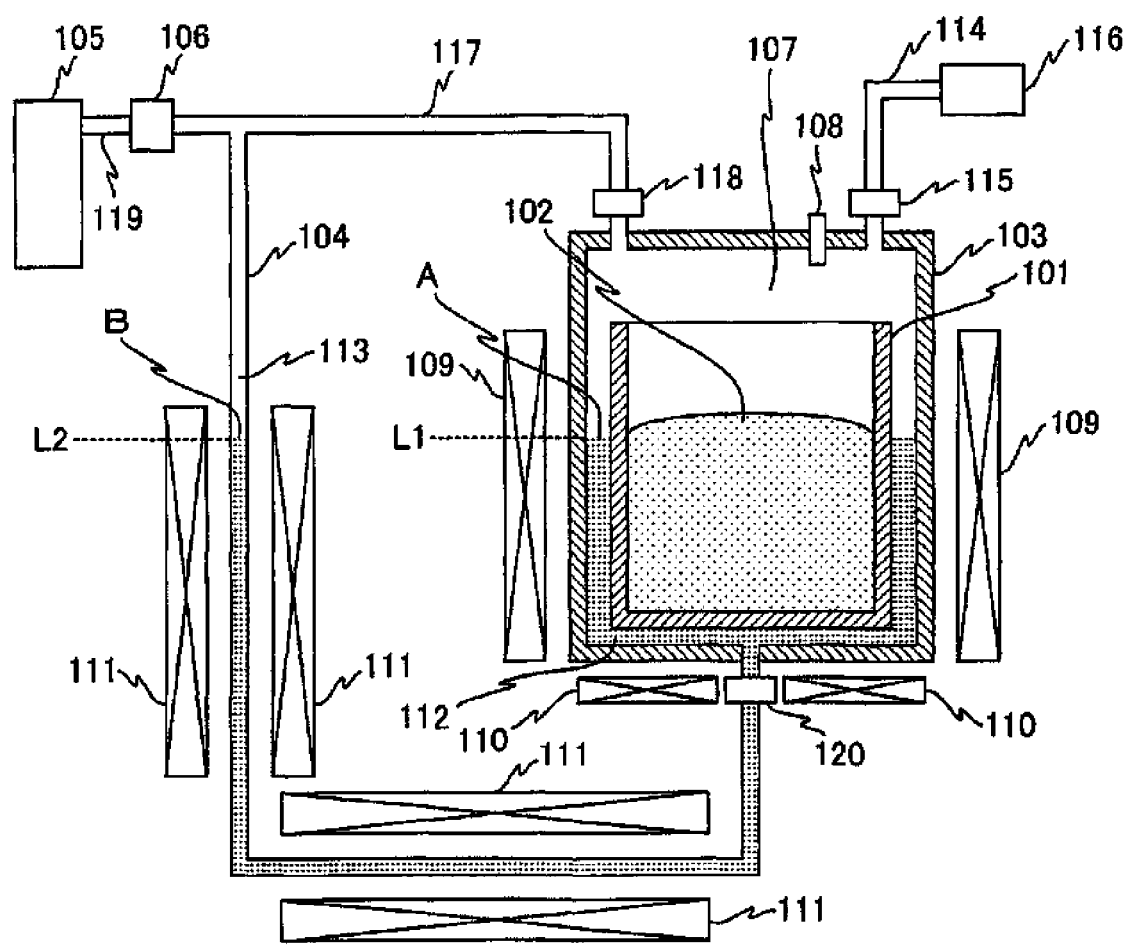
FIG. 4 is a drawing (3) for describing a production method using the production apparatus of FIG. 1.
Figure 5:
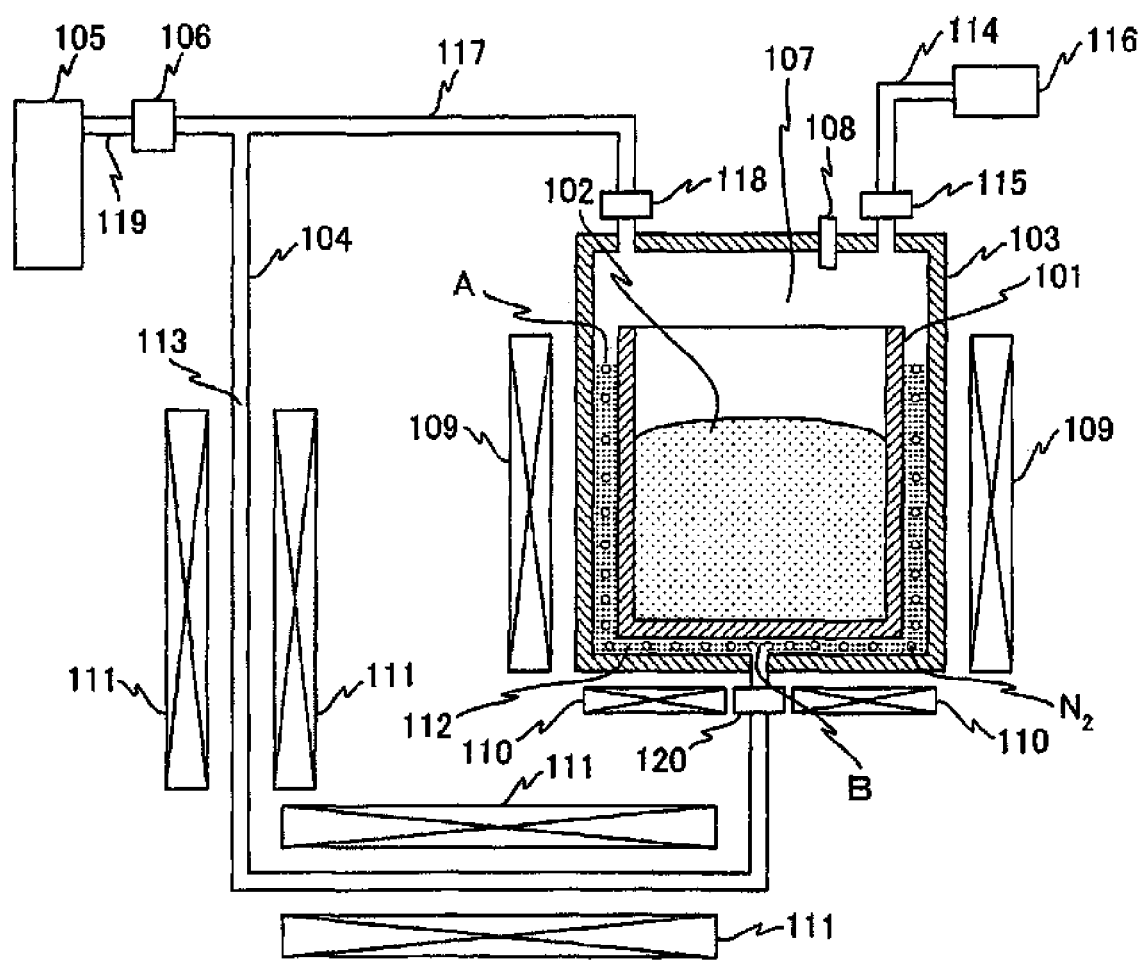
FIG. 5 is a drawing (4) for describing a production method using the production apparatus of FIG. 1.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 5, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt 112 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that at the gas-liquid interface B become almost the same. In the process of growing crystals, the conditions as shown in FIGS. 4 and 5 are alternately repeated to supply the nitrogen gas to the space 107 in the reaction vessel 103.

At this time, the temperature at the gas-liquid interface A is 800° C. the same as the temperature in the reaction vessel 103. Since the vapor pressure of Na at this temperature is as large as about 0.45 of atmospheric pressure, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 and is liquidized, which will not influence the introduction of the nitrogen gas into the space 107 in the reaction vessel 103.

The GaN crystals produced in the above manner are more excellent in quality than those produced by the typical flux method and are large in size.

Figure 6:
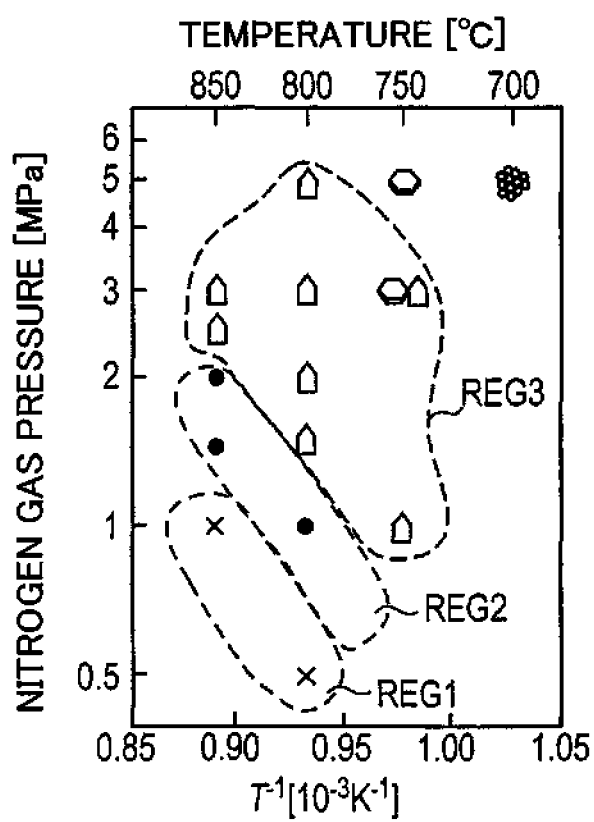
FIG. 6 is a drawing showing a relationship between nitrogen gas pressure and crystal growth temperature when GaN crystals are grown.

FIG. 6 is a drawing showing a relationship between nitrogen gas pressure and crystal growth temperature when GaN crystals are grown. In FIG. 6, the horizontal axis represents the crystal growth temperature and the vertical axis represents the nitrogen gas pressure. Note that the sign T in the horizontal axis in FIG. 6 represents the absolute temperature.

As shown in FIG. 6, REG1 is a region where GaN crystals dissolve, REG2 is a region where the formation of nuclei in the mixed melt 102 is suppressed and the GaN crystals grow from seed crystals, and REG3 is a region where many nuclei occur in the bottom surface and the side surface in contact with the mixed melt 102 and column-shaped GaN crystals grown in the c-axis (<0001>) direction are produced.

In the crystal production apparatus 100A, various GaN crystals are produced using the nitrogen gas pressure and the crystal growth temperature in the regions REG1, REG2, and REG3 as shown in FIG. 6, while preventing the vaporization of metal Na from the mixed melt 102 to the outside by the metal Na melt 112.

For example, the nitrogen gas pressure and the crystal growth temperature in the regions REG2 and REG3 are used to grow seed crystals and spontaneous nuclei individually.

Furthermore, many spontaneous nuclei are generated in the melt holding vessel 101 using the nitrogen gas pressure and the crystal growth temperature in the region REG3; some of the spontaneous nuclei are dissolved using the nitrogen gas pressure and the crystal growth temperature in the region REG1, and subsequently the remaining spontaneous nuclei as seed crystals are grown to be GaN crystals using the nitrogen gas pressure and the crystal growth temperature in the region REG2.

Moreover, many spontaneous nuclei are generated in the melt holding vessel 101 using the nitrogen gas pressure and the crystal growth temperature in the region REG3, and then the spontaneous nuclei as seed crystals are grown to be GaN crystals using the nitrogen gas pressure and the crystal growth temperature in the region REG2.

In this manner, in the crystal production apparatus 100A, various GaN crystals are produced, while preventing the vaporization of the metal Na from the mixed melt 102 to the outside by the metal Na melt 112.

As described above, according to the embodiment 1, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103. As a result, it is possible to prevent the diffusion of Na to the outside of the reaction vessel 103 and supply a nitrogen material in a secure manner, continue the stable growth of GaN crystals, and produce low-cost, high-quality, large-sized, and homogeneous GaN crystals. Accordingly, it is possible to grow group III nitride crystals excellent in quality and larger in size than those produced by the typical flux method.

Furthermore, since Na the same as flux is present in the outside of the melt holding vessel 101 and the Na vapor is generated also from the gas-liquid interface A, it is possible to suppress the vaporization of Na from the mixed melt 102 in the melt holding vessel 101. As a result, the amount (ratio) of Na in the mixed melt 102 becomes stable, thus making it possible to maintain a low-cost and stable growth of GaN crystals.

Note that although the embodiment 1 describes the case in which the opening connected to the other end of the exhaust pipe 114 is provided at the top of the reaction vessel 103, the present invention is not limited to this. In short, there may be employed a configuration in which the gas in the reaction vessel 103 can be evacuated when the gap between the reaction vessel 103 and the melt holding vessel 101 is filled with the metal Na melt.

Furthermore, although the embodiment 1 describes the case in which the opening connected to the other end of the gas supply pipe 117 is provided at the top of the reaction vessel 103, the present invention is not limited to this. In short, there may be employed a configuration in which the nitrogen gas can be introduced when the gap between the reaction vessel 103 and the melt holding vessel 101 is filled with the metal Na melt.

Furthermore, although the embodiment 1 describes the case in which the opening connected to the other end of the gas supply pipe 104 is provided at the lower part of the reaction vessel 103, the present invention is not limited to this. In short, there may be employed a configuration in which if the pressure in the reaction vessel 103 is smaller than that suitable for growing GaN crystals in the melt holding vessel 101, the differential pressure causes the metal Na melt to be moved into the reaction vessel 103 to open the gas supply pipe 104, and if the pressure in the reaction vessel 103 becomes a pressure suitable for growing GaN crystals in the melt holding vessel 101, some of the metal Na melt in the reaction vessel 103 may be moved into the gas supply pipe 104 to close the gas supply pipe 104.

Embodiment 2

Figure 7:
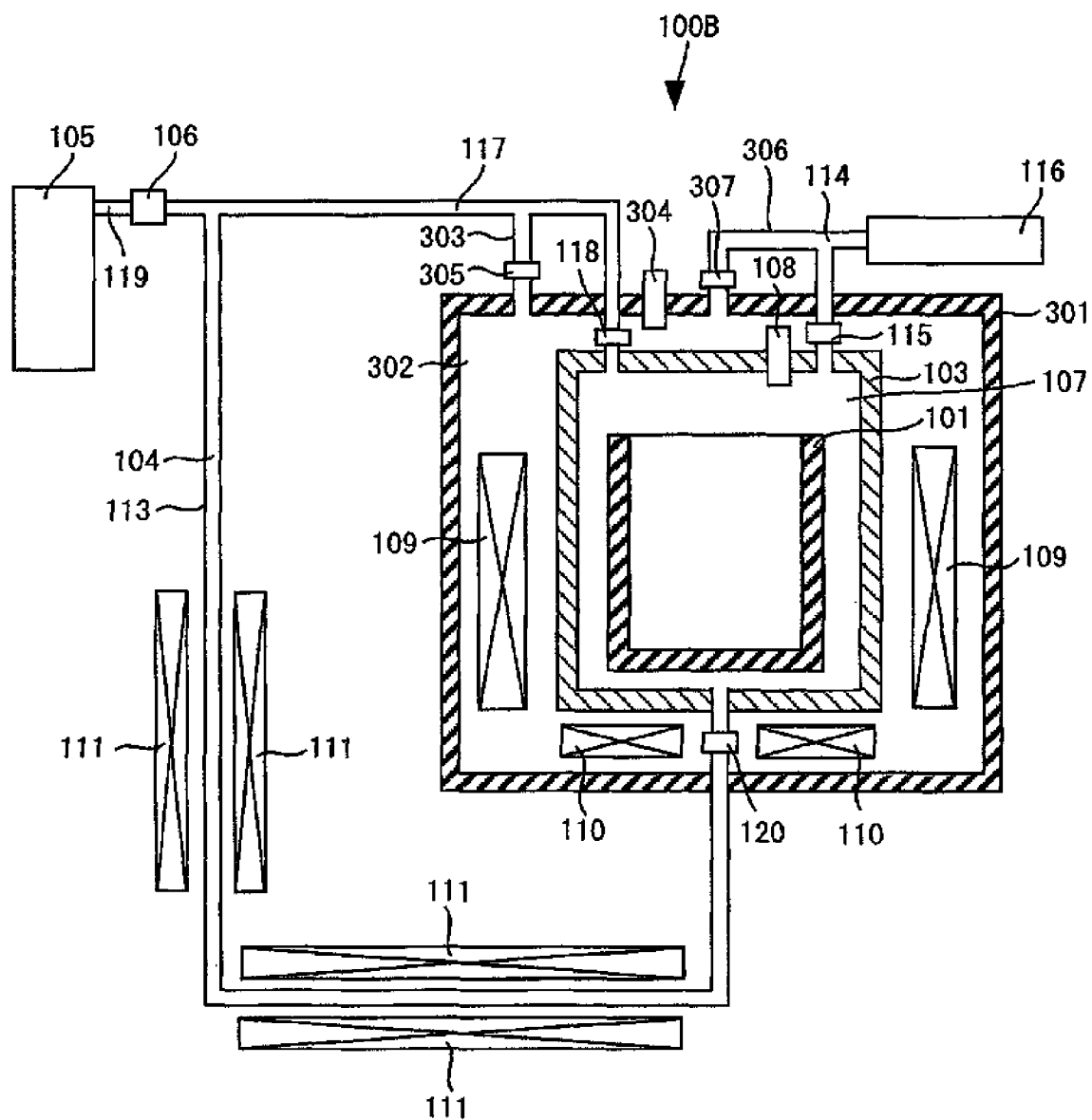
FIG. 7 is a drawing for describing a schematic configuration of a production apparatus for GaN crystals according to an embodiment 2 of the present invention.
Figure 8:
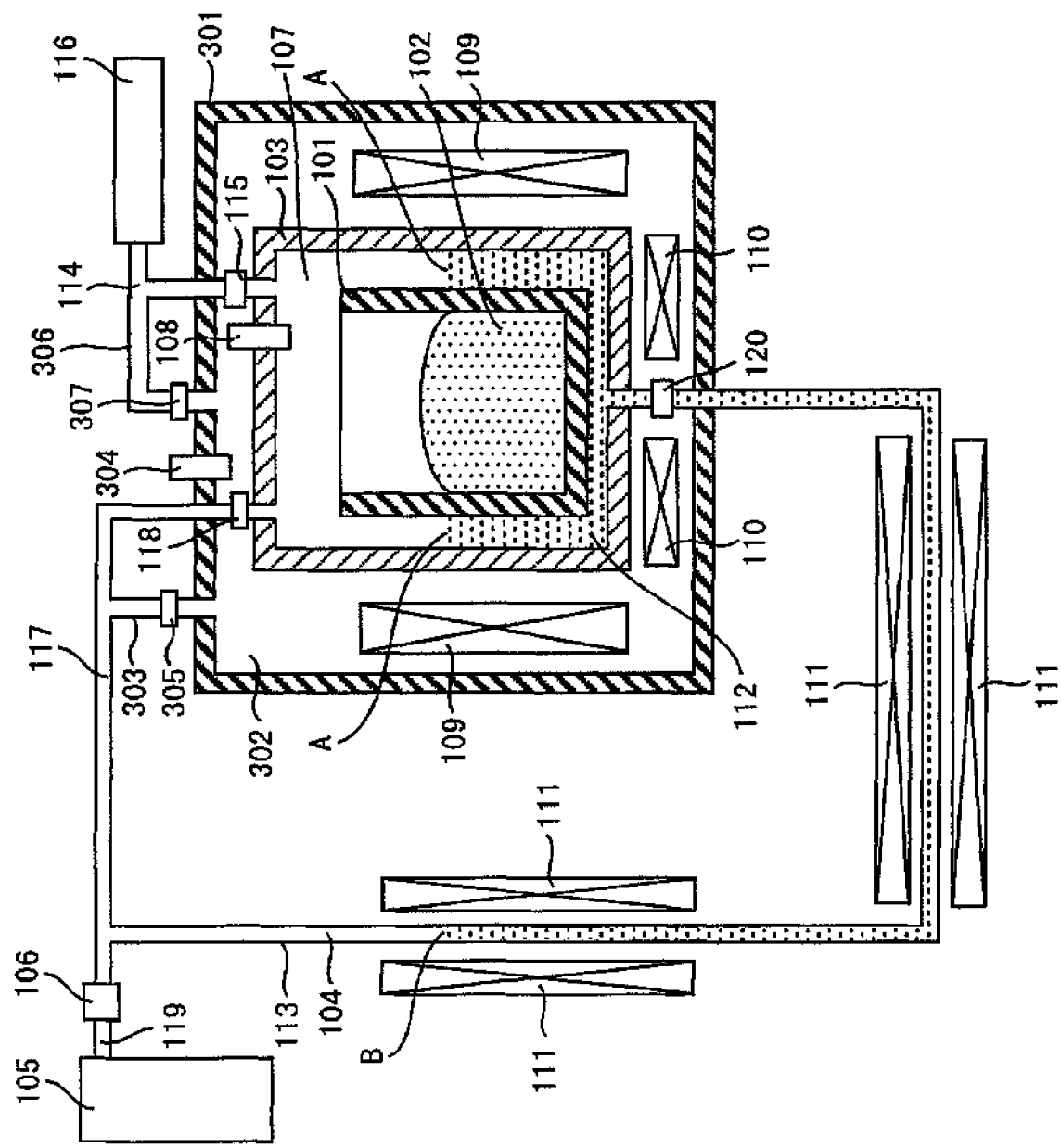
FIG. 8 is a drawing (1) for describing a production method using the production apparatus of FIG. 7.
Figure 9:
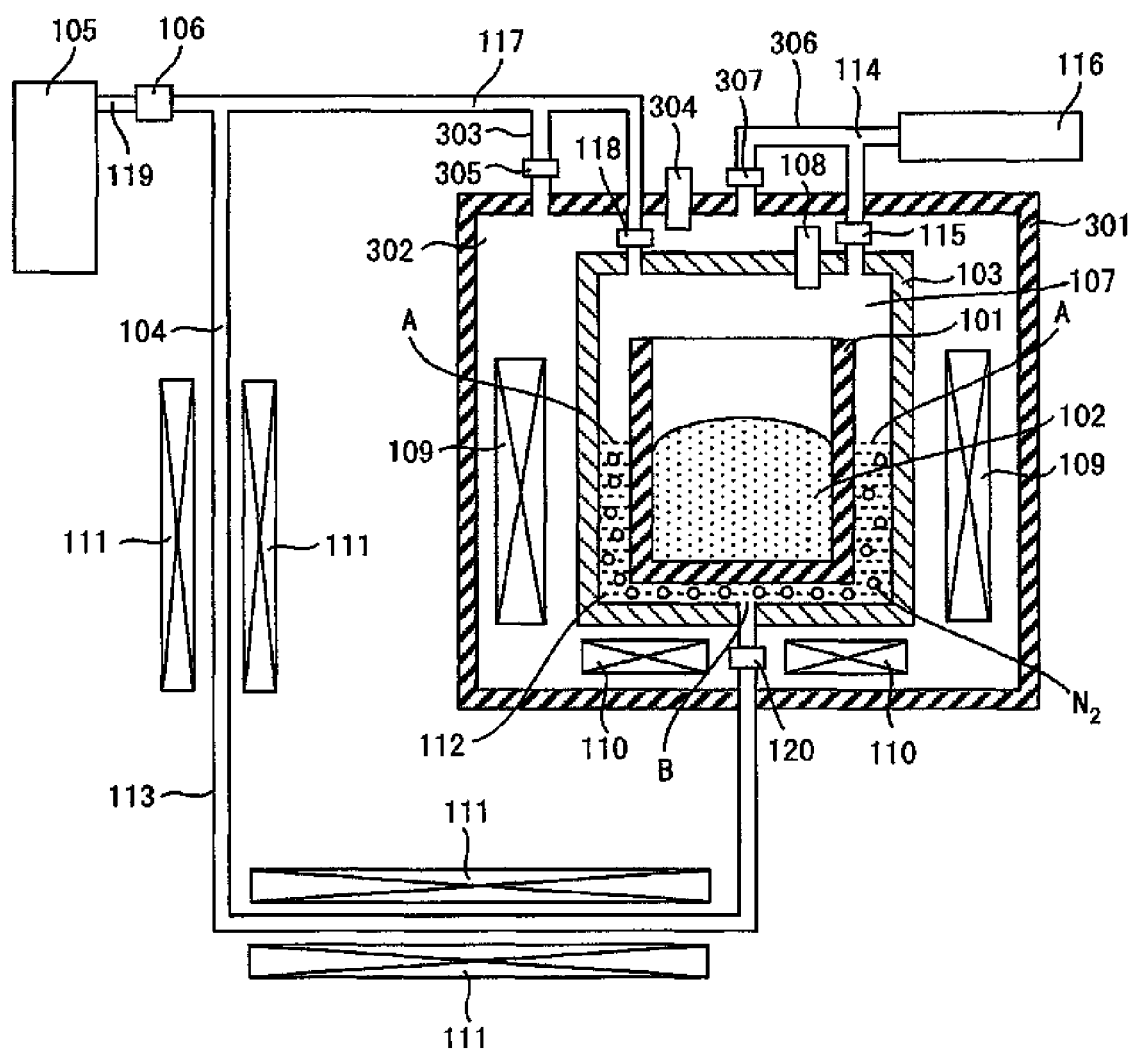
FIG. 9 is a drawing (2) for describing a production method using the production apparatus of FIG. 7.

Referring next to FIGS. 7 through 9, a description is made of an embodiment 2 of the present invention.

FIG. 7 shows a schematic configuration of a crystal production apparatus 100B for GaN crystals as an apparatus for producing group III nitride crystals according to the embodiment 2 of the present invention. Note that, in the following description, components the same as or similar to those of the embodiment 1 are indicated by the same numerals, and the descriptions thereof are simplified or omitted.

The crystal production apparatus 100B as shown in FIG. 7 is composed of the reaction vessel 103, a pressure vessel 301, the melt holding vessel 101, the heaters 109, 110, and 111, the nitrogen-gas supply source (nitrogen-gas cylinder) 105, the gas supply pipes 104, 117, 119, and 303, valves 115, 118, 120, 305, and 307, the two pressure sensors 108 and 304, the exhaust pipes 114 and 306, the vacuum pump 116, the pressure regulator 106, and the like. In other words, the crystal production apparatus 100B is formed by adding the pressure vessel 301, the pressure sensor 304, the gas supply pipe 303, the valves 305 and 307, and the gas exhaust pipe 306 to the crystal production apparatus 100A of the embodiment 1.

The pressure vessel 301 is a stainless-steel closed vessel. In the pressure vessel 301, the reaction vessel 103, the heaters 109 and 110, and the like are accommodated.

The gas supply pipe 303 is formed by branching the gas supply pipe 117 and provided to supply nitrogen gas to the pressure vessel 301. The gas supply pipe 303 has one end connected to be on the halfway of the gas supply pipe 117 and the other end connected to an opening of the pressure vessel 301.

The pressure sensor 304 is provided at the top of the pressure vessel 301 and used to monitor the pressure in the pressure vessel 301.

The valve 305 is attached to the gas supply pipe 303 near the pressure vessel 301. The valve 305 supplies nitrogen gas to the pressure vessel 301 or stops supplying nitrogen gas thereto.

The gas exhaust pipe 306 has one end connected to the pressure vessel 301 and the other end connected to the exhaust pipe 114. The gas exhaust pipe 306 introduces the gas in the pressure vessel 301 to the vacuum pump 116.

The valve 307 is attached to the gas exhaust pipe 306 near the pressure vessel 301. The valve 307 introduces the gas in the pressure vessel 301 to the vacuum pump 116 or stops supplying the gas in the pressure vessel 301 to the vacuum pump 116 side.

Next, a description is made of a method of producing GaN crystals using the crystal production apparatus 100B configured in the above manner.

(1) Close each valve.

(2) Separate the reaction vessel 103 from each pipe and take it out from the pressure vessel 301.

(3) Put the taken-out reaction vessel 103 in a glove box in an Ar atmosphere.

(4) Take out the melt holding vessel 101 from the reaction vessel 103 and put the metal Ga as a material and the metal Na as flux in the melt holding vessel 101. Here, the molar ratio of Na to Ga is 5:5 as an example.

(5) Pour a metal Na melt in the reaction vessel 103.

(6) Accommodate the melt holding vessel 101 in a predetermined position of the reaction vessel 103. Accordingly, as exemplified in FIG. 3, a gap between the reaction vessel 103 and the melt holding vessel 101 is filled with the metal Na melt.

(7) Close the cover of the reaction vessel 103.

(8) Take out the reaction vessel 103 from the glove box and accommodate it in a predetermined position of the pressure vessel 301.

(9) Connect the reaction vessel 103 to each pipe. At this time, connect the reaction vessel to each pipe while supplying, for example, nitrogen gas to each gas supply pipe so as not to leave air therein. Accordingly, each gas supply pipe is filled with the nitrogen gas.

(10) Close the cover of the pressure vessel 301.

(11) Operate the vacuum pump 116.

(12) Open the valves 115 and 307. Accordingly, the Ar gas contained in the space 107 in the reaction vessel 103 and the gas present in the space 302 between the pressure vessel 301 and the reaction vessel 103 are evacuated.

(13) Refer to the pressure sensors 108 and 304, and close the valves 115 and 307 when the pressure in the space 107 in the reaction vessel 103 and that in the space 302 between the pressure vessel 301 and the reaction vessel 103 reach a predetermined pressure.

(14) Open the valves 118 and 305 and supply the nitrogen gas to the reaction vessel 103 and the pressure vessel 301. At this timer refer to the pressure sensors 108 and 304 and control the pressure regulator 106 so that the pressure of the nitrogen gas in the reaction vessel 103 and the pressure vessel 301 become almost 15 times atmospheric pressure. When the pressures in the reaction vessel 103 and the pressure vessel 301 become 15 times atmospheric pressure, close the valve 118 while keeping the valve 305 opened. The above steps are performed at a temperature at which the metal Na melt between the melt holding vessel 101 and the reaction vessel 103 is kept in a liquid state and at a temperature at which substantial vaporization of Na is suppressed (for example, 100° C.).

(15) Open the valve 120. Accordingly, as exemplified in FIG. 8, some of the metal Na melt 112 filling in the gap between the reaction vessel 103 and the melt holding vessel 101 is caused to flow into the U-shaped portion of the gas supply pipe 104. Here, since the pressure in the space 107 in the reaction vessel 103 and that in the space 113 in the gas supply pipe 104 are almost the same, the level of the gas-liquid interface A and that of the gas-liquid interface B are almost equalized to each other.

(16) Energize the heaters 109 and 110 to raise the temperatures of the melt holding vessel 101 and the reaction vessel 103 up to 800° C. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, the heaters 111 are controlled to keep Na in a liquid state and suppress substantial vaporization of Na at the gas-liquid interface B. Accordingly, the temperature at the gas-liquid interface A becomes higher than that of the gas-liquid interface B, causing a temperature gradient between the gas-liquid interface A and the gas-liquid interface B.

Note that, in this temperature raising process of the reaction vessel 103, the pressure is controlled to be raised up to 40 times atmospheric pressure with the pressure regulator 106 so that the pressure in the space 107 in the reaction vessel 103, that in space 113 on the nitrogen cylinder side of the gas supply pipe 104, and that in the space 302 in the pressure vessel 301 become almost the same.

(17) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 9, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 8 and 9 are alternately repeated to supply the nitrogen gas to the space 107 in the reaction vessel 103.

At this time, the temperature at the gas-liquid interface A is 800° C. the same as the temperature in the reaction vessel 103. Since the vapor pressure of Na at this temperature is as large as about 0.45 of atmospheric pressure, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 to be a metal Na melt, which will not influence the introduction of nitrogen into the space 107 in the reaction vessel 103.

Note that also in the crystal production apparatus 100B, GaN crystals are produced using the nitrogen gas pressure and the crystal growth temperature in the regions REG1, REG2, and REG3 as shown in FIG. 6.

As described above, according to the embodiment 2, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103. As a result, it is possible to prevent the diffusion of Na to the outside of the reaction vessel 103 and supply a nitrogen material in a secure manner, continue the stable growth of GaN crystals, and produce low-cost, high-quality, large-sized, and homogeneous GaN crystals.

Furthermore, it is possible to make the pressure in the space 302 in the pressure vessel 301 almost the same as that in the space 107 in the reaction vessel 103. In the case of the above-described crystal production apparatus 100A, it is necessary for the reaction vessel 103 to meet both a pressure-resisting property and a heat-resisting property. On the other hand, it is not necessary for the reaction vessel 103 in the crystal production apparatus 100B of the embodiment 2 to have the pressure-resisting property. Accordingly, it is possible to make the reaction vessel 103 thin and make the heat capacity of the reaction vessel 103 small, thus allowing a fine control of the temperature of the pressure vessel 301. As a result, the temperature fluctuation range in the pressure vessel 301 can be made smaller than that in the embodiment 1, thus making it possible to continue the stable growth of GaN crystals, and produce low-cost, high-quality, large-sized, and homogeneous GaN crystals.

Embodiment 3

Referring next to FIGS. 10 through 13, a description is made of an embodiment 3 of the present invention.

Figure 10:
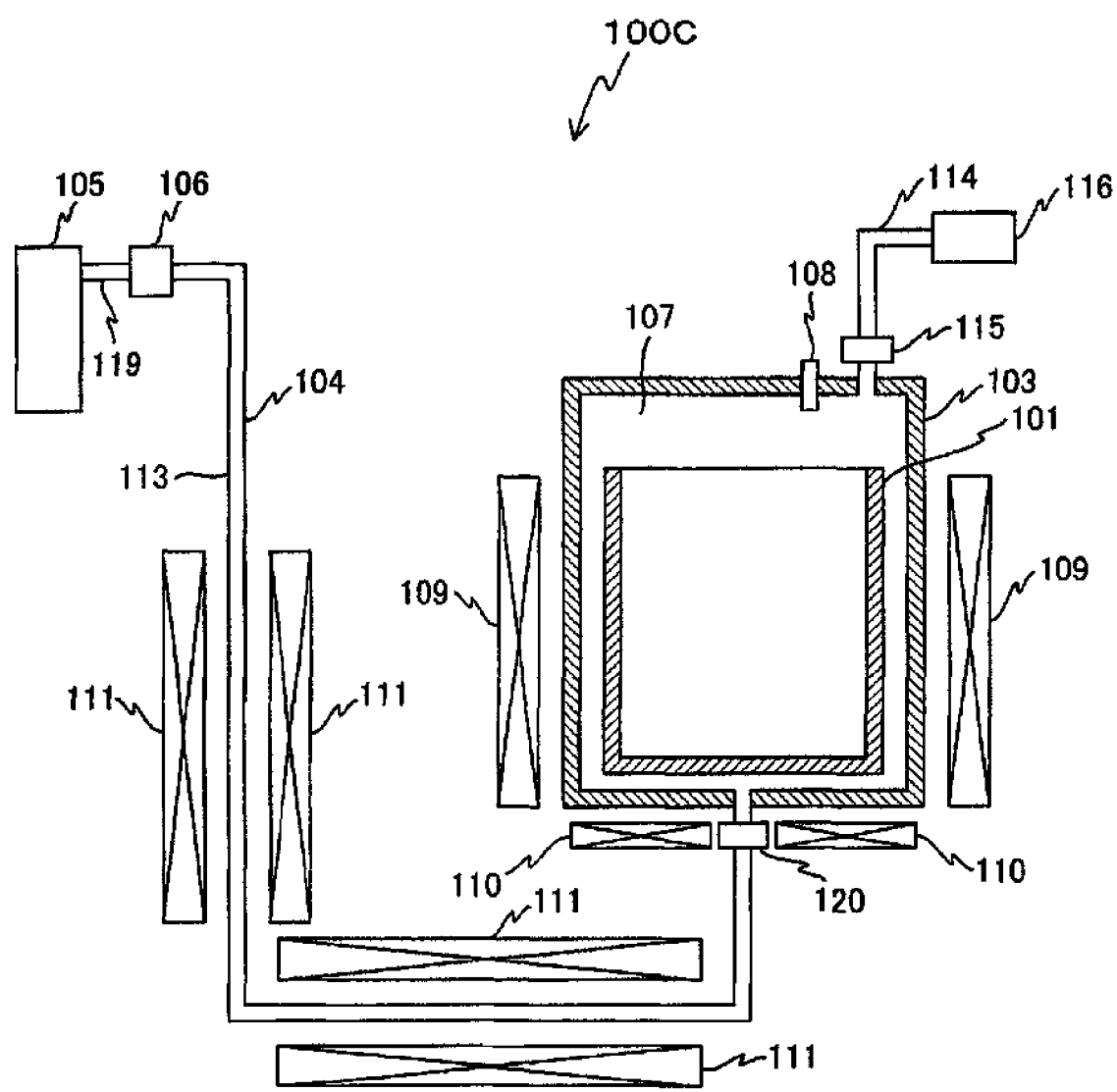
FIG. 10 is a drawing for describing a schematic configuration of a production apparatus for GaN crystals according to an embodiment 3 of the present invention.

FIG. 10 shows a schematic configuration of a crystal production apparatus 100C for GaN crystals as an apparatus for producing group III nitride crystals according to the embodiment 3 of the present invention. Note that, in the following description, components the same as or similar to those of the embodiment 1 are indicated by the same numerals, and the descriptions thereof are simplified or omitted.

The crystal production apparatus 100C as shown in FIG. 10 is composed of the reaction vessel 103, the melt holding vessel 101, the heaters 109, 110 and 111, the nitrogen-gas supply source (nitrogen-gas cylinder) 105, the gas supply pipes 104 and 119, valves 115 and 120, the pressure sensor 108, the exhaust pipe 114, the vacuum pump 116, the pressure regulator 106, and the like. In other words, the crystal production apparatus 100C is formed by eliminating the gas supply pipe 117 and the valve 118 from the crystal production apparatus 100A of the embodiment 1.

Next, a description is made of a method of producing GaN crystals using the crystal production apparatus 100C configured in the above manner.

(1) Close each valve.

(2) Separate the reaction vessel 103 from each pipe and put it in a glove box in an Ar atmosphere.

(3) Take out the melt holding vessel 101 from the reaction vessel 103 and put the metal Ga as a material and the metal Na as flux in the melt holding vessel 101. Here, the molar ratio of Na to Ga is 5:5 as an example.

(4) Accommodate the melt holding vessel 101 in a predetermined position of the reaction vessel 103. Here, unlike the embodiments 1 and 2, nothing is poured into the gap between the reaction vessel 103 and the melt holding vessel 101.

(5) Close the cover of the reaction vessel 103.

Figure 11:
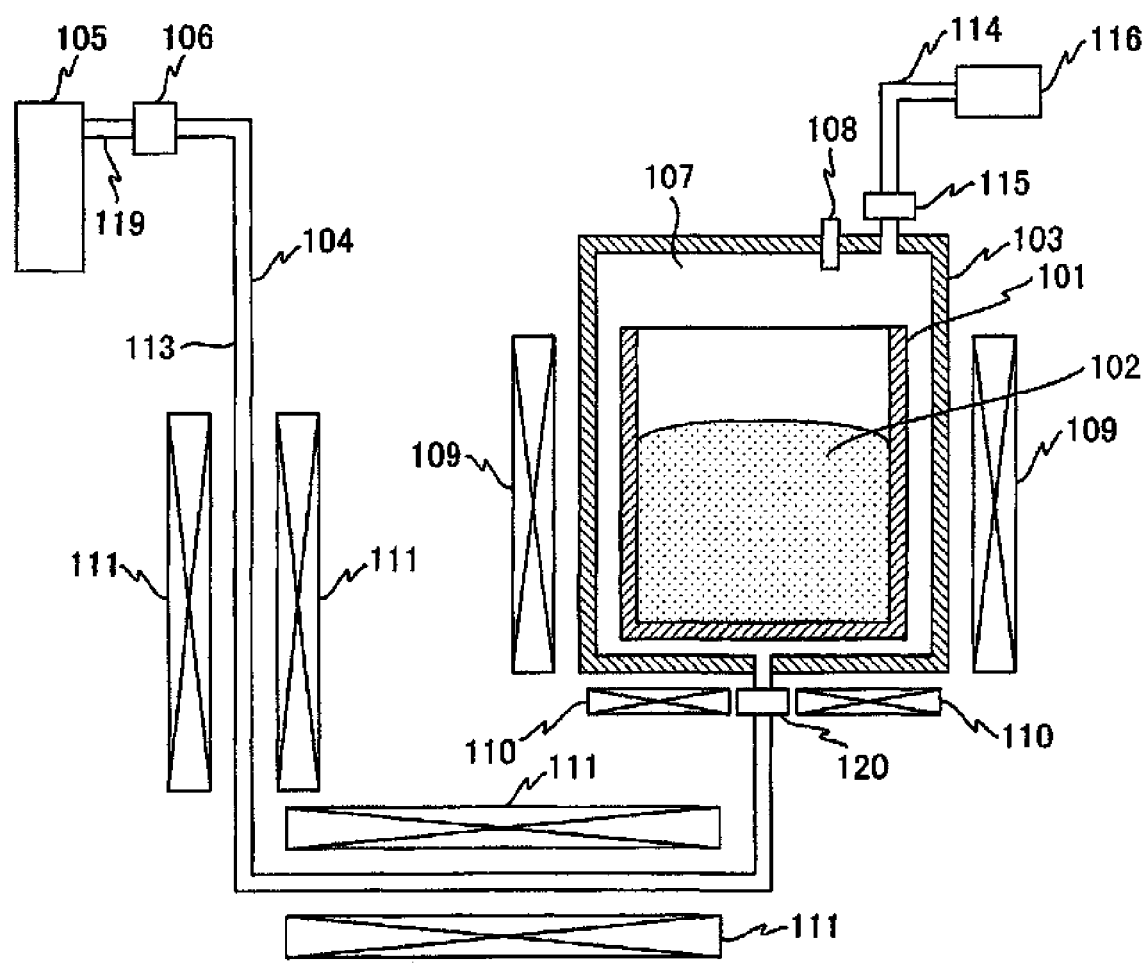
FIG. 11 is a drawing (1) for describing a production method using the production apparatus of FIG. 10.

(6) Take out the reaction vessel 103 from the glove box and connect it to each pipe as exemplified in FIG. 11. At this time, connect the reaction vessel to each pipe while supplying, for example, nitrogen gas to each gas supply pipe so as not to leave air therein. Accordingly, each gas supply pipe is filled with the nitrogen gas.

(7) Operate the vacuum pump 116.

(8) Open the valve 115. Accordingly, the Ar gas contained in the space 107 in the reaction vessel 103 is evacuated.

(9) Refer to the pressure sensor 108, and close the valve 115 when the pressure in the space 107 in the reaction vessel 103 reaches a predetermined pressure.

(10) Open the valve 120 and supply the nitrogen gas to the reaction vessel 103. At this time, refer to the pressure sensor 108 and control the pressure regulator 106 so that the pressure of the nitrogen gas in the reaction vessel 103 becomes almost 15 times atmospheric pressure.

(11) Energize the heaters 109 and 110 to raise the temperatures of the melt holding vessel 101 and the reaction vessel 103 up to 800° C. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

(12) When the temperature in the reaction vessel 103 is raised, some of Na in the mixed melt 102 is vaporized and the Na vapor is emitted to the space 107. The Na vapor is moved to an area of low temperature of the gas supply pipe 104. At this time, as exemplified in FIG. 11, the metal Na melt 501 is caused to adhere to the inside of the gas supply pipe 104 by controlling the temperature of gas supply pipe 104 at a temperature at which Na is not substantially vaporized. Here, since the pressure in the space 107 in the reaction vessel 103 and that in the space 113 in the gas supply pipe 104 are almost the same, the level of the gas-liquid interface A and that of the gas-liquid interface B are almost equalized to each other.

Note that, in this temperature raising process of the reaction vessel 103, the pressure is controlled to be raised up to 40 times atmospheric pressure with the pressure regulator 106 so that the pressure in the space 107 in the reaction vessel 103 and that in space 113 on the nitrogen cylinder side of the gas supply pipe 104 become almost the same.

(12) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

Figure 12:
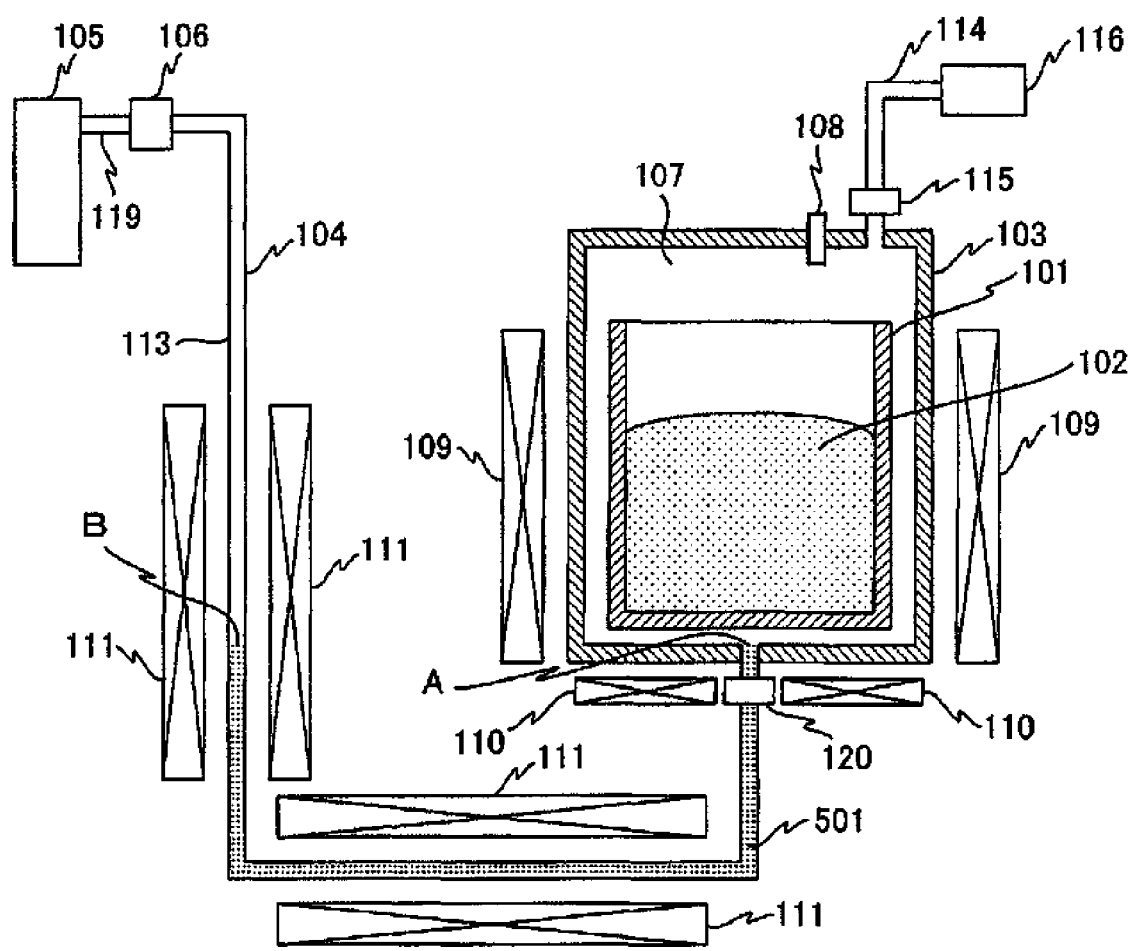
FIG. 12 is a drawing (2) for describing a production method using the production apparatus of FIG. 10.
Figure 13:
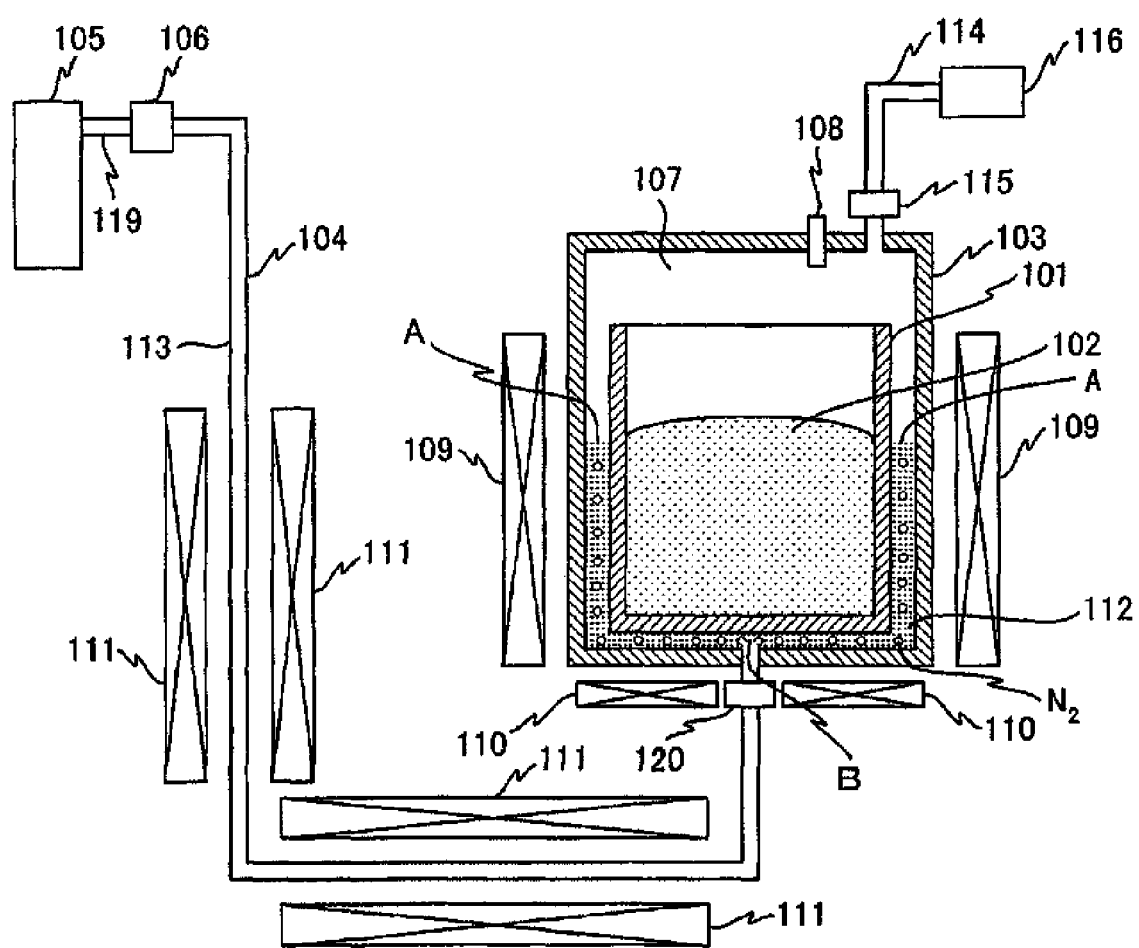
FIG. 13 is a drawing (3) for describing a production method using the production apparatus of FIG. 10.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 13, a differential pressure between the space 113 in the gas supply pipe 104 and the space 107 in the reaction vessel 103 causes the metal Na melt 501 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 12 and 13 are alternately repeated to supply the nitrogen gas to the space 107 in the reaction vessel 103.

At this time, the temperature at the gas-liquid interface A is 800° C. the same as the temperature in the reaction vessel 103. Since the vapor pressure of Na at this temperature is as large as about 0.45 of atmospheric pressure, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 to be a metal Na melt, which will not influence the introduction of nitrogen into the space 107 in the reaction vessel 103.

Note that also in the crystal production apparatus 100C, GaN crystals are produced using the nitrogen gas pressure and the crystal growth temperature in the regions REG1, REG2, and REG3 as shown in FIG. 6.

As described above, according to the embodiment 3, as the temperature in the reaction vessel 103 is raised, some of Na in the mixed melt 102 is vaporized and concentrated in the gas supply pipe 104. Then, the space 113 in the gas supply pipe 104 and the space 107 in the reaction vessel 103 are interrupted. Subsequently, in the process of growing GaN crystals, if the pressure in the space 113 in the gas supply pipe 104 and that in the space 107 in the reaction vessel 103 are almost the same, both spaces are interrupted by the metal Na melt. When the nitrogen pressure in the reaction vessel 103 is reduced, the nitrogen gas is introduced into the reaction vessel 103. As a result, it is possible to continue the stable growth of GaN crystals and produce low-cost, high-quality, large-sized, and homogeneous GaN crystals.

Furthermore, since there is no need to use the gas supply pipe 117 and the valve 118, it is possible to make the apparatus simpler in configuration, facilitate the regulation of the nitrogen pressure, and improve the pressure controllability, thus allowing safer and more efficient crystal growth.

Embodiment 4

Figure 14:
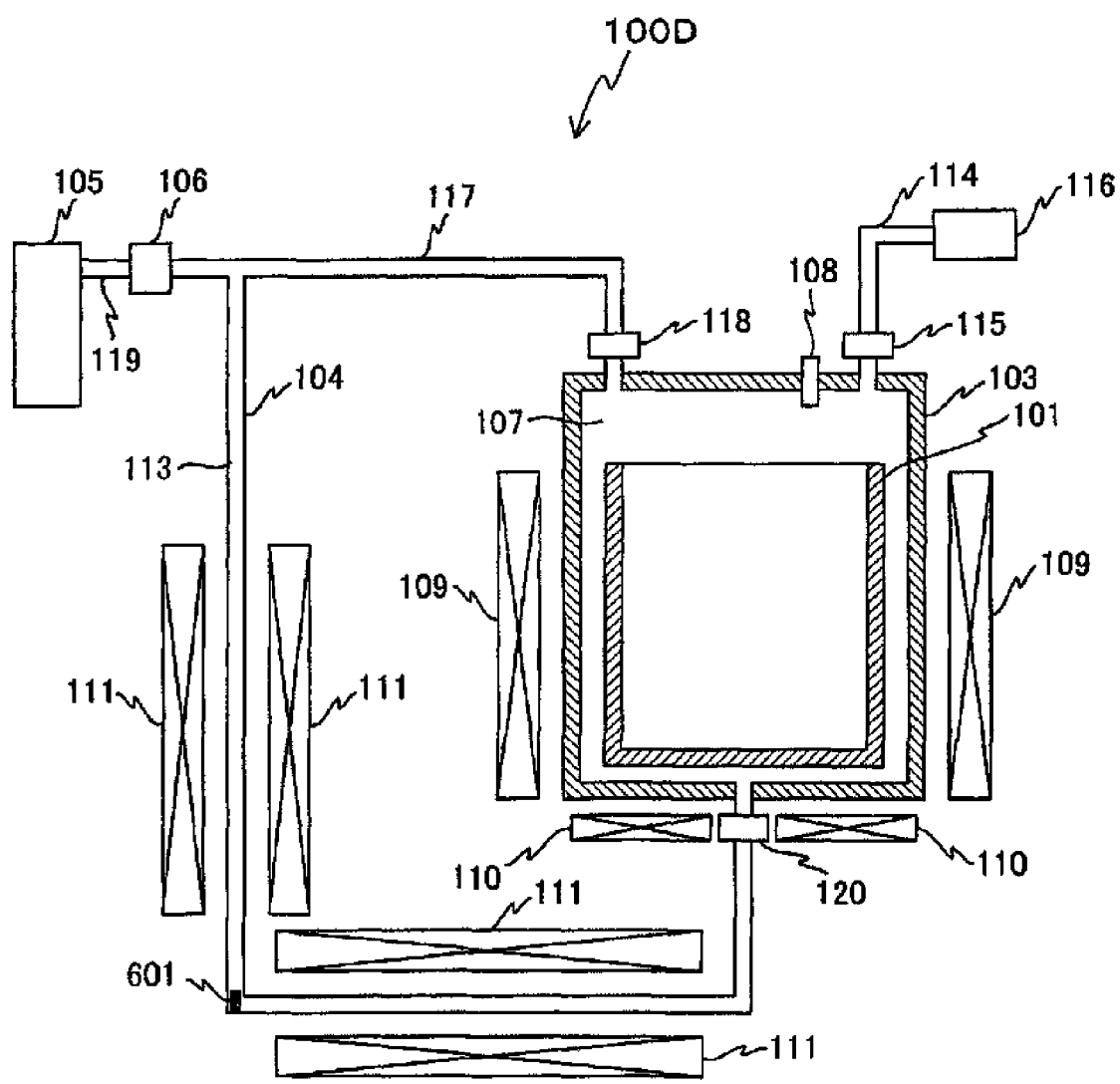
FIG. 14 is a drawing for describing a schematic configuration of a production apparatus for CaN crystals according to an embodiment 4 of the present invention.
Figure 15:
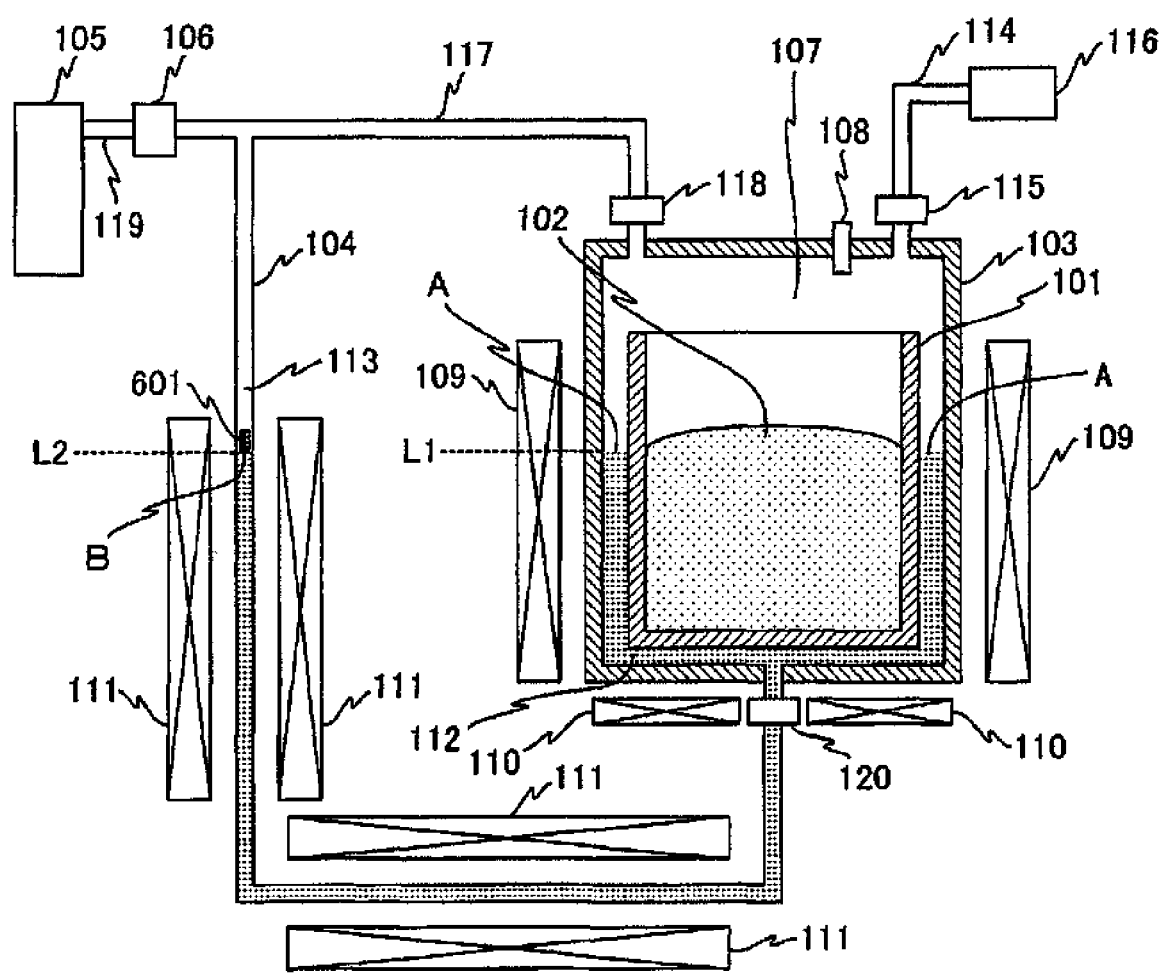
FIG. 15 is a drawing (1) for describing a production method using the production apparatus of FIG. 14.
Figure 16:
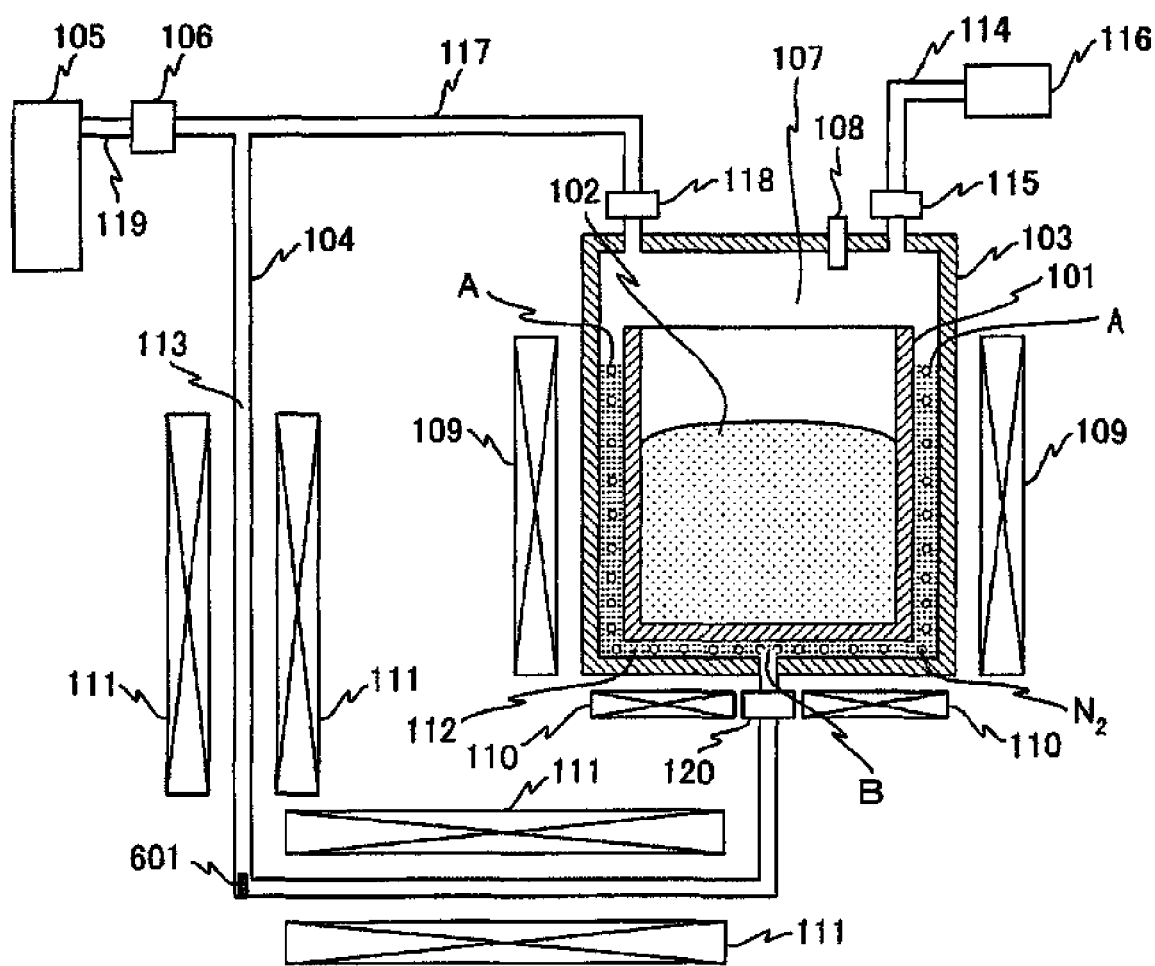
FIG. 16 is a drawing (2) for describing a production method using the production apparatus of FIG. 14.

Referring next to FIGS. 14 through 16, a description is made of an embodiment 4 of the present invention. FIG. 14 shows a schematic configuration of a crystal production apparatus 100D for GaN crystals as an apparatus for producing group III nitride crystals according to the embodiment 4 of the present invention. Note that, in the following description, components the same as or similar to those of embodiment 1 are indicated by the same numerals, and the descriptions thereof are simplified or omitted.

The crystal production apparatus 100D as shown in FIG. 14 is composed of the reaction vessel 103, the melt holding vessel 101, the heaters 109, 110 and 111, the nitrogen-gas supply source (nitrogen-gas cylinder) 105, the gas supply pipes 104, 117, and 119, valves 115, 118, 120, the pressure sensor 108, the exhaust pipe 114, the vacuum pump 116, the pressure regulator 106, a float 601, and the like. In other words, the crystal production apparatus 100D is formed by adding the float 601 to the crystal production apparatus 100A of the embodiment 1.

The float 601 has a specific gravity lower than a metal Na melt and made of a material inactive to the metal Na melt. The float 601 is a column-shaped member as an example, has a diameter smaller than the inner diameter of the gas supply pipe 104, and arranged in the gas supply pipe 104. Accordingly, nitrogen gas can pass through a gap between the gas supply pipe 104 and the float 601.

Next, a description is made of a method of producing GaN crystals using the crystal production apparatus 100D configured in the above manner.

(1) Close each valve.

(2) Separate the reaction vessel 103 from each pipe and put it in a glove box in an Ar atmosphere.

(3) Take out the melt holding vessel 101 from the reaction vessel 103 and put the metal Ga as a material and the metal Na as flux in the melt holding vessel 101. Here, the molar ratio of Na to Ga is 5:5 as an example.

(4) Pour a metal Na melt in the reaction vessel 103.

(5) Accommodate the melt holding vessel 101 in a predetermined position of the reaction vessel 103. Accordingly, the gap between the reaction vessel 103 and the melt holding vessel 101 is filled with the metal Na melt.

(6) Close the cover of the reaction vessel 103.

(7) Take out the reaction vessel 103 from the glove box and connect it to each pipe. At this time, connect the reaction vessel to each pipe while supplying, for example, nitrogen gas to each gas supply pipe so as not to leave air therein. Accordingly, each gas supply pipe is filled with the nitrogen gas.

(8) Operate the vacuum pump 116.

(9) Open the valve 115. Accordingly, the Ar gas contained in the space 107 in the reaction vessel 103 is evacuated.

(10) Refer to the pressure sensor 108, and close the valve 115 when the pressure in the space 107 in the reaction vessel 103 reaches a predetermined pressure.

(11) Open the valve 118 and supply the nitrogen gas to the reaction vessel 103. At this time, refer to the pressure sensor 108 and control the pressure regulator 106 so that the pressure of the nitrogen gas in the reaction vessel 103 becomes almost 15 times atmospheric pressure. When the pressure in the reaction vessel 103 becomes 15 times atmospheric pressure, close the valve 118. The above steps are performed at a temperature at which the metal Na melt between the melt holding vessel 101 and the reaction vessel 103 is kept in a liquid state and at a temperature at which substantial vaporization of Na is suppressed (for example, 100° C.).

(12) Open the valve 120. Accordingly, as exemplified in FIG. 15, some of the metal Na melt filling in the gap between the reaction vessel 103 and the melt holding vessel 101 is caused to flow into the U-shaped portion of the gas supply pipe 104. At this time, the float 601 is moved upward in the gas supply pipe 104 in a state of floating in the metal Na melt. Here, since the pressure in the space 107 in the reaction vessel 103 and that in the space 113 in the gas supply pipe 104 are almost the same, the level of the gas-liquid interface A and that of the gas-liquid interface B are almost equalized to each other.

(13) Energize the heaters 109 and 110 to raise the temperatures of the melt holding vessel 101 and the reaction vessel 103 up to 800° C. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, the heaters 111 are controlled to keep Na in a liquid state and suppress substantial vaporization of Na at the gas-liquid interface B. Accordingly, the temperature at the gas-liquid interface A becomes higher than that of the gas-liquid interface B, causing a temperature gradient between the gas-liquid interface A and the gas-liquid interface B.

Note that, in this temperature raising process of the reaction vessel 103, the pressure is controlled to be raised up to 40 times atmospheric pressure with the pressure regulator 106 so that the pressure in the space 107 in the reaction vessel 103 and that in space 113 on the nitrogen cylinder side of the gas supply pipe 104 become almost the same.

(14) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 16, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt 112 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 15 and 16 are alternately repeated to supply the nitrogen gas to the space 107 in the reaction vessel 103.

At this time, the temperature at the gas-liquid interface A is 800° C. the same as the temperature in the reaction vessel 103. Since the vapor pressure of Na at this temperature is as large as about 0.45 of atmospheric pressure, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 to be a metal Na melts which will not influence the introduction of nitrogen into the space 107 in the reaction vessel 103.

Note that also in the crystal production apparatus 100D, GaN crystals are produced using the nitrogen gas pressure and the crystal growth temperature in the regions REG1, REG2, and REG3 as shown in FIG. 6.

As described above, according to the embodiment 4, when the pressure in the space 113 in the gas supply pipe 104 and that in the space 107 in the reaction vessel 103 are almost the same, both spaces are interrupted by the metal Na melt. When the nitrogen pressure in the reaction vessel 103 is reduced, the nitrogen gas is introduced into the reaction vessel 103. As a result, it is possible to prevent the diffusion of Na to the outside of the reaction vessel 103 and supply a nitrogen material in a secure manner, continue the stable growth of GaN crystals, and produce low-cost, high-qualityr large-sized, and homogeneous GaN crystals.

Furthermore, since the opening at the gas-liquid interface B is narrowed by the float 601, it is possible to further reduce a slight vaporization amount of Na, resulting in further improvement in the safety and the stability of crystal growth.

Embodiment 5

Referring next to FIGS. 17 through 20, a description is made of an embodiment 5 of the present invention.

Figure 17:
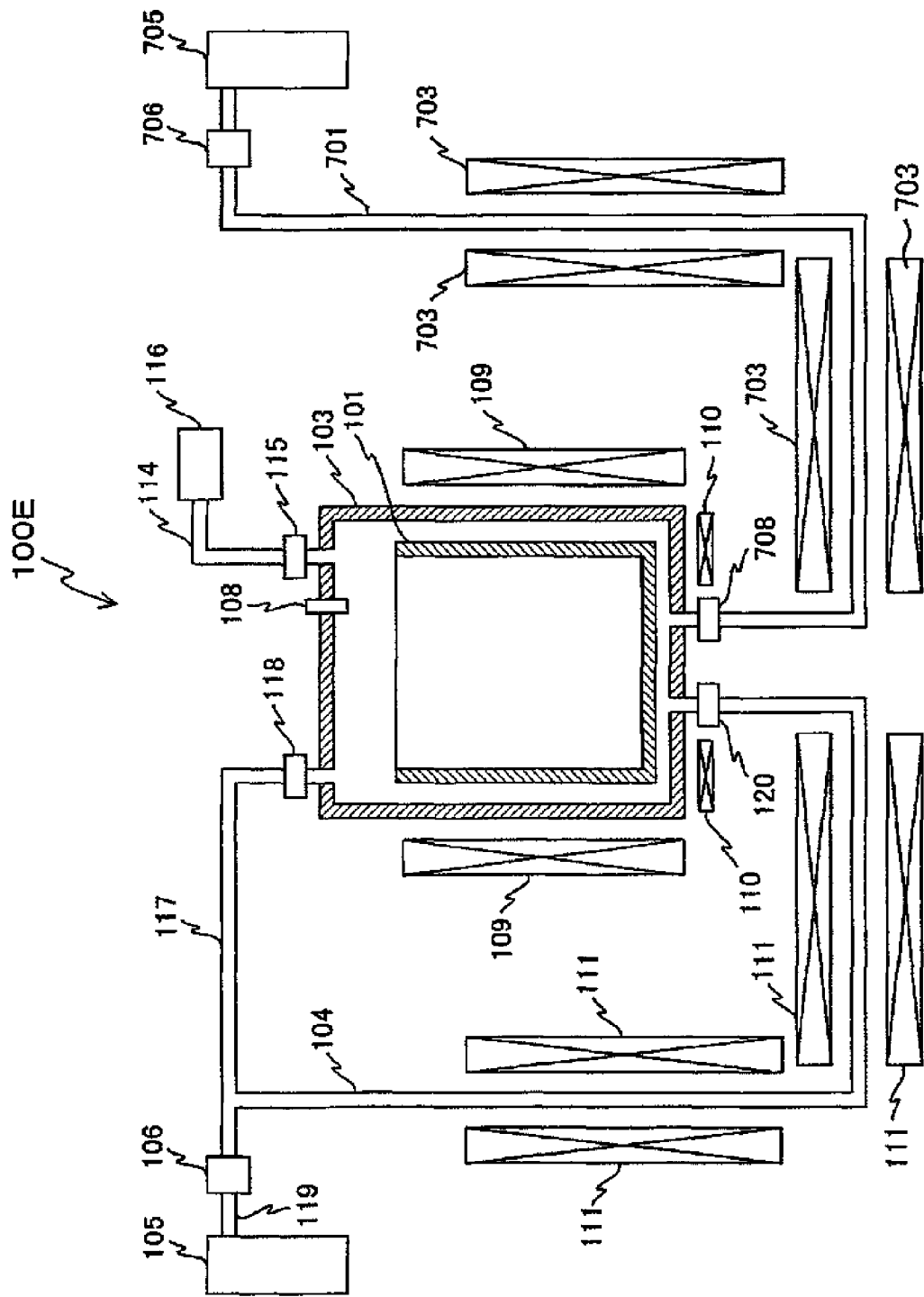
FIG. 17 is a drawing for describing a schematic configuration of a production apparatus for GaN crystals according to an embodiment 5 of the present invention.

FIG. 17 shows an schematic configuration of a crystal production apparatus 100E for GaN crystals as an apparatus for producing group III nitride crystals according to the embodiment 5 of the present invention. Note that, in the following description, components the same as or similar to those of the embodiment 1 are indicated by the same numerals, and the descriptions thereof are simplified or omitted.

The crystal production apparatus 100E as shown in FIG. 17 is composed of the reaction vessel 103, the melt holding vessel 101, the heaters 109, 110, 111, and 703, the nitrogen-gas supply source (nitrogen-gas cylinder) 105, the gas supply pipes 104, 117, and 119 for supplying nitrogen gas, the nitrogen-gas pressure regulator 106, an Ar-gas supply source (Ar-gas cylinder) 705, a gas supply pipe 701 for supplying Ar gas, an Ar-gas pressure regulator 706, the valves 115, 118, 120, and 708, the pressure sensor 108, the exhaust pipe 114, the vacuum pump 116, and the like. In other words, the crystal production apparatus 100E is formed by adding the heaters 703, the Ar-gas cylinder 705, the gas supply pipe 701, the pressure regulator 706, and the valve 708 to the crystal production apparatus 100A of the embodiment 1.

The gas supply pipe 701 has a U-shaped portion and is used to supply Ar gas to the reaction vessel 103. The gas supply pipe 701 has one end connected to the Ar-gas cylinder 705 through the pressure regulator 706 and the other end connected to an opening provided at the bottom of the reaction vessel 103.

The heaters 703 have plural heating portions, adjacently arranged on the rising portion separated from the reaction vessel 103 of the gas supply pipe 701 and the bottom portion thereof, and impart a temperature gradient to the U-shaped portion so as to suppress substantial vaporization of a metal Na melt (liquid) held in the U-shaped portion of the gas supply pipe 701.

The valve 708 is on the gas supply pipe 701 and provided near the reaction vessel 103.

The pressure regulator 706 is provided on the gas supply pipe 701 and used to regulate the pressure of Ar gas.

Figure 18:
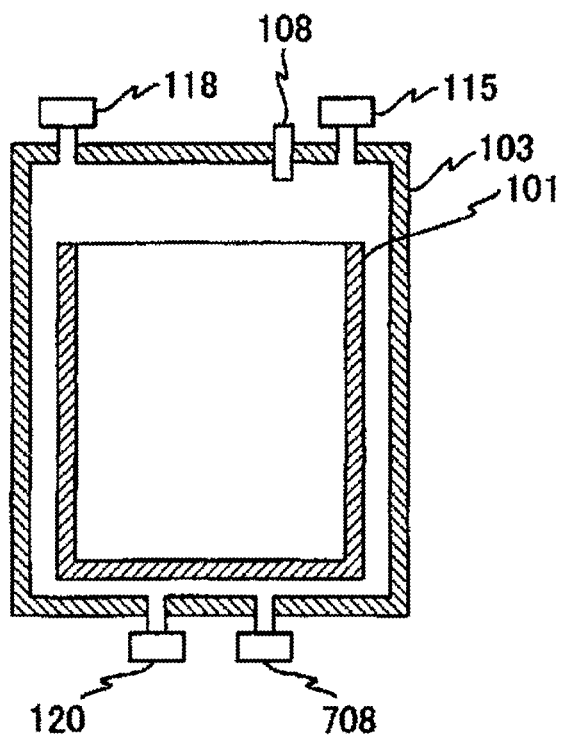
FIG. 18 is a drawing (1) for describing a production method using the production apparatus of FIG. 17.

Furthermore, the reaction vessel 103 having each valve attached thereto is separable from each pipe as shown in FIG. 18 and can be moved to a glove box so as to perform an operation.

Next, a description is made of a method of producing GaN crystals using the crystal production apparatus 100E configured in the above manner.

(1) Close each valve.

(2) Separate the reaction vessel 103 from each pipe and put it in the glove box in an argon (Ar) atmosphere.

(3) Take out the melt holding vessel 101 from the reaction vessel 103 and put the metal Ga as a material and the metal Na as flux in the melt holding vessel 101. Here, the molar ratio to Na to Ga is 5:5 as an example.

(4) Pour the metal Na melt 112 in the reaction vessel 103.

(5) Accommodate the melt holding vessel 101 in a predetermined position of the reaction vessel 103. Accordingly, a gap between the reaction vessel 103 and the melt holding vessel 101 is filled with the metal Na melt.

(6) Close the cover of the reaction vessel 103.

(7) Take out the reaction vessel 103 from the glove box and connect it to each pipe. At this time, connect the reaction vessel to each pipe while supplying, for example, nitrogen gas to each gas supply pipe so as not to leave air in the gas supply pipe 701. Furthermore, connect the reaction vessel to each pipe while supplying, for example, nitrogen gas to each pipe so as not to leave air in the gas supply pipe 701. Accordingly, each gas supply pipe 701 is filled with Ar gas.

(8) Operate the vacuum pump 116.

(9) Open the valve 115. Accordingly, the Ar gas contained in the space 107 in the reaction vessel 103 is evacuated.

(10) Refer to the pressure sensor 108, and close the valve 115 when the pressure in the space 107 in the reaction vessel 103 reaches a predetermined pressure.

(11) Open the valve 118 and supply the nitrogen gas to the reaction vessel 103. At this time, refer to the pressure sensor 108 and regulate the pressure regulator 106 so that the pressure of the nitrogen gas in the reaction vessel 103 becomes almost 15 times atmospheric pressure. When the pressure in the reaction vessel 103 becomes 15 times atmospheric pressure, close the valve 118. The above steps are performed at a temperature at which the metal Na melt between the melt holding vessel 101 and the reaction vessel 103 is kept in a liquid state and at a temperature at which substantial vaporization of Na is suppressed (for example, 100° C.).

(12) Open the valves 120 and 708. Accordingly, as exemplified in FIG. 19, some of the metal Na melt 112 filling in the gap between the reaction vessel 103 and the melt holding vessel 101 is caused to flow into the U-shaped portions of the gas supply pipes 104 and 701. At this time, the metal Na melt has a gas-liquid interface A in the reaction vessel 103, a gas-liquid interface B in the gas supply pipe 104, and a gas-liquid interface C in the gas supply pipe 701. Here, since the pressure in the space 107 in the reaction vessel 103, that in the space 113 in the gas supply pipe 104, and that in a space 702 in the gas supply pipe 701 are almost the same, the level of the gas-liquid interface A, that of the gas-liquid interface B, and that of the gas-liquid interface C are almost equalized to each other.

(13) Energize the heaters 109 and 110 to raise the temperatures of melt holding vessel 101 and the reaction vessel 103 up to 800° C. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, the heaters 111 are controlled to keep Na in a liquid state and suppress substantial vaporization of Na at the gas-liquid interface B. Accordingly, the temperature at the gas-liquid interface A becomes higher than that of the gas-liquid interface B, causing a temperature gradient between the gas-liquid interface A and the gas-liquid interface B. Furthermore, the heaters 703 are controlled to keep Na in a liquid state and suppress substantial vaporization of Na at the gas-liquid interface C. Accordingly, the temperature at gas-liquid interface A becomes higher than that of the gas-liquid interface C, causing a temperature gradient between the gas-liquid interface A and the gas-liquid interface C.

Note that, in this temperature raising process of the reaction vessel 103, the pressure in the space 107 in the reaction vessel 103 is controlled to be raised up to 40 times atmospheric pressure with the pressure regulators 106 and 706 so that the pressure in the space 107 in the reaction vessel 103, that in the space 113 on the nitrogen cylinder side of the gas supply pipe 104, and that in the space 702 on the Ar-gas cylinder 705 side of the gas supply pipe 701 become almost the same.

(14) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

Figure 19:
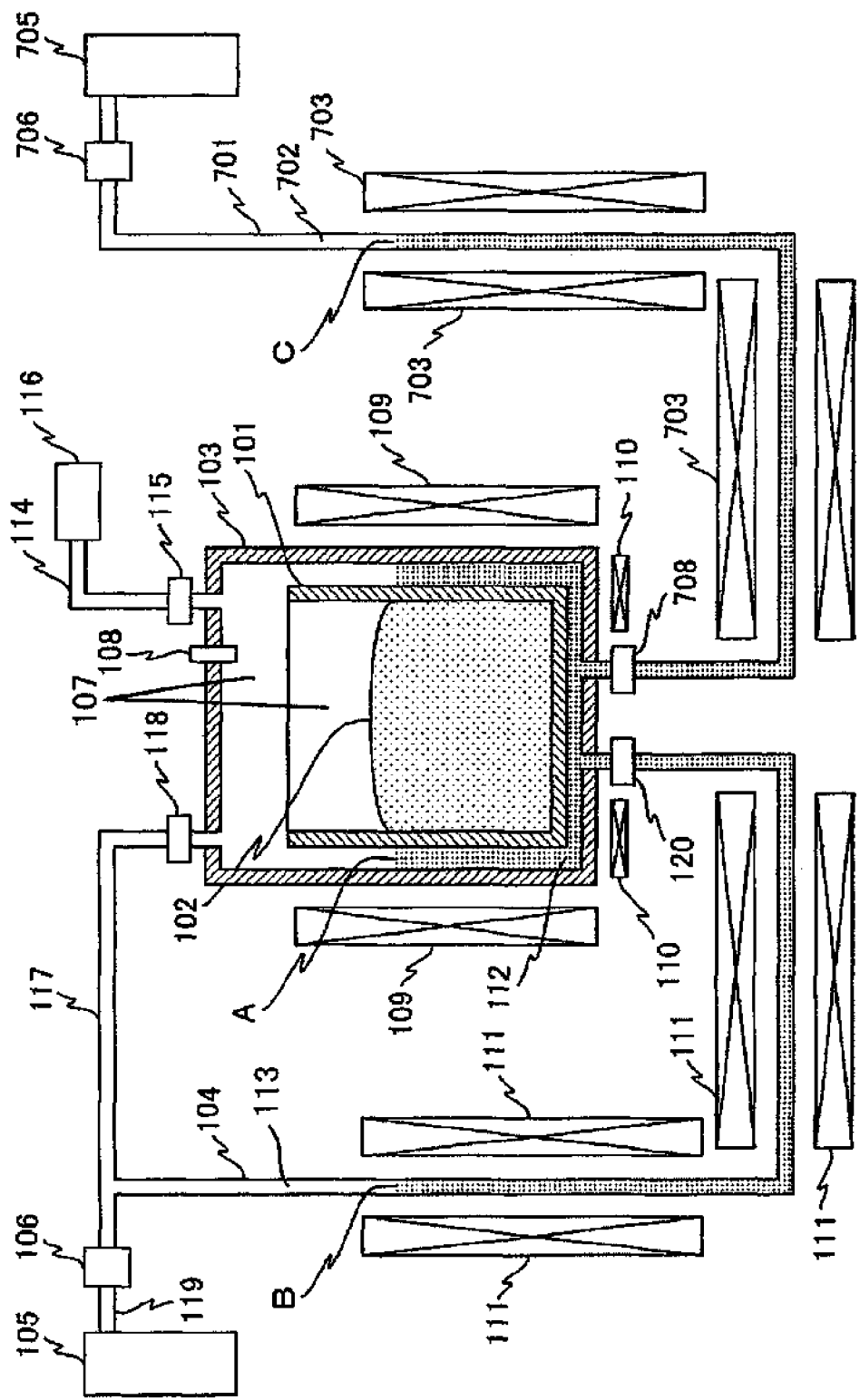
FIG. 19 is a drawing (2) for describing a production method using the production apparatus of FIG. 17.
Figure 20:
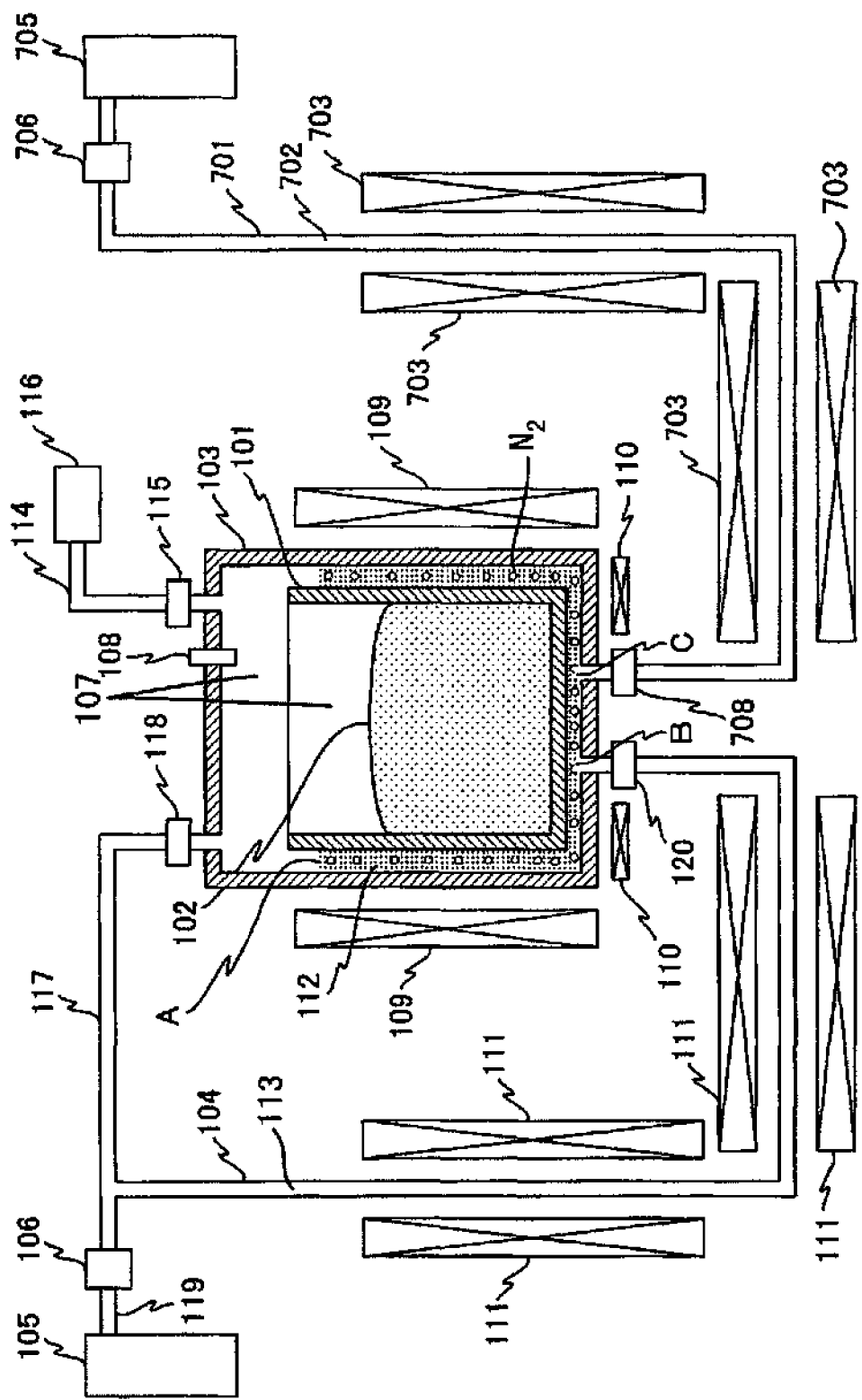
FIG. 20 is a drawing (3) for describing a production method using the production apparatus of FIG. 17.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 20, a differential pressure between the space 113 in the gas supply pipe 104 and the space 107 in the reaction vessel 103 and that between the space 702 in the gas supply pipe 701 and the space 107 in the reaction vessel 103 cause the metal Na melt 112 to be moved into the reaction vessel 103. As a result, the gas-liquid interface A is raised, the gas-liquid interface B is moved up to a point near the boundary between the reaction vessel 103 and the gas supply pipe 104, and the gas-liquid interface C is moved up to a point near the boundary between the reaction vessel 103 and gas supply pipe 701. At this time, the nitrogen gas is moved upward in the metal Na melt in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. Furthermore, the Ar gas is moved upward in the metal Na melt 112 in a foamed state and reaches the space 107 in the reaction vessel 103. Alternatively, the space 702 in the gas supply pipe 701 and the space 107 in the reaction vessel are directly connected to each other so as to supply the Ar gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104, that in the space 702 in the gas supply pipe 701, and that in the space 107 in the reaction vessel 103 become almost the same, and the Ar gas is supplied from the Ar gas cylinder 705 to the space 107 in the reaction vessel 103. When the pressure in the space 113 in the gas supply pipe 104, that in the space 702 in the gas supply pipe 701, and that in the space 107 in the reaction vessel 103 become almost the same, the level of the gas-liquid interface A, that of the gas-liquid interface B, and that of the gas-liquid interface C become almost the same. In the process of growing crystals, the conditions as shown in FIGS. 19 and 20 are alternately repeated to supply the nitrogen gas and the Ar gas to the space 107 in the reaction vessel 103.

At this time, the temperature at the gas-liquid interface A is 800° C. the same as the temperature in the reaction vessel 103. Since the vapor pressure of Na at this temperature is as large as about 0.45 of atmospheric pressure, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt of the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 to be a metal Na melt, which will not influence the introduction of nitrogen into the space 107 in the reaction vessel 103. Furthermore, since the gas-liquid interface C is kept at a temperature at which Na is not substantially vaporized as described above, the vapor pressure of Na is small and the diffusion of Na from the gas-liquid interface C to the upstream side (Ar-gas cylinder 105 side) is negligible. Note that even if the metal Na melt of the gas supply pipe 701 is moved into the reaction vessel 103 and the gas-liquid interface C is moved up to a point near the reaction vessel 103, the Na vapor diffusing from the gas-liquid interface C adheres to a temperature-controlled area of the gas supply pipe 701 to be a metal Na melt, which will not influence the introduction of Ar gas into the space 107 in the reaction vessel 103.

Note that also in the crystal production apparatus 100D, GaN crystals are produced using the nitrogen gas pressure and the crystal growth temperature in the regions REG1, REG2, and REG3 as shown in FIG. 6.

As described above, according to the embodiment 5, when the pressure in the space 113 in the gas supply pipe 104 and that in the space 107 in the reaction vessel 103 are almost the same, both spaces are interrupted by the metal Na melt. When the nitrogen pressure in the reaction vessel 103 is reduced, the nitrogen gas is introduced into the reaction vessel 103. As a result, it is possible to prevent the diffusion of Na to the outside of the reaction vessel 103 and supply a nitrogen material in a secure manner, continue the stable growth of GaN crystals, and produce low-cost, high-quality, large-sized, and homogeneous GaN crystals.

Furthermore, since plural kinds of gases are mixed together in the reaction vessel 103, the nitrogen partial pressure and the total pressure in the reaction vessel 103 can be separately controlled. As a result, it is possible to widen a controllable range of a nitrogen dissolving amount in the mixed melt 102 and improve the controllability of crystal growth.

Embodiment 6

Figure 21:
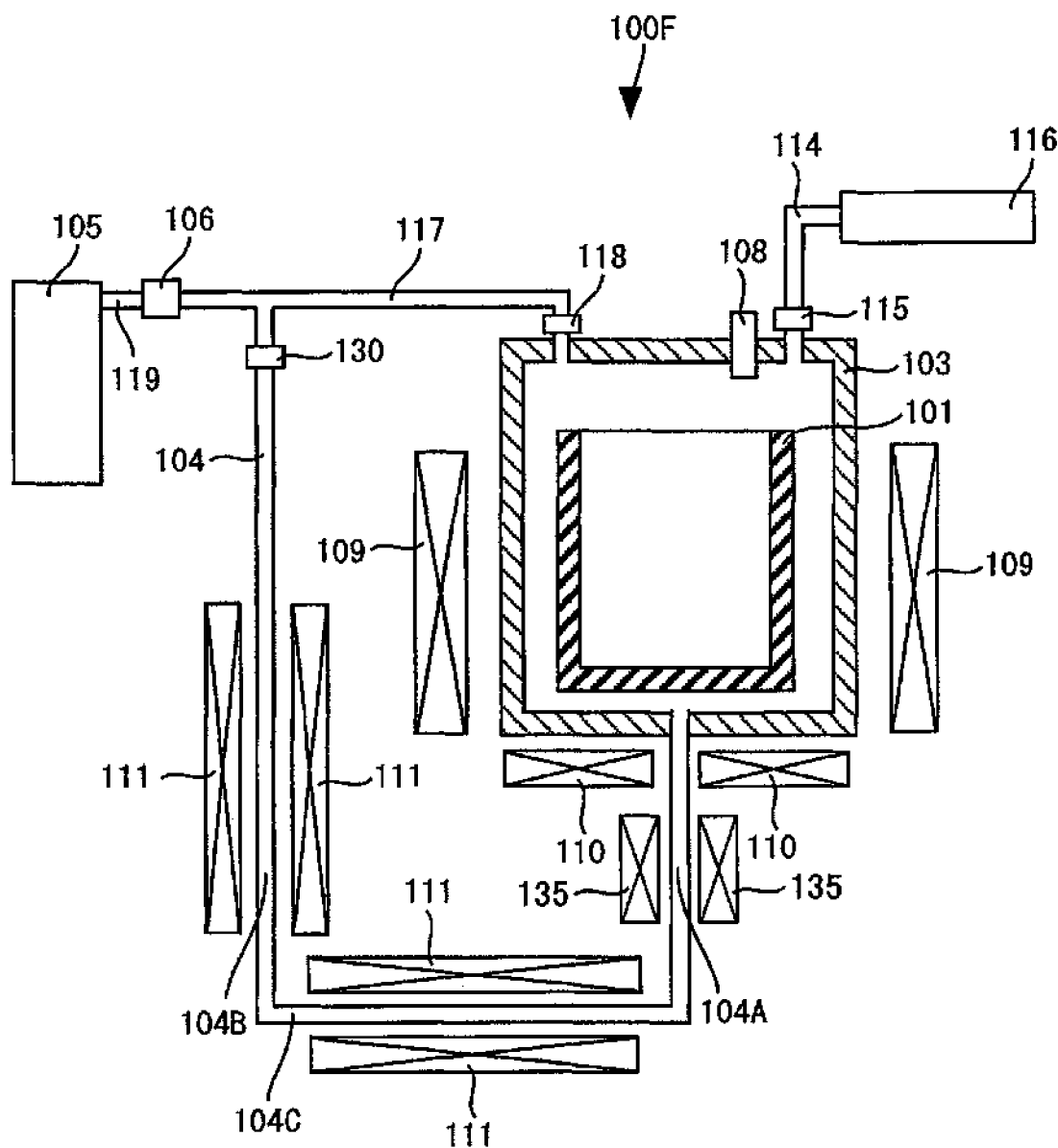
FIG. 21 is a schematic drawing showing a configuration of a production apparatus for GaN crystals according to an embodiment 6.

FIG. 21 is a schematic view showing a configuration of a production apparatus for GaN crystals according to an embodiment 6. As shown in FIG. 21, the crystal production apparatus 100F of the embodiment 6 is formed by replacing the valve 120 of the crystal production apparatus 100A of FIG. 1 with a valve 130 and adding heaters 135 thereto. Other components are the same as those of the crystal production apparatus 100A.

The valve 130 is attached to the gas supply pipe 104 near the connection between the gas supply pipes 104 and 117. The valve 130 supplies nitrogen gas from the gas supply pipe 117 to the reaction vessel 103 side or stops supplying nitrogen gas thereto.

The heaters 135 are arranged around a rising portion 104A of the gas supply pipe 104. The heaters 135 heat the rising portion 104A of the gas supply pipe 104 to a specific temperature at which the vapor pressure of the metal Na vaporized from a metal Na melt accumulated in part of the gas supply pipe 104 is approximately equalized to that of the metal Na vaporized from the mixed melt 102 in the melt holding vessel 101.

Figure 22:
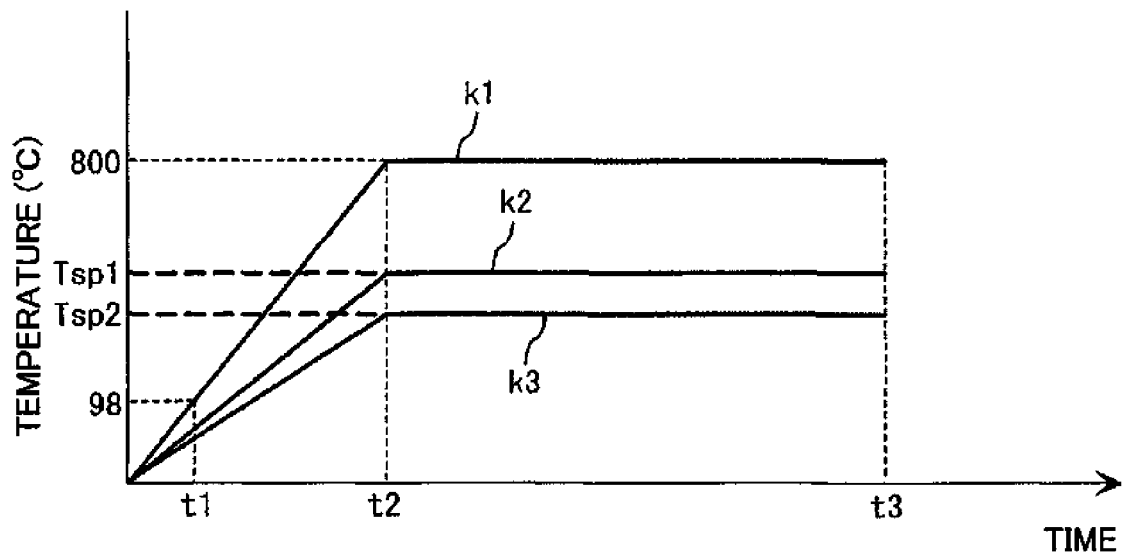
FIG. 22 is a timing chart of the temperature of a melt holding vessel, a reaction vessel, and a gas supply pipe.

FIG. 22 is a timing chart showing the temperatures of the melt holding vessel 101, the reaction vessel 103, and the gas supply pipe 104. Furthermore, FIG. 23 is a drawing showing the state change in the melt holding vessel 101 and the reaction vessel 103 in the timings t1 and t2 as shown in FIG. 22.

Note that, in FIG. 22, the straight line k1 shows the temperatures of the melt holding vessel 101 and the reaction vessel 103, and the curved line k2 and the straight line k3 show the temperature of the metal Na melt in the gas supply pipe 104.

As shown in FIG. 22, the heaters 109 and 110 heat the melt holding vessel 101 and the reaction vessel 103 so that the temperature is raised in accordance with the straight line k1 and kept at 800° C. Furthermore, the heaters 135 heat the rising portion 104A of the gas supply pipe 104 so that the temperature is raised in accordance with the curved line k2 and kept at the specific temperature Tsp1. Moreover, the heaters 111 heat a rising portion 104B and a horizontal portion 104C of the gas supply pipe 104 so that the temperature is raised in accordance with the curved line k3 and kept at the specific temperature Tsp2.

Figure 23A:
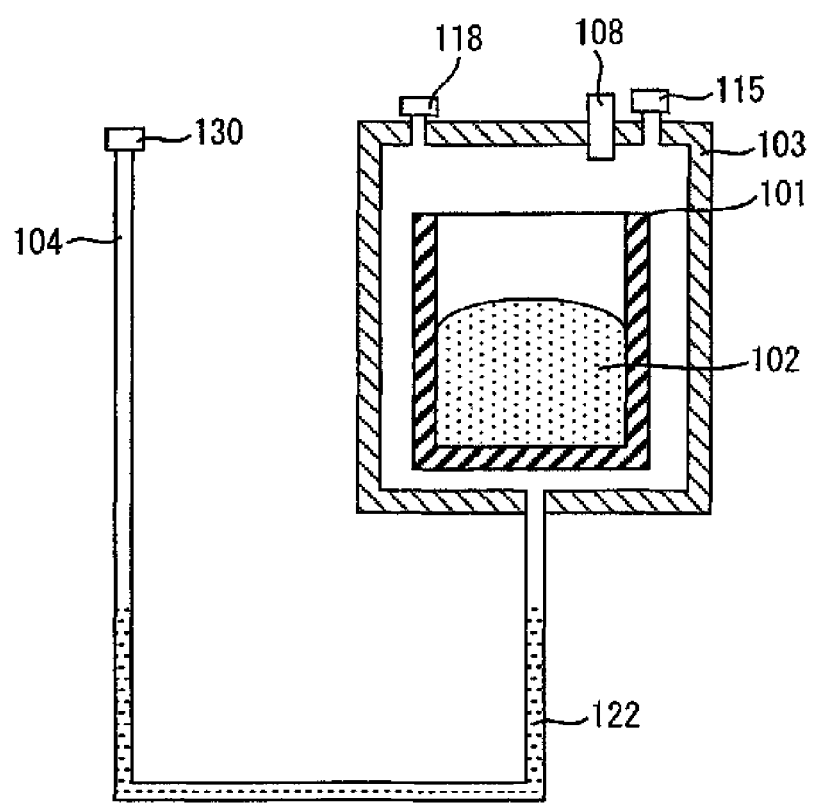
FIG. 23A is a drawing showing the state change in the melt holding vessel and the reaction vessel in timings t1 and t2 as shown in FIG. 22.

When the heaters 109 and 110 start heating the melt holding vessel 101 and the reaction vessel 103 and when the heaters 111 and 140 start heating the gas supply pipe 104, the metal Na melt 122 is present in the gas supply pipe 104 and the mixed melt 102 containing the metal Na and the metal Ga is present in the melt holding vessel 101 (see FIG. 23A).

Then, the temperatures of the melt holding vessel 101 and the reaction vessel 103 reach 98° C. at the timing t1 and reaches 800° C. at the timing t2. Furthermore, the temperature of the rising portion 104A of the gas supply pipe 104 reaches the specific temperature Tsp1 at the timing t2, and the temperature of the rising portion 104B reaches the specific temperature Tsp2 at the timing t2. Note that the specific temperature Tsp1 is a temperature at which the vapor pressure $P_{Na}1$ of the metal Na vaporized from the metal Na melt 122 is approximately equalized to the vapor pressure $P_{Na-Ga}$ of the metal Na vaporized from the mixed melt 102. Furthermore, as described in the embodiments 1 through 5, the specific temperature Tsp2 is a temperature at which substantial vaporization of Na from the metal Na melt accumulated in the gas supply pipe 104 is suppressed. The specific temperature Tsp1 is lower than 800° C., and the specific temperature Tsp2 is lower than the specific temperature Tsp1.

Figure 23B:
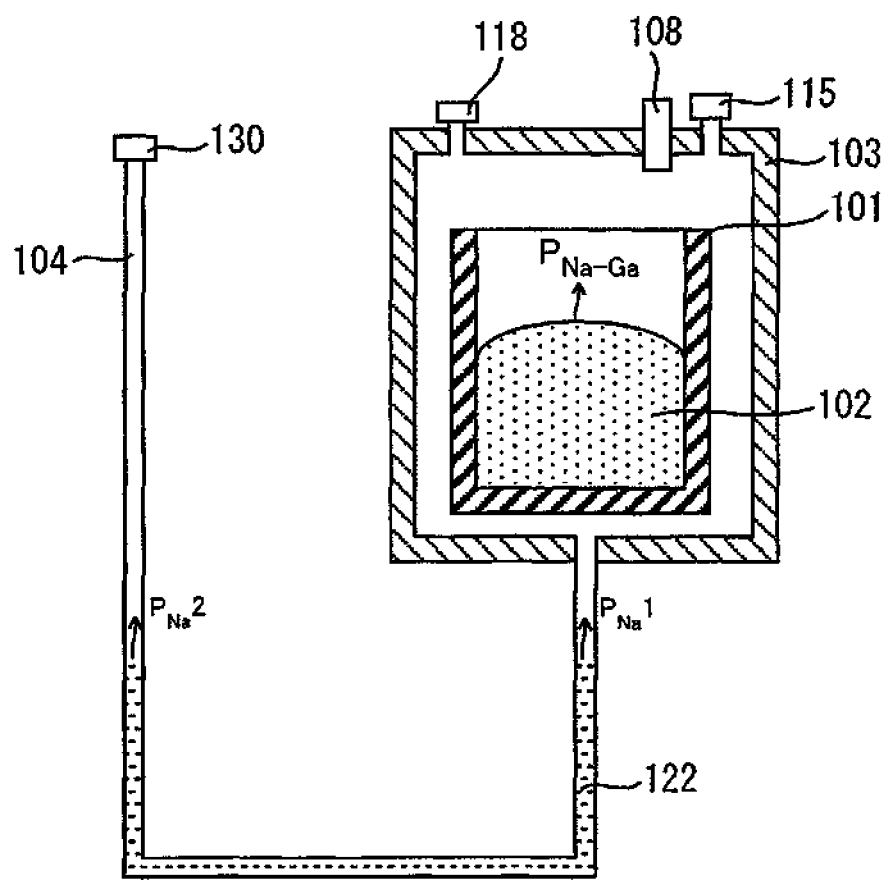
FIG. 23B is a drawing showing the state change in the melt holding vessel and the reaction vessel in the timings t1 and t2 as shown in FIG. 22.

Accordingly, the rising portion 104A of the gas supply pipe 104 is raised to the specific temperature Tsp1 by the heaters 135 at which the vaporization of the metal Na from the metal Na melt 122 is approximately in equilibrium with the vaporization of the metal Na from the metal Na from the mixed melt 102 (see FIG. 23B). Furthermore, the temperature of the rising portion 104B of the gas supply pipe 104 is raised to the specific temperature Tsp2 by the heaters 111 at which substantial the metal Na from the metal Na melt 122 is not substantially vaporized. In this case, the vapor pressure of the metal Na at the rising portion 104B of the gas supply pipe 104 is $P_{Na}2$, a low vapor pressure such as $7.6 \times 10^{-9}$ of atmospheric pressure, $1.8 \times 10^{-5}$ of atmospheric pressure, and $4.7 \times 10^{-4}$ of atmospheric pressure as described in the embodiments 1 through 5.

As a result, the vapor transportation of the metal Na from the metal Na melt 122 to the mixed melt 102 is approximately in equilibrium with the vapor transportation of the metal Na from the mixed melt 102 to the metal Na melt 122, and the vapor transportation of the metal Na between the metal Na melt 122 and the mixed melt 102 seems to be stopped. Then, variation in the mixing ratio of the metal Na to the metal Ga in the mixed melt 102 caused by the vaporization of the metal Na from the metal Na melt 122 and the mixed melt 102 is suppressed.

Figure 24:
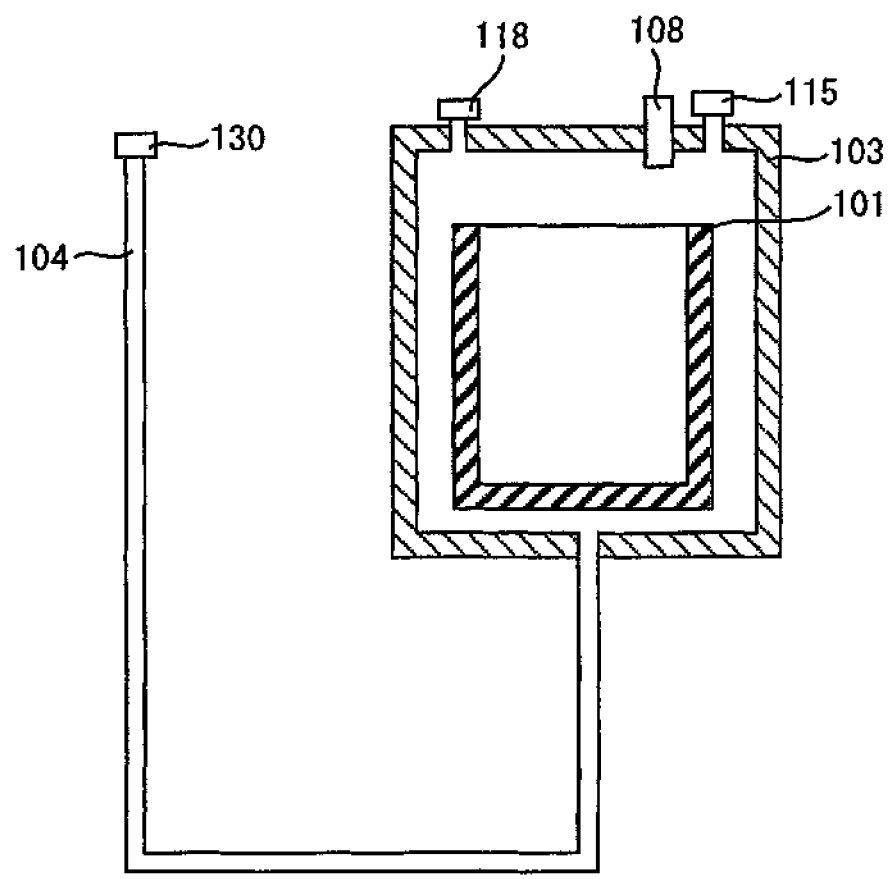
FIG. 24 is a drawing (1) for describing a production method using the production apparatus of FIG. 21.
Figure 25:
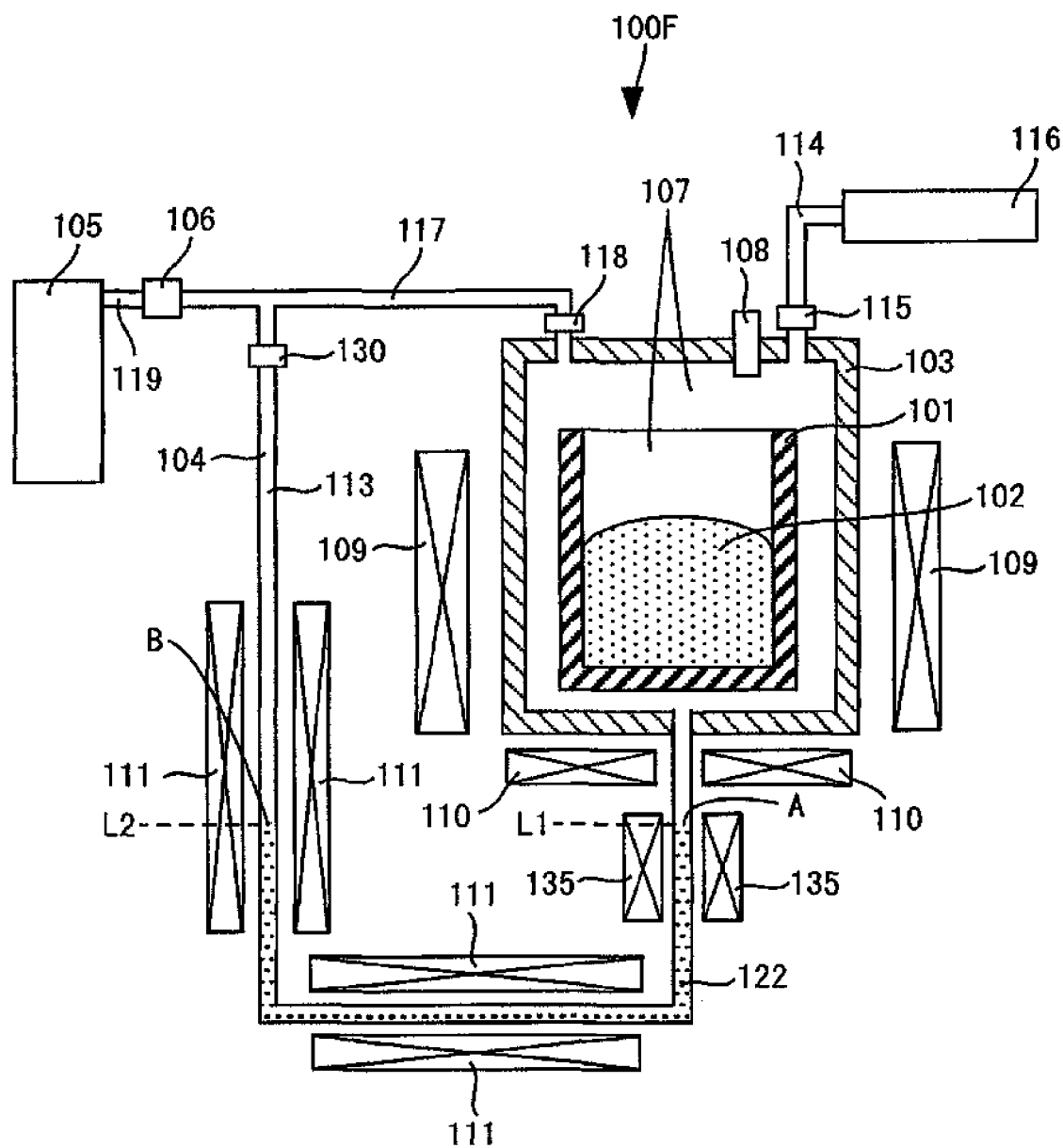
FIG. 25 is a drawing (2) for describing a production method using the production apparatus of FIG. 21.
Figure 26:
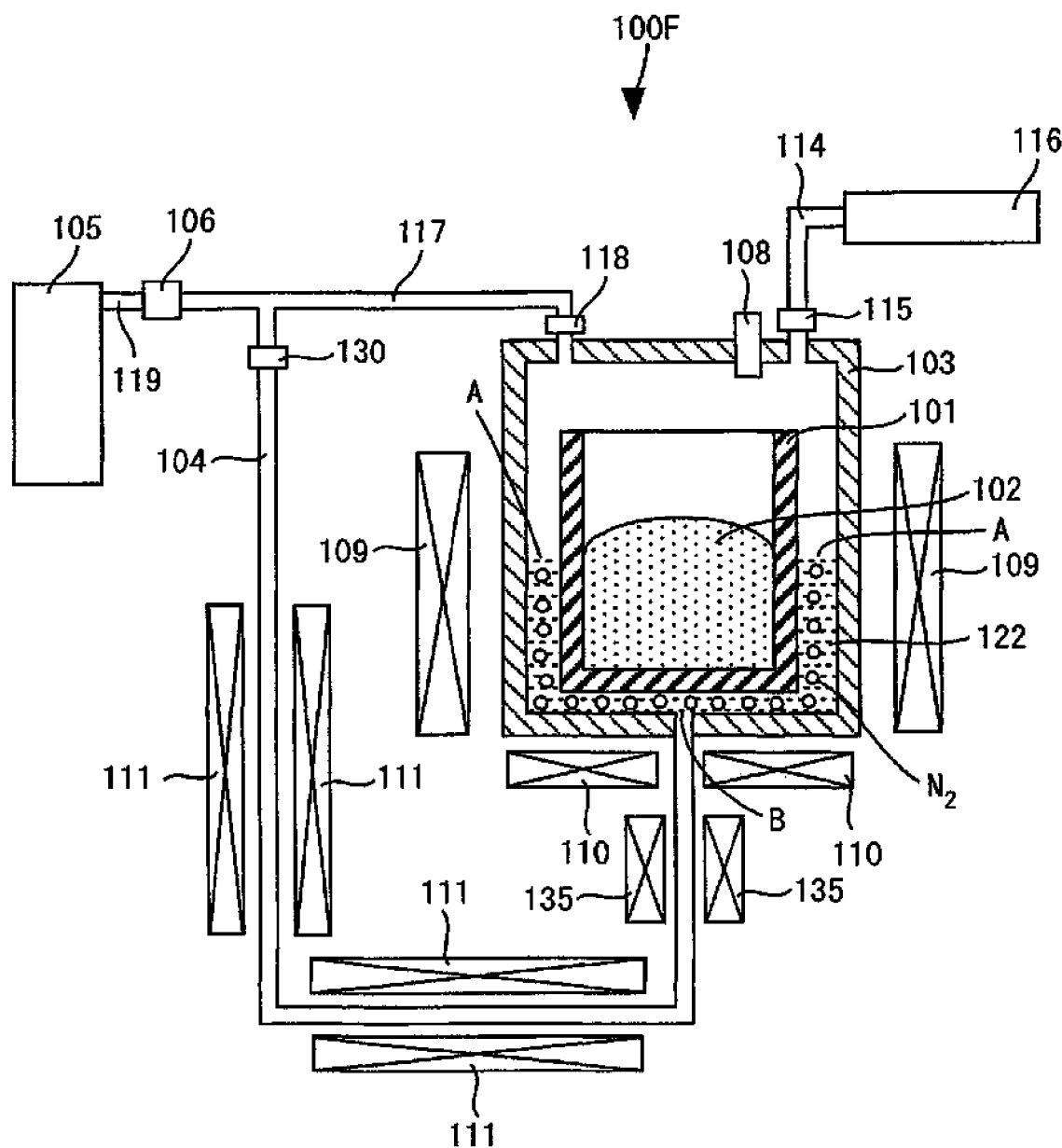
FIG. 26 is a drawing (3) for describing a production method using the production apparatus of FIG. 21.

Referring next to FIGS. 24 through 26, a description is made of a method of producing GaN crystals using the crystal production apparatus 100F. Note that, in the crystal production apparatus 100F, the reaction vessel 103 and the gas supply pipe 104 having each valve attached thereto are separable from each pipe as shown in FIG. 24 and can be moved to a glove box, not shown, so as to perform an operation.

(1) Close each valve.

(2) Separate the reaction vessel 103 and the gas supply pipe 104 from each pipe and put them in the glove box in an argon (Ar) atmosphere.

(3) Open the cover of the reaction vessel 103 and take out the melt holding vessel 101 from the reaction vessel 103. Then, the metal Ga as a material and the metal Na as flux are put in the melt holding vessel 101. Here, the molar ratio of Na to Ga in the mixed melt 102 is 5:5 as an example.

(4) Pour the metal Na melt 112 in the gas supply pipe 104.

(5) Accommodate the melt holding vessel 101 in a predetermined position of the reaction vessel 103. Note that treating Ga and Na in an Ar atmosphere makes it possible to prevent their reactions with oxygen and moisture.

(6) Close the cover of the reaction vessel 103.

(7) Take out the reaction vessel 103 and the gas supply pipe 104 from the glove box and connect them to each pipe. At this time, connect the reaction vessel and the gas supply pipe to each pipe while supplying, for example, nitrogen gas to each gas supply pipe so as not to leave air therein. Accordingly, each gas supply pipe is filled with the nitrogen gas. At this stage, as shown in FIG. 23A, the mixed melt 102 is held in the melt holding vessel 101, and the metal Na melt 122 is held in the gas supply pipe 104.

(8) Operate the vacuum pump 116.

(9) Open the valve 115. Accordingly, the Ar gas contained in the space 107 in the reaction vessel 103 is evacuated. In other words, the gas in the reaction vessel 103 is purged.

(10) Refer to the pressure sensor 108, and close the valve 115 when the pressure in the space 107 in the reaction vessel 103 reaches a predetermined pressure.

(11) Open the valves 118 and 130 and supply the nitrogen gas to the reaction vessel 103. At this time, refer to the pressure sensor 108 and regulate the pressure regulator 106 so that the pressure of the nitrogen gas in the reaction vessel 103 becomes almost 15 times atmospheric pressure. When the pressure in the reaction vessel 103 becomes 15 times atmospheric pressure, close the valve 118. Note that the above steps are performed at a temperature at which the metal Na melt 122 in the gas supply pipe 104 is kept in a liquid state.

(12) Energize the heaters 109 and 110 to raise the temperature in the reaction vessel 103 up to 800° C. Furthermore, energize the heaters 111 and 140 to raise the temperature at the rising portion 104A of the gas supply pipe 104 to the specific temperature Tsp1 and that at the rising portion 104B of the gas supply pipe 104 to the specific temperature Tsp2. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, as shown in FIG. 25, the metal Na melt 122 has two gas-liquid interfaces A and B in the gas supply pipe 104. Here, since the pressure in the space 107 in the reaction vessel 103 and that in the space 113 in the gas supply pipe 104 are almost the same, the level L1 of the gas-liquid interface A and the level L2 of the gas-liquid interface B are almost equalized to each other.

The vapor pressure $P_{Na}1$ of the metal Na at the gas-liquid interface A is approximately equalized to the vapor pressure $P_{Na-Ga}$ of the metal Na vaporized from the mixed melt 102. The fact that the vapor pressure $P_{Na}1$ is approximately equalized to the vapor pressure $P_{Na-Ga}$ means that the vapor transportation of the metal Na from the metal Na melt 122 to the mixed melt 102 is in equilibrium with that of the metal Na from the mixed melt 102 to the metal Na melt 122, thereby preventing the reduction of the metal Na from the mixed melt 102.

Furthermore, the vapor pressure $P_{Na}2$ of the metal Na at the gas-liquid interface B is kept at a vapor pressure at which the metal Na from the metal Na melt 122 is not substantially vaporized.

Accordingly, the temperature at the gas-liquid interface A of the metal Na melt 122 held in the gas supply pipe 104 is set at a temperature at which the reduction of the metal Na from the mixed melt 102 is prevented, and the temperature at the gas-liquid interface B of the melt Na melt 122 is set at a temperature at which substantial vaporization of the metal Na from the metal Na melt 122 is suppressed.

Note that, in this temperature raising process of the reaction vessel 103 and the gas supply pipe 104, the pressure is controlled to be raised up to 40 times atmospheric pressure with the pressure regulator 106 so that the pressure in the space 107 in the reaction vessel 103 and that in space 113 on the nitrogen cylinder side of the gas supply pipe 104 become almost the same.

(14) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 26, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt 122 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 25 and 26 are alternately repeated to supply the nitrogen gas to the space 107 in the reaction vessel 103.

At this time, the temperature at the gas-liquid interface A is set at the specific temperature Tsp1 at which the vapor transportation of the metal Na from the metal Na melt 122 to the mixed melt 102 is in equilibrium with that of the metal Na from the mixed melt 102 to the metal Na melt 122. Accordingly, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 and is liquidized, which will not influence the introduction of the nitrogen gas into the space 107 in the reaction vessel 103.

In the crystal production apparatus 100F, various GaN crystals are produced using the nitrogen gas pressure and the crystal growth temperature in the regions REG1, REG2, and REG3 as shown in FIG. 6.

As described above, according to the embodiment 6, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103.

Furthermore, the vapor pressure $P_{Na}1$ of the metal Na at the gas-liquid interface A on the reaction 103 side of the metal Na melt 122 held in the gas supply pipe 104 is approximately equalized to the vapor pressure $P_{Na-Ga}$ of the metal Na vaporized from the mixed melt 102.

As a result, it is possible to keep the mixing ratio of the metal Na to the metal Ga in the mixed melt 102 approximately constant while preventing the diffusion of Na to the outside of the reaction vessel 103, and supply a nitrogen material in a secure manner. Furthermore, it is possible to continue the stable growth of GaN crystals and produce low-cost, high-quality, large-sized, and homogeneous GaN crystals. Accordingly, it is possible to grow group III nitride crystals excellent in quality and larger in size than those produced by the typical flux method.

Other details are the same as those of the embodiment 1.

Embodiment 7

Figure 27:
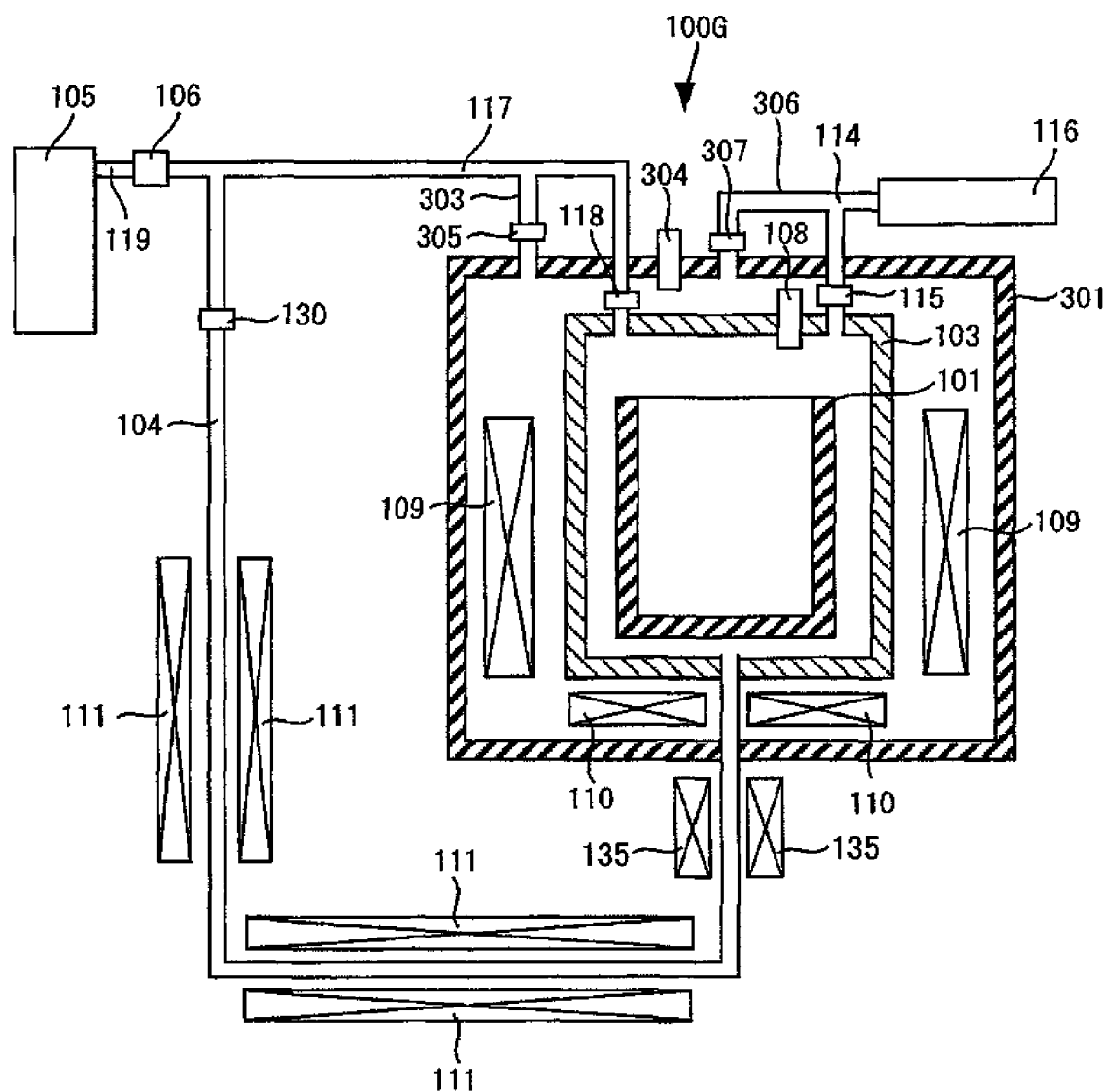
FIG. 27 is a schematic drawing showing a configuration of a production apparatus for GaN crystals according to an embodiment 7.

FIG. 27 is a schematic view showing a configuration of a production apparatus for GaN crystals according to an embodiment 7. As shown in FIG. 27, the crystal production apparatus 100G of the embodiment 7 is formed by replacing the valve 120 of the crystal production apparatus 100B of FIG. 7 with the valve 130 and adding the heaters 135 thereto. Other components are the same as those of the crystal production apparatus 100B.

The valve 130 and the heaters 135 are described in the embodiment 6.

Figure 28:
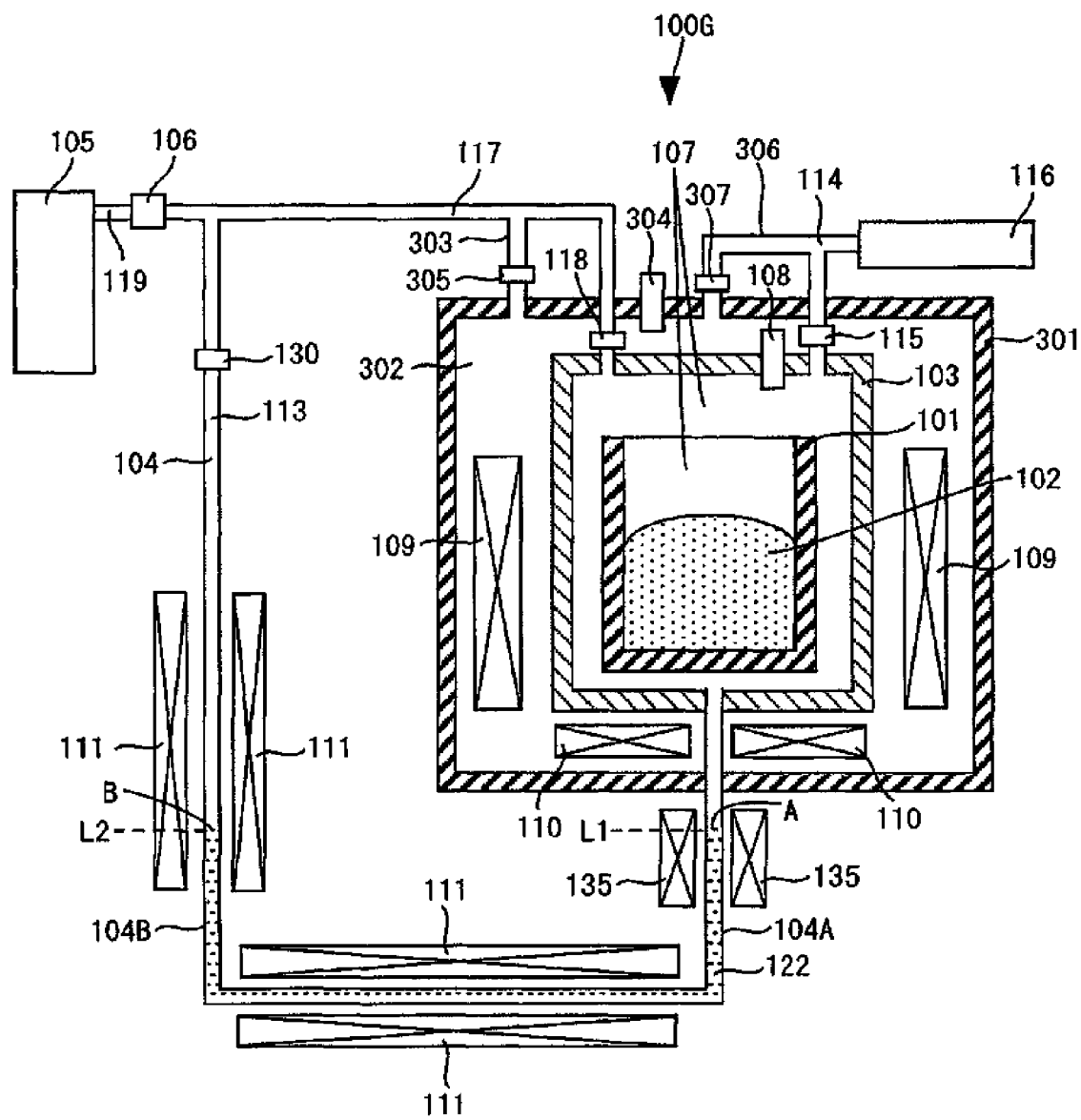
FIG. 28 is a drawing (1) for describing a production method using the production apparatus of FIG. 27.
Figure 29:
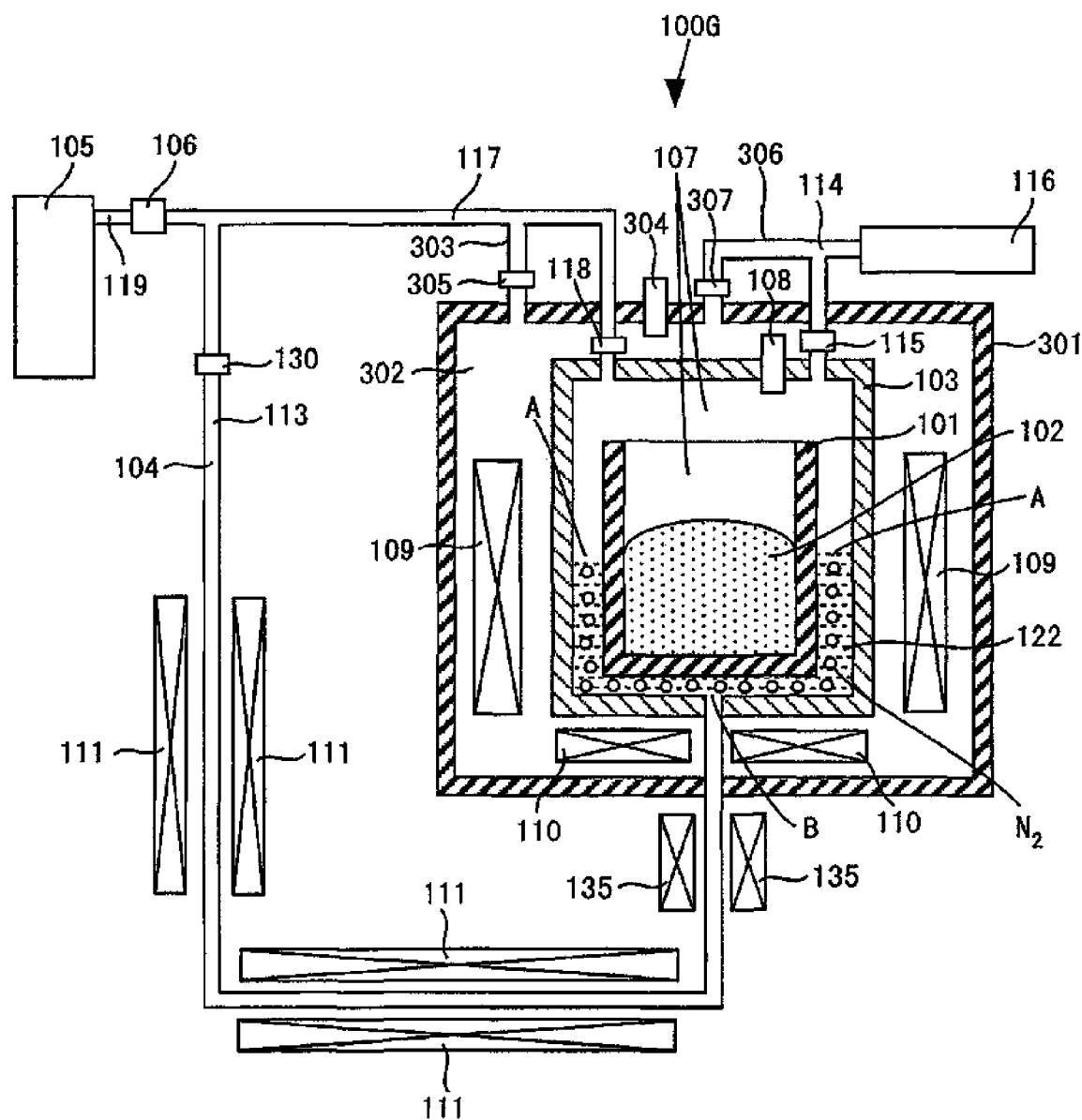
FIG. 29 is a drawing (2) for describing a production method using the production apparatus of FIG. 27.

Referring next to FIGS. 28 and 29, a description is made of a method of producing GaN crystals using the crystal production apparatus 100G.

(1) Close each valve.

(2) Separate the reaction vessel 103 and the gas supply pipe 104 from each pipe and take out the reaction vessel 103 from the pressure vessel 301.

(3) Put the taken-out reaction vessel 103 and the gas supply pipe 104 in a glove box in an Ar atmosphere.

(4) Take out the melt holding vessel 101 from the reaction vessel 103 and put the metal Ga as a material and the metal Na as flux in the melt holding vessel 101. Here, the molar ratio of Na to Ga is 5:5 as an example.

(5) Pour a metal Na melt in the gas supply pipe 104.

(6) Accommodate the melt holding vessel 101 in a predetermined position of the reaction vessel 103.

(7) Close the cover of the reaction vessel 103.

(8) Take out the reaction vessel 103 and the gas supply pipe 104 from the glove box and accommodate them in a predetermined position of the pressure vessel 301.

(9) Connect the reaction vessel 103 and the gas supply pipe 104 to each pipe. At this time, connect the reaction vessel and the gas supply pipe to each pipe while supplying, for example, nitrogen gas to each gas supply pipe so as not to leave air therein. Accordingly, each gas supply pipe is filled with the nitrogen gas.

(10) Close the cover of the pressure vessel 301.

(11) Operate the vacuum pump 116.

(12) Open the valves 115 and 307. Accordingly, the Ar gas contained in the space 107 in the reaction vessel 103 and the gas present in the space 302 between the pressure vessel 301 and the reaction vessel 103 are evacuated.

(13) Refer to the pressure sensors 108 and 304, and close the valves 115 and 307 when the pressure in the space 107 in the reaction vessel 103 and that in the space 302 between the pressure vessel 301 and the reaction vessel 103 reach a predetermined pressure.

(14) Open the valves 118, 130, and 305 and supply the nitrogen gas to the reaction vessel 103 and the pressure vessel 301. At this time, refer to the pressure sensors 108 and 304 and control the pressure regulator 106 so that the pressures of the nitrogen gas in the reaction vessel 103 and the pressure vessel 301 become almost 15 times atmospheric pressure. When the pressures in the reaction vessel 103 and the pressure vessel 301 become 15 times atmospheric pressure, close the valve 118 while keeping the valve 305 opened. The above steps are performed at a temperature at which the metal Na melt 122 in the gas supply pipe 104 is kept in a liquid state and at a temperature at which substantial vaporization of Na is suppressed (for example, 100° C.).

(15) Energize the heaters 109 and 110 to raise the temperature in the reaction vessel 103 up to 800° C. Furthermore, energize the heaters 111 and 140 to raise the temperature at the rising portion 104A of the gas supply pipe 104 to the specific temperature Tsp1 and that at the rising portion 104B of the gas supply pipe 104 to the specific temperature Tsp2. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, as shown in FIG. 28, the metal Na melt 122 has two gas-liquid interfaces A and B in the gas supply pipe 104. Here, since the pressure in the space 107 in the reaction vessel 103 and that in the space 113 in the gas supply pipe 104 are almost the same, the level L1 of the gas-liquid interface A and the level L2 of the gas-liquid interface B are almost equalized to each other.

The vapor pressure $P_{Na}1$ of the metal Na at the gas-liquid interface A is approximately equalized to the vapor pressure $P_{Na-Ga}$ of the metal Na vaporized from the mixed melt 102. The fact that the vapor pressure $P_{Na}1$ is approximately equalized to the vapor pressure $P_{Na-Ga}$ means that the vapor transportation of the metal Na from the metal Na melt 122 to the mixed melt 102 is in equilibrium with that of the metal Na from the mixed melt 102 to the metal Na melt 122, thereby preventing the reduction of the metal Na from the mixed melt 102.

Furthermore, the vapor pressure $P_{Na}2$ of the metal Na at the gas-liquid interface B is kept at a vapor pressure at which the metal Na from the metal Na melt 122 is not substantially vaporized.

Accordingly, the temperature at the gas-liquid interface A of the metal Na melt 122 held in the gas supply pipe 104 is set at a temperature at which the reduction of the metal Na from the mixed melt 102 is prevented, and the temperature at the gas-liquid interface B of the melt Na melt 122 is set at a temperature at which substantial vaporization of the metal Na from the metal Na melt 122 is suppressed.

Note that, in this temperature raising process of the reaction vessel 103 and the gas supply pipe 104, the pressure is controlled to be raised up to 40 times atmospheric pressure with the pressure regulator 106 so that the pressure in the space 107 in the reaction vessel 103, that in space 113 on the nitrogen cylinder side of the gas supply pipe 104, and that in the space 302 in the pressure vessel 301 become almost the same.

(16) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 29, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt 122 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 28 and 29 are alternately repeated to supply the nitrogen gas to the space 107 in the reaction vessel 103.

At this time, the temperature at the gas-liquid interface A is set at the specific temperature Tsp1 at which the vapor transportation of the metal Na from the metal Na melt 122 to the mixed melt 102 is in equilibrium with that of the metal Na from the mixed melt 102 to the metal Na melt 122. Accordingly, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 and is liquidized, which will not influence the introduction of the nitrogen gas into the space 107 in the reaction vessel 103.

In the crystal production apparatus 100G, various GaN crystals are produced using the nitrogen gas pressure and the crystal growth temperature in the regions REG1, REG2, and REG3 as shown in FIG. 6.

As described above, according to the embodiment 7, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103.

Furthermore, the vapor pressure $P_{Na}1$ of the metal Na at the gas-liquid interface A on the reaction vessel 103 side of the metal Na melt 122 held in the gas supply pipe 104 is approximately equalized to the vapor pressure $P_{Na-Ga}$ of the metal Na vaporized from the mixed melt 102.

As a result, it is possible to keep the mixing ratio of the metal Na to the metal Ga in the mixed melt 102 approximately constant while preventing the diffusion of the metal Na outside the reaction vessel 103, and supply a nitrogen material in a secure manner. Furthermore, it is possible to continue the stable growth of GaN crystals and produce low-cost, high-quality, large-sized, and homogeneous GaN crystals. Accordingly, it is possible to grow group III nitride crystals excellent in quality and larger in size than those produced by the typical flux method.

Other details are the same as those of the embodiments 1 and 2.

Embodiment 8

Figure 30:
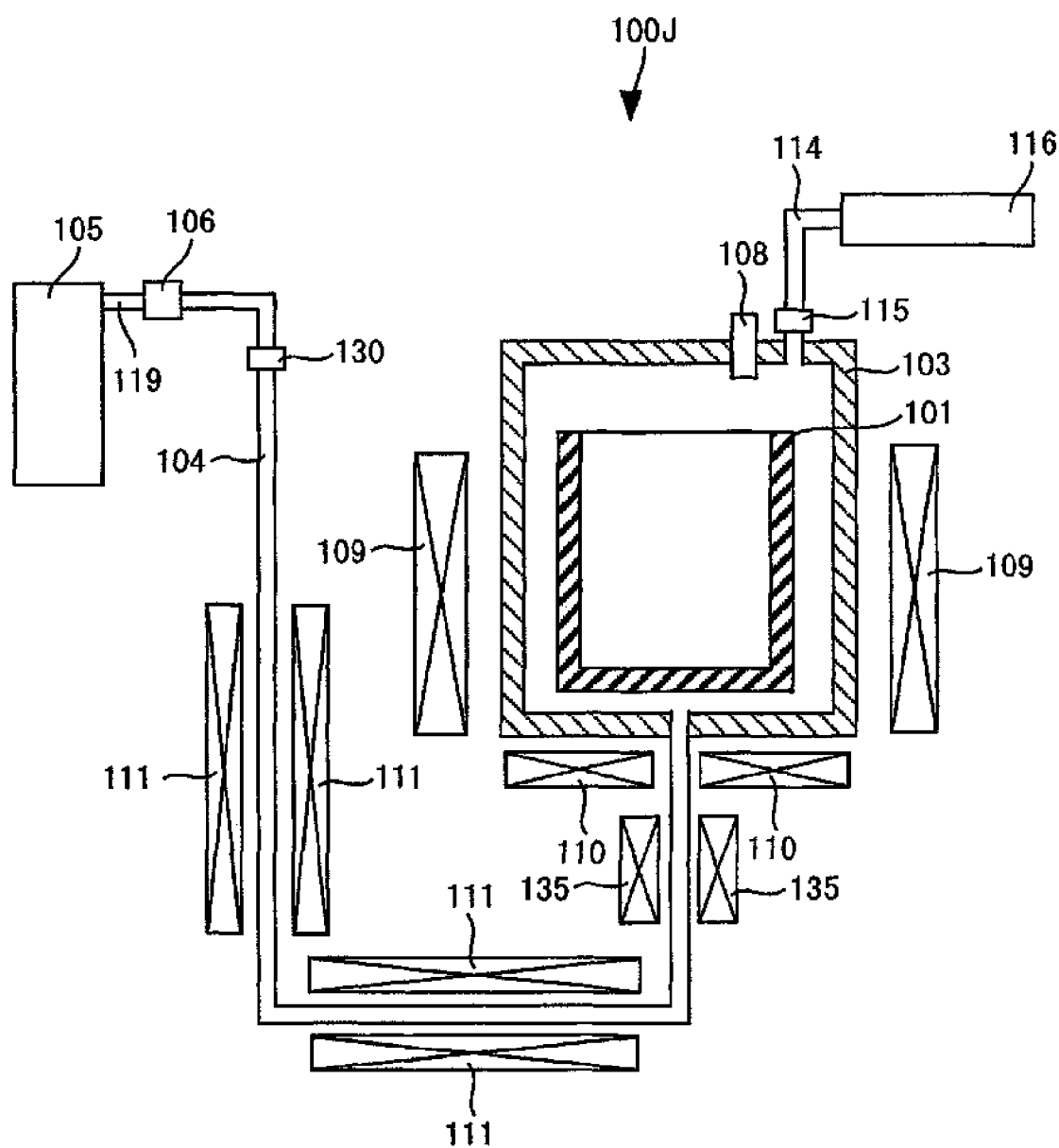
FIG. 30 is a schematic drawing showing a configuration of a production apparatus for GaN crystals according to an embodiment 8.

FIG. 30 is a schematic view showing a configuration of a production apparatus for GaN crystals according to an embodiment 8. As shown in FIG. 30, the crystal production apparatus 100J of the embodiment 8 is formed by replacing the valve 120 of the crystal production apparatus 100C of FIG. 10 with the valve 130 and adding the heaters 135 thereto. Other components are the same as those of the crystal production apparatus 100C.

The valve 130 and the heaters 135 are described in the embodiment 6.

Figure 31:
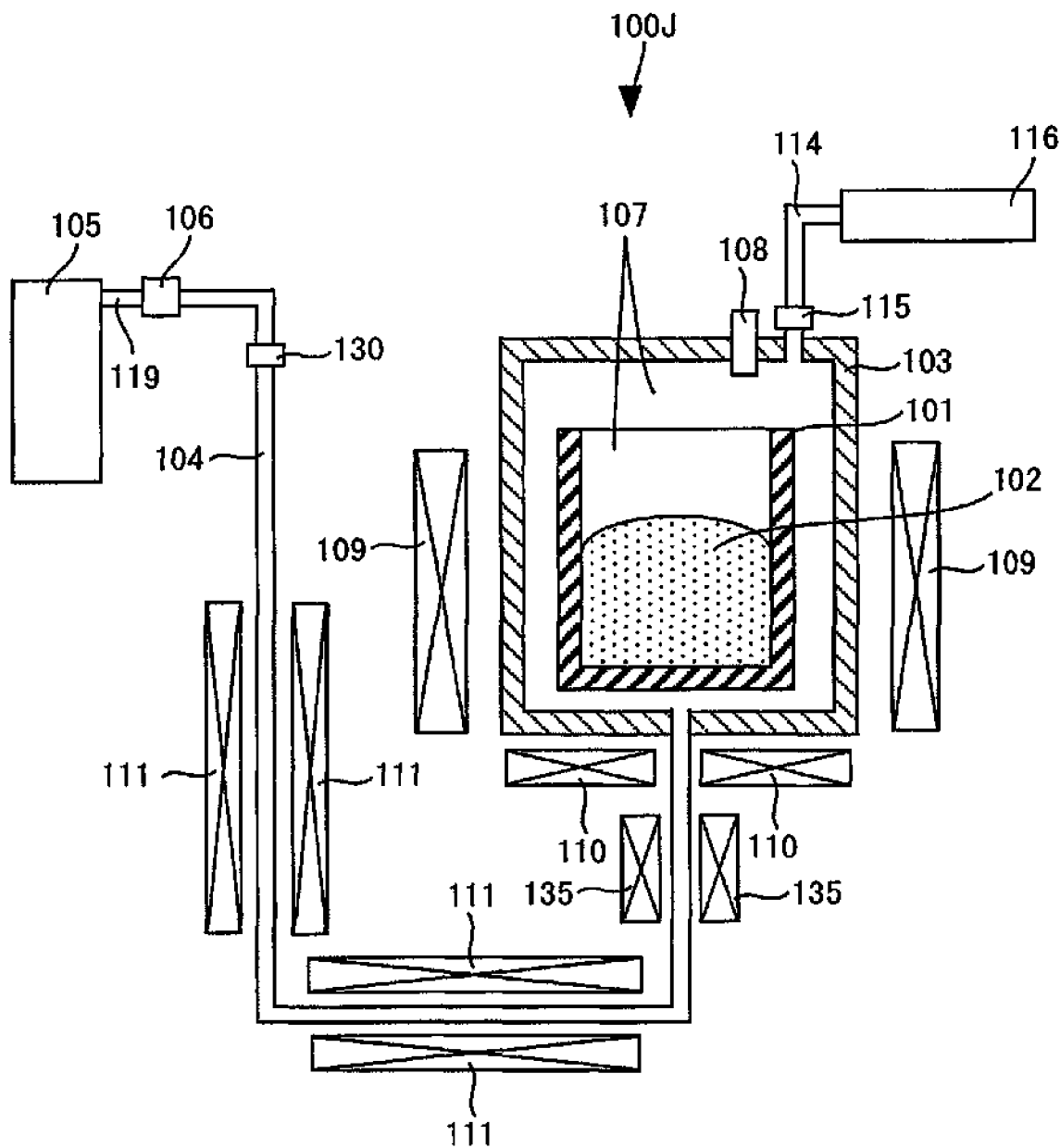
FIG. 31 is a drawing (1) for describing a production method using the production apparatus of FIG. 30.
Figure 32:
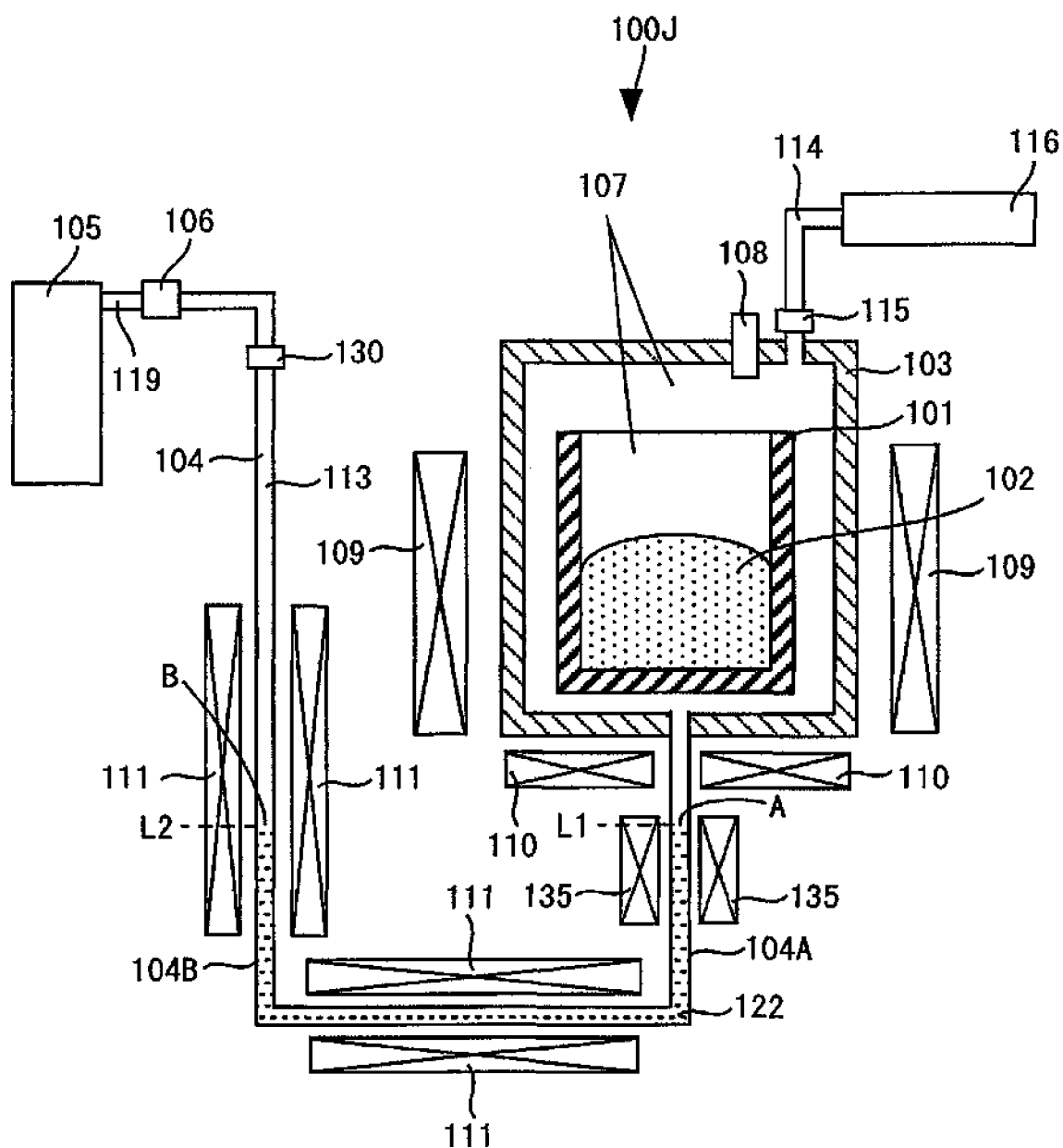
FIG. 32 is a drawing (2) for describing a production method using the production apparatus of FIG. 30.
Figure 33:
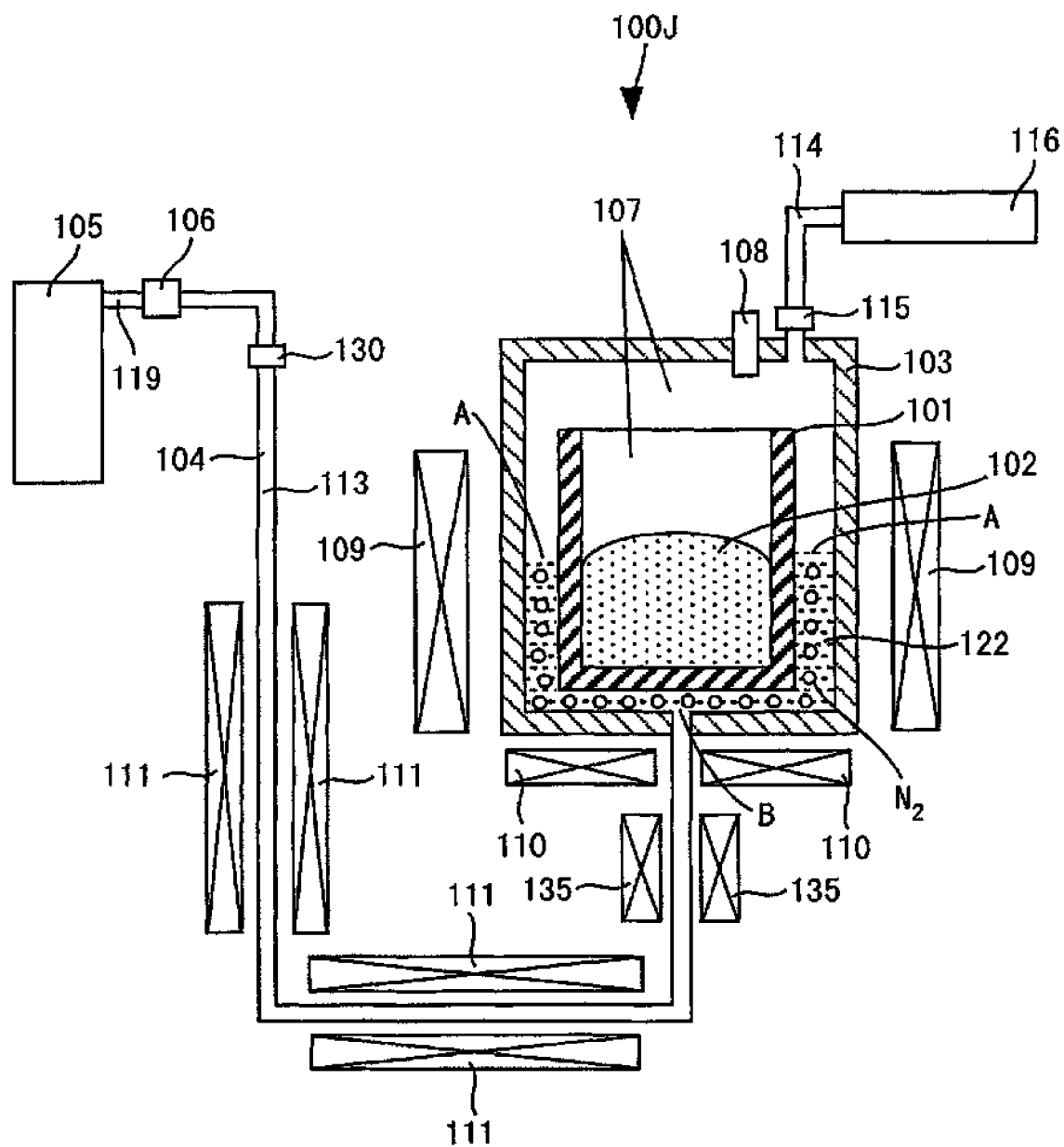
FIG. 33 is a drawing (3) for describing a production method using the production apparatus of FIG. 30.

Referring next to FIGS. 31 through 33, a description is made of a method of producing GaN crystals using the crystal production apparatus 100J.

(1) Close each valve.

(2) Separate the reaction vessel 103 and the gas supply pipe 104 from each pipe and put them in a glove box in an Ar atmosphere.

(3) Take out the melt holding vessel 101 from the reaction vessel 103 and put the metal Ga as a material and the metal Na as flux in the melt holding vessel 101. Here, the molar ratio of Na to Ga is 5:5 as an example.

(4) Accommodate the melt holding vessel 101 in a predetermined position of the reaction vessel 103. In this case, unlike the embodiments 6 and 7, the melt holding vessel 101 is accommodated in the reaction vessel 103 where a metal Na melt is not poured into the gas supply pipe 104.

(5) Close the cover of the reaction vessel 103.

Figure 3:
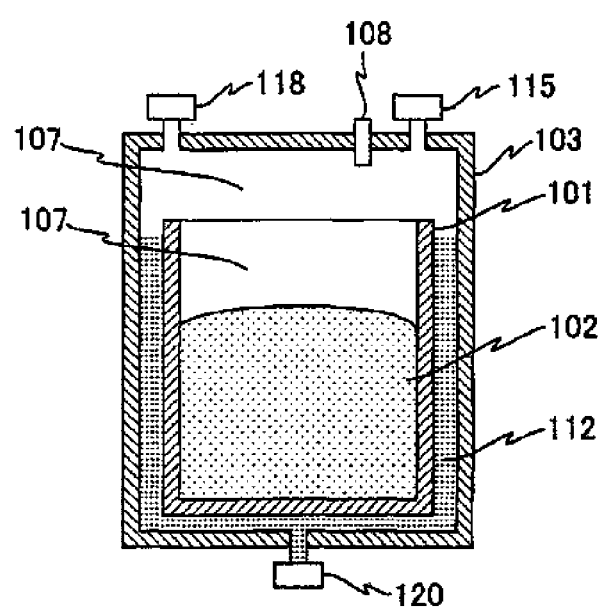
FIG. 3 is a drawing (2) for describing a production method using the production apparatus of FIG. 1.

(6) Take out the reaction vessel 103 and the gas supply pipe 104 from the glove box and connect them to each pipe as exemplified in FIG. 3. At this time, connect the reaction vessel and the gas supply pipe to each pipe while supplying, for example, nitrogen gas to each gas supply pipe so as not to leave air therein. Accordingly, each gas supply pipe is filled with the nitrogen gas.

(7) Operate the vacuum pump 116.

(8) Open the valve 115. Accordingly, the Ar gas contained in the space 107 in the reaction vessel 103 is evacuated.

(9) Refer to the pressure sensor 108, and close the valve 115 when the pressure in the space 107 in the reaction vessel 103 reaches a predetermined pressure.

(10) Open the valve 130 and supply the nitrogen gas to the reaction vessel 103. At this time, since the metal Na is not accumulated in the gas supply pipe 104, the nitrogen gas is supplied to the space 107 in the reaction vessel 103 through the gas supply pipe 104. Furthermore, refer to the pressure sensor 108 and control the pressure regulator 106 so that the pressure of the nitrogen gas in the reaction vessel 103 becomes almost 15 times atmospheric pressure.

(11) Energize the heaters 109 and 110 to raise the temperature in the reaction vessel 103 up to 800° C. Furthermore, energize the heaters 111 and 140 to raise the temperature at the rising portion 104A of the gas supply pipe 104 to the specific temperature Tsp1 and that at the rising portion 104B of the gas supply pipe 104 to the specific temperature Tsp2. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

As shown in FIG. 31, at starting the energizing of the heaters 109, 110, 111, and 140, the mixed melt 102 is held in the melt holding vessel 101 and the metal Na melt is not accumulated in the gas supply pipe 104.

Then, as the temperatures of the melt holding vessel 101 and the reaction vessel 103 get close to 800° C., the amount of the metal Na vaporized from the mixed melt 102 is increased, and the metal Na vaporized from the mixed melt 102 is accumulated in the gas supply pipe 104 where the metal Na could be present in a liquid state. At this timer as shown in FIG. 32, the metal Na melt 122 accumulated in the gas supply pipe 104 has two gas-liquid interfaces A and B in the gas supply pipe 104. Here, since the pressure in the space 107 in the reaction vessel 103 and that in the space 113 in the gas supply pipe 104 are almost the same, the level L1 of the gas-liquid interface A and the level L2 of the gas-liquid interface B are almost equalized to each other.

Since the temperature at the rising portion 104A of the gas supply pipe 104 is raised to the specific temperature Tsp1 and that at the rising portion 104B of the gas supply pipe 104 is raised to the specific temperature Tsp2, the vapor pressure $P_{Na}1$ of the metal Na at the gas-liquid interface A is approximately equalized to the vapor pressure $P_{Na-Ga}$ of the metal Na vaporized from the mixed melt 102. The fact that the vapor pressure $P_{Na}1$ is approximately equalized to the vapor pressure $P_{Na}1$ means that the vapor transportation of the metal Na from the metal Na melt 122 to the mixed melt 102 is in equilibrium with that of the metal Na from the mixed melt 102 to the metal Na melt 122, thereby preventing the reduction of the metal Na from the mixed melt 102.

Furthermore, the vapor pressure $P_{Na}2$ of the metal Na at the gas-liquid interface B is kept at a vapor pressure at which the metal Na from the metal Na melt 122 is not substantially vaporized.

Accordingly, the temperature at the gas-liquid interface A of the metal Na melt 122 held in the gas supply pipe 104 is set at a temperature at which the reduction of the metal Na from the mixed melt 102 is prevented, and the temperature at the gas-liquid interface B of the melt Na melt 122 is set at a temperature at which substantial vaporization of the metal Na from the metal Na melt 122 is suppressed.

Note that, in this temperature raising process of the reaction vessel 103 and the gas supply pipe 104, the pressure is controlled to be raised up to 40 times atmospheric pressure with the pressure regulator 106 so that the pressure in the space 107 in the reaction vessel 103 and that in space 113 on the nitrogen cylinder side of the gas supply pipe 104 become almost the same.

(12) Keep the temperature in the reaction vessel 103 at 800° C. and keep the pressure in the space 107 in the reaction vessel 103 at 40 times atmospheric pressure when the temperature in the reaction vessel 103 reaches 800° C. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 33, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt 122 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 32 and 33 are alternately repeated to supply the nitrogen gas to the space 107 in the reaction vessel 103.

At this time, the temperature at the gas-liquid interface A is set at the specific temperature Tsp1 at which the vapor transportation of the metal Na from the metal Na melt 122 to the mixed melt 102 is in equilibrium with that of the metal Na from the mixed melt 102 to the metal Na melt 122. Accordingly, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 and is liquidized, which will not influence the introduction of the nitrogen gas into the space 107 in the reaction vessel 103.

In the crystal production apparatus 100J, various GaN crystals are produced using the nitrogen gas pressure and the crystal growth temperature in the regions REG1, REG2, and REG3 as shown in FIG. 6.

As described above, according to the embodiment 8, as the temperature in the reaction vessel 103 is increased, some of the Na in the mixed melt 102 is vaporized and concentrated in the gas supply pipe 104. Then, the space 113 in the gas supply pipe 104 and the space 107 in the reaction vessel 103 are interrupted by the metal Na melt 122. Subsequently, in the process of growing GaN crystals, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103.

Furthermore, the vapor pressure $P_{Na}1$ of the metal Na at the gas-liquid interface A on the reaction 103 side of the metal Na melt 122 held in the gas supply pipe 104 is approximately equalized to the vapor pressure $P_{Na-Ga}$ of the metal Na vaporized from the mixed melt 102.

As a result, it is possible to keep the mixing ratio of the metal Na to the metal Ga in the mixed melt 102 approximately constant while preventing the diffusion of the metal Na outside the reaction vessel 103, and supply a nitrogen material in a secure manner. Furthermore, it is possible to continue the stable growth of GaN crystals and produce low-cost, high-quality, large-sized, and homogeneous GaN crystals. Accordingly, it is possible to grow group III nitride crystals excellent in quality and larger in size than those produced by the typical flux method.

Other details are the same as those of the embodiments 1 and 3.

Embodiment 9

Figure 34:
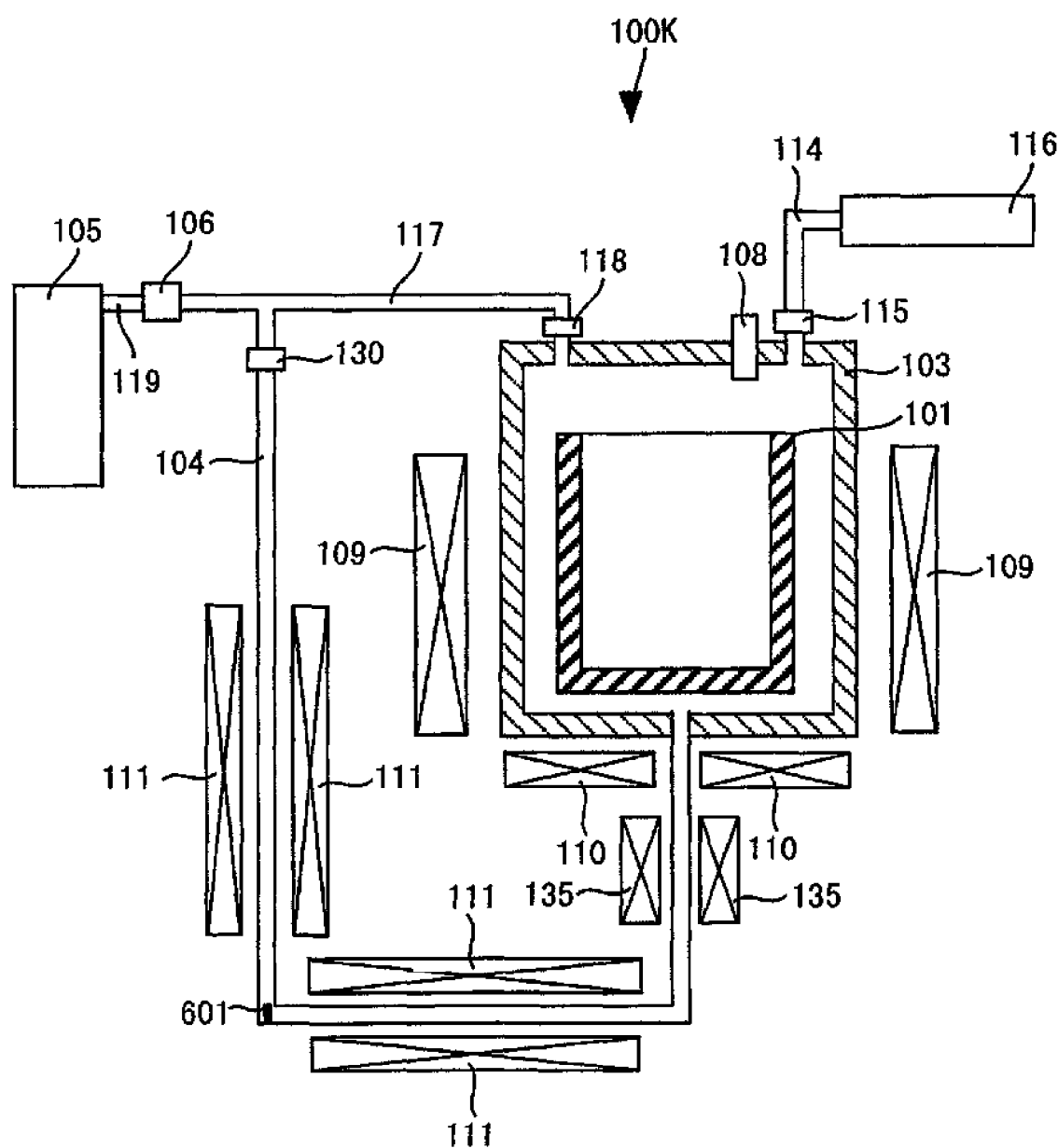
FIG. 34 is a schematic drawing showing a configuration of a production apparatus for GaN crystals according to an embodiment 9.

FIG. 34 is a schematic view showing a configuration of a production apparatus for GaN crystals according to an embodiment 9. As shown in FIG. 34, the crystal production apparatus 100K of the embodiment 9 is formed by replacing the valve 120 of the crystal production apparatus 100D of FIG. 14 with the valve 130 and adding the heaters 135 thereto. Other components are the same as those of the crystal production apparatus 100D.

The valve 130 and the heaters 135 are described in the embodiment 6.

Figure 35:
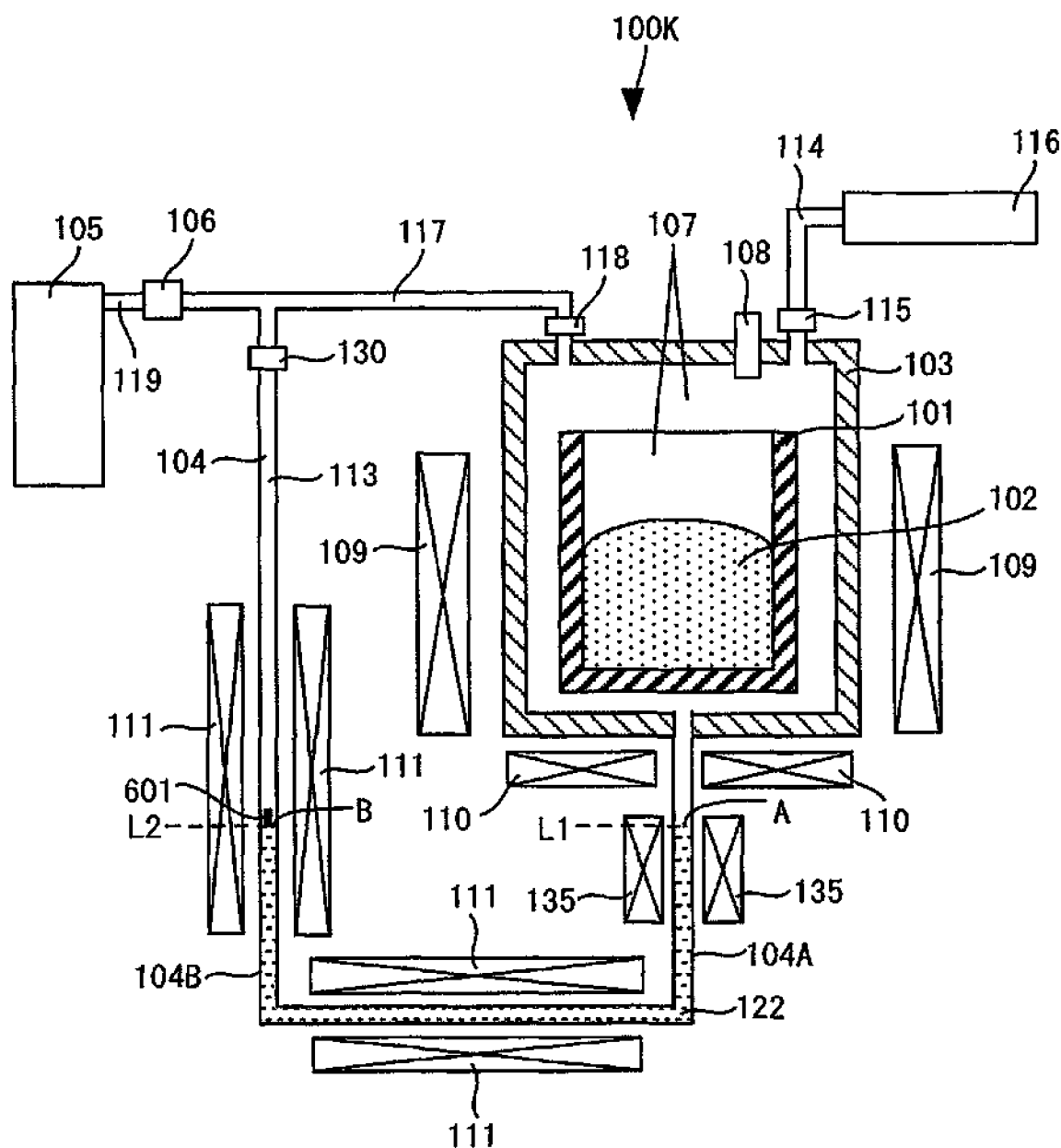
FIG. 35 is a drawing (1) for describing a production method using the production apparatus of FIG. 34.
Figure 36:
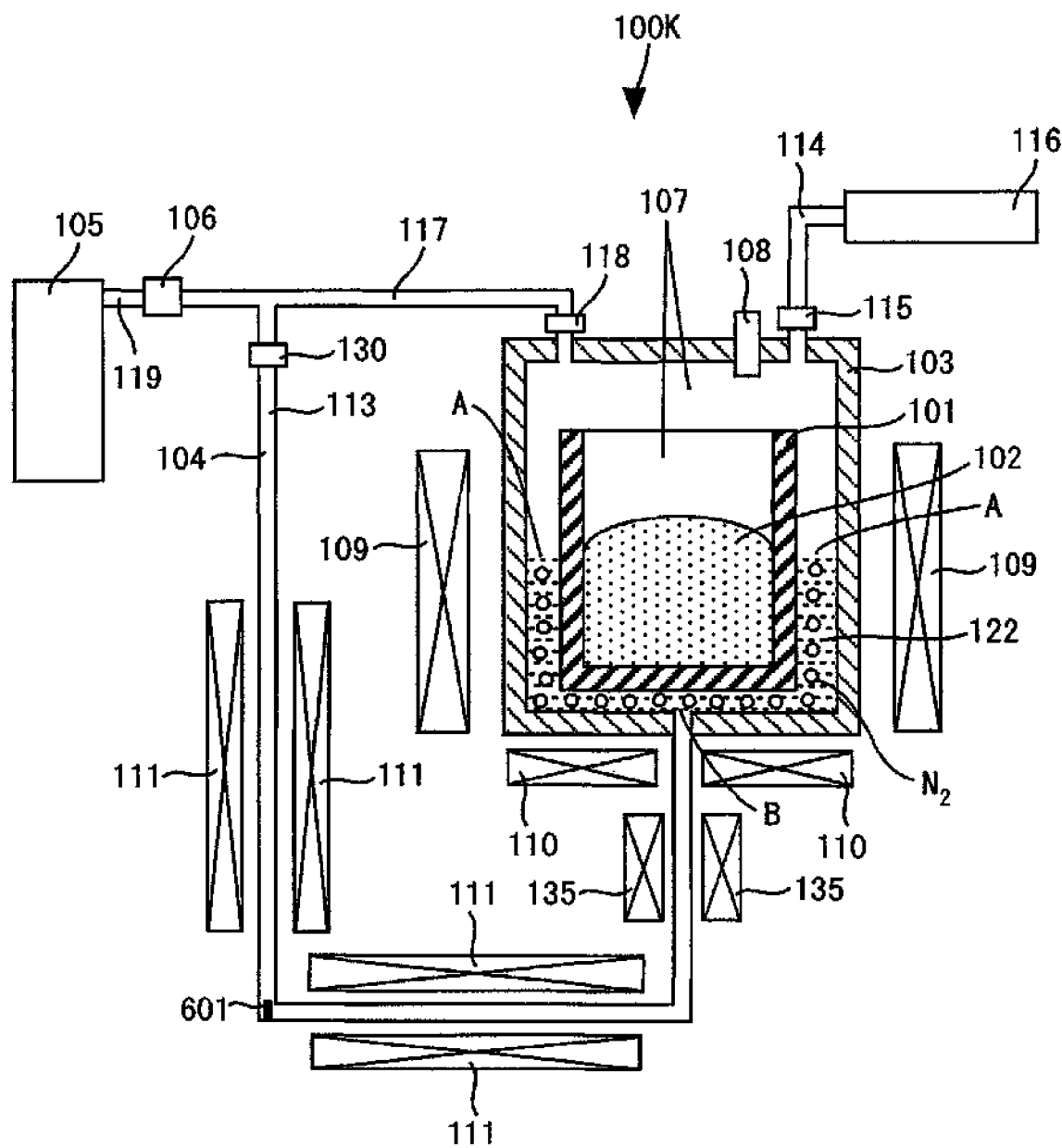
FIG. 36 is a drawing (2) for describing a production method using the production apparatus of FIG. 34.

Referring next to FIGS. 35 and 36, a description is made of a method of producing CaN crystals using the crystal production apparatus 100K.

(1) Close each valve.
(2) Separate the reaction vessel 103 and the gas supply pipe 104 from each pipe and put them in a glove box in an Ar atmosphere.
(3) Take out the melt holding vessel 101 from the reaction vessel 103 and put the metal Ga as a material and the metal Na as flux in the melt holding vessel 101. Here, the molar ratio of Na to Ga is 5:5 as an example.
(4) Pour a metal Na melt in the gas supply pipe 104.
(5) Accommodate the melt holding vessel 101 in a predetermined position of the reaction vessel 103.
(6) Close the cover of the reaction vessel 103.
(7) Take out the reaction vessel 103 and the gas supply pipe 104 from the glove box and connect them to each pipe. At this time, connect the reaction vessel and the gas supply pipe to each pipe while supplying, for example, nitrogen gas to each gas supply pipe so as not to leave air therein. Accordingly, each gas supply pipe is filled with the nitrogen gas.
(8) Operate the vacuum pump 116.
(9) Open the valve 115. Accordingly, the Ar gas contained in the space 107 in the reaction vessel 103 is evacuated.
(10) Refer to the pressure sensor 108, and close the valve 115 when the pressure in the space 107 in the reaction vessel 103 reaches a predetermined pressure.
(11) Open the valves 118 and 130 and supply the nitrogen gas to the reaction vessel 103. At this time, refer to the pressure sensor 108 and regulate the pressure regulator 106 so that the pressure of the nitrogen gas in the reaction vessel 103 becomes almost 15 times atmospheric pressure. When the pressure in the reaction vessel 103 becomes 15 times atmospheric pressure, close the valve 118. The above steps are performed at a temperature at which the metal Na melt 122 in the gas supply pipe 104 is kept in a liquid state and at a temperature at which substantial vaporization of Na is suppressed (for example, 100° C.).
(12) Energize the heaters 109 and 110 to raise the temperature in the reaction vessel 103 up to 800° C. Furthermore, energize the heaters 111 and 140 to raise the temperature at the rising portion 104A of the gas supply pipe 104 to the specific temperature Tsp1 and that at the rising portion 104B of the gas supply pipe 104 to the specific temperature Tsp2. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, as shown in FIG. 35, the metal Na melt 122 has two gas-liquid interfaces A and B in the gas supply pipe 104. The float 601 floats on the gas-liquid interface B of the metal Na melt 122. Here, since the pressure in the space 107 in the reaction vessel 103 and that in the space 113 in the gas supply pipe 104 are almost the same, the level L1 of the gas-liquid interface A and the level L2 of the gas-liquid interface B are almost equalized to each other.

The vapor pressure $P_{Na}1$ of the metal Na at the gas liquid interface A is approximately equalized to the vapor pressure $P_{Na-Ga}$ of the metal Na vaporized from the mixed melt 102. The fact that the vapor pressure $P_{Na}1$ is approximately equalized to the vapor pressure $P_{Na-Ga}$ means that the vapor transportation of the metal Na from the metal Na melt 122 to the mixed melt 102 is in equilibrium with that of the metal Na from the mixed melt 102 to the metal Na melt 122, thereby preventing the reduction of the metal Na from the mixed melt 102.

Furthermore, the vapor pressure $P_{Na}2$ of the metal Na at the gas-liquid interface B is kept at a vapor pressure at which the metal Na from the metal Na melt 122 is not substantially vaporized.

Accordingly, the temperature at the gas-liquid interface A of the metal Na melt 122 held in the gas supply pipe 104 is set at a temperature at which the reduction of the metal Na from the mixed melt 102 is prevented, and the temperature at the gas-liquid interface B of the melt Na melt 122 is set at a temperature at which substantial vaporization of the metal Na from the metal Na melt 122 is suppressed.

Note that, in this temperature raising process of the reaction vessel 103 and the gas supply pipe 104, the pressure is controlled to be raised up to 40 times atmospheric pressure with the pressure regulator 106 so that the pressure in the space 107 in the reaction vessel 103 and that in space 113 on the nitrogen cylinder side of the gas supply pipe 104 become almost the same.

(13) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 36, a differential pressure between the space 113 in the gas supply pipe 104 and the space 107 in the reaction vessel 103 causes the metal Na melt 112 to be moved into the reaction vessel 103. As a result, the gas-liquid interface A is raised and the gas-liquid interface B is moved up to a point near the boundary between the reaction vessel 103 and the gas supply pipe 104. At this time, the nitrogen gas is moved upward in the metal Na melt 122 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. In this manner, the nitrogen gas is supplied from the nitrogen gas cylinder 105 to the space 107 in the reaction vessel 103 until the pressure in the space 113 in the gas supply pipe 104 and that in the space 107 in the reaction vessel 103 become almost the same. When the pressure in the space 113 in the gas supply pipe 104 and that in the space 107 in the reaction vessel 103 become almost the same, the level of the gas-liquid interface A and that of the gas-liquid interface B become almost the same. In the process of growing crystals, the conditions as shown in FIGS. 35 and 36 are alternately repeated to supply the nitrogen gas to the space 107 in the reaction vessel 103.

At this time, the temperature at the gas-liquid interface A is set at the specific temperature Tsp1 at which the vapor transportation of the metal Na from the metal Na melt 122 to the mixed melt 102 is in equilibrium with that of the metal Na from the mixed melt 102 to the metal Na melt 122. Accordingly, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 and is liquidized, which will not influence the introduction of the nitrogen gas into the space 107 in the reaction vessel 103.

In the crystal production apparatus 100K, various GaN crystals are produced using the nitrogen gas pressure and the crystal growth temperature in the regions REG1, REG2, and REG3 as shown in FIG. 6.

As described above, according to the embodiment 9, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103.

Furthermore, the vapor pressure $P_{Na}1$ of the metal Na at the gas-liquid interface A on the reaction 103 side of the metal Na melt 122 held in the gas supply pipe 104 is approximately equalized to the vapor pressure $P_{Na-Ga}$ of the metal Na vaporized from the mixed melt 102.

As a result, it is possible to keep the mixing ratio of the metal Na to the metal Ga in the mixed melt 102 approximately constant while preventing the diffusion of the metal Na outside the reaction vessel 103, and supply a nitrogen material in a secure manner. Furthermore, it is possible to continue the stable growth of GaN crystals and produce low-cost, high-quality, large-sized, and homogeneous GaN crystals. Accordingly, it is possible to grow group III nitride crystals excellent in quality and larger in size than those produced by the typical flux method.

Other details are the same as those of the embodiments 1 and 4.

Embodiment 10

Figure 37:
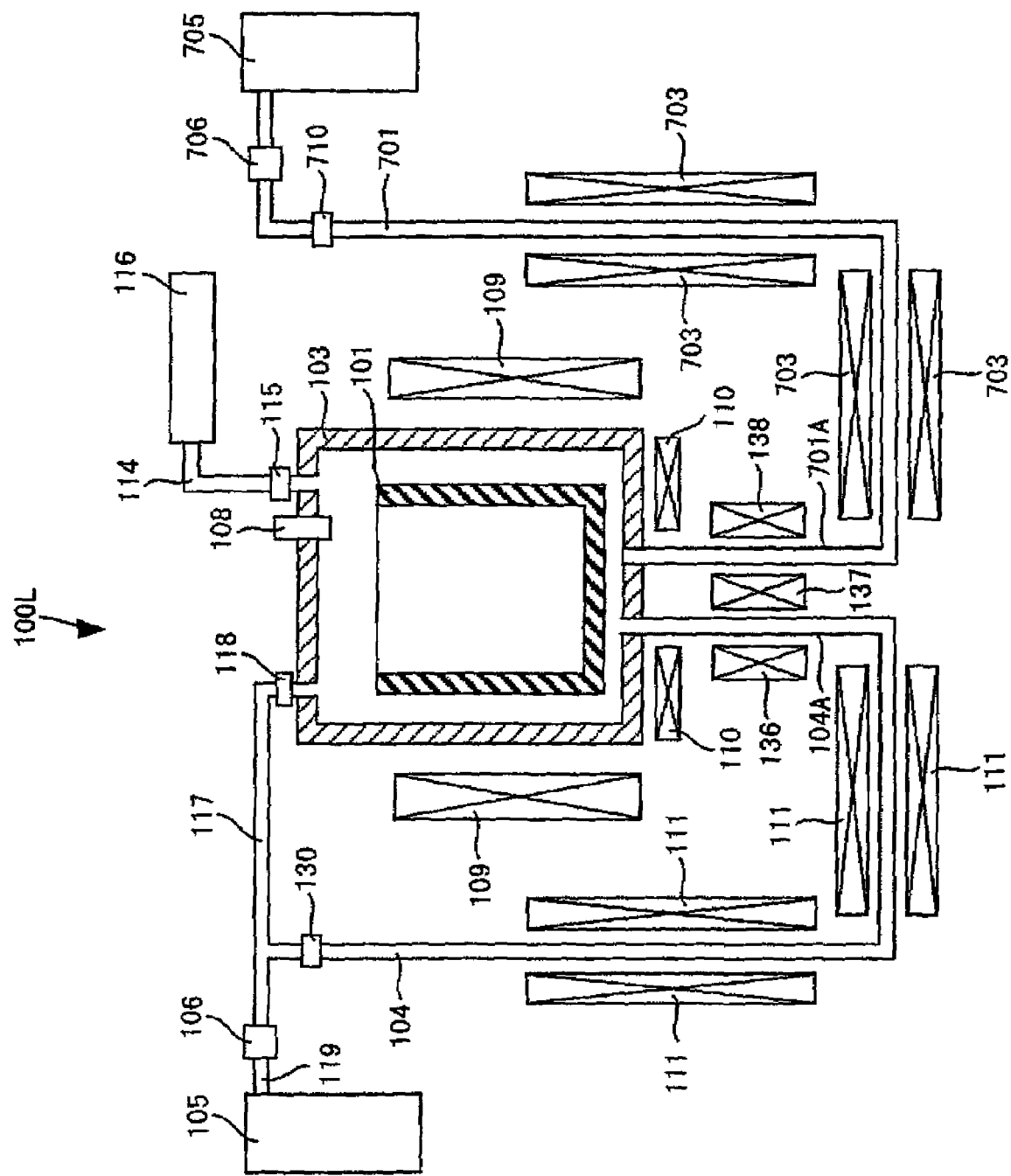
FIG. 37 is a schematic drawing showing a configuration of a production apparatus for GaN crystals according to an embodiment 10.

FIG. 37 is a schematic view showing a configuration of a production apparatus for GaN crystals according to an embodiment 10. As shown in FIG. 37, the crystal production apparatus 100L of the embodiment 10 is formed by replacing the valves 120 and 708 of the crystal production apparatus 100E of FIG. 17 with the valves 130 and 710, respectively, and adding the heaters 136 through 138 thereto. Other components are the same as those of the crystal production apparatus 100E.

The valve 130 is described in the embodiment 6. The valve 710 is attached to the gas supply pipe 701 near the pressure regulator 706. The valve 710 supplies the Ar gas from the gas cylinder 705 to the reaction vessel 103 side or stops supplying the Ar gas from the gas cylinder 705 gas thereto.

The heater 136 is arranged opposite to the rising portion 104A of the gas supply pipe 104, the heater 137 is arranged opposite to the rising portion 104A of the gas supply pipe 104 and the rising portion 701A of the gas supply pipe 701A, and the heater 138 is arranged opposite to the rising portion 701A of the gas supply pipe 701.

The heaters 136 and 137 heat the rising portion 104A of the gas supply pipe 104 to the specific temperature Tsp1 at which the vapor pressure of the metal Na vaporized from the metal Na melt accumulated in part of the gas supply pipe 104 is approximately equalized to that of the metal Na vaporized from the mixed melt 102 in the melt holding vessel 101. Furthermore, the heaters 137 and 138 heat the rising portion 701A of the gas supply pipe 701 to the specific temperature Tsp1 at which the vapor pressure of the metal Na vaporized from the metal Na melt accumulated in part of the gas supply pipe 701 is approximately equalized to that of the metal Na vaporized from the mixed melt 102 in the melt holding vessel 101.

Figure 38:
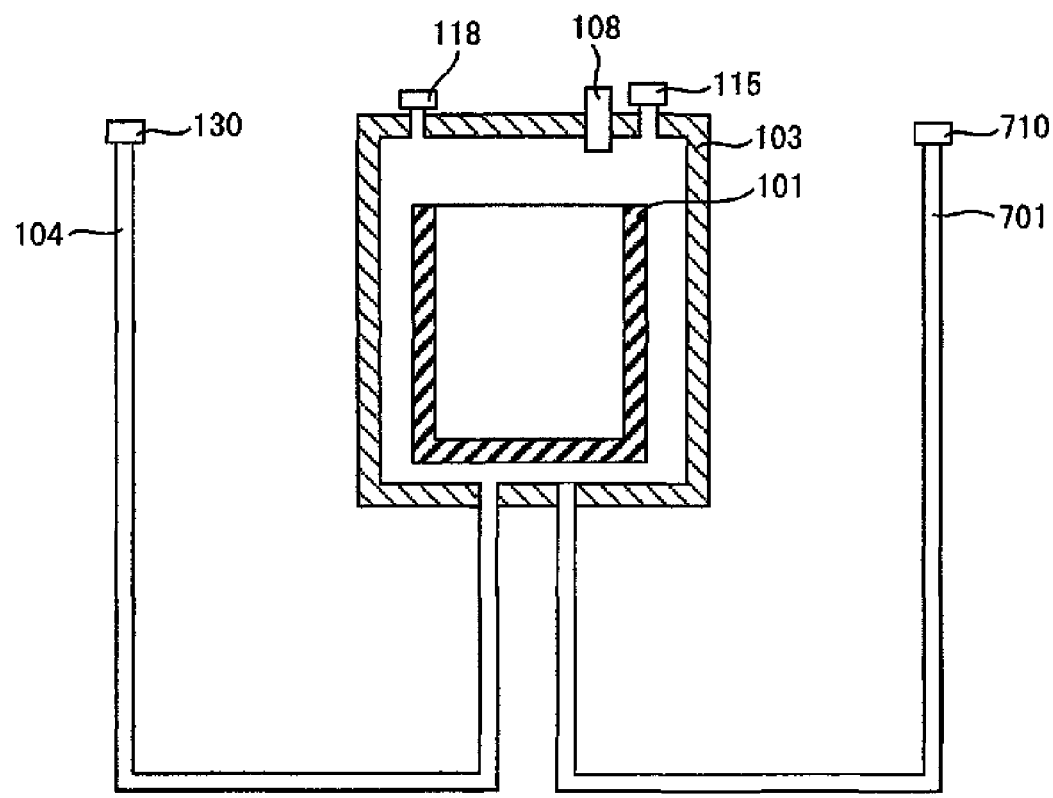
FIG. 38 is a drawing (1) for describing a production method using the production apparatus of FIG. 37.
Figure 39:
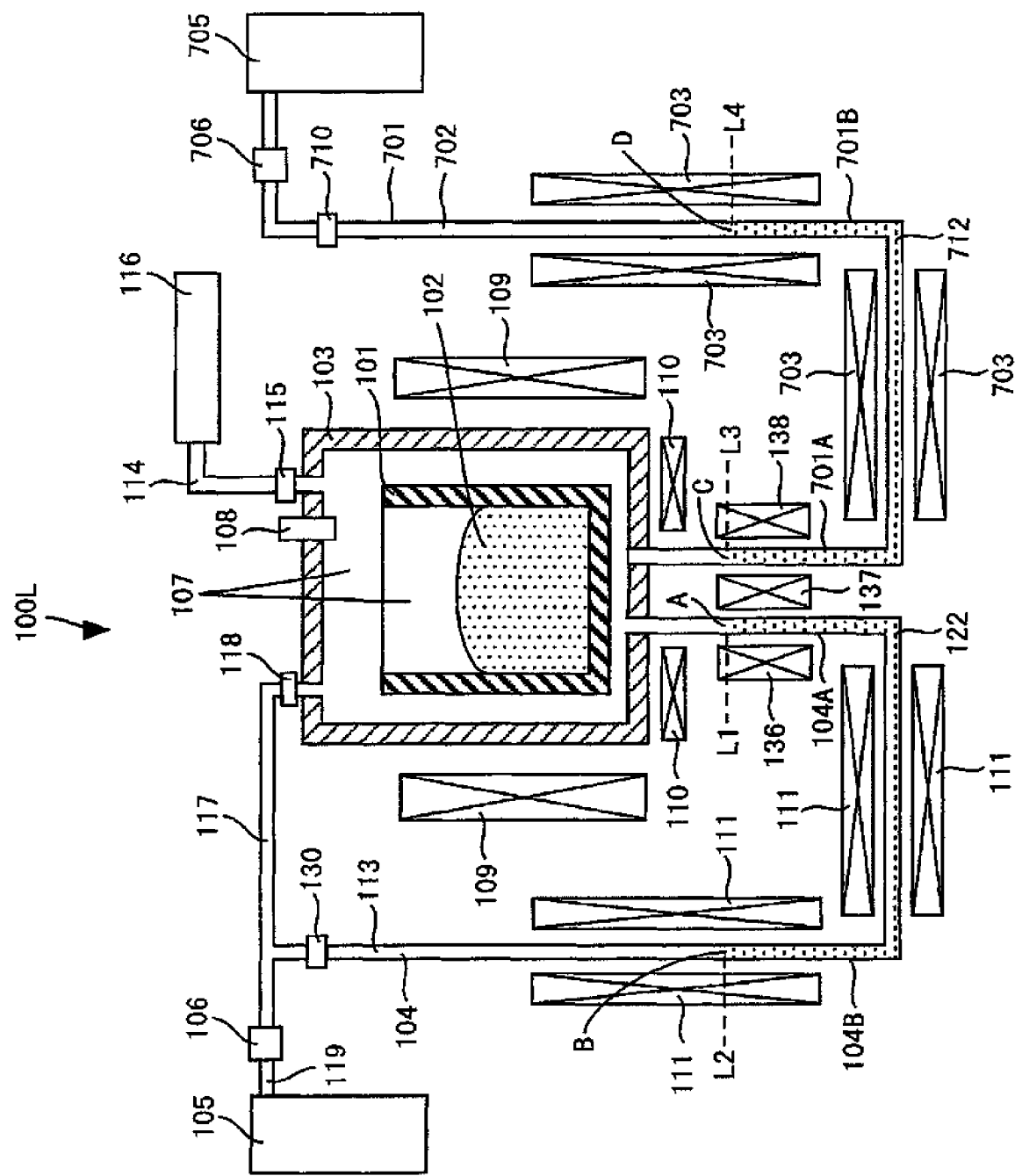
FIG. 39 is a drawing (2) for describing a production method using the production apparatus of FIG. 37.
Figure 40:
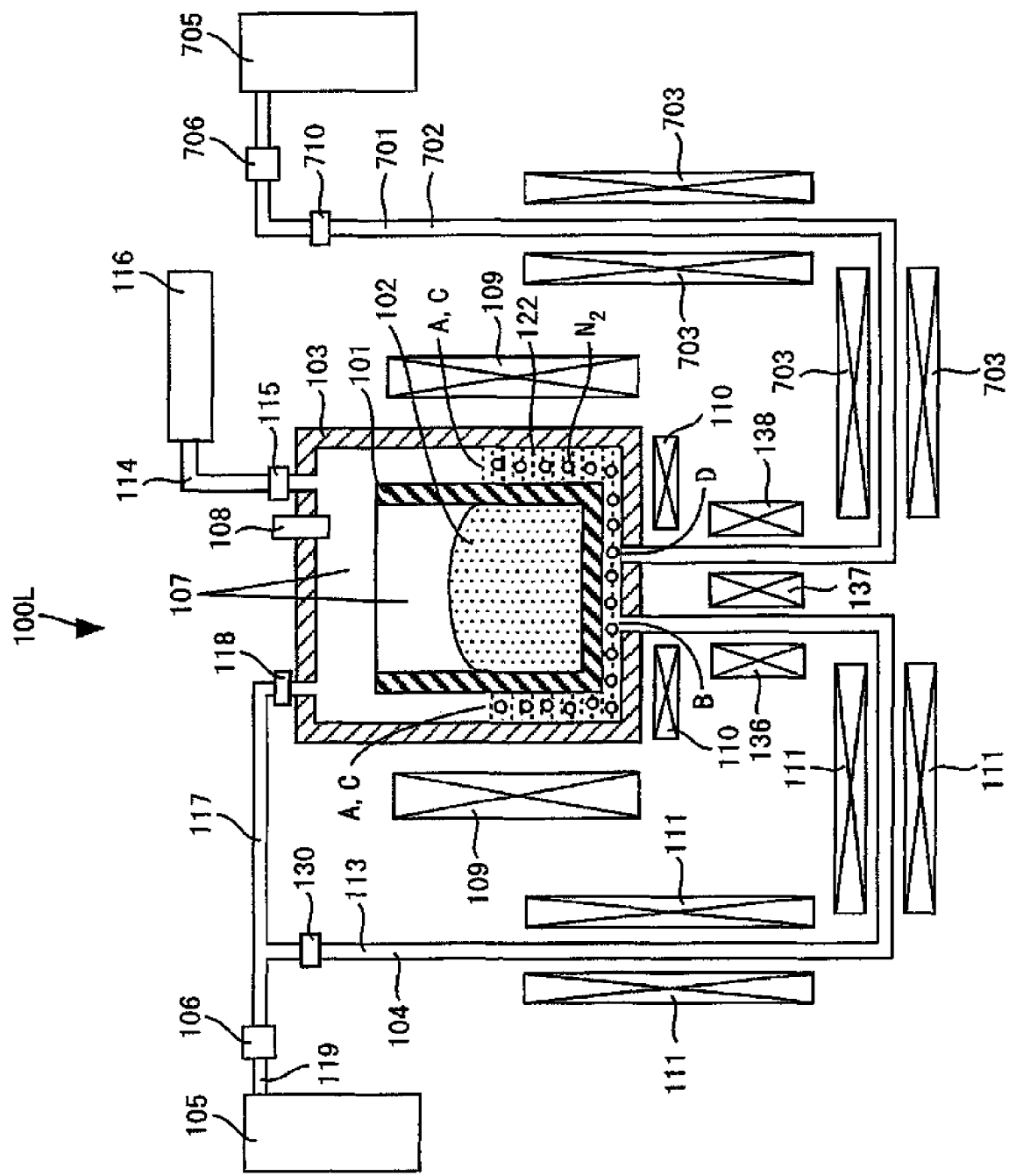
FIG. 40 is a drawing (3) for describing a production method using the production apparatus of FIG. 39.

Referring next to FIGS. 38 through 40, a description is made of a method of producing GaN crystals using the crystal production apparatus 100L. Note that, in the crystal production apparatus 100L, the reaction vessel 103 and the gas supply pipes 104 and 701 having each valve attached thereto are separable from each pipe as shown in FIG. 38 and can be moved to a glove box, not shown, so as to perform an operation.

(1) Close each valve.

(2) Separate the reaction vessel 103 and the gas supply pipes 104 and 710 from each pipe and put them in a glove box in an Ar atmosphere.

(3) Take out the melt holding vessel 101 from the reaction vessel 103 and put the metal Ga as a material and the metal Na as flux in the melt holding vessel 101. Here, the molar ratio of Na to Ga is 5:5 as an example.

(4) Pour the metal Na melts 122 and 712 in the gas supply pipes 104 and 701.

(5) Accommodate the melt holding vessel 101 in a predetermined position of the reaction vessel 103.

(6) Close the cover of the reaction vessel 103.

(7) Take out the reaction vessel 103 and the gas supply pipes 104 and 701 from the glove box and connect them to each pipe. At this time, connect the reaction vessel and the gas supply pipes to each pipe while supplying, for example, nitrogen gas to each gas supply pipe so as not to leave air therein. Accordingly, the gas supply pipe 104 is filled with the nitrogen gas. Furthermore, connect the reaction vessel and the gas supply pipes to each pipe while supplying, for example, Ar gas to each gas supply pipe so as not to leave air therein. Accordingly, the gas supply pipe 104 is filled with Ar gas.

(8) Operate the vacuum pump 116.

(9) Open the valve 115. Accordingly, the Ar gas contained in the space 107 in the reaction vessel 103 is evacuated.

(10) Refer to the pressure sensor 108, and close the valve 115 when the pressure in the space 107 in the reaction vessel 103 reaches a predetermined pressure.

(11) Open the valves 118 and 130 and supply the nitrogen gas to the reaction vessel 103. At this time, refer to the pressure sensor 108 and regulate the pressure regulator 106 so that the pressure of the nitrogen gas in the reaction vessel 103 becomes almost 15 times atmospheric pressure. When the pressure in the reaction vessel 103 becomes 15 times atmospheric pressure, close the valve 118. The above steps are performed at a temperature at which the metal Na melt in the gas supply pipe 104 and the metal Na melt 712 in the gas supply pipe 701 are kept in a liquid state and at a temperature at which substantial vaporization of Na is suppressed (for example, 100° C.).

(12) Energize the heaters 109 and 110 to raise the temperature in the reaction vessel 103 up to 800° C. Furthermore, energize the heaters 111, 136 through 138, and 703 to raise the temperature at the rising portion 104A of the gas supply pipe 104 and that at the rising portion 701A of the gas supply pipe 701 to the specific temperature Tsp1, that at the rising portion 104B of the gas supply pipe 104 to the specific temperature Tsp2, and that at the rising portion 701B of the gas supply pipe 701 to the specific temperature Tsp2. When the temperature of the space 107 in the reaction vessel 103 reaches 800° C., the pressure in the space 107 in the reaction vessel 103 becomes 40 times atmospheric pressure. At temperatures above 560° C. in this temperature raising process, the metal Na and the metal Ga in the melt holding vessel 101 are formed into a complete mixed melt.

At this time, as shown in FIG. 39, the metal Na melt 122 has two gas-liquid interfaces A and B in the gas supply pipe 104, and the metal Na melt 712 has two gas-liquid interfaces C and D in the gas supply pipe 701. Here, since the pressure in the space 107 in the reaction vessel 103 and that in the space 113 in the gas supply pipe 104 are almost the same, the level L1 of the gas-liquid interface A and the level L2 of the gas-liquid interface B are almost equalized to each other. Furthermore, since the pressure in the space 107 in the reaction vessel 103 and that in the space 702 in the gas supply pipe 701 are almost the same, the level L3 of the gas-liquid interface C and the level L4 of the gas-liquid interface D are almost equalized to each other.

The vapor pressure $P_{Na}1$ of the metal Na at the gas-liquid interface A is approximately equalized to the vapor pressure $P_{Na-Ga}$ of the metal Na vaporized from the mixed melt 102, and the vapor pressure $P_{Na}3$ of the metal Na at the gas-liquid interface C is approximately equalized to the vapor pressure $P_{Na-Ga}$ of the metal Na vaporized from the mixed melt 102. The fact that the vapor pressures $P_{Na}1$ and $P_{Na}3$ are approximately equalized to the vapor pressure $P_{Na-Ga}$ means that the vapor transportation of the metal Na from the metal Na melt 122 to the mixed melt 102 is in equilibrium with that of the metal Na from the mixed melt 102 to the metal Na melt 122 and the vapor transportation of the metal Na from the metal Na melt 712 to the mixed melt 102 is in equilibrium with that of the metal Na from the mixed melt 102 to the metal Na melt 712, thereby preventing the reduction of the metal Na from the mixed melt 102.

Furthermore, the vapor pressure $P_{Na}2$ of the metal Na at the gas-liquid interface B and the vapor pressure $P_{Na}4$ of the metal Na at the gas-liquid interface D are kept at a vapor pressure at which the metal Na from the metal Na melts 122 and 712 is not substantially vaporized.

Accordingly, the temperature at the gas-liquid interface A of the metal Na melt 122 held in the gas supply pipe 104 and that of the gas-liquid interface C of the metal Na melt 712 held in the gas supply pipe 701 are set at a temperature at which the reduction of the metal Na from the mixed melt 102 is prevented, the temperature at the gas-liquid interface B of the melt Na melt 122 is set at a temperature at which substantial vaporization of the metal Na from the metal Na melt 122 is suppressed, and the temperature at the gas-liquid interface D of the metal Na melt 712 is set at a temperature at which substantial vaporization of the metal Na is suppressed.

Note that, in this temperature raising process of the reaction vessel 103 and the gas supply pipes 104 and 701, the pressure is controlled to be raised up to 40 times atmospheric pressure with the pressure regulators 106 and 706 so that the pressure in the space 107 in the reaction vessel 103, that in the space 113 on the nitrogen cylinder side of the gas supply pipe 104, and that in the space 702 on the Ar gas cylinder 705 side of the gas supply pipe 701 become almost the same.

(13) Keep the temperature in the reaction vessel 103 at 800° C. and keep the pressure in the space 107 in the reaction vessel 103 at 40 times atmospheric pressure. Accordingly, GaN crystals as group III nitrides start growing in the mixed melt 102 in the melt holding vessel 101.

As the growth of GaN crystals progresses, the nitrogen gas as a nitrogen material of the space 107 in the reaction vessel 103 is consumed to thereby reduce the pressure in the space 107. Due to the reduction in pressure in the space 107 in the reaction vessel 103, as exemplified in FIG. 40, a differential pressure between the space 113 in the gas supply pipe 104 and the space 107 in the reaction vessel 103 and that between the space 702 in the gas supply pipe 701 and the space 107 in the reaction vessel 103 cause the metal Na melts 122 and 712 to be moved into the reaction vessel 103. As a result, the gas-liquid interfaces A and C are raised, the gas-liquid interface B is moved up to a point near the boundary between the reaction vessel 103 and the gas supply pipe 104, and the gas-liquid interface D is moved up to a point near the boundary between the reaction vessel 103 and the gas supply pipe 701. At this time, the nitrogen gas is moved upward in the metal Na melt 122 in a foamed state and reaches the space 107 in the reaction vessel 103. Alternatively, the space 113 in the gas supply pipe 104 and the space 107 in the reaction vessel 103 are directly connected to each other so as to supply the nitrogen gas to the space 107 in the reaction vessel 103. Furthermore, the Ar gas is moved upward in the metal Na melt 712 in a foamed state and reaches the space 107 in the reaction vessel 103. Alternatively, the space 702 in the gas supply pipe 701 and the space 107 in the reaction vessel 103 are directly connected to each other so as to supply the Ar gas to the space 107 in the reaction vessel 103. In this manner, the nitrogen gas is supplied from the nitrogen gas cylinder 105 to the space 107 in the reaction vessel 103 and the Ar gas is supplied from the Ar gas cylinder 705 to the space 107 in the reaction vessel 103 until the pressure in the space 113 in the gas supply pipe 104, that in the space 702 in the gas supply pipe 701, and that in the space 107 in the reaction vessel 103 become almost the same. When the pressure in the space 113 in the gas supply pipe 104, that in the space 702 in the gas supply pipe 701, and that in the space 107 in the reaction vessel 103 become almost the same, the level of the gas-liquid interface A, that of the gas-liquid interface B, that of the gas-liquid interface C, and that of the gas-liquid interface D become almost the same. In the process of growing crystals, the conditions as shown in FIGS. 39 and 40 are alternately repeated to supply the nitrogen gas and the Ar gas to the space 107 in the reaction vessel 103.

At this time, the temperature at the gas-liquid interface A is set at the specific temperature Tsp1 at which the vapor transportation of the metal Na from the metal Na melt 122 to the mixed melt 102 is in equilibrium with that of the metal Na from the mixed melt 102 to the metal Na melt 122, and the temperature at the gas-liquid interface C is set at the specific temperature Tsp1 at which the vapor transportation of the metal Na from the metal Na melt 712 to the mixed melt 102 is in equilibrium with that of the metal Na from the mixed melt 102 to the metal Na melt 712. Accordingly, the space 107 in the reaction vessel 103 is in a mixed atmosphere of the Na vapor and the nitrogen gas. On the other hand, since the gas-liquid interface B is kept at a temperature at which Na is not substantially vaporized as described above, the vapor pressure of Na is small and the diffusion of Na from the gas-liquid interface B to the upstream side (nitrogen cylinder 105 side) is negligible. Furthermore, since the gas-liquid interface D is also kept at a temperature at which Na is not substantially vaporized as described above, the vapor pressure of Na is small and the diffusion of Na from the gas-liquid interface D to the upstream side (Ar-gas cylinder 705 side) is negligible. Note that even if the metal Na melt 112 in the gas supply pipe 104 is moved into the reaction vessel 103 and the gas-liquid interface B is moved up to a point near the reaction vessel 103, the Na vapor diffusing from the gas-liquid interface B adheres to a temperature-controlled area of the gas supply pipe 104 and is liquidized, which will not influence the introduction of the nitrogen gas into the space 107 in the reaction vessel 103.

In the crystal production apparatus 100L, various GaN crystals are produced using the nitrogen gas pressure and the crystal growth temperature in the regions REG1, REG2, and REG3 as shown in FIG. 6.

As described above, according to the embodiment 10, when the pressure in the space 113 in the gas supply pipe 104 and that in the space 107 in the reaction vessel 103 are almost the same, both spaces are interrupted by the metal Na melt 112. When the nitrogen pressure in the reaction vessel 103 is reduced, the nitrogen gas is introduced into the reaction vessel 103.

Furthermore, the vapor pressure $P_{Na}1$ of the metal Na at the gas-liquid interface A on the reaction 103 side of the metal Na melt 122 held in the gas supply pipe 104 is approximately equalized to the vapor pressure $P_{Na-Ga}$ of the metal Na vaporized from the mixed melt 102, and the vapor pressure $P_{Na}3$ of the metal Na at the gas-liquid interface C on the reaction vessel 103 side of the metal Na melt 712 held in the gas supply pipe 701 is approximately equalized to the vapor pressure $P_{Na-Ga}$ of the metal Na vaporized from the mixed melt 102.

As a result, it is possible to keep the mixing ratio of the metal Na to the metal Ga in the mixed melt 102 approximately constant while preventing the diffusion of Na to the outside of the reaction vessel 103, and supply a nitrogen material in a secure manner. Furthermore, it is possible to continue the stable growth of GaN crystals and produce low-cost, high-quality, large-sized, and homogeneous GaN crystals. Accordingly, it is possible to grow group III nitride crystals excellent in quality and larger in size than those produced by the typical flux method.

Other details are the same as those of the embodiments 1 and 5.

With the above embodiments, it is possible to achieve high-performance and low-cost group III nitride semiconductor devices, which has not been achieved in the past, for example, optical devices such as light-emitting diodes, semiconductor lasers, and photo diodes and electronic devices such as transistors.

Note that although the description is made using Na as flux in each of the embodiments, the present invention is not limited to this and may use alkaline metals such as Li, Na, and K or alkaline earth metals such as Mg, Ca, and Sr.

Furthermore, although the description is made using nitrogen gas as a substance containing nitrogen in each of the embodiments, the present invention is not limited to this and may use compounds containing nitrogen such as sodium azide and ammonia as constituent elements.

Furthermore, although the description is made using Ga as a group III metal in each of the embodiments, the present invention is not limited to this and may use, for example, B, Al, In, or the like. Note that although boron (B) is not a metal, it may be applicable to the present invention as a group III substance constituting BN as a group III nitride.

The embodiments disclosed herein should be considered to be exemplifications in all the points and be not limitative. The scope of the present invention is indicated by claims, not the above embodiments, and intends to include all the modifications within the meaning and the range equivalent to the claims.

According to third and fourth aspects of the present inventions, there is provided a crystal production apparatus comprising a melt holding vessel that holds a mixed melt of an alkaline metal and a group III metal; a backflow prevention unit that suppresses an outflow of an alkali metal vapor in a vessel space in contact with the mixed melt in the melt holding vessel to an outer space by a differential pressure between the vessel space and the outer space or by its own weight and introduces a nitrogen material gas supplied from an outside into the melt holding vessel by the differential pressure; and a heater that heats the mixed melt to a crystal growth temperature.

Preferably, the crystal production apparatus further comprises a reaction vessel. The reaction vessel covers a periphery of the melt holding vessel. The backflow prevention unit includes a through-hole, a pair of guides, and a backflow prevention valve. The through-hole is provided at a bottom surface of the reaction vessel facing a bottom surface of the melt holding vessel in a gravity direction. The pair of guides substantially perpendicularly come in contact with the bottom surface of the melt holding vessel and the bottom surface of the reaction vessel and are provided on sides of the through-hole. The backflow prevention valve slides along the pair of guides between a position where the through-hole is closed and a position where the through-hole is opened by the differential pressure or the own weight.

Preferably, the backflow prevention unit further includes a metal melt held between the melt holding vessel and the reaction vessel.

Preferably, the crystal production apparatus further comprises a cover. The cover forms a partition between the vessel space in the melt holding vessel and a space in the reaction vessel. The backflow prevention unit further includes a metal melt held near a gap between the melt holding vessel and the cover.

Preferably, the crystal production apparatus further comprises a cover. The cover forms a partition between the vessel space in the melt holding vessel and a space in the reaction vessel. The backflow prevention unit further includes a metal melt held in the vessel space in the melt holding vessel.

Preferably, the crystal production apparatus further comprises a cover. The cover forms a partition between the vessel space in the melt holding vessel and a space in the reaction vessel. The backflow prevention unit further includes a metal melt held in the vessel space along an inner wall of the melt holding vessel.

Preferably, the crystal production apparatus according further comprises a pipe connected to the melt holding vessel in communication with the vessel space in the melt holding vessel. The backflow prevention unit includes a closed vessel, a through-hole, and a backflow prevention valve. The closed vessel is connected to the pipe on a side opposite to the vessel space. The through-hole is provided at a bottom surface of the closed vessel in a gravity direction. The backflow prevention valve slides along a side wall of the closed vessel between a position where the through-hole is closed and a position where the through-hole is opened by the differential pressure or the own weight.

Preferably, the backflow prevention unit further includes an outer vessel and a metal melt. The outer vessel is connected to the pipe between the melt holding vessel and the closed vessel. The metal Na melt is held in the outer vessel.

Preferably, the metal Na melt is different from the mixed melt.

Preferably, the metal Na melt is formed of an alkaline metal Na melt.

Preferably, a first temperature at a first interface between a space communicating with the vessel space or the vessel space and the metal melt or at a point near the first interface is equal to or higher than a second temperature at a second interface between the vessel space and the mixed melt or at a point near the second interface.

Preferably, the first temperature is approximately equalized to the second temperature.

Preferably, the crystal production apparatus further comprises a gas supply unit. The gas supply unit supplies the nitrogen material gas to the backflow prevention unit so that a pressure in the vessel space becomes approximately constant.

Preferably, the heater further heats the backflow prevention unit to the crystal growth temperature.

Furthermore, according to the present invention, there is provided a production method producing a group III nitride crystal using a crystal production apparatus. The crystal production apparatus comprises a melt holding vessel and a backflow prevention unit. The melt holding vessel holds a mixed melt of an alkaline metal and a group III metal. The backflow prevention unit suppresses an outflow of an alkali metal vapor in a vessel space in contact with the mixed melt in the melt holding vessel to an outer space by a differential pressure between the vessel space and the outer space or by its own weight and introduces a nitrogen material gas supplied from an outside into the melt holding vessel by the differential pressure.

The production method comprises a first step of putting the alkaline metal and the group III metal in the melt holding vessel in an inert-gas or a nitrogen-gas atmosphere; a second step of supplying the nitrogen material gas into the vessel space; a third step of heating the melt holding vessel to a crystal growth temperature; a fourth step of keeping a temperature of the melt holding vessel at the crystal growth temperature for a predetermined time; and a fifth step of supplying the nitrogen material gas to the melt holding vessel through the backflow prevention unit so that a pressure in the vessel space is kept at a predetermined pressure.

Preferably, the crystal production unit further includes a reaction vessel. The reaction vessel covers a periphery of the melt holding vessel. The metal Na melt is arranged between the melt holding vessel and the reaction vessel. The production method further comprises a sixth step of putting a metal for the metal melt between the melt holding vessel and the reaction vessel in the inert-gas or the nitrogen-gas atmosphere; and a seventh step of heating a place between the melt holding vessel and the reaction vessel to a temperature at which the metal for the metal melt becomes a liquid.

Preferably, the crystal production unit further includes a pipe connected to the melt holding vessel in communication with the vessel space in the melt holding vessel. The backflow prevention unit further includes a closed vessel connected to the pipe on a side opposite to the vessel space; a through-hole provided at a bottom surface of the closed vessel in a gravity direction; a backflow prevention valve that slides along a side wall of the closed vessel between a position where the through-hole is closed and a position where the through-hole is opened by the differential pressure or the own weight; an outer vessel connected to the pipe between the melt holding vessel and the closed vessel; and a metal melt held in the outer vessel.

The production method further comprises a sixth step of putting a metal for a metal Na melt in the outer vessel in the inert-gas or the nitrogen-gas atmosphere; and a seventh step of heating the outer vessel to a temperature at which the metal for the metal Na melt becomes a liquid.

Preferably, the production method further comprises an eighth step of raising a temperature of the backflow prevention unit to the crystal growth temperature.

Preferably, the metal Na melt is different from the mixed melt.

Preferably, the metal melt is an alkaline metal melt.

Embodiment 11

Figure 41:
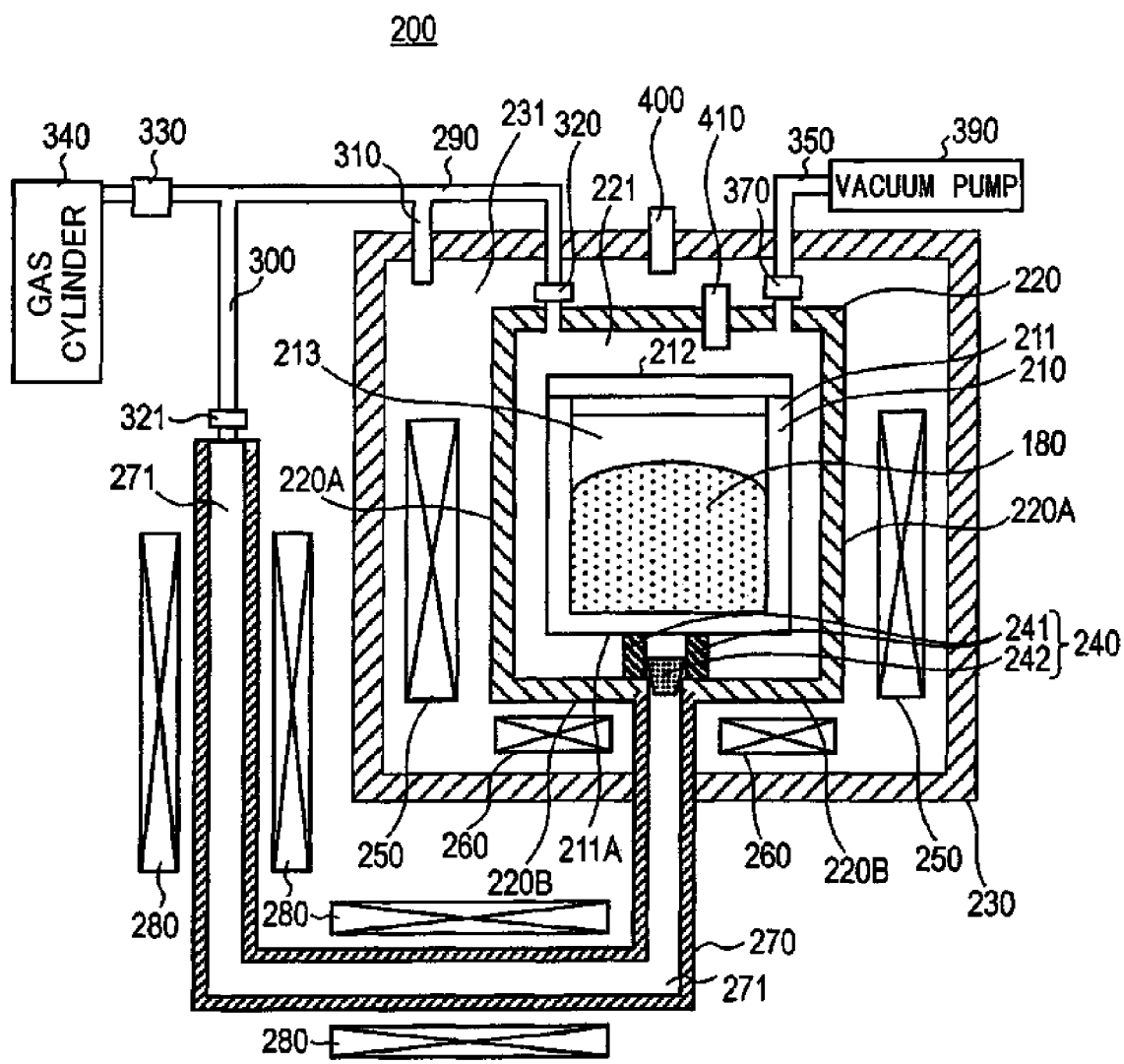
FIG. 41 is a schematic cross-sectional view of a crystal production apparatus according to an embodiment 11 of the present invention.

FIG. 41 is a schematic cross-sectional view of a crystal production apparatus according to an embodiment 11 of the present invention.

As shown in FIG. 41, the crystal production apparatus 200 of the embodiment 11 of the present invention is composed of a melt holding vessel 210, reaction vessels 220 and 230, a backflow prevention unit 240, heaters 250, 260, and 280, a pipe 270, gas supply pipes 290, 300, and 310, valves 320, 321, and 370, a pressure regulator 330, a gas cylinder 340, an exhaust pipe 350, a vacuum pump 390, and pressure sensors 400 and 410.

The melt holding vessel 210 is made of SUS316L and is of a substantially column-shape. The melt holding vessel 210 is composed of a main body part 211 and a cover part 212. The reaction vessel 220 is made of SUS316L and arranged on the periphery of the melt holding vessel 210 at a predetermined gap with the melt holding vessel 210. The reaction vessel 230 is made of SUS316L and arranged on the periphery of the reaction vessel 220 at a predetermined gap with the reaction vessel 220.

The backflow prevention unit 240 is provided between the melt holding vessel 210 and the reaction vessel 220 and includes a pair of guides 241 and a backflow prevention valve 242. The pair of guides 241 and the backflow prevention valve 242 are made of SUS316L.

The heaters 250 are arranged opposite to an outer peripheral surface 220A of the reaction vessel 220 between the reaction vessels 220 and 230, and the heaters 260 are arranged opposite to a bottom surface 220B of the reaction vessel 220 between the reaction vessels 220 and 230.

The pipe 270 has one end connected to the reaction vessel 220 through the reaction vessel 230 and the other end connected to the gas supply pipe 300. The heaters 280 are provided on the periphery of the pipe 270.

The gas supply pipe 290 has one end connected to the reaction vessel 220 through the valve 320 and the other end connected to the gas cylinder 340 through the pressure regulator 330. The gas supply pipe 300 has one end connected to the pipe 270 through the valve 321 and the other end connected to the gas supply pipe 290. The gas supply pipe 310 has one end connected to the reaction vessel 230 and the other end connected to the gas supply pipe 290.

The valve 320 is attached to the gas supply pipe 290 near the reaction vessel 220. The valve 321 is attached to the gas supply pipe 300 near the pipe 270. The pressure regulator 330 is attached to the gas supply pipe 290 near the gas cylinder 340. The gas cylinder 340 is connected to the gas supply pipe 290.

The exhaust pipe 350 has one end connected to the reaction vessel 220 through the valve 370 and the other end connected to the vacuum pump 390. The valve 370 is attached to the exhaust pipe 350 near the reaction vessel 220. The vacuum pump 390 is connected to the exhaust pipe 350.

The pressure sensor 400 is provided on the reaction vessel 230, and the pressure sensor 410 is provided on the reaction vessel 220.

The melt holding vessel 210 holds a mixed melt 180 of the metal Na and the metal Ga. The reaction vessel 220 covers the periphery of the melt holding vessel 210. The reaction vessel 230 covers the periphery of the reaction vessel 220.

The backflow prevention unit 240 introduces nitrogen gas from a space 271 to a space 221 by a differential pressure between the space 271 in the pipe 270 and the space 221 in the reaction vessel 220 and holds a metal Na vapor and the nitrogen gas in the melt holding vessel 210 and the reaction vessel 220 by the differential pressure between the spaces 221 and 271 and by its own weight.

The heaters 250 heat the melt holding vessel 210 and the reaction vessel 220 from the outer peripheral surface 220A of the reaction vessel 220. The heaters 260 heat the melt holding vessel 210 and the reaction vessel 220 from the bottom surface 220B of the reaction vessel 220.

The pipe 270 supplies the nitrogen gas supplied from the gas cylinder 340 through the pressure regulator 330 and the gas supply pipe 300 to the backflow prevention unit 240.

The gas supply pipe 290 supplies the nitrogen gas supplied from the gas cylinder 340 through the pressure regulator 330 to the reaction vessel 220 through the valve 320. The gas supply pipe 300 supplies the nitrogen gas supplied from the gas cylinder 340 through the pressure regulator 330 to the pipe 270 through the valve 321. The gas supply pipe 310 supplies the nitrogen gas supplied from the gas cylinder 340 through the pressure regulator 330 and the gas supply pipe 290 to the reaction vessel 230.

The valve 320 supplies the nitrogen gas in the gas supply pipe to the reaction vessel 220 or stops supplying the nitrogen gas thereto. The valve 321 supplies the nitrogen gas in the gas supply pipe 300 to the pipe 270 or stops supplying the nitrogen gas thereto. The pressure regulator 330 supplies the nitrogen gas from the gas cylinder 340 to the gas supply pipes 290, 300, and 310 after setting it at a predetermined pressure.

The gas cylinder 340 holds nitrogen gas. The exhaust pipe 350 allows the gas in the reaction vessel 220 to pass through to the vacuum pump 390. The valve 370 causes the reaction vessel 220 and the exhaust pipe 350 to be spatially connected or causes the reaction vessel 220 and the exhaust pipe 350 to be spatially interrupted.

The vacuum pump 390 evacuates the reaction vessel 220 through the exhaust pipe 350 and the valve 370.

The pressure sensor 400 detects the pressure in the reaction vessel 230, and the pressure sensor 410 detects the pressure in the reaction vessel 220.

Figure 42A:
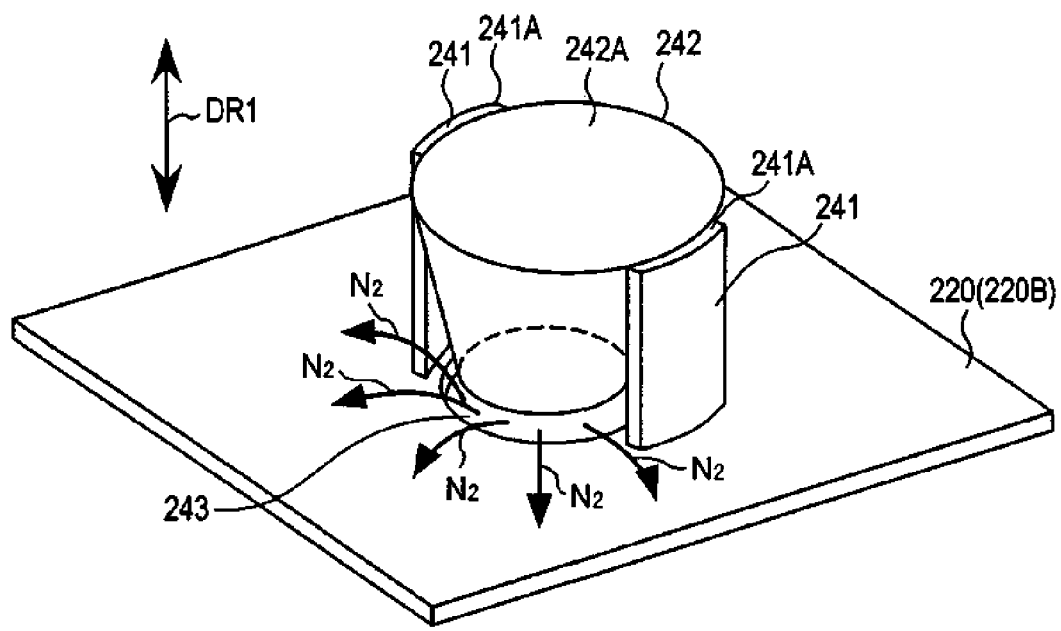
FIG. 42A is a perspective view (1) of a backflow prevention unit as shown in FIG. 41.
Figure 42B:
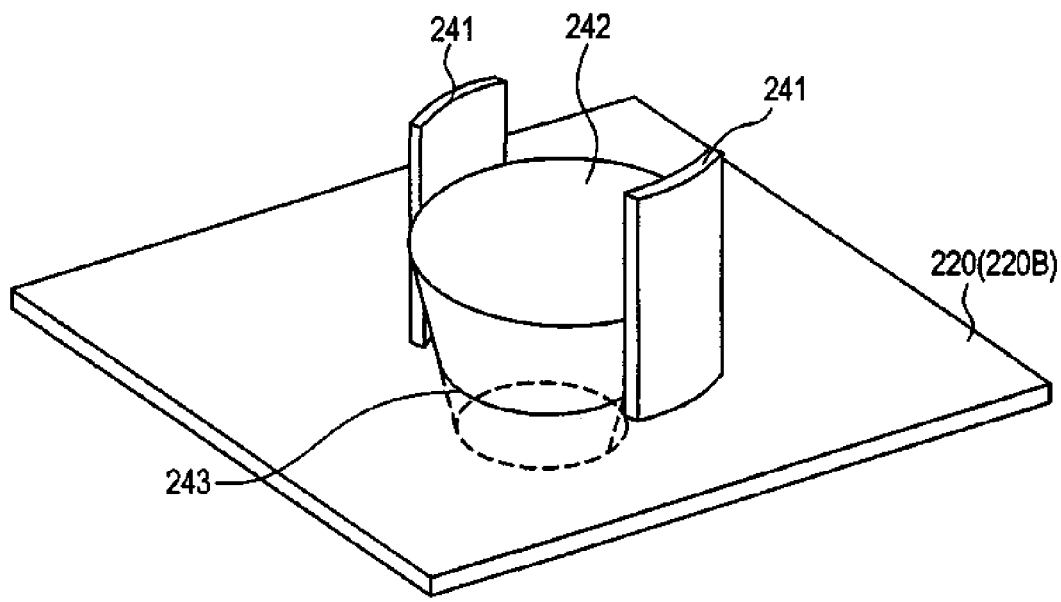
FIG. 42B is a perspective view (2) of the backflow prevention unit as shown in FIG. 41.

FIGS. 42A and 42B are perspective views of the backflow prevention unit 240 as shown in FIG. 41. FIG. 42A shows where the backflow prevention valve 242 of the backflow prevention unit 240 is moved to the melt holding vessel 210 sides and FIG. 42B shows where the backflow prevention valve 242 is moved to the pipe 270 side.

As shown in FIG. 42A, the backflow prevention unit 240 further includes a through-hole 243, in addition to the pair of guides 241 and the backflow prevention valve 242. The though-hole 243 is provided at the connection between the reaction vessel 220 and the pipe 270 so as to pierce through the bottom surface 220B of the reaction vessel 220.

The pair of guides 241 are provided on each side of the through-hole 243. The backflow prevention valve 242 slides along the pair of guides 241 in the gravity directions DR1. Top surfaces 241A of the pair of guides 241 are in contact with a bottom surface 211A (see FIG. 41) of the main body part 211 of the melt holding vessel 210, and as the backflow prevention valve 242 is moved along the pair of guides 241 up to the position where a top surface 242A of the backflow prevention valve 242 comes in contact with the bottom surface 211A of the main body part 211 of the melt holding vessel 210, the through-hole 243 is opened.

Since the pressure in the pipe 270 is higher than that in the reaction vessel 220 if the backflow prevention valve 242 is moved up to the position where the top surface 242A of the backflow prevention valve 242 comes into contact with the bottom surface 211A of the main body part 211 of the melt holding vessel 210, nitrogen gas $N_2$ is diffused from the pipe 270 into the reaction vessel 220 in a case where the through-hole 243 is opened. Accordingly, the metal Na vapor in the space 221 of the reaction vessel 220 is blocked by the flow of the nitrogen gas $N_2$, and the diffusion of the metal Na vapor from the reaction vessel 220 to the pipe 270 is suppressed.

If the pressure in the reaction vessel 220 becomes higher than that in the pipe 270, the backflow prevention valve 242 is moved in the direction of the pipe 270 from the bottom surface 211A of the main body part 211 of the melt holding vessel 210, causing the through-hole 243 to be closed. Furthermore, if the pressure in the reaction vessel 220 is almost the same as that in the pipe 270, the backflow prevention valve 242 is moved in the direction of the pipe 270 by its own weight, causing the through-hole 243 to be closed (see FIG. 42B).

Accordingly, by the differential pressure between the reaction vessel 220 and the pipe 270 and by its own weight, the backflow prevention valve 242 is moved in the gravity directions DR between the position where the through-hole 243 is closed and that where the through-hole 243 is opened.

Since the pair of guides 241 are made of SUS316L like the reaction vessel 220, they are connected to the reaction vessel 220 by welding. When the pair of guides 241 are welded to the reaction vessel 220, the backflow prevention valve 242 is put between the pair of guides 241, and then the melt holding vessel 210 is placed on the pair of guides 241. Accordingly, there is completed a mechanism in which the bottom surface 211A of the main body part 211 of the melt holding vessel 210 comes in contact with the top surfaces 241A of the pair of guides 241 and the backflow prevention valve 242 is moved along the pair of guides 241 between the position where the through-hole 243 is closed and that where the through-hole 243 is opened.

In growing GaN crystals using the crystal production apparatus 200, a glove box is used to put the metal Na and the metal Ga in the melt holding vessel 210 in an Ar-gas atmosphere, and the melt holding vessel 210 and the reaction vessel 220 are set in the reaction vessel 230 of the crystal production apparatus 200 with the space 213 in the melt holding vessel 210 and the space 221 in the reaction vessel 220 filled with Ar gas.

Then, the valve 370 is opened to cause the vacuum pump 390 to evacuate the reaction vessel 220 down to a predetermined pressure (equal to or lower than 0.133 Pa) through the exhaust pipe 350. In this case, in the melt holding vessel 210, the cover part 212 is just placed on the main body part 211 and a gap is present between the main body part 211 and the cover part 212. As a result, the evacuation of the reaction vessel 220 causes the melt holding vessel 210 also to be evacuated.

Thereafter, when the pressure sensor 410 detects that the pressures in the spaces 213 and 221 have become the predetermined pressure, the valve 370 is closed, the valves 320 and 321 are opened, and nitrogen gas is supplied from the gas cylinder 340 to the melt holding vessel 210 and the reaction vessels 220 and 230 through the gas supply pipes 290, 300, and 310. In this case, the nitrogen gas is supplied to the melt holding vessel 210 and the reaction vessels 220 and 230 with the pressure regulator 330 so that the pressures in the melt holding vessel 210 and the reaction vessel 220 and 230 become about atmospheric pressure.

When the pressures in the reaction vessels 220 and 230 detected by the pressure sensors 400 and 410 become about atmospheric pressure, the valves 320 and 321 are closed and the valve 370 is opened to cause the vacuum pump 390 to evacuate the melt holding vessel 210 and the reaction vessel 220 down to a predetermined pressure (0.133 Pa).

Then, the evacuation of the melt holding vessel 210 and the reaction vessel 220 and the supplying of the nitrogen gas into the melt holding vessel 210 and the reaction vessel 220 are alternately repeated several times.

Then, the nitrogen gas is supplied to the melt holding vessel 210 and the reaction vessels 220 and 230 with the pressure regulator 330 so that the pressures in the melt holding vessel 210 and the reaction vessels 220 and 230 become 10 through 50 times atmospheric pressure.

Then, the valve 320 is closed when the pressure detected by the pressure sensors 400 and 410 becomes 10 through 50 times atmospheric pressure.

When the supplying of the nitrogen gas into the melt holding vessel 210 and the reaction vessels 220 and 230 is completed, the melt holding vessel 210 and the reaction vessel 220 are heated to 800° C. by the heaters 250 and 260, and then the temperatures of the melt holding vessel 210 and the reaction vessel 220 are kept at 800° C. for several tens to several hundreds of hours.

The metal Na and the metal Ga put in the melt holding vessel 210 are melted in the process of heating the melt holding vessel 210, thereby generating the mixed melt 180 in the melt holding vessel 210. When the temperature of the melt holding vessel 210 reaches 800° C., GaN crystals start growing in the mixed melt 180. Then, as the growth of GaN crystals progresses, the metal Na is vaporized from the mixed melt 180, and the metal Na vapor and the nitrogen gas are mixed together in the space 213. In this case, the pressure of the metal Na vapor in the space 213 is 0.45 of atmospheric pressure.

Then, the metal Na vapor in the space 213 is diffused into the space 221 through the gap between the main body part 211 and the cover part 212, and the metal Na vapor and the nitrogen gas are mixed together also in the space 221.

Since the backflow valve 242 is closed if the pressure in the space 221 is higher than that in the space 271 (see FIG. 42B), the metal Na vapor in the space 221 is not diffused into the space 271 in the pipe 270.

Furthermore, as the growth of GaN crystals progresses, the nitrogen gas in the space 213 is consumed. If the pressure in the melt holding vessel 210 (=pressure in the reaction vessel 220) becomes lower than that in the pipe 270, the backflow prevention valve 242 is moved to the melt holding vessel 210 side along the guides 241, and the nitrogen gas is introduced from the pipe 270 into the reaction vessel 220 and the melt holding vessel 210 through the through-hole 243. In this case, since the flow of the nitrogen-gas $N_2$ is generated from the pipe 270 side to the reaction vessel 220 side, the diffusion of the metal Na vapor in the space 221 into the space 271 will be suppressed (see FIG. 42A).

Figure 43:
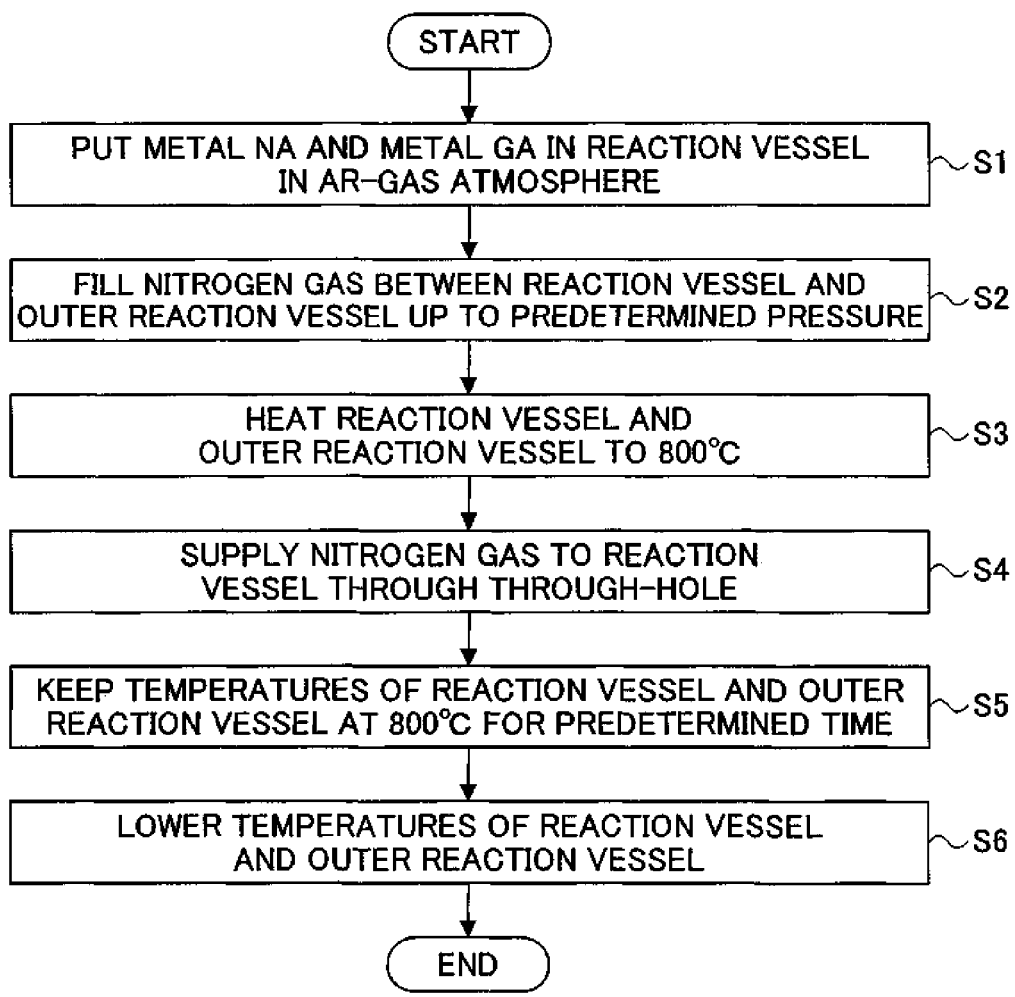
FIG. 43 is a flowchart of the embodiment 1 for describing a method of producing GaN crystals.

FIG. 43 is a flowchart of the embodiment 11 for describing a method of producing GaN crystals.

As shown in FIG. 43, when a series of operations are started, the melt holding vessel 210 and the reaction vessel 220 are put in a glove box filled with Ar gas. Then, the metal Na and the metal Ga are put in the melt holding vessel 210 in an Ar-gas atmosphere (step S1). In this case, the metal Na and the metal Ga with the molar ratio of 5:5 are put in the melt holding vessel 210. Note that Ar gas has a water amount equal to or smaller than 10 ppm and an oxygen amount equal to or smaller than 10 ppm (the same applies to the description below).

Then, the melt holding vessel 210 and the reaction vessel 220 are set in the reaction vessel 230 of the crystal production apparatus 200 with the melt holding vessel 210 and the reaction vessel 220 filled with Ar gas.

Subsequently, the valve 370 is opened to cause the vacuum pump 390 to evacuate the Ar gas filling in the melt holding vessel 210 and the reaction vessel 220. After the melt holding vessel 210 and the reaction vessel 220 are evacuated down to a predetermined pressure (equal to or lower than 0.133 Pa) by the vacuum pump 390, the valve 370 is closed and the valves 320 and 321 are opened to supply the nitrogen gas from the gas cylinder 340 into the melt holding vessel 210 and the reaction vessel 220 through the gas supply pipes 290 and 300. In this case, the nitrogen gas is supplied to the melt holding vessel 210 and the reaction vessel 220 with the pressure regulator 330 so that the pressures in the melt holding vessel 210 and the reaction vessel 220 become about atmospheric pressure.

Then, when the pressure in the reaction vessel 220 detected by the pressure sensor 410 becomes about atmospheric pressure, the valves 320 and 321 are closed and the valve 370 is opened to cause the vacuum pump 390 to evacuate the nitrogen gas filling in the melt holding vessel 210 and the reaction vessel 220. In this case also, the melt holding vessel 210 and the reaction vessel 220 are evacuated down to a predetermined pressure (equal to or lower than 0.133 Pa) by the vacuum pump 390.

Then, the evacuation of the melt holding vessel 210 and the reaction vessel 220 and the supplying of the nitrogen gas into the melt holding vessel 210 and the reaction vessel 220 are alternately repeated several times.

Subsequently, after the melt holding vessel 210 and the reaction vessel 220 are evacuated down to the predetermined pressure by the vacuum pump 390, the valve 370 is closed and the valves 320 and 321 are opened to supply the nitrogen gas into the melt holding vessel 210 and the reaction vessel 220 with the pressure regulator 330 so that the pressures in the melt holding vessel 210 and the reaction vessel 220 become 10 through 50 times atmospheric pressure (step S2).

In this case, if the pressure in the pipe 270 is higher than that in the reaction vessel 220, the backflow prevention valve 242 is moved to the melt holding vessel 210 side and the nitrogen gas is supplied to the reaction vessel 22 also from the pipe 270.

Furthermore, the nitrogen gas supplied to the reaction vessel 220 is filled also into the melt holding vessel 210 through the gap between the main body part 211 and the cover part 212. When the pressures in the spaces 221 and 231 detected by the pressure sensors 400 and 410 become 10 through 50 times atmospheric pressure, the valve 320 is closed. At this time, the pressures in the spaces 213, 221, and 231 become 10 through 50 times atmospheric pressure.

Subsequently, the melt holding vessel 210 and the reaction vessel 220 are heated up to 800° C. by the heaters 250 and 260 (step S3). In this case, the metal Na and the metal Ga in the melt holding vessel 210 are melted in the process of heating the melt holding vessel 210 and the reaction vessel 220, thereby generating the mixed melt 180 in the melt holding vessel 210. Then, the nitrogen gas in the space 213 is taken into the mixed melt 180 and reacted with the Na to start growing GaN crystals in the mixed melt 180.

Then, as the growth of GaN crystals progresses, the nitrogen gas and the metal Na vapor are mixed together in the spaces 213 and 221. Subsequently, when the nitrogen gas in the space 213 is consumed to thereby reduce the nitrogen gas in the space 213, the pressure P1 in the spaces 213 and 221 becomes lower than the pressure P2 in the space 271 in the pipe 270 (P1<P2) to generate a differential pressure between the spaces 213 and 221 and the space 271. As a result, the backflow-prevention valve 242 is moved to the melt holding vessel 210 side, and the nitrogen gas in the space 271 is sequentially supplied to the spaces 221 and 213 through the through-hole 243 (step S4).

Subsequently, the temperatures of the melt holding vessel 210 and the reaction vessels 220 and 230 are kept at 800° C. for predetermined hours (several tens to several hundreds of hours) (step S5). Accordingly, large-sized GaN crystals are grown. The GaN crystals are column-shaped GaN crystals grown in the c-axis (<0001>) direction and are defect-free crystals.

Then, the temperatures of the melt holding vessel 210 and the reaction vessels 220 and 230 are lowered (step S6), thus completing and the production of GaN crystals.

Although the temperature at the area where the backflow prevention valve 242 is provided is also raised to high temperatures of about 800° C. in the production of GaN crystals using the crystal production apparatus 200, the pair of guides 241 and the backflow valve 242 stably operate without being broken even if they are raised to high temperatures of about 800° C. because they are made of SUS316L like the melt holding vessel 210 and the reaction vessel 220.

Accordingly, the present invention is characterized in that the backflow prevention valve withstanding high temperatures of about 800° C. is used to suppress the diffusion of the metal Na vapor vaporized from the mixed melt 180 in the melt holding vessel 210 into the pipe 270 and the nitrogen gas in the pipe 270 is supplied to the reaction vessel 220 and the melt holding vessel 210 by the differential pressure between the spaces 271 and 221.

With these characteristics, the metal Na vapor is confined in the spaces 213 and the 221, thus making it possible to suppress the vaporization of the metal Na from the mixed melt 180. As a result, it is possible to stabilize the molar ratio of the metal Na to the metal Ga in the mixed melt 180 and produce large-sized GaN crystals.

Note that the pressure regulator 330 and the gas cylinder 340 constitute a "gas supply unit."

Furthermore, the space 271 constitutes an "outer space."

Embodiment 12

Figure 44:
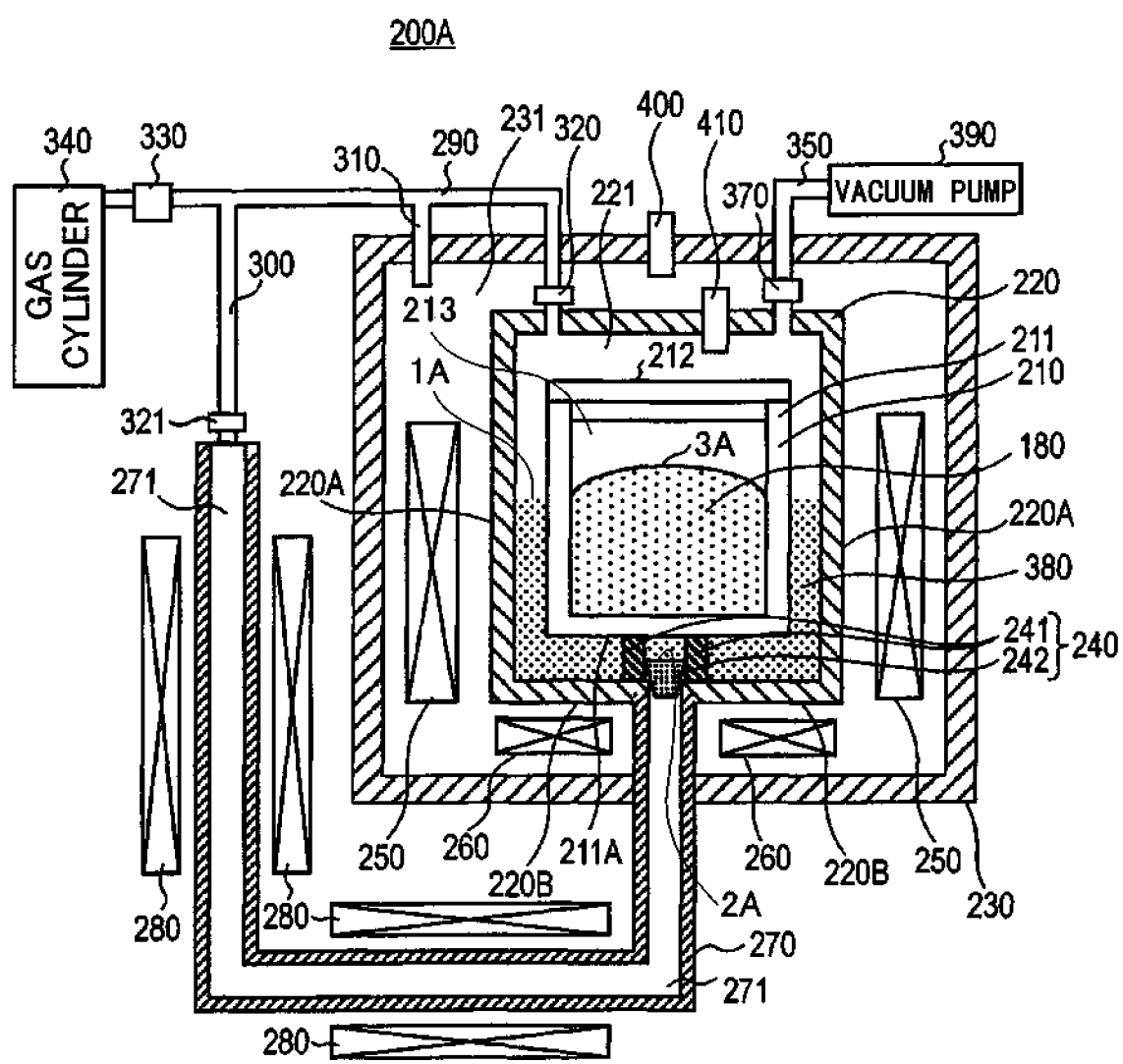
FIG. 44 is a schematic cross-sectional view of a crystal production apparatus of an embodiment 12.

FIG. 44 is a schematic cross-sectional view of a crystal production apparatus of an embodiment 12.

As shown in FIG. 44, the crystal production apparatus 200A of the embodiment 12 is formed by adding a metal Na melt 380 to the crystal production apparatus 200 as shown in FIG. 41, and other components are the same as those of the crystal production apparatus 200.

The metal Na melt 380 is formed of a metal Na melt and held between the melt holding vessel 210 and the reaction vessel 220. In the process of growing GaN crystals, the metal Na melt 380 vaporizes the metal Na into the space 221 and supplies the nitrogen gas introduced from the pipe 270 through the backflow prevention unit 240 to the space 221.

In growing GaN crystals using the crystal production apparatus 200A, a glove box is used to put the metal Na and the metal Ga in the melt holding vessel 210 in an Ar-gas atmosphere and put the metal Na between the melt holding vessel 210 and the reaction vessel 220. Then, the melt holding vessel 210 and the reaction vessel 220 are set in the reaction vessel 230 of the crystal production apparatus 200A with the space 213 in the melt holding vessel 210 and the space 221 in the reaction vessel 220 filled with Ar gas.

Then, after the valve 370 is opened to cause the vacuum pump 390 to evacuate the melt holding vessel 210 and the reaction vessel 220 down to a predetermined pressure (equal to or lower than 0.133 Pa) through the exhaust pipe 350, the valve 370 is closed and the valves 320 and 321 are opened to supply the nitrogen gas from the gas cylinder 340 into the melt holding vessel 210 and the reaction vessel 220 through the gas supply pipes 290 and 300. In this case, the nitrogen gas is supplied to the melt holding vessel 210 and the reaction vessel 220 with the pressure regulator 330 so that the pressures in the melt holding vessel 210 and the reaction vessel 220 become about atmospheric pressure.

Then, when the pressure in the reaction vessel 220 detected by the pressure sensor 410 becomes about atmospheric pressure, the valves 320 and 321 are closed and the valve 370 is opened to cause the vacuum pump 390 to evacuate the nitrogen gas filling in the melt holding vessel 210 and the reaction vessel 220. In this case also, the melt holding vessel 210 and the reaction vessel 220 are evacuated down to a predetermined pressure (equal to or lower than 0.133 Pa) by the vacuum pump 390.

Then, the evacuation of the melt holding vessel 210 and the reaction vessel 220 and the supplying of the nitrogen gas into the melt holding vessel 210 and the reaction vessel 220 are alternately repeated several times.

Subsequently, after the melt holding vessel 210 and the reaction vessel 220 are evacuated down to the predetermined pressure by the vacuum pump 390, the valve 370 is closed and the valves 320 and 321 are opened to supply the nitrogen gas into the melt holding vessel 210 and the reaction vessel 220 with the pressure regulator 330 so that the pressures in the melt holding vessel 210 and the reaction vessel 220 become 10 through 50 times atmospheric pressure.

Then, the valve 320 is closed when the pressure detected by the pressure sensors 400 and 410 becomes 10 through 50 times atmospheric pressure. At this time, since the temperatures of the melt holding vessel 210 and the reaction vessel 220 are room temperature, the metal Na between the melt holding vessel 210 and the reaction vessel 220 is a solid. Accordingly, if the pressure in the pipe 270 is higher than that in the reaction vessel 220, the backflow prevention valve 242 is moved to the melt holding vessel 210 side and the nitrogen gas is supplied to the reaction vessel 22 also from the pipe 270 through the through-hole 243. Furthermore, the nitrogen gas in the space 221 is supplied also into the space 213 in the melt holding vessel 210 through the gap between the main body part 211 and the cover part 212. As a result, the pressures in the spaces 213, 221, and 231 are easily equalized to one another.

When the supplying of the nitrogen gas into the melt holding vessel 210 and the reaction vessels 220 and 230 is completed, the melt holding vessel 210 and the reaction vessel 220 are heated to 800° C. by the heaters 250 and 260, and then the temperatures of the melt holding vessel 210 and the reaction vessel 220 are kept at 800° C. for several tens to several hundreds of hours.

The metal Na and the metal Ga put in the melt holding vessel 210 are melted in the process of heating the melt holding vessel 210, thereby generating the mixed melt 180 in the melt holding vessel 210. Furthermore, the metal Na between the melt holding vessel 210 and the reaction vessel 220 is melted in the process of heating the melt holding vessel 210 and the reaction vessel 220, thereby generating the metal Na melt 380 between the melt holding vessel 210 and the reaction vessel 220. As a result, the nitrogen gas present in the spaces 213 and 221 in the melt holding vessel 210 and the reaction vessel 220 comes in contact with the mixed melt 180 and the metal Na melt 380, respectively, and are confined in the spaces 213 and 221 because the valves 320 and 370 are closed.

Then, as the growth of GaN crystals progresses, the metal Na is vaporized from the mixed melt 180 and the metal Na melt 380, and the metal Na vapor and the nitrogen gas are confined in the spaces 213 and 221. In this case, the pressure of the metal Na vapor in the space 213 is 0.45 of atmospheric pressure. Furthermore, as the growth of GaN crystals progresses, the nitrogen gas in the space 213 is consumed. If the pressure P3 in the melt holding vessel 210 is lower than the pressure P4 in the pipe 270 (P3<P4), the backflow prevention valve 242 is moved to the melt holding vessel 210 side by a differential pressure between the pressure P4 in the pipe 270 and the pressure P3 in the reaction vessel 220, and the nitrogen gas in the pipe 270 is supplied to the metal Na melt 380 through the through-hole 243, moved in the metal Na melt 380 in a foamed state, and supplied to the space 221 in the reaction vessel 220. Thus, the nitrogen gas is stably supplied to the spaces 221 and 213.

In the crystal production apparatus 200A, since the metal Na melt 380 is present between the backflow prevention valve 242 and the space 221 even if the backflow prevention valve 242 is moved to the melt holding vessel 210 side to open the through-hole 243, it is possible to stabilize the molar ratio of the metal Na to the metal Ga in the mixed melt 180 without diffusing the metal Na vapor in the space 221 into the pipe 270.

Note that, if the through-hole 243 has a size of about several tens of μm where the backflow prevention valve 242 is moved to the melt holding vessel 210 side, the metal Na melt 380 is held between the melt holding vessel 210 and the reaction vessel 220 by the surface tension. Accordingly, in the crystal production apparatus 200A, the backflow prevention valve 242 is so designed that the through-hole 243 has a size of about several tens of μm where the backflow prevention valve 242 is moved to the melt holding vessel 210 side until the top surface 242A of the backflow prevention valve 242 comes in contact with the bottom surface 211A of the main body part 211 of the melt holding vessel 210.

Figure 45:
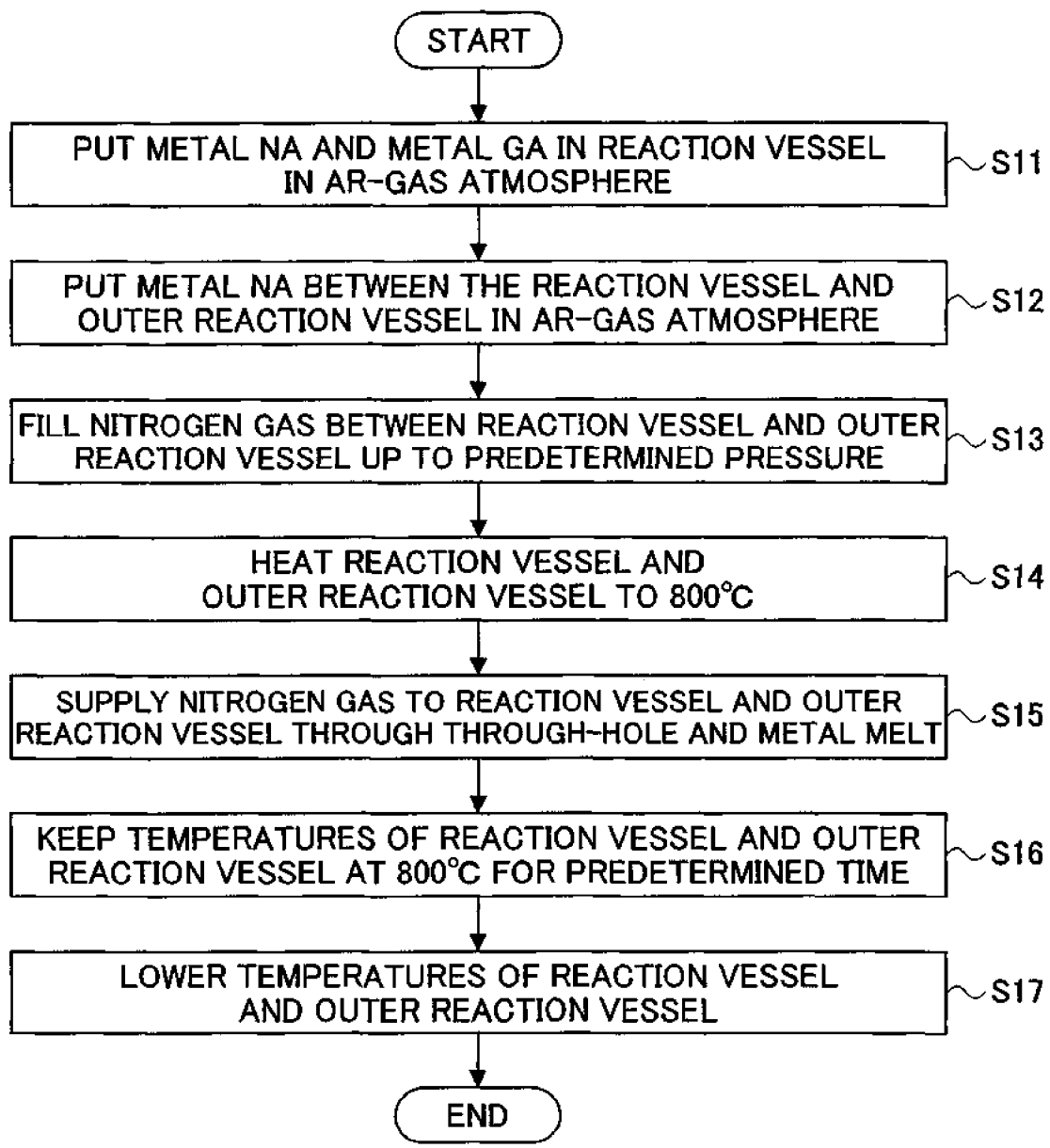
FIG. 45 is a flowchart of the embodiment 2 for describing a method of producing GaN crystals.

FIG. 45 is a flowchart of the embodiment 12 for describing a method of producing GaN crystals. As shown in FIG. 45, when a series of operations are started, the melt holding vessel 210 and the reaction vessel 220 are put in a glove box filled with Ar gas. Then, the metal Na and the metal Ga are put in the melt holding vessel 210 in an Ar-gas atmosphere (step S11). In this case, the metal Na and the metal Ga with the molar ratio of 5:5 are put in the melt holding vessel 210.

Then, the metal Na is put between the melt holding vessel 210 and the reaction vessel 220 in an Ar-gas atmosphere (step S12). Then, the melt holding vessel, 210 and the reaction vessel 220 are set in the reaction vessel 230 of the crystal production apparatus 200A with the melt holding vessel 210 and the reaction vessel 220 filled with Ar gas.

Subsequently, the evacuation of the melt holding vessel 210 and the reaction vessel 220 and the supplying of the nitrogen gas into the melt holding vessel 210 and the reaction vessel 220 are alternately repeated several times by the above operations. Then, the valve 370 is opened to cause the vacuum pump 390 to evacuate the nitrogen gas filling in the melt holding vessel 210 and the reaction vessel 220. After the melt holding vessel 210 and the reaction vessel 220 are evacuated down to a predetermined pressure (equal to or lower than 0.133 Pa) by the vacuum pump 390, the valve 370 is closed and the valves 320 and 321 are opened to supply the nitrogen gas from the gas cylinder 340 to the melt holding vessel 210 and the reaction vessel 220 through the gas supply pipes 290 and 300. Then, the nitrogen gas is supplied to the melt holding vessel 210 and the reaction vessel 220 with the pressure regulator 330 so that the pressures in the melt holding vessel 210 and the reaction vessel 220 become 10 through 50 times atmospheric pressure (step S13).

In this case, the metal Na between the melt holding vessel 210 and the reaction vessel 220 is a solid. Accordingly, if the pressure in the pipe 270 is higher than that in the reaction vessel 220, the nitrogen gas is supplied from the space 271 in the pipe 270 to the space 221 in the reaction vessel 220 and the space 213 in the melt holding vessel 210 through the backflow prevention unit 240. Since the cover part 212 is just placed on the main body part 211 and so a gap is present between the main body part 211 and the cover part 212, the nitrogen gas supplied to the space 221 is supplied also into the space 213 in the melt holding vessel 210 through the gap. Then, the valve 320 is closed when the pressures in the spaces 221 and 231 detected by the pressure sensors 400 and 410 become 10 through 50 times atmospheric pressure. At this timer the pressures in the spaces 213, 221, and 231 become 10 through 50 times atmospheric pressure.

Subsequently, the melt holding vessel 210 and the reaction vessel 220 are heated up to 800° C. by the heaters 250 and 260 (step S14). In this case, since the metal Na held between the melt holding vessel 210 and the reaction vessel 220 has a melting point of about 98° C., it is melted in the process of heating the melt holding vessel 210 and the reaction vessel 220 to 800° C. so as to be formed into the metal Na melt 380. As a result, two gas-liquid interfaces 1A and 2A are generated (see FIG. 44). The gas-liquid interface 1A is positioned at an interface between the metal Na melt 380 and the space 221 in the reaction vessel 220, and the gas-liquid interface 2A is positioned at an interface between the metal Na melt 380 and the backflow prevention valve 242.

Furthermore, when the temperatures of the melt holding vessel 210 and the reaction vessel 220 are raised to 800° C., the metal Na and the metal Ga in the melt holding vessel 210 also become liquid, thereby generating the mixed melt 180 of the metal Na and the metal Ga. Then, the nitrogen gas in the space 213 is taken into the mixed melt 180 and reacted with Na to start growing GaN crystals in the mixed melt 180.

Subsequently, as the growth of GaN crystals progresses, the metal Na is vaporized from the mixed melt 180 and the metal Na melt 380, resulting in a metal Na vapor and the nitrogen gas being mixed together in the spaces 213 and 221. Furthermore, as the growth of GaN crystals progresses, the nitrogen gas in the space 213 is consumed to thereby reduce the nitrogen gas in the space 213. The pressures P3 in the spaces 213 and 221 become lower than the pressure P4 in the space 271 in the pipe 270 (P3<P4) to generate a differential pressure between the spaces 213 and 221 and the space 271. As a result, the backflow prevention valve 242 is moved to the melt holding vessel 210 side along the pair of guides 241, and the nitrogen gas in the space 271 is sequentially supplied to the spaces 221 and 213 through the through-hole 243 and the metal Na melt 380 (=metal Na melt) (step S15).

Subsequently, the temperatures of the melt holding vessel 210 and the reaction vessel 220 are kept at 800° C. for predetermined hours (several tens to several hundreds of hours) (step S16). Accordingly, large-sized GaN crystals are grown. The GaN crystals are column-shaped GaN crystals grown in the c-axis (<0001>) direction and are defect-free crystals.

Then, the temperatures of the melt holding vessel 210 and the reaction vessel 220 are lowered (step S17), thus completing and the production of GaN crystals.

Note that, in the crystal production apparatus, the heaters 250 heat the melt holding vessel 210 and the reaction vessel 220 so that the temperature T1 at the gas-liquid interface 1A between the space 221 in the reaction vessel 220 communicating with the space 213 in the melt holding vessel 210 and the metal Na melt 380 or at a point near the gas-liquid interface 1A is approximately equalized to the temperature T2 at the gas-liquid interface 3A between the space 213 and the mixed melt 180 or at a point near the gas-liquid interface 3A.

In this manner, by making the temperature T1 at the gas-liquid interface 1A or at the point near the gas-liquid interface 1A approximately equalized to the temperature T2 at the gas-liquid interface 3A or at the point near the gas-liquid interface 3A, the metal Na vapor vaporized from the metal Na melt 380 and the metal Na vapor vaporized from the mixed melt 180 are in equilibrium with each other in the spaces 213 and 221, thus making it possible to suppress the diffusion of the metal Na vapor in the space 213 into the space 221. As a result, it is possible to reliably suppress the vaporization of the metal Na from the mixed melt 180 to stabilize the molar ratio of the metal Na to the metal Ga in the mixed melt 180 and stably produce large-sized GaN crystals.

Furthermore, in the crystal production apparatus 200A, the melt holding vessel 210 and the reaction vessel 220 may be heated so that the temperature T1 becomes higher than the temperature T2. In this case, heaters are further provided between the melt holding vessel 210 and the reaction vessel 220, the melt holding vessel 210 is heated by the heaters provided so that the temperature at the gas-liquid interface 3A or at the point near the gas-liquid interface 3A is raised to the temperature T2, and the temperature at the gas-liquid interface 1A or at the point near the gas-liquid interface 1A is raised to the temperature T1 by the heaters 250.

In this manner, by making the temperature T1 higher than the temperature T2, the vapor pressure of the metal Na at the gas-liquid interface 1A becomes higher than that of the metal Na at the gas-liquid interface 3A, thereby diffusing the metal Na vapor from the space 221 into the space 213. Accordingly, the concentration of the metal Na vapor in the space 213 becomes high, thus making it possible to further suppress the vaporization of the metal Na from the mixed melt 180. As a result, it is possible to reliably stabilize the molar ratio of the metal Na to the metal Ga in the mixed melt 180 and stably produce large-sized GaN crystals.

Accordingly, in the crystal production apparatus 200A, GaN crystals are preferably produced with the temperature T1 set equal to or higher than the temperature T2.

According to the embodiment 12, in the process of growing GaN crystals, since the metal Na vapor is confined in the spaces 213 and 221 by the metal Na melt 380 and the backflow prevention valve 242 and the nitrogen gas is stably supplied from the pipe 270 to the spaces 213 and 221, it is possible to stabilize the molar ratio of the metal Na to the metal Ga in the mixed melt 180 and stably supply the nitrogen gas to the mixed melt 180. As a result, it is possible to produce large-sized GaN crystals.

Note that, in the embodiment 12, the metal Na melt 380 constitutes the backflow prevention unit 240 together with the pair of guides 241, the backflow prevention valve 242, and the through-hole 243.

Other details are the same as those of FIG. 11.

Embodiment 13

Figure 46:
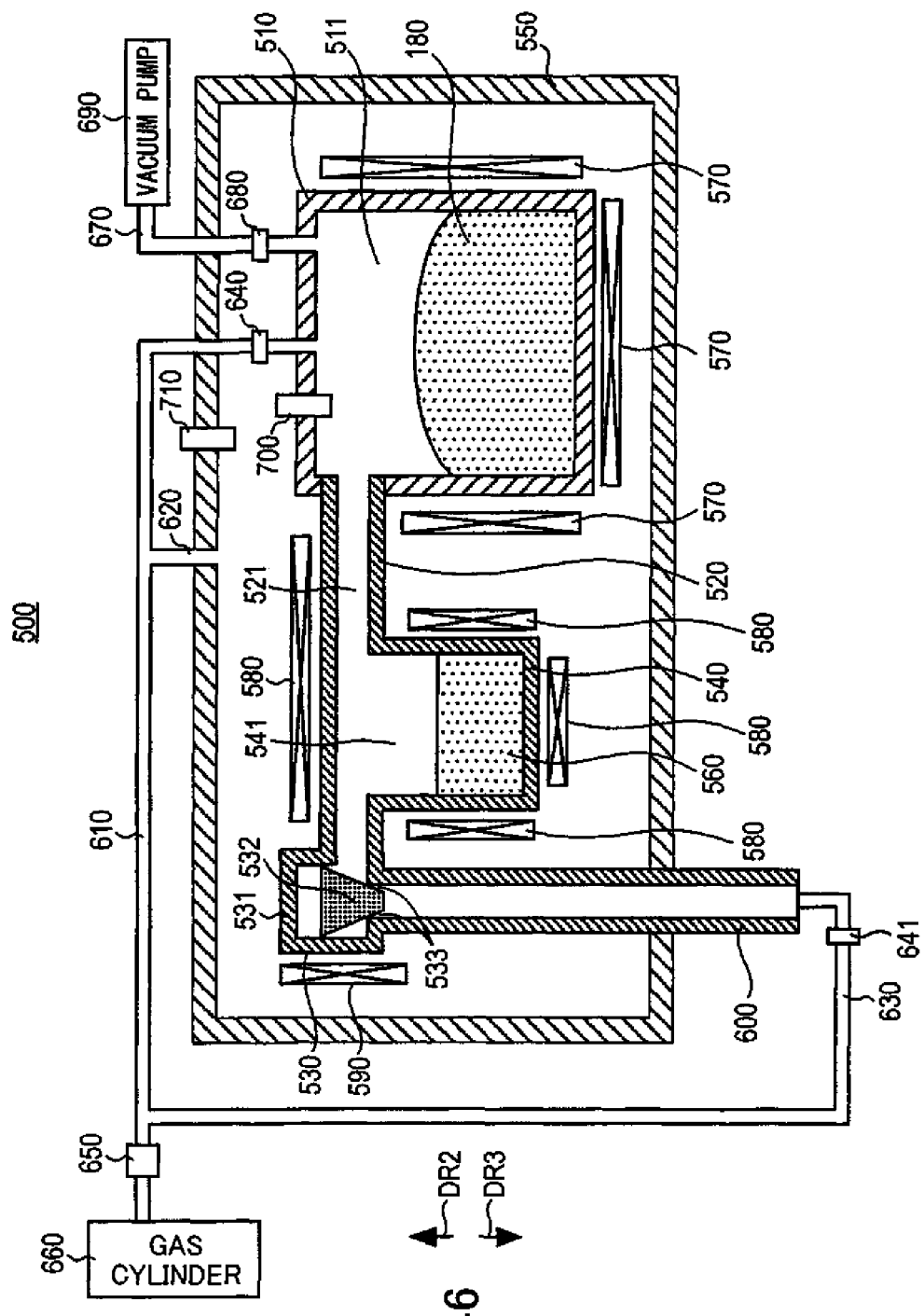
FIG. 46 is a schematic cross-sectional view of a crystal production apparatus of an embodiment 12.

FIG. 46 is a schematic cross-sectional view of a crystal production apparatus according to an embodiment 13.

As shown in FIG. 46, the crystal production apparatus 500 of the embodiment 13 is composed of a melt holding vessel 510, pipes 520 and 600, a backflow prevention unit 530, an outer vessel 540, a reaction vessel 550, a metal Na melt 560, heaters 570, 580, and 590, gas supply pipes 610, 620, and 630, valves 640, 641, and 680, a pressure regulator 650, a gas cylinder 660, an exhaust pipe 670, a vacuum pump 690, and pressure sensors 700 and 710.

The melt holding vessel 510 is made of SUS316L and is of a substantially column-shape. The pipe 520 is made of SUS316L. The pipe 520 has one end connected to the melt holding vessel 510 and the other end connected to the backflow prevention unit 530. The backflow prevention unit 530 is connected to the other end of the pipe 520 and includes a closed vessel 531, a backflow prevention valve 532, and a through-hole 533. The outer vessel 540 is made of SUS316L and is of a substantially column-shape. The outer vessel 540 is connected to an opening provided at the outer peripheral surface of the pipe 520.

The reaction vessel 550 is arranged at a predetermined gap with the melt holding vessel 510, the pipe 520, the backflow prevention unit 530, and the outer vessel 540.

The metal Na melt 560 is held in the outer vessel 540. The heaters 570 are arranged opposite to the outer peripheral surfaces and the bottom surface of the melt holding vessel 510. The heaters 580 are arranged on the periphery of the pipe 520 and the outer vessel 540. The heater 590 is arranged opposite to the closed vessel 531 of the backflow prevention unit 530. The pipe 600 is connected to the through-hole 533 of the backflow prevention unit 530 through the reaction vessel 550.

The gas supply pipe 610 has one end connected to the melt holding vessel 510 through the valve 640 and the other end connected to the gas cylinder 660 through the pressure regulator 650. The gas supply pipe 620 has one end connected to the reaction vessel 550 and the other end connected to the gas supply pipe 610. The gas supply pipe 630 has one end connected to the pipe 600 through the valve 641 and the other end connected to the gas supply pipe 610 on the output side of the pressure regulator 650.

The valve 640 is attached to the gas supply pipe 610 near the melt holding vessel 510. The valve 641 is attached to the gas supply pipe 630 near the pipe 600. The pressure regulator 650 is attached to the gas supply pipe 610 near the gas cylinder 660. The gas cylinder 660 is connected to the gas supply pipe 610.

The exhaust pipe 670 has one end connected to the melt holding vessel 510 through the valve 680 and the other end connected to the vacuum pump 690. The valve 680 is attached to the exhaust pipe 670 near the melt holding vessel 510. The vacuum pump 690 is connected to the exhaust pipe 670.

The pressure sensor 700 is provided on the melt holding vessel 510, and the pressure sensor 710 is provided on the reaction vessel 550.

The melt holding vessel 510 holds the mixed melt 180 of the metal Na and the metal Ga. The backflow prevention unit 530 introduces nitrogen gas from the pipe 600 to the pipe 520 and the melt holding vessel 510 by a differential pressure between the pressure in the pipe 600 and that in the pipe 520 and holds a metal Na vapor and the nitrogen gas in the pipe 520 and the melt holding vessel 510 by a differential pressure between the pressure in the pipe 520 and that in the pipe 600 and by its own weight. The outer vessel 540 holds the metal Na melt 560. The reaction vessel 550 covers the melt holding vessel 510, the pipe 520, the backflow prevention unit 530, the outer vessel 540, and the heaters 570, 580, and 590.

The heaters 570 heat the melt holding vessel 510. The heaters 580 heat the pipe 520 and the outer vessel 540. The heater 590 heats the backflow prevention unit 530.

The pipe 600 supplies the nitrogen gas introduced from the gas cylinder 660 through the pressure regulator 650 and the gas supply pipe 630 to the backflow prevention unit 530.

The gas supply pipe 610 supplies the nitrogen gas introduced from the gas cylinder 660 through the pressure regulator 650 to the melt holding vessel 510. The gas supply pipe 620 supplies the nitrogen gas introduced from the gas cylinder 660 through the pressure regulator 650 to the reaction vessel 550. The gas supply pipe 630 supplies the nitrogen gas introduced through the gas cylinder 660 and the pressure regulator 650 to the pipe 600 through the valve 641.

The valve 640 supplies the nitrogen gas in the gas supply pipe 610 to the melt holding vessel 510 or stops supplying the nitrogen gas thereto. The valve 641 supplies the nitrogen gas in the gas supply pipe 630 to the pipe 600 or stops supplying the nitrogen gas thereto. The pressure regulator 650 supplies the nitrogen gas from the gas cylinder 660 to the gas supply pipes 610, 620, and 630 after setting it at a predetermined pressure.

The gas cylinder 660 holds nitrogen gas. The exhaust pipe 670 allows the gas in the melt holding vessel 510 to pass through to the vacuum pump 690. The valve 680 causes the melt holding vessel 510 and the exhaust pipe 670 to be spatially connected or causes the melt holding vessel 510 and the exhaust pipe 670 to be spatially interrupted.

The vacuum pump 690 evacuates the melt holding vessel 510 through the exhaust pipe 670 and the valve 680.

The pressure sensor 700 detects the pressure in the melt holding vessel 510, and the pressure sensor 710 detects the pressure in the reaction vessel 550.

In the backflow prevention unit 530, if the pressure in the pipe 600 is higher than that in the pipe 520, the backflow prevention valve 532 is moved in the upward direction DR2 along the side walls of the closed vessel 531, causing the through-hole 533 to be opened.

On the other hand, if the pressure in the pipe 600 is lower than that in the pipe 520, the backflow prevention valve 532 is moved in the downward direction DR3 along the side walls of the closed vessel 531, causing the through-hole 533 to be closed.

Furthermore, if the pressure in the pipe 600 is almost the same as that in the pipe 520, the backflow prevention valve 532 is moved in the direction of the pipe 600 by its own weight, causing the through-hole 533 to be closed.

Accordingly, by the differential pressure between the pressure in the pipe 600 and that in the pipe 520 and by its own weight, the backflow prevention valve 532 is moved in the gravity directions DR2 and DR3 between the position where the through-hole 533 is closed and that where the through-hole 533 is opened.

When the backflow prevention valve 532 is moved up to the position where the through-hole 533 is opened, the nitrogen gas is diffused from the pipe 600 into the pipe 520, thus generating the flow of the nitrogen gas from the pipe 600 to the pipe 520. As a result, the diffusion of the metal Na vapor, which is present in the pipe 520, from the pipe 520 to the pipe 600 through the through-hole 533 is suppressed.

Furthermore, when the backflow valve 532 is moved up to the position where the through-hole 533 is closed, the diffusion of the metal Na vapor present in the pipe 520 from the pipe 520 to the pipe 600 is blocked.

In this manner, by the differential pressure between the pressure in the pipe 520 and that in the pipe 600 and by its own weight, the backflow prevention valve 532 supplies the nitrogen gas in the pipe 600 to the pipe 520 and suppresses the diffusion of the metal Na vapor in the pipe 520 into the pipe 600.

In growing GaN crystals using the crystal production apparatus 500, a glove box is used to put the metal Na and the metal Ga in the melt holding vessel 510 in an Ar-gas atmosphere and put the metal Na in the outer vessel 540. Then, the outer vessel 540 is attached to the opening provided at the outer peripheral surface of the pipe 520, and the melt holding vessel 510, the pipe 520, and the outer vessel 540 are set in the reaction vessel 550 of the crystal production apparatus 500 with the space 511 in the melt holding vessel 510, the space 521 in the pipe 520, and the space 541 in the outer vessel 540 filled with Ar gas.

Then, after the valve 680 is opened to cause the vacuum pump 690 to evacuate the melt holding vessel 510, the pipe 520, and the outer vessel 540 down to a predetermined pressure (equal to or lower than 0.133 Pa) through the exhaust pipe 670, the valve 680 is closed and the valves 640 and 641 are opened to supply the nitrogen gas from the gas cylinder 660 into the melt holding vessel 510, the pipe 520, and the outer vessel 540 through the gas supply pipes 610 and 630. In this case, the nitrogen gas is supplied to the melt holding vessel 510, the pipe 520, and the outer vessel 540 so that the pressures in the melt holding vessel 510, the pipe 520, and the outer vessel 540 become about atmospheric pressure.

Then, when the pressure in the melt holding vessel 510 detected by the pressure sensor 700 becomes about atmospheric pressure, the valves 640 and 641 are closed and the valve 680 is opened to cause the vacuum pump 690 to evacuate the nitrogen gas filling in the melt holding vessel 510, the pipe 520, and the outer vessel 540. In this case also, the melt holding vessel 510, the pipe 520, and the outer vessel 540 are evacuated down to a predetermined pressure (equal to or lower than 0.133 Pa) by the vacuum pump 690.

Then, the evacuation of the melt holding vessel 510, the pipe 520, and the outer vessel 540 and the supplying of the nitrogen gas into the melt holding vessel 510, the pipe 520, and the outer vessel 540 are alternately repeated several times.

Subsequently, after the melt holding vessel 510, the pipe 520, and the outer vessel 540 are evacuated down to the predetermined pressure by the vacuum pump 690, the valve 680 is closed and the valves 640 and 641 are opened to supply the nitrogen gas into the melt holding vessel 510, the pipe 520, and the outer vessel 540 with the pressure regulator 650 so that the pressures in the melt holding vessel 510, the pipe 520, and the outer vessel 540 become 10 through 50 times atmospheric pressure.

Then, the valve 640 is closed when the pressure detected by the pressure sensors 700 and 710 becomes 10 through 50 times atmospheric pressure. At this time, since the temperatures of the melt holding vessel 510 and the outer vessel 540 are room temperature, the metal Na and the metal Ga in the melt holding vessel 510 and the metal Na in the outer vessel 540 are a solid. Accordingly, if the pressure in the pipe 600 is higher than those in the pipe 520 and the outer vessel 540, the backflow prevention valve 532 is moved in the upward direction D2, causing the nitrogen gas to be filled in the pipe 520, the outer vessel 540, and the melt holding vessel 510 also from the pipe 600 through the through-hole 533. As a result, the pressures in the spaces 511, 521, 541 are easily equalized to one another.

When the supplying of the nitrogen gas into the melt holding vessel 510, the pipes 520 and 600, the outer vessel 540, and the reaction vessel 550 is completed, the melt holding vessel 510 is heated to 800° C. by the heaters 570 and the pipe 520 and the outer vessel 540 are heated to 800° C. by the heater 580. Also, the backflow prevention unit 530 is heated to 800° C. by the heater. Then, the temperatures of the melt holding vessel 510, the pipe 520, the outer vessel 540, and the backflow prevention unit 530 are kept at 800° C. for several tens to several hundreds of hours.

The metal Na and the metal Ga put in the melt holding vessel 510 are melted in the process of heating the melt holding vessel 510, thereby generating the mixed melt 180 in the melt holding vessel 510. Furthermore, the metal Na put in the outer vessel 540 is melted in the process of heating the outer vessel 540, thereby generating the metal Na melt 560 in the outer vessel 540.

In this case, the backflow prevention valve 532 closes the through-hole 533 by its own weight. Accordingly, since the valves 640 and 680 are closed, the nitrogen gases in the melt holding vessel 510, the pipe 520, and the outer vessel 540 are confined in the spaces 511, 521, and 541.

Then, as GaN crystals start growing in the mixed melt 180 and the growth of GaN crystals progresses, the metal Na is vaporized from the mixed melt 180 and the metal Na melt 560, and the metal Na vapor and the nitrogen gas are confined in the spaces 511, 521, and 541. In this case, the pressure of the metal Na vapor in the space 511 is 0.45 of atmospheric pressure.

Furthermore, as the growth of GaN crystals progresses, the nitrogen gas in the space 511 is consumed. If the pressure P5 in the spaces 511, 521, and 541 becomes lower than the pressure P6 in the pipe 600 (P5<P6), the backflow prevention valve 532 is moved in the upward direction DR2 by the differential pressure between the pressure P6 in the pipe 600 and the pressure P5 in the spaces 511, 521, and 541, and the nitrogen gas in the pipe 600 is supplied to the spaces 511, 521, and 541 through the through-hole 533. Thus, the nitrogen gas is stably supplied to the space 511.

In the crystal production apparatus 500, since the flow of the nitrogen gas is generated from the pipe 600 to the pipe 520 even if the backflow prevention valve 532 is moved in the upward direction DR2 to open the through-hole 533, it is possible to stabilize the molar ratio of the metal Na to the metal Ga in the mixed melt 180 without diffusing the metal Na vapor in the spaces 511, 521, and 541 into the pipe 600.

Figure 47:
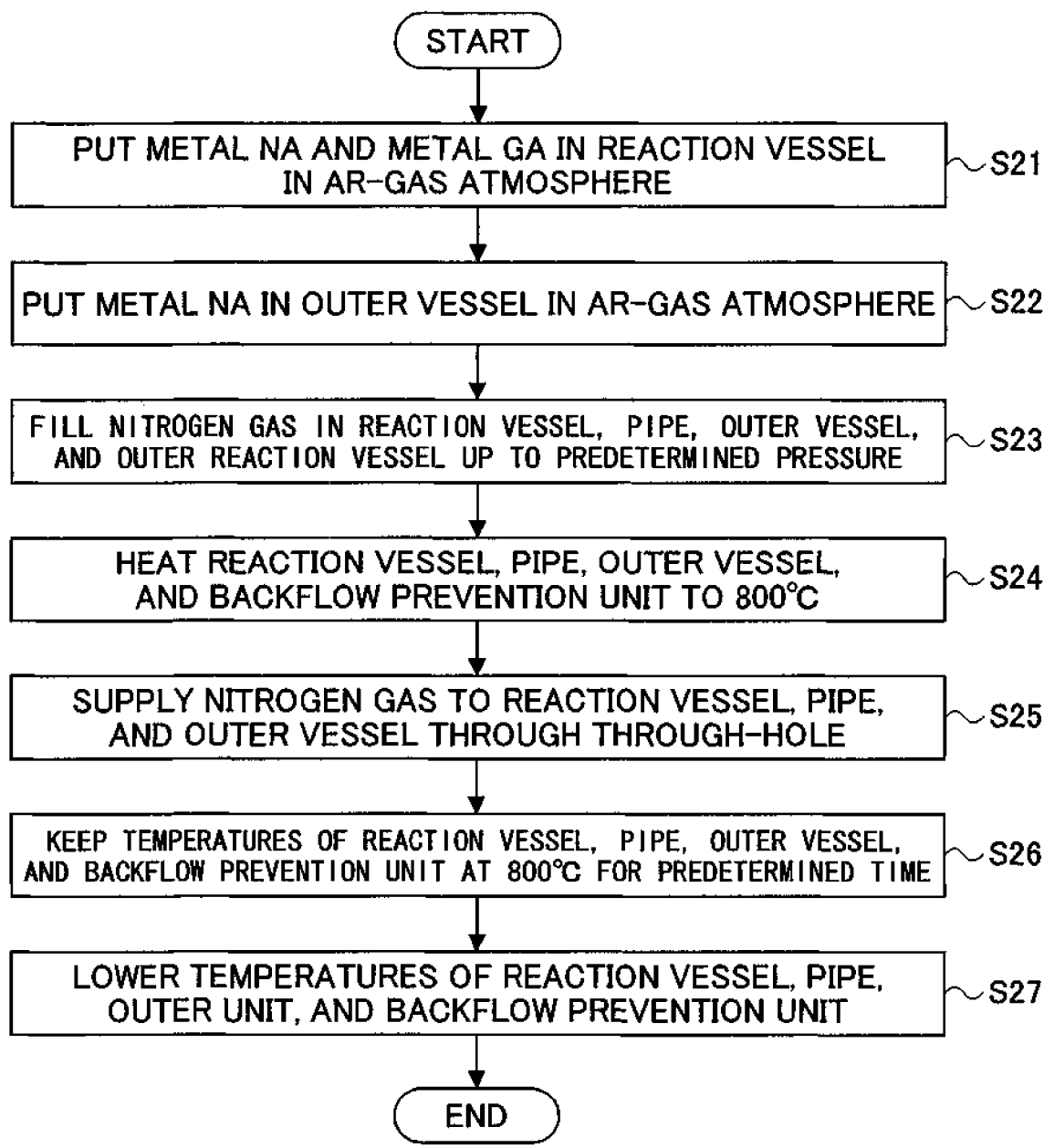
FIG. 47 is a flowchart of the embodiment 3 for describing a method of producing GaN crystals.

FIG. 47 is a flowchart of the embodiment 13 for describing a method of manufacturing GaN crystals.

As shown in FIG. 47, when a series of operations are started, the melt holding vessel 510, the pipe 520, and the outer vessel 540 are put in a glove box filled with Ar gas. Then, the metal Na and the metal Ga are put in the melt holding vessel 510 in an Ar-gas atmosphere (step S21). In this case, the metal Na and the metal Ga with the molar ratio of 5:5 are put in the melt holding vessel 510.

Then, the metal Na is put in the outer vessel 540 in an Ar-gas atmosphere (step S22). Then, the melt holding vessel 510, the pipe 520, and the outer vessel 540 are set in the reaction vessel 550 of the crystal production apparatus 500 with the melt holding vessel 510, the pipe 520, and the outer vessel 540 filled with Ar gas.

Subsequently, the evacuation of the melt holding vessel 510, the pipe 520, and the outer vessel 540 and the supplying of the nitrogen gas into the melt holding vessel 510, the pipe 520, and the outer vessel 540 are alternately repeated several times by the above operations. Then, the valve 680 is opened to cause the vacuum pump 690 to evacuate the nitrogen gas filling in the melt holding vessel 510, the pipe 520, and the outer vessel 540. After the melt holding vessel 510, the pipe 520, and the outer vessel 540 are evacuated down to a predetermined pressure (equal to or lower than 0.133 Pa) by the vacuum pump 690, the valve 680 is closed and the valves 640 and 641 are opened to supply the nitrogen gas from the gas cylinder 660 to the melt holding vessel 510, the pipe 520, and the outer vessel 540 through the gas supply pipe 610. Then, the nitrogen gas is supplied to the melt holding vessel 510, the pipe 520, the outer vessel 540, and the reaction vessel 550 with the pressure regulator 650 so that the pressures in the melt holding vessel 510, the pipe 520, the outer vessel 540, and the reaction vessel 550 become 10 through 50 times atmospheric pressure (step S23).

In this case, the metal Na and the metal Ga in the melt holding vessel 510 and the metal Na in the outer vessel 540 are a solid. Accordingly, if the pressure in the pipe 600 is higher than those in the pipe 520 and the outer vessel 540, the nitrogen gas is supplied from the space 600 to the pipe 520 and the outer vessel 540 through the through-hole 533.

Then, the valve 640 is closed when the pressures in the melt holding vessel 510, the pipe 520, the outer vessel 540, and the reaction vessel 550 detected by the pressure sensors 700 and 710 become 10 through 50 times atmospheric pressure. At this time, the pressures in the spaces 511, 521, and 541 become 10 through 50 times atmospheric pressure.

Subsequently, the melt holding vessel 510 is heated up to 800° C. by the heater 570, the pipe 520 and the outer vessel 540 are heated up to 800° C. by the heaters 580, and the backflow prevention unit 530 is heated up to 800° C. by the heater 590 (step S24). In this case, since the metal Na held in the outer vessel 540 has a melting point of about 98° C., it is melted in the process of heating the pipe 520 and the outer vessel 540 to 800° C. so as to be formed into the metal Na melt 560.

Furthermore, when the temperature of the melt holding vessel 510 is raised to 800° C., the metal Na and the metal Ga in the melt holding vessel 510 also become liquid, thereby generating the mixed melt 180 of the metal Na and the metal Ga. Then, the nitrogen gas in the space 511 is taken into the mixed melt 180 and reacted with Na to start growing GaN crystals in the mixed melt 180.

Subsequently, as the growth of GaN crystals progresses, the metal Na is vaporized from the mixed melt 180 and the metal Na melt 560, resulting in a metal Na vapor and the nitrogen gas being mixed together in the spaces 511, 521, and 541. Furthermore, as the growth of GaN crystals progresses, the nitrogen gas in the space 511 is consumed to thereby reduce the nitrogen gas in the space 511. Thus, the pressure P5 in the spaces 511, 521, and 541 becomes lower than the pressure P6 in the pipe 600 (P5<P6) to generate the differential pressure between the melt holding vessel 510, the pipe 520, and the outer vessel 540 and the pipe 600. As a result, the backflow prevention valve 532 is moved in the upward direction DR2 along the side walls of the closed vessel 531, and the nitrogen gas in the pipe 600 is sequentially supplied to the spaces 521, 541, and 511 through the through-hole 533 (step S25).

Subsequently, the temperatures of the melt holding vessel 510, the pipe 520, and the outer vessel 540 are kept at 800° C. for predetermined hours (several tens to several hundreds of hours) (step S26). Accordingly, large-sized GaN crystals are grown. The GaN crystals are column-shaped GaN crystals grown in the c-axis (<0001>) direction and are defect-free crystals.

Then, the temperatures of the melt holding vessel 510, the pipe 520, the outer vessel 540, and the backflow prevention unit 530 are lowered (step S27), thus completing the production of GaN crystals.

Note that, in the embodiment 13, the crystal production apparatus may be formed by eliminating the outer vessel 540 and the metal Na melt 560. In this case, the heaters 580 heat the pipe 520. Even if the outer vessel 540 and the metal Na melt 560 are eliminated, it is possible to suppress the diffusion of the metal Na vapor in the pipe 520 into the pipe 600 through the through-hole 533. The backflow prevention valve 532 is moved in the upward direction DR2 if the pressure P5 in the spaces 511 and 521 is lower than the pressure P6 in the pipe 600. Since the flow of the nitrogen gas from the pipe 600 to the pipe 520 is generated when the backflow prevention valve 532 is moved in the upward direction DR2, the diffusion of the metal Na vapor in the pipe 520 from the pipe 520 to the pipe 600 is suppressed by this flow of the nitrogen gas.

According to the embodiment 13, in the process of growing GaN crystals, since the metal Na vapor is confined in the spaces 511 and 521 by the backflow prevention unit 530 (or the backflow prevention unit 530 and the metal Na melt 560) and the nitrogen gas is stably supplied from the pipe 600 to the spaces 511 and 521, it is possible to stabilize the molar ratio of the metal Na to the metal Ga in the mixed melt 180 and stably supply the nitrogen gas to the mixed melt 180. As a result, it is possible to produce large-sized GaN crystals.

In the embodiment 13, the outer vessel 540 and the metal Na melt 560 constitute the "backflow prevention unit," as well as the closed vessel 531, the backflow prevention valve 532, and the through-hole 533.

Furthermore, the pressure regulator 650 and the gas cylinder 660 constitute a "gas supply unit."

Moreover, the space in the pipe 600 constitutes an "outer space."

Embodiment 14

Figure 48:
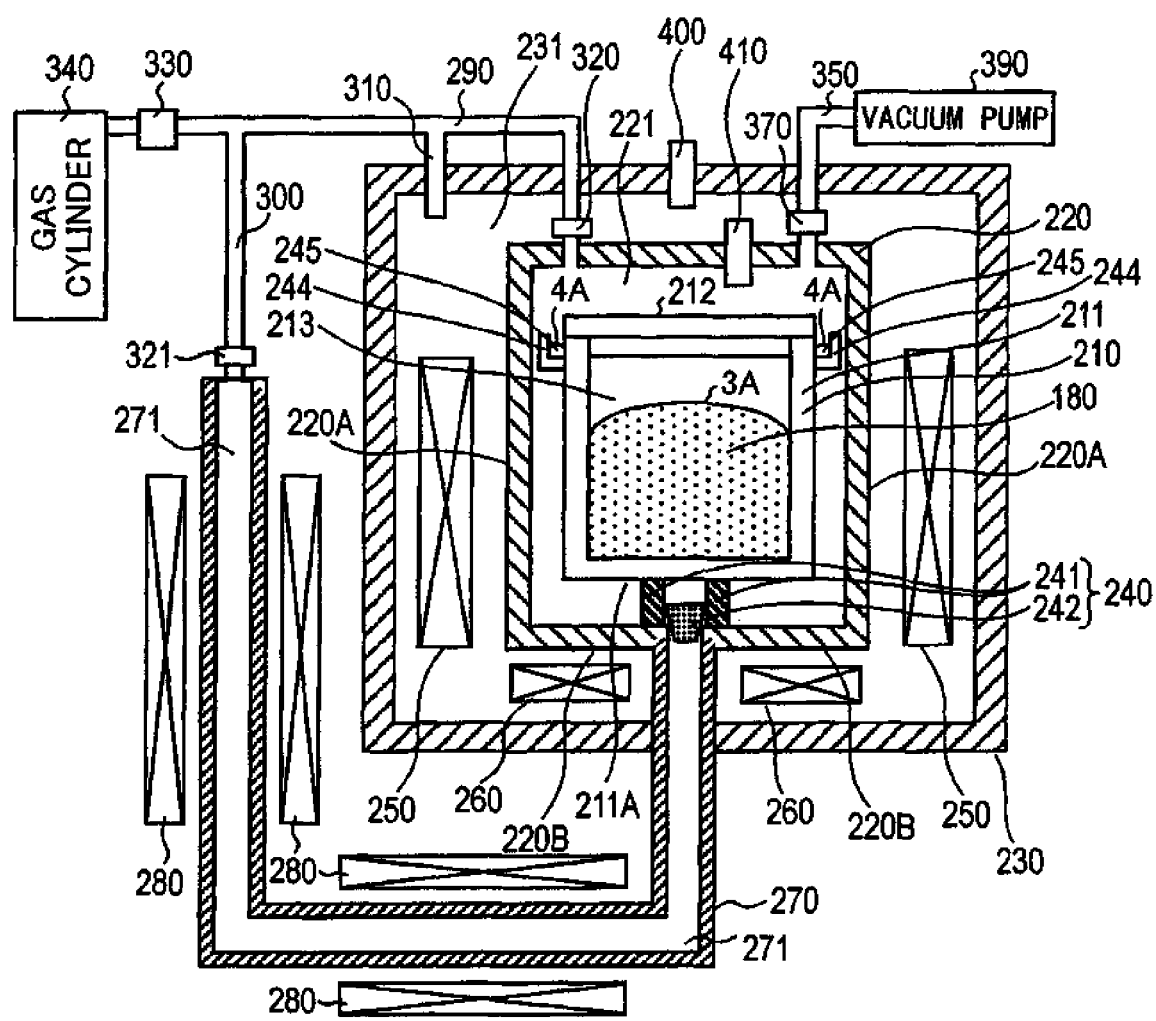
FIG. 48 is a schematic cross-sectional view of a crystal production apparatus of an embodiment 14.

FIG. 48 is a schematic cross-sectional view of a crystal production apparatus according to an embodiment 14.

As shown in FIG. 48, the crystal production apparatus 200B of the embodiment 14 is formed by adding a vessel 244 and a metal Na melt 245 to the crystal production apparatus 200 as shown in FIG. 41. Other components are the same as those of the crystal production apparatus 200.

The vessel 244 is made of SUS316L and arranged along the outer peripheral surface of the main body part 211 near a gap between the main body part 211 of the melt holding vessel 210 and the cover part 212 thereof. The vessel 244 holds the metal Na melt 245.

In growing GaN crystals using the crystal production apparatus 200B, a glove box is used to put the metal Na and the metal Ga in the melt holding vessel 210 in an Ar-gas atmosphere and put the metal Na in the vessel 244. Then, the melt holding vessel 210 and the reaction vessel 220 are set in the reaction vessel 230 of the crystal production apparatus 200B with the space 213 in the melt holding vessel 210, and the space 221 in the reaction vessel 220 filled with Ar gas.

Then, after the valve 370 is opened to cause the vacuum pump 390 to evacuate the melt holding vessel 210 and the reaction vessel 220 down to a predetermined pressure (equal to or lower than 0.133 Pa) through the exhaust pipe 350, the valve 370 is closed and the valves 320 and 321 are opened to supply the nitrogen gas from the gas cylinder 340 into the melt holding vessel 210 and the reaction vessel 220 through the gas supply pipe 290. In this case, the nitrogen gas is supplied to the melt holding vessel 210 and the reaction vessel 220 with the pressure regulator 330 so that the pressures in the melt holding vessel 210 and the reaction vessel 220 become about atmospheric pressure.

Then, when the pressure in the reaction vessel 220 detected by the pressure sensor 410 becomes about atmospheric pressure, the valves 320 and 321 are closed and the valve 370 is opened to cause the vacuum pump 390 to evacuate the nitrogen gas filling in the melt holding vessel 210 and the reaction vessel 220. In this case also, the melt holding vessel 210 and the reaction vessel 220 are evacuated down to a predetermined pressure (equal to or lower than 0.133 Pa) by the vacuum pump 390.

Then, the evacuation of the melt holding vessel 210 and the reaction vessel 220 and the supplying of the nitrogen gas into the melt holding vessel 210 and the reaction vessel 220 are alternately repeated several times.

Subsequently, after the melt holding vessel 210 and the reaction vessel 220 are evacuated down to the predetermined pressure by the vacuum pump 390, the valve 370 is closed and the valves 320 and 321 are opened to supply the nitrogen gas into the melt holding vessel 210 and the reaction vessels 220 and 230 with the pressure regulator 330 so that the pressures in the melt holding vessel 210 and the reaction vessels 220 and 230 become 10 through 50 times atmospheric pressure.

Then, the valve 320 is closed when the pressure detected by the pressure sensors 400 and 410 becomes 10 through 50 times atmospheric pressure. At this time, since the temperatures of the melt holding vessel 210 and the reaction vessel 220 are room temperature, the metal Na in the vessel 244 is a solid. Accordingly, if the pressure in the pipe 270 is higher than that in the reaction vessel 220, the backflow prevention valve 242 is moved to the melt holding vessel 210 side, causing the nitrogen gas to be filled in the space 221 of the reaction vessel 220 also from the pipe 270 through the through-hole 243. Furthermore, the nitrogen gas in the space 221 is supplied also into the space 213 in the melt holding vessel 210 through the gap between the main body part 211 and the cover part 212. As a result, the pressures in the spaces 213, 221, 231 are easily equalized to one another.

When the supplying of the nitrogen gas into the melt holding vessel 210 and the reaction vessels 220 and 230 is completed, the melt holding vessel 210 and the reaction vessel 220 are heated to 800° C. by the heaters 250 and 260. Then, the temperatures of the melt holding vessel 210 and the reaction vessel 220 are kept at 800° C. for several tens to several hundreds of hours.

The metal Na and the metal Ga put in the melt holding vessel 210 are melted in the process of heating the melt holding vessel 210, thereby generating the mixed melt 180 in the melt holding vessel 210. Furthermore, the metal Na put in the vessel 244 is melted in the process of heating the melt holding vessel 210 and the reaction vessel 220, thereby generating the metal Na melt 245 in the vessel 244.

Then, as GaN crystals start growing and the growth of GaN crystals progresses, the metal Na is vaporized from the mixed melt 180 and the metal Na melt 245, and the metal Na vapor and the nitrogen gas are confined in the spaces 213 and 221.

In this case, the pressure of the metal Na vapor in the space 213 is 0.45 of atmospheric pressure. Furthermore, since the metal Na melt 245 generates the metal Na vapor near the gap between the main body part 211 and the cover part 212, the diffusion of the metal Na vapor present in the space 213 hardly occurs in the space 211 through the gap between the main body part 211 and the cover part 212. As a result, the vaporization of the metal Na from the mixed melt 180 is suppressed, thus making it possible to stabilize the molar ratio of the metal Na to metal Ga in the mixed melt 180.

Furthermore, if the nitrogen gas in the space 213 is consumed as the growth of GaN crystals progresses, the nitrogen gas is supplied from the pipe 270 to the spaces 221 and 213 through the through-hole 243. Accordingly, the nitrogen gas is stably supplied to the spaces 221 and 213.

The method of producing GaN crystals using the crystal production apparatus 200B is the same as the method of producing GaN crystals using the crystal production apparatus 200A as shown in FIG. 44 and carried out in accordance with the flowchart as shown in FIG. 45. In this case, in step S12 as shown in FIG. 45, the metal Na is put in the vessel 244 in an Ar-gas atmosphere.

Note that, in the crystal production apparatus 200B, the heaters 250 heat the melt holding vessel 210 and the reaction vessel 220 so that the temperature T3 at the gas-liquid interface 4A between the space 221 in the reaction vessel 220 communicating with the space 213 in the melt holding vessel 210 and the metal Na melt 245 or at a point near the gas-liquid interface 4A is approximately equalized to the temperature T2 at the gas-liquid interface 3A between the space 213 and the mixed melt 180 or at a point near the gas-liquid interface 3A.

In this manner, by making the temperature T3 at the gas-liquid interface 4A or at the point near the gas-liquid interface 4A approximately equalized to the temperature T2 at the gas-liquid interface 3A or at the point near the gas-liquid interface 3A, the metal Na vapor vaporized from the metal Na melt 245 and the metal Na vapor vaporized from the mixed melt 180 are in equilibrium with each other in the spaces 213 and 221, thus making it possible to suppress the diffusion of the metal Na vapor in the space 213 into the space 221. As a result, it is possible to reliably suppress the vaporization of the metal Na from the mixed melt 180 to stabilize the molar ratio of the metal Na to the metal Ga in the mixed melt 180 and stably produce large-sized GaN crystals.

Furthermore, in the crystal production apparatus 200B, the melt holding vessel 210 and the reaction vessel 220 may be heated so that the temperature T3 becomes higher than the temperature T2. In this case, heaters are further provided between the melt holding vessel 210 and the reaction vessel 220, the melt holding vessel 210 is heated by the heaters provided so that the temperature at the gas-liquid interface 3A or at the point near the gas-liquid interface 3A is raised to the temperature T2, and the temperature at the gas-liquid interface 4A or at the point near the gas-liquid interface 4A is raised to the temperature T3 by the heaters 250.

In this manner, by making the temperature T3 higher than the temperature T2, the vapor pressure of the metal Na at the gas-liquid interface 4A becomes higher than that of the metal Na at the gas-liquid interface 3A, thereby diffusing the metal Na vapor from the space 221 into the space 213. Accordingly, the concentration of the metal Na vapor in the space 213 becomes high, thus making it possible to further suppress the vaporization of the metal Na from the mixed melt 180. As a result, it is possible to reliably stabilize the molar ratio of the metal Na to the metal Ga in the mixed melt 180 and stably produce large-sized GaN crystals.

Accordingly, in the crystal production apparatus B, GaN crystals are preferably produced with the temperature T3 set equal to or higher than the temperature T2.

According to the embodiment 14, in the process of growing GaN crystals, since the diffusion of the metal Na vapor in the spaces 213 and 221 into the pipe 270 is suppressed by the backflow prevention unit 240, the diffusion of the metal Na vapor in the space 213, which is in contact with the mixed melt 180, into the space 221 is suppressed by the metal Na vapor vaporized from the metal Na melt 245, and the nitrogen gas is supplied from the pipe 270 to the spaces 221 and 213, it is possible to stabilize the molar ratio of the metal Na to the metal Ga in the mixed melt 180 and stably supply the nitrogen gas to the mixed melt 180. As a result, it is possible to produce large-sized GaN crystals.

Note that, in the embodiment 14, the vessel 244 and the metal Na melt 245 constitute the backflow prevention unit 240 together with the pair of guides 241, the backflow prevention valve 242, and the through-hole 243.

Other details are the same as those of FIGS. 11 and 12.

Embodiment 15

Figure 49:
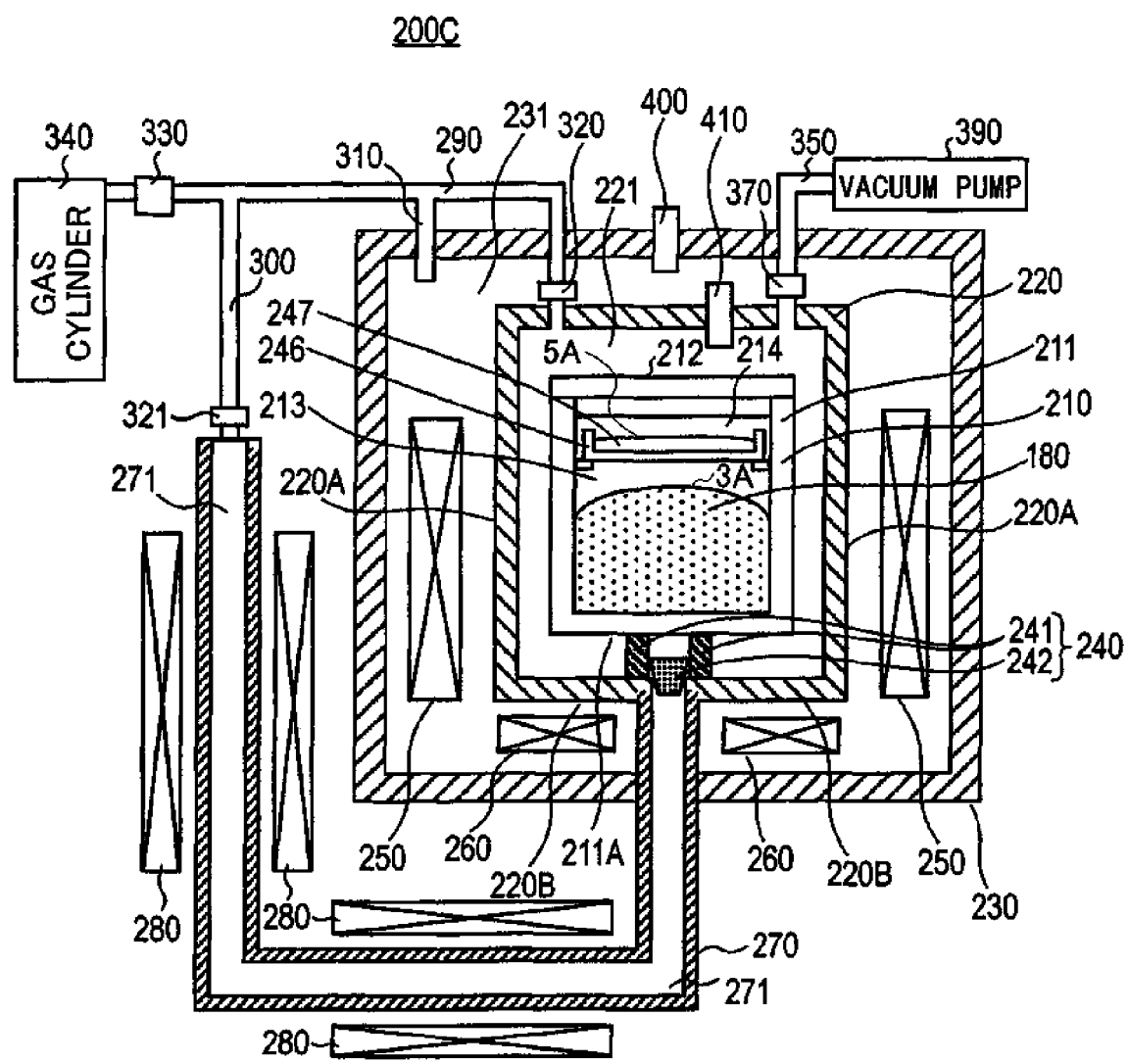
FIG. 49 is a schematic cross-sectional view of a crystal production apparatus of an embodiment 15.

FIG. 49 is a schematic cross-sectional view of a crystal production apparatus according to an embodiment 15.

As shown in FIG. 49, the crystal production apparatus 200C of the embodiment 15 is formed by adding a vessel 246 and a metal Na melt 247 to the crystal production apparatus 200 as shown in FIG. 41. Other components are the same as those of the crystal production apparatus 200.

The vessel 246 is made of SUS316L and arranged in the metal holding vessel 210. The vessel 246 holds the metal Na melt 247.

In growing GaN crystals using the crystal production apparatus 200C, a glove box is used to put the metal Na and the metal Ga in the melt holding vessel 210 in an Ar-gas atmosphere and put the metal Na in the vessel 246. Then, the melt holding vessel 210 and the vessel 220 are set in the reaction vessel 230 of the crystal production apparatus 200C with the spaces 213 and 214 in the melt holding vessel 210 and the space 221 in the reaction vessel 220 filled with Ar gas.

Then, the evacuation of the melt holding vessel 210 and the reaction vessel 220 and the supplying of the nitrogen gas into the melt holding vessel 210 and the reaction vessel 220 are alternately repeated several times by the above operations.

Subsequently, the valve 370 is closed and the valves 320 and 321 are opened to supply the nitrogen gas from the gas cylinder 340 to the melt holding vessel 210 and the reaction vessels 220 and 230 through the gas supply pipes 290, 300, and 310. Then, the nitrogen gas is supplied to the melt holding vessel 210 and the reaction vessels 220 and 230 with the pressure regulator 330 so that the pressures in the melt holding vessel 210 and the reaction vessels 220 and 230 become 10 through 50 times atmospheric pressure.

Then, the valve 320 is closed when the pressure detected by the pressure sensors 400 and 410 becomes 10 through 50 times atmospheric pressure. At this time, since the temperatures of the melt holding vessel 210 and the reaction vessel 220 are room temperature, the metal Na in the vessel 246 is a solid. Accordingly, if the pressure in the pipe 270 is higher than that in the reaction vessel 220, the backflow prevention valve 242 is moved to the melt holding vessel 210 side, causing the nitrogen gas to be filled in the space 221 of the reaction vessel 220 also from the pipe 270 through the through-hole 243. Furthermore, the nitrogen gas in the space 221 is sequentially supplied also into the spaces 214 and 213 in the melt holding vessel 210 through a gap between the main body part 211 and the cover part 212. As a result, the pressures in the spaces 213, 214, 221, and 231 are easily equalized to one another.

When the supplying of the nitrogen gas into the melt holding vessel 210 and the reaction vessels 220 and 230 is completed, the melt holding vessel 210 and the reaction vessel 220 are heated to 800° C. by the heaters 250 and 260. Then, the temperatures of the melt holding vessel 210 and the reaction vessel 220 are kept at 800° C. for several tens to several hundreds of hours.

The metal Na and the metal Ga put in the melt holding vessel 210 are melted in the process of heating the melt holding vessel 210, thereby generating the mixed melt 180 in the melt holding vessel 210. Furthermore, the metal Na put in the vessel 246 is melted in the process of heating the melt holding vessel 210, thereby generating the metal Na melt 247 in the vessel 246.

Then, as GaN crystals start growing and the growth of GaN crystals progresses, the metal Na is vaporized from the mixed melt 180 and the metal Na melt 247, resulting in the metal Na vapor and the nitrogen gas being mixed together in the spaces 213 and 214.

In this case, the pressure of the metal Na vapor in the space 213 is 0.45 of atmospheric pressure. Furthermore, since the metal Na melt 247 generates the metal Na vapor in the space 214 of the metal holding vessel 210, the diffusion of the metal Na vapor present in the space 213 hardly occurs in the space 221 through the gap between the main body part 211 and the cover part 212. As a result, the vaporization of the metal Na from the mixed melt 180 is suppressed, thus making it possible to stabilize the molar ratio of the metal Na to metal Ga in the mixed melt 180.

Furthermore, if the nitrogen gas in the space 213 is consumed as the growth of GaN crystals progresses, the nitrogen gas is supplied from the pipe 270 to the space 221 through the through-hole 243, and the nitrogen gas supplied to the space 221 is further diffused into the spaces 214 and 213 in the melt holding vessel 210 through the gap between the main body part 211 and the cover part 212. Accordingly, the nitrogen gas is stably supplied to the spaces 214 and 213.

The method of producing GaN crystals using the crystal production apparatus 200C is the same as the method of producing GaN crystals using the crystal production apparatus 200A as shown in FIG. 44 and carried out in accordance with the flowchart as shown in FIG. 45. In this case, in step S12 as shown in FIG. 45, the metal Na is put in the vessel 246 in an Ar-gas atmosphere.

Note that, in the crystal production apparatus 200C, the heaters 250 heat the melt holding vessel 210 and the reaction vessel 220 so that the temperature T4 at the gas-liquid interface 5A between the space 214 in the melt holding vessel 210 communicating with the space 213 in the melt holding vessel 210 and the metal Na melt 247 or at a point near the gas-liquid interface 5A is approximately equalized to the temperature T2 at the gas-liquid interface 3A between the space 213 and the mixed melt 180 or at a point near the gas-liquid interface 3A.

In this manner, by making the temperature T4 at the gas-liquid interface 5A or at the point near the gas-liquid interface 5A approximately equalized to the temperature T2 at the gas-liquid interface 3A or at the point near the gas-liquid interface 3A, the metal Na vapor vaporized from the metal Na melt 247 and the metal Na vapor vaporized from the mixed melt 180 are in equilibrium with each other in the spaces 213 and 214, thus making it possible to suppress the diffusion of the metal Na vapor in the space 213 into the space 214. As a result, it is possible to reliably suppress the vaporization of the metal Na from the mixed melt 180 to stabilize the molar ratio of the metal Na to the metal Ga in the mixed melt 180 and stably produce large-sized GaN crystals.

Furthermore, in the crystal production apparatus 200C, the melt holding vessel 210 and the reaction vessel 220 may be heated so that the temperature T4 becomes higher than the temperature T2. In this case, heaters are further provided opposite to the vessel 246, the vessel 246 is heated by the heaters provided so that the temperature at the gas-liquid interface 5A or at the point near the gas-liquid interface 5A is raised to the temperature T4, and the temperature at the gas-liquid interface 3A or at the point near the gas-liquid interface 3A is raised to the temperature T2 by the heaters 250.

In this manner, by making the temperature T4 higher than the temperature T2, the vapor pressure of the metal Na at the gas-liquid interface 5A becomes higher than that of the metal Na at the gas-liquid interface 3A, thereby diffusing the metal Na vapor from the space 214 into the space 213. Accordingly, the concentration of the metal Na vapor in the space 213 becomes high, thus making it possible to further suppress the vaporization of the metal Na from the mixed melt 180. As a result, it is possible to reliably stabilize the molar ratio of the metal Na to the metal Ga in the mixed melt 180 and stably produce large-sized GaN crystals.

Accordingly, in the crystal production apparatus C, GaN crystals are preferably produced with the temperature T4 set equal to or higher than the temperature T2.

According to the embodiment 15, in the process of growing GaN crystals, since the diffusion of the metal Na vapor in the spaces 213, 214, and 221 into the pipe 270 is suppressed by the backflow prevention unit 240, the diffusion of the metal Na vapor in the space 213, which is in contact with the mixed melt 180, into the space 221 is suppressed by the metal Na vapor vaporized from the metal Na melt 247, and the nitrogen gas is supplied from the pipe 270 to the spaces 221, 214, and 213, it is possible to stabilize the molar ratio of the metal Na to the metal Ga in the mixed melt 180 and stably supply the nitrogen gas to the mixed melt 180. As a result, it is possible to produce large-sized GaN crystals.

Note that, in the embodiment 15, the vessel 246 and the metal Na melt 247 constitute the backflow prevention unit 240 together with the pair of guides 241, the backflow prevention valve 242, and the through-hole 243.

Other details are the same as those of FIGS. 11 and 12.

Embodiment 16

Figure 50:
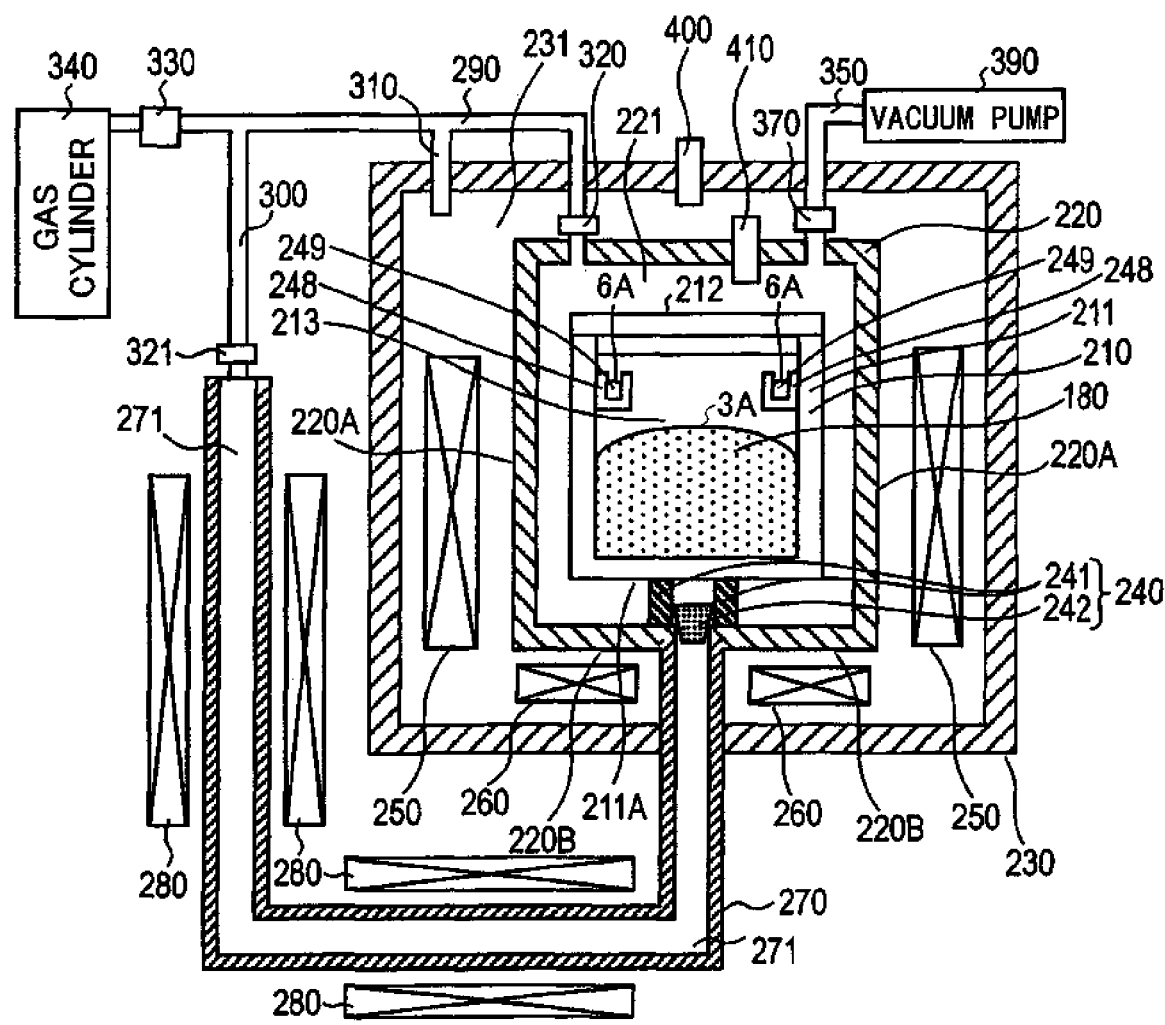
FIG. 50 is a schematic cross-sectional view of a crystal production apparatus of an embodiment 16.

FIG. 50 is a schematic cross-sectional view of a crystal production apparatus according to an embodiment 16.

As shown in FIG. 50, the crystal production apparatus 200D of the embodiment 16 is formed by adding a vessel 248 and a metal Na melt 249 to the crystal production apparatus 200 as shown in FIG. 41. Other components are the same as those of the crystal production apparatus 200.

The vessel 248 is made of SUS316L and arranged along the inner wall of the melt holding vessel 210. The vessel 248 holds the metal Na melt 249.

In growing GaN crystals using the crystal production apparatus 200D, a glove box is used to put the metal Na and the metal Ga in the melt holding vessel 210 in an Ar-gas atmosphere and put the metal Na in the vessel 248. Then, the melt holding vessel 210 and the reaction vessel 220 are set in the reaction vessel 230 of the crystal production apparatus 200D with the space 213 in the melt holding vessel 210 and the space 221 in the reaction vessel 220 filled with Ar gas.

Then, the evacuation of the melt holding vessel 210 and the reaction vessel 220 and the supplying of the nitrogen gas into the melt holding vessel 210 and the reaction vessel 220 are alternately repeated several times by the above operations.

Subsequently, the valve 370 is closed and the valves 320 and 321 are opened to supply the nitrogen gas from the gas cylinder 340 to the melt holding vessel 210 and the reaction vessels 220 and 230 through the gas supply pipes 290, 300, and 310. Then, the nitrogen gas is supplied to the melt holding vessel 210 and the reaction vessels 220 and 230 with the pressure regulator 330 so that the pressures in the melt holding vessel 210 and the reaction vessels 220 and 230 become 10 through 50 times atmospheric pressure.

Then, the valve 320 is closed when the pressure detected by the pressure sensors 400 and 410 becomes 10 through 50 times atmospheric pressure. At this time, since the temperatures of the melt holding vessel 210 and the reaction vessel 220 are room temperature, the metal Na in the vessel 248 is a solid. Accordingly, if the pressure in the pipe 270 is higher than that in the reaction vessel 220, the backflow prevention valve 242 is moved to the melt holding vessel 210 side, causing the nitrogen gas to be filled in the space 221 of the reaction vessel 220 also from the pipe 270 through the through-hole 243. Furthermore, the nitrogen gas in the space 221 is supplied also into the space 213 in the melt holding vessel 210 through a gap between the main body part 211 and the cover part 212. As a result, the pressures in the spaces 213, 221, and 231 are easily equalized to one another.

When the supplying of the nitrogen gas into the melt holding vessel 210 and the reaction vessels 220 and 230 is completed, the melt holding vessel 210 and the reaction vessel 220 are heated to 800° C. by the heaters 250 and 260. Then, the temperatures of the melt holding vessel 210 and the reaction vessel 220 are kept at 800° C. for several tens to several hundreds of hours.

The metal Na and the metal Ga put in the melt holding vessel 210 are melted in the process of heating the melt holding vessel 210, thereby generating the mixed melt 180 in the melt holding vessel 210. Furthermore, the metal Na put in the vessel 246 is melted in the process of heating the melt holding vessel 210, thereby generating the metal Na melt 249 in the vessel 248.

Then, as GaN crystals start growing and the growth of GaN crystals progresses, the metal Na is vaporized from the mixed melt 180 and the metal Na melt 249, resulting in the metal Na vapor and the nitrogen gas being mixed together in the space 213.

In this case, the pressure of the metal Na vapor in the space 213 is 0.45 of atmospheric pressure. Furthermore, since the metal Na melt 249 generates the metal Na vapor in the space 213 near the gap between the main body part 211 and the cover part 212 in the metal holding vessel 210, the diffusion of the metal Na vapor vaporized from the mixed melt 180 hardly occurs in the space 221 through the gap between the main body part 211 and the cover part 212. As a result, the vaporization of the metal Na from the mixed melt 180 is suppressed, thus making it possible to stabilize the molar ratio of the metal Na to metal Ga in the mixed melt 180.

Furthermore, if the nitrogen gas in the space 213 is consumed as the growth of GaN crystals progresses, the nitrogen gas is supplied from the pipe 270 to the space 221 through the through-hole 243, and the nitrogen gas supplied to the space 221 is further diffused into the space 213 in the melt holding vessel 210 through the gap between the main body part 211 and the cover part 212. Accordingly, the nitrogen gas is stably supplied to the space 213.

The method of producing GaN crystals using the crystal production apparatus 200D is the same as the method of producing GaN crystals using the crystal production apparatus 200A as shown in FIG. 44 and carried out in accordance with the flowchart as shown in FIG. 45. In this case, in step S12 as shown in FIG. 45, the metal Na is put in the vessel 248 in an Ar-gas atmosphere.

Note that, in the crystal production apparatus 200D, the heaters 250 heat the melt holding vessel 210 and the reaction vessel 220 so that the temperature T5 at the gas-liquid interface 6A between the space 213 in the melt holding vessel 210 and the metal Na melt 249 or at a point near the gas-liquid interface 6A is approximately equalized to the temperature T2 at the gas-liquid interface 3A between the space 213 and the mixed melt 180 or at a point near the gas-liquid interface 3A.

In this manner, by making the temperature T5 at the gas-liquid interface 6A or at the point near the gas-liquid interface 6A approximately equalized to the temperature T2 at the gas-liquid interface 3A or at the point near the gas-liquid interface 3A, the metal Na vapor vaporized from the metal Na melt 249 and the metal Na vapor vaporized from the mixed melt 180 are in equilibrium with each other in the space 213, thus making it possible to suppress the diffusion of the metal Na vapor in the space 213 into the space 221. As a result, it is possible to reliably suppress the vaporization of the metal Na from the mixed melt 180 to stabilize the molar ratio of the metal Na to the metal Ga in the mixed melt 180 and stably produce large-sized GaN crystals.

Furthermore, in the crystal production apparatus 200D, the melt holding vessel 210 and the reaction vessel 220 may be heated so that the temperature T5 becomes higher than the temperature T2. In this case, heaters are further provided opposite to the vessel 248, the vessel 248 is heated by the heaters provided so that the temperature at the gas-liquid interface GA or at the point near the gas-liquid interface 6A is raised to the temperature T5, and the temperature at the gas-liquid interface 3A or at the point near the gas-liquid interface 3A is raised to the temperature T2 by the heaters 250.

In this manner, by making the temperature T5 higher than the temperature T2, the vapor pressure of the metal Na at the gas-liquid interface 6A becomes higher than that of the metal Na at the gas-liquid interface 3A, thereby diffusing the metal Na vapor into the direction of the gas-liquid interface 3A. Accordingly, the concentration of the metal Na vapor at the gas-liquid interface 3A becomes high, thus making it possible to further suppress the vaporization of the metal Na from the mixed melt 180. As a result, it is possible to reliably stabilize the molar ratio of the metal Na to the metal Ga in the mixed melt 180 and stably produce large-sized GaN crystals.

Accordingly, in the crystal production apparatus C, GaN crystals are preferably produced with the temperature T5 set equal to or higher than the temperature T2.

According to the embodiment 16, in the process of growing GaN crystals, since the diffusion of the metal Na vapor in the spaces 213 and 221 into the pipe 270 is suppressed by the backflow prevention unit 240, the diffusion of the metal Na vapor in the space 213, which is in contact with the mixed melt 180, into the space 221 is suppressed by the metal Na vapor vaporized from the metal Na melt 249, and the nitrogen gas is supplied from the pipe 270 to the spaces 221 and 213, it is possible to stabilize the molar ratio of the metal Na to the metal Ga in the mixed melt 180 and stably supply the nitrogen gas to the mixed melt 180. As a result, it is possible to produce large-sized GaN crystals.

Note that, in the embodiment 16, the vessel 246 and the metal Na melt 249 constitute the backflow prevention unit 240 together with the pair of guides 241, the backflow prevention valve 242, and the through-hole 243.

Other details are the same as those of FIGS. 11 and 12.

Figure 51A:
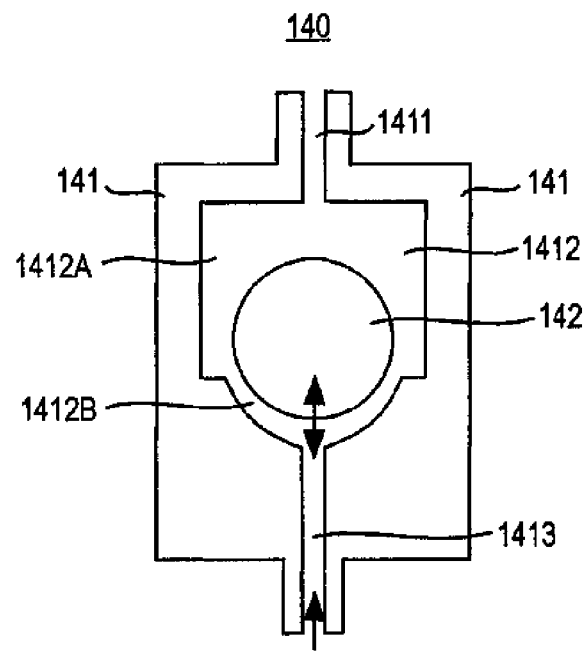
FIG. 51A is a schematic cross-sectional view (1) of another backflow prevention unit.
Figure 51B:
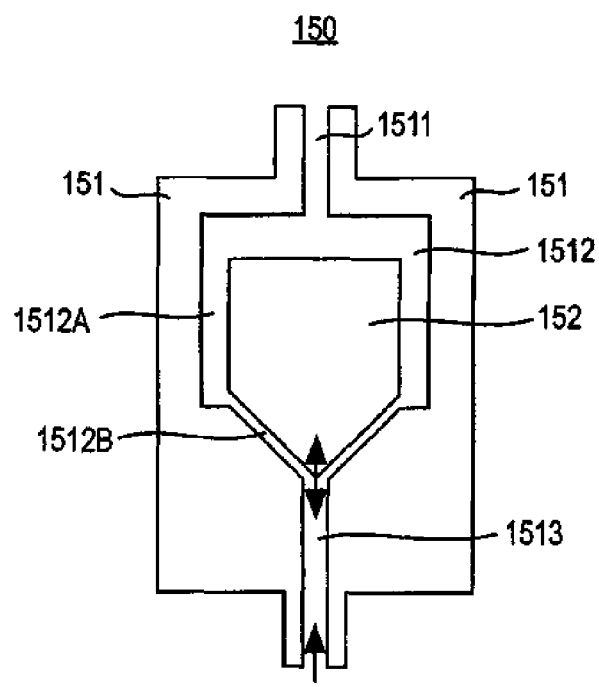
FIG. 51B is a schematic cross-sectional view (2) of another backflow prevention unit.

FIGS. 51A and 51B are schematic cross-sectional views of other backflow prevention units.

As shown in FIG. 51A, a backflow prevention unit 140 includes a main body part 141 and a ball member 142. The main body part 141 includes through-holes 1411 and 1413 and a cavity part 1412.

The cavity part 1412 is formed of a square part 1412A and a spherical part 1412B. The square part 1412A is substantially quadrangular in cross section, and the spherical part 1412B is substantially semicircular in cross section.

The through-hole 1411 is provided between one end of the main body part 141 and the square part 1412A of the cavity part 1412, and the through-hole 1413 is provided between the spherical part 1412B of the cavity part 1412 and the other end of the main body part 141.

The ball member 142 is of a circular shape having a diameter smaller than the square part 1412A and arranged in the cavity part 1412. The ball member 142 is moved up and down in the cavity part 1412 by a differential pressure between the pressure in the through-hole 1411 and that in the through-hole 1413 or by its own weight. When the ball member 142 is moved in the downward direction, it is fit in the spherical part 1412B.

If the pressure in the through-hole 1413 is higher than that in the through-hole 1411, the ball member 142 is moved in the upward direction by the differential pressure between the pressure in the through-hole 1411 and that in the through-hole 1413. In this case, the backflow prevention unit 140 causes the nitrogen gas flowed from the through-hole 1413 to pass through the through-hole 1411 through the cavity part 1412.

Furthermore, if the pressure in the through-hole 1411 is higher than that in the through-hole 1413, the ball member 142 is moved in the downward direction by the differential pressure between the pressure in the through-hole 1411 and that in the through-hole 1413 and fit in the spherical part 1412B. If the pressure in the through-hole 1413 is approximately the same as that in the through-hole 1411, the ball member 142 is moved in the downward direction by its own weight and fit in the spherical part 1412B. In this case, the place between the cavity part 1412 and the through-hole 1413 is closed by the ball member 142, and the backflow prevention unit 140 prevents a metal Na vapor or a metal Na melt from passing through from the through-hole 1411 to the through-hole 1413 through the cavity part 1412.

As shown in FIG. 51B, a backflow prevention unit 150 includes a main body part 151 and a rod member 152. The main body part 151 includes through-holes 1511 and 1513 and a cavity part 1512.

The cavity part 1512 is formed of square parts 1512A and 1512B. The square part 1512A is substantially quadrangular in cross section, and the square part 1512B is substantially triangular in cross section.

The through-hole 1511 is provided between one end of the main body part 151 and the square part 1512A of the cavity part 1512, and the through-hole 1513 is provided between the square part 1512B of the cavity part 1512 and the other end of the main body 151.

The rod member 152 is of a pentagonal shape smaller than that of the square part 1512A and arranged in the cavity part 1512. The rod member 152 is moved up and down in the cavity part 1512 by a differential pressure between the pressure in the through-hole 1511 and that in the through-hole 1513 or by its own weight. When the rod member 152 is moved in the downward direction, it is fit in the square part 1512B.

If the pressure in the through-hole 1513 is higher than that in the through-hole 1511, the rod member 152 is moved in the upward direction by the differential pressure between the pressure in the through-hole 1511 and that in the through-hole 1513. In this case, the backflow prevention unit 150 causes the nitrogen gas flowed from the through-hole 1513 to pass through the through-hole 1511 through the cavity part 1512.

Furthermore, if the pressure in the through-hole 1511 is higher than that in the through-hole 1513, the rod member 152 is moved in the downward direction by the differential pressure between the pressure in the through-hole 1511 and that in the through-hole 1513 and fit in the spherical part 1512B. If the pressure in the through-hole 1513 is approximately the same as that in the through-hole 1511, the rod member 152 is moved in the downward direction by its own weight and fit in the spherical part 1512B. In this case, the place between the cavity part 1512 and the through-hole 1513 is closed by the spherical part 1512B, and the backflow prevention unit 150 prevents a metal Na vapor or a metal Na melt from passing through from the through-hole 1511 to the through-hole 1513 through the cavity part 1512.

The backflow prevention units 140 and 150 do not use a spring mechanism, and so they could not be broken even at high temperatures at which crystals are grown and are highly reliable.

Each of the backflow prevention units 140 and 150 as shown in FIGS. 51A and 51B is used in the crystal production apparatuses 200, 200A, 200B, 200C, 200D, and 500 instead of the backflow prevention units 240 and 530. When the backflow prevention units 140 and 150 are used in the crystal production apparatuses 200, 200A, 200B, 200C, 200D, and 500, they are preferably used while being heated to a crystal growth temperature.

Note that although the crystal growth temperature is 800° C. in the embodiments 1 through 16, the present invention is not limited to this. The crystal growth temperature may be in a range from 600° C. to 900° C.

Furthermore, although the metal Na and the metal Ga are put in the melt holding vessels 210 and 510 in an Ar-gas atmosphere and the metal Na is put between the melt holding vessel 210 and the reaction vessel 220 or in the outer vessel 540 in an Ar-gas atmosphere in the above description, the present invention is not limited to this. Alternatively, the metal Na and the metal Ga may be put in the melt holding vessels 210 and 510 and the metal Na may be put between the melt holding vessel 210 and the reaction vessel 220 or in the outer vessel 510 in a gas other than Ar gas such as He, Ne, and Kr or a nitrogen gas atmosphere. In general, the metal Na and the metal Ga may be put in the melt holding vessels 210 and 510 and the metal Na may be put between the melt holding vessel 210 and the reaction vessel 220 or in the outer vessel 540 in an inert gas or a nitrogen gas atmosphere. In this case, the inert gas or the nitrogen gas has a water amount equal to or smaller than 10 ppm and an oxygen amount equal to or smaller than 10 ppm.

Moreover, although the metal with which the metal Ga is mixed is Na in the above description, the present invention is not limited to this. Alternatively, the metal Ga may be mixed with alkaline metals such as lithium (Li) and kalium (K) or alkaline earth metals such as magnesium (Mg), calcium (Ca), and strontium (Sr) to generate the mixed melt 180. The resultant substances after these alkaline metals are melted constitute an alkaline metal Na melt, and the resultant substances after these alkaline earth metals are melted constitute an alkaline earth metal Na melt.

In addition, compounds containing nitrogen such as sodium azide and ammonia as constituent elements may be used instead of nitrogen gas. These compounds constitute a nitrogen material gas.

According to another aspect of the present invention, there is provided a crystal production apparatus comprising a melt holding vessel that holds a mixed melt of an alkaline metal and a group III metal; a suppression/introduction vessel that suppresses an outflow of an alkali metal vapor in a vessel space in contact with the mixed melt in the melt holding vessel to an outer space and introduces a nitrogen material gas supplied from an outside into the melt holding vessel by a differential pressure between the vessel space and the outer space; and a heater that heats the mixed melt to a crystal growth temperature.

Preferably, the crystal production apparatus further comprises a reaction vessel. The reaction vessel covers a periphery of the melt holding vessel. The suppression/introduction vessel includes a metal melt and a suppression/introduction member. The metal melt is held between the melt holding vessel and the reaction vessel. The suppression/introduction member is provided in contact with the metal melt, suppresses an outflow of the metal melt from the reaction vessel to the outer space by a surface tension of the metal melt, and introduces the nitrogen material gas into the melt holding vessel through the metal melt by the differential pressure.

Preferably, the suppression/introduction member is provided at a surface in contact with the metal melt in the reaction vessel and formed of a through-hole having a diameter that suppresses an outflow of the metal melt to the outer space by the surface tension.

Preferably, if a temperature of an area where the through-hole is provided is relatively high, the diameter of the through-hole is set to a relatively small value.

Preferably, the crystal production apparatus according further comprises a gas supply unit that supplies the nitrogen material gas to the through-hole so that a pressure in the vessel space becomes approximately constant.

Preferably, the crystal production apparatus further comprises a pipe connected to the reaction vessel. The suppression/introduction member has at its outer peripheral surface a concavo-convex structure that suppresses an outflow of the metal melt to the outer space by the surface tension and formed of a fitting member fit in an inner diameter of the pipe at a connection between the reaction vessel and the pipe.

Preferably, if a temperature of the fitting member is relatively high, a size of a gap between the concavo-convex structure and an inner peripheral surface of the pipe is set to a relatively small value.

Preferably, the crystal production apparatus further comprises a pipe connected to the reaction vessel. The suppression/introduction member is formed of a gap forming member held to make a gap between the suppression/introduction member and an inner surface of the pipe or an inner surface of the reaction vessel. The gap has a size that suppresses the outflow of the metal melt to the outer space by the surface tension.

Preferably, if a temperature of the gap forming member is relatively high, the size of the gap is set to a relatively small value.

Preferably, the crystal production apparatus further comprises a gas supply unit that supplies the nitrogen material gas to the connection so that a pressure in the vessel space becomes approximately constant.

Preferably, a temperature of the suppression/introduction member is set at a temperature at which the metal melt is not substantially vaporized.

Preferably, the metal melt is different from the mixed melt.

Preferably, the metal melt is formed of an alkaline metal melt.

Preferably, a first temperature at a first interface between a space in the reaction vessel communicating with the vessel space and the metal melt or at a point near the first interface is equal to or higher than a second temperature at a second interface between the vessel space and the mixed melt or at a point near the second interface.

Preferably, the first temperature is approximately equalized to the second temperature.

Furthermore, according to the present invention, there is provided a production method for producing a group III nitride crystal using a crystal production apparatus. The crystal production apparatus comprises a melt holding vessel that holds a mixed melt of an alkaline metal and a group III metal; a suppression/introduction vessel that suppresses an outflow of an alkali metal vapor in a vessel space in contact with the mixed melt in the melt holding vessel to an outer space and introduces a nitrogen material gas supplied from an outside into the melt holding vessel by a differential pressure between the vessel space and the outer space.

The production method comprises a first step of putting the alkaline metal and the group III metal in the melt holding vessel in an inert-gas or a nitrogen-gas atmosphere; a second step of supplying the nitrogen material gas into the vessel space; a third step of heating the melt holding vessel to a crystal growth temperature; a fourth step of keeping a temperature of the melt holding vessel at the crystal growth temperature for a predetermined time; and a fifth step of supplying the nitrogen material gas to the melt holding vessel through the suppression/introduction vessel so that a pressure in the vessel space is kept at a predetermined pressure.

Preferably, the crystal production unit further includes a reaction vessel that covers a periphery of the melt holding vessel. A metal melt is arranged between the melt holding vessel and the reaction vessel. The production method further comprises a sixth step of putting a metal for the metal melt between the melt holding vessel and the reaction vessel in the inert-gas or the nitrogen-gas atmosphere; and a seventh step of heating a place between the melt holding vessel and the reaction vessel to a temperature at which the metal for the metal melt becomes a liquid.

Preferably, the production method further comprises an eighth step of keeping a temperature of the suppression/introduction vessel at a temperature at which the metal melt is not substantially vaporized through the suppression/introduction vessel.

Preferably, the metal melt is different from the mixed melt.

Preferably, the metal melt is an alkaline metal melt.

Embodiment 17

Figure 52:
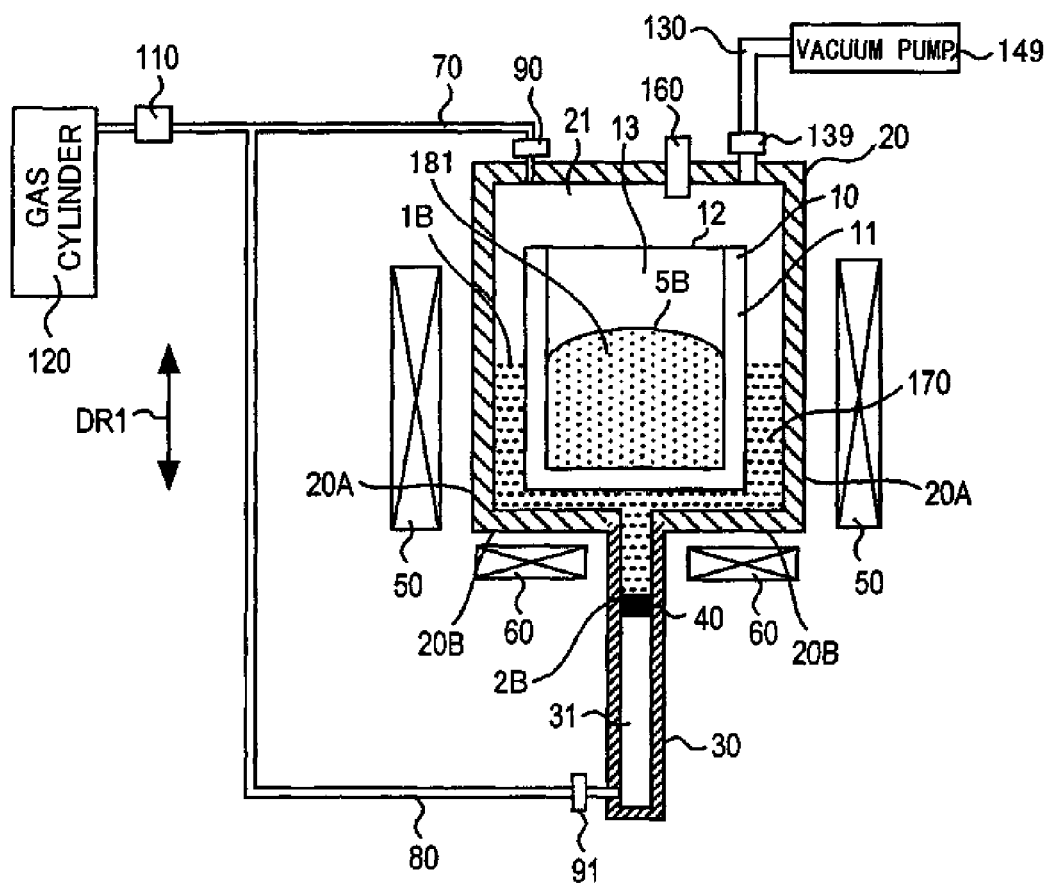
FIG. 52 is a schematic cross-sectional view of a crystal production apparatus of an embodiment 17.

FIG. 52 is a schematic cross-sectional view of a crystal production apparatus according to an embodiment 17 of the present invention.

As shown in FIG. 52, the crystal production apparatus 100M of the embodiment 17 of the present invention is composed of a melt holding vessel 10, a reaction vessel, a pipe 30, a suppression/introduction stopper 40, heaters 50 and 60, gas supply pipes 70 and 80, valves 90, 91, and 140, a pressure regulator 110, a gas cylinder 121, an exhaust pipe 130, a vacuum pump 149, a pressure sensor 160, and a metal Na melt 170.

The melt holding vessel 10 is of a substantially column shape and composed of a main body part 11 and a cover part 12. The reaction vessel 20 is arranged on the periphery of the melt holding vessel 10 at a predetermined gap with the melt holding vessel 10. The melt holding vessel 10 is made of boron nitride (BN), and the reaction vessel 20 is made of SUS316L.

The pipe 30 is connected to the reaction vessel 20 underneath the melt holding vessel 10 in the gravity directions DR1. The suppression/introduction stopper 40 is made, for example, of a metal, ceramic, or the like and held in the pipe 30 at a position underneath the connection between the reaction vessel 20 and the pipe 30.

The heaters 50 are arranged so as to enclose an outer peripheral surface 20A of the reaction vessel 20. The heaters 60 are arranged opposite to a bottom surface 20B of the reaction vessel 20. The gas supply pipe 70 has one end connected to the reaction vessel 20 through the valve 90 and the other end connected to the gas cylinder 121 through the pressure regulator 110. The gas supply pipe 80 has one end connected to the pipe 30 through the valve 91 and the other end connected to the gas supply pipe 70.

The valve 90 is attached to the gas supply pipe 70 near the reaction vessel 20. The valve 91 is attached to the gas supply pipe 80 near the pipe 30. The pressure regulator 110 is attached to the gas supply pipe 70 near the gas cylinder 121. The gas cylinder 121 is connected to the gas supply pipe 70.

The exhaust pipe 130 has one end connected to the reaction vessel 20 through the valve 139 and the other end connected to the vacuum pump 149. The valve 139 is attached to the exhaust pipe1 130 near the reaction vessel 20. The vacuum pump 149 is connected to the exhaust pipe 130.

The pressure sensor 160 is provided on the reaction vessel 20. The metal Na melt 170 is formed of a metal sodium (metal Na) melt and held between the melt holding vessel 10 and the reaction vessel 20.

The melt holding vessel 10 holds a mixed melt 780 of the metal Na and the metal gallium (metal Ga). The reaction vessel 20 covers the periphery of the melt holding vessel 10. The pipe 30 introduces the nitrogen gas ($N_2$ gas) supplied from the gas cylinder 121 through the gas supply pipes 70 and 80 into the suppression/introduction stopper 40.

The suppression/introduction stopper 40 has a concavo-convex structure at its outer peripheral surface so as to form holes of several tens of µm between the suppression/introduction stopper 40 and the inner wall of the pipe 30, causes the nitrogen gas in the pipe 30 to pass through in the direction of the metal Na melt 170, and supplies the nitrogen gas to a space 21 through the metal Na melt 170. Furthermore, the metal Na melt 170 does not enter the holes of several tens of µm due to the surface tension of the metal Na melt 170 and is held on the suppression/introduction stopper 40. As a result, the suppression/introduction stopper 40 holds the metal Na melt 170 between the melt holding vessel 10 and the reaction vessel 20.

The heaters 50 heat the melt holding vessel 10 and the reaction vessel 20 from the outer peripheral surface 20A of the reaction vessel 20. The heaters 60 heat the melt holding vessel 10 and the reaction vessel 20 from the bottom surface 20B of the reaction vessel 20.

The gas supply pipe 70 supplies the nitrogen gas introduced from the gas cylinder 121 through the pressure regulator 110 to the reaction vessel 20 through the valve 90. The gas supply pipe 80 supplies the nitrogen gas introduced from the gas cylinder 121 through the pressure regulator 110 to the pipe 30 through the valve 91.

The valve 90 supplies the nitrogen gas in the gas supply pipe 70 to the reaction vessel 20 or stops supplying the nitrogen gas thereto. The valve 91 supplies the nitrogen gas in the gas supply pipe 80 to the pipe 30 or stops supplying the nitrogen gas thereto. The pressure regulator 110 supplies the nitrogen gas from the gas cylinder 121 to the gas supply pipes 70 and 80 after setting it at a predetermined pressure.

The gas cylinder 121 holds nitrogen gas. The exhaust pipe 130 allows the gas in the reaction vessel 20 to pass through to the vacuum pump 149. The valve 139 causes the reaction vessel 20 and the exhaust pipe 130 to be spatially connected or causes the reaction vessel 20 and the exhaust pipe 130 to be spatially interrupted. The vacuum pump 149 evacuates the reaction vessel 20 through the exhaust pipe 130 and the valve 139.

The pressure sensor 160 detects the pressure in the reaction vessel 20. The nitrogen gas is supplied to the space 21 through the metal Na melt 170 and the suppression/introduction stopper 40.

Figure 53:
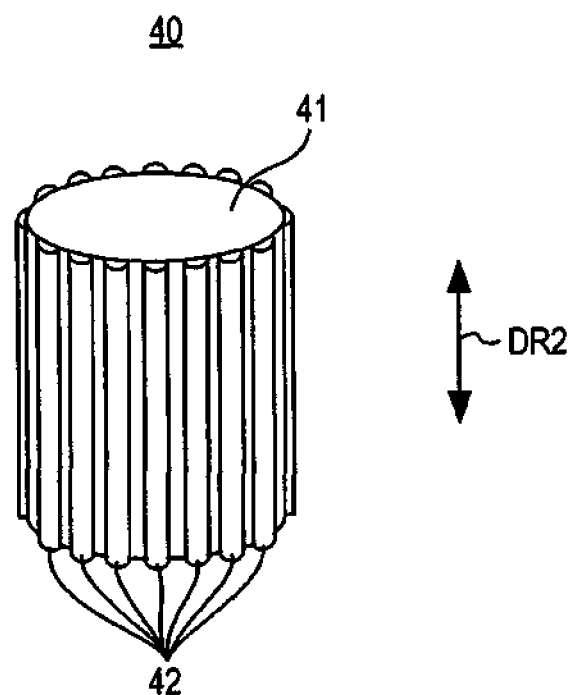
FIG. 53 is a perspective view of a suppression/introduction stopper as shown in FIG. 53.

FIG. 53 is a perspective view of the suppression/introduction stopper 40 as shown in FIG. 52.

As shown in FIG. 53, the suppression/introduction stopper 40 includes a stopper 41 and convex parts 42. The stopper 41 is of a substantially column shape. The convex parts 42 are of a substantially semicircular cross-sectional shape and are formed on the outer peripheral surface of the stopper 41 along the length directions DR2 thereof.

Figure 54:
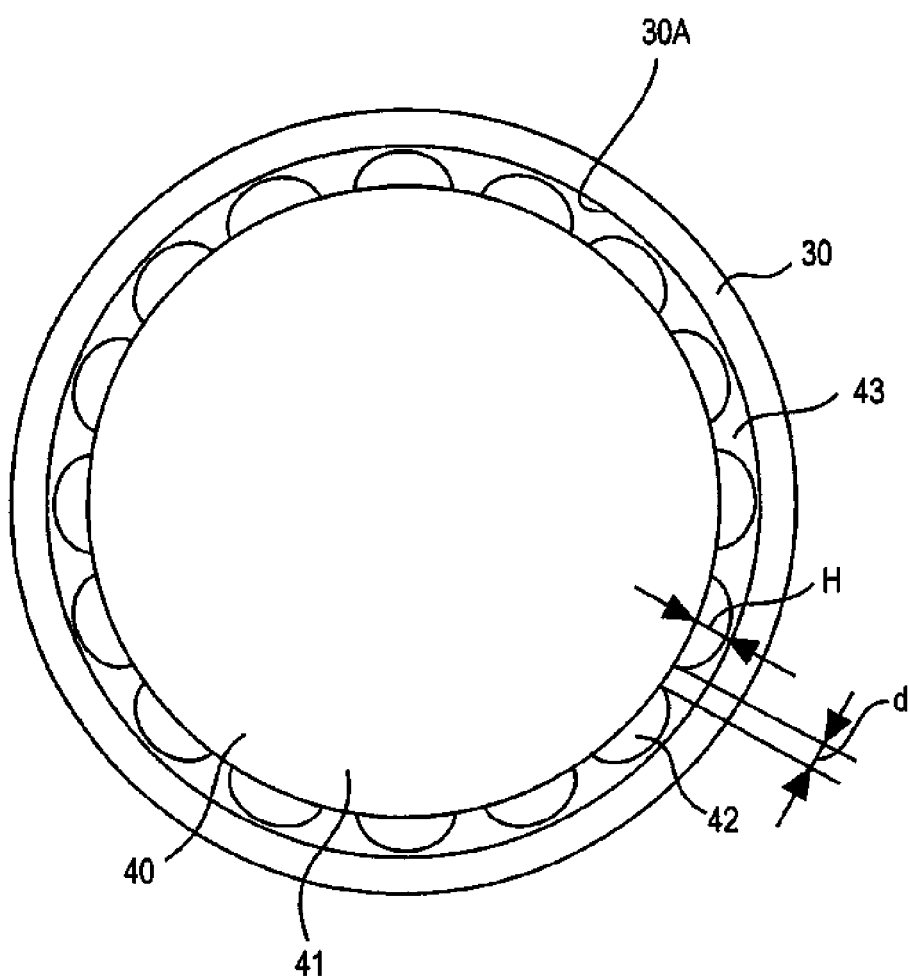
FIG. 54 is a plan view showing where the suppression/introduction stopper is installed in a pipe.

FIG. 54 is a plan view showing where the suppression/introduction stopper 40 is installed in the pipe 30.

As shown in FIG. 54, the convex parts 42 are formed in the circumferential direction of the stopper 41 and arranged at the interval d of several tens of µm. Furthermore, the convex parts 42 have the height H of several tens of µm. The plural convex parts 42 of the suppression/introduction stopper 40 come in contact with the inner wall 30A of the pipe 30. In this manner, the suppression/introduction stopper 40 is fit within the inner wall 30A of the pipe 30.

Since the convex parts 42 have the height H of several tens of µm and are arranged on the outer peripheral surface of the stopper 41 at the interval d of several tens of µm, plural gaps 43 having a diameter of approximately several tens of µm are formed between the suppression/introduction stopper 40 and the inner wall 30A of the pipe 30 where the suppression/introduction stopper 40 is fit within the inner wall 30A of the pipe 30.

The gaps 43 allow the nitrogen gas to pass through in the length direction DR2 of the stopper 41, hold the metal Na melt 170 by the surface tension of the metal Na melt 170, and prevent the metal Na melt 170 from passing through in the length direction DR2 of the stopper 41.

Figure 55:
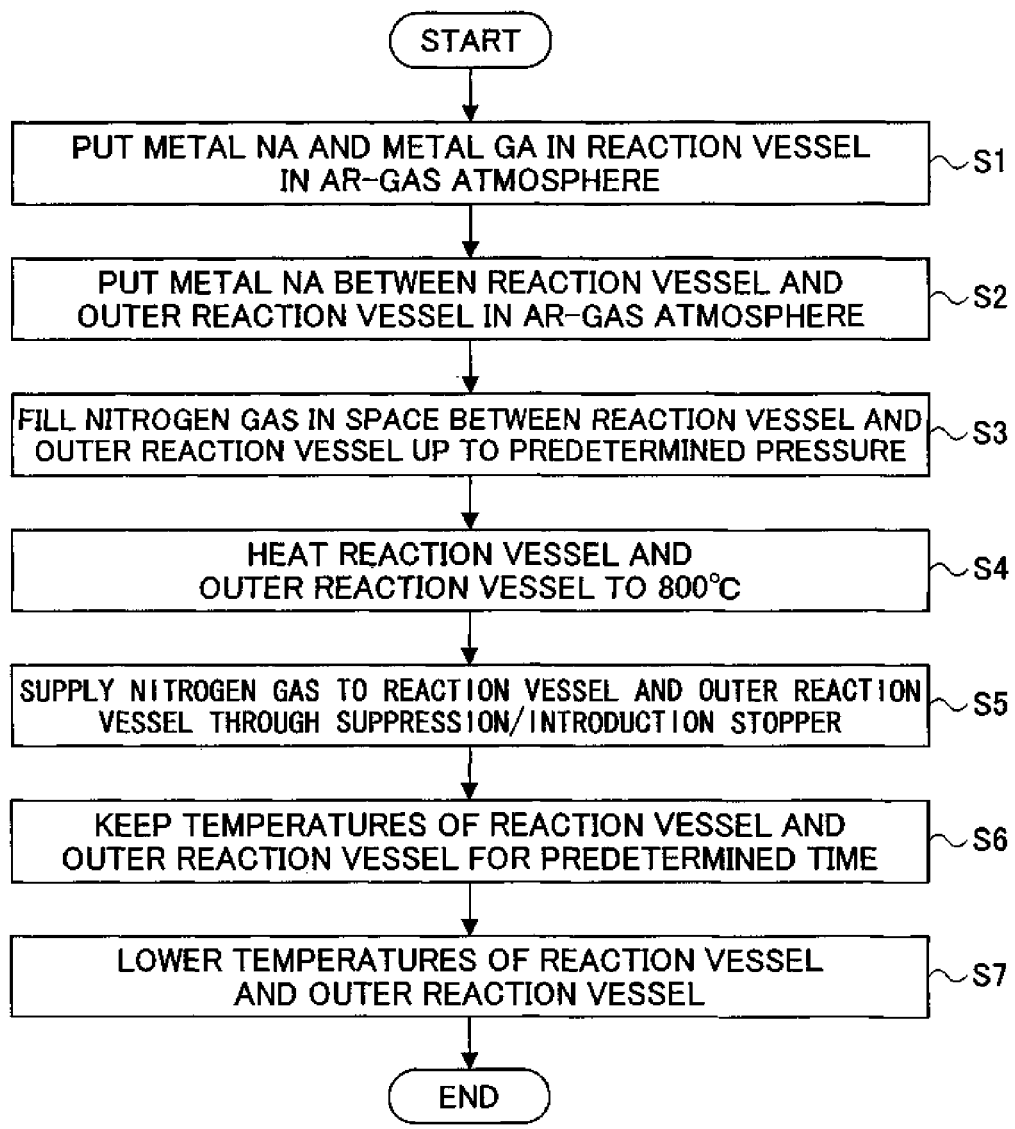
FIG. 55 is a flowchart of the embodiment 1 for describing a method of producing GaN crystals.

FIG. 55 is a flowchart of the embodiment 17 for describing a method of producing GaN crystals.

As shown in FIG. 55, when a series of operations are started, the melt holding vessel 10 and the reaction vessel 20 are put in a glove box filled with Ar gas. Then, the metal Na and the metal Ga are put in the melt holding vessel 10 in an Ar-gas atmosphere (step S1). In this case, the metal Na and the metal Ga with the molar ratio of 5:5 are put in the melt holding vessel 10. Note that Ar gas has a water amount equal to or smaller than 10 ppm and an oxygen amount equal to or smaller than 10 ppm (the same applies to the description below).

Then, the metal Na is put between the melt holding vessel 10 and the reaction vessel 20 in an Ar-gas atmosphere (step S2). Then, the melt holding vessel 10 and the reaction vessel 20 are set in the crystal production apparatus 100M with the melt holding vessel 10 and the reaction vessel 20 filled with Ar gas.

Subsequently, the valve 139 is opened to cause the vacuum pump 149 to evacuate the Ar gas filling in the melt holding vessel 10 and the reaction vessel 20. After the melt holding vessel 10 and the reaction vessel 20 are evacuated down to a predetermined pressure (equal to or lower than 0.133 Pa) by the vacuum pump 149, the valve 139 is closed and the valves 90 and 91 are opened to supply the nitrogen gas from the gas cylinder 121 into the melt holding vessel 10 and the reaction vessel 20 through the gas supply pipes 70 and 80. In this case, the nitrogen gas is supplied to the melt holding vessel 10 and the reaction vessel 20 with the pressure regulator 110 so that the pressures in the melt holding vessel 10 and the reaction vessel 20 become about atmospheric pressure.

Then, when the pressure in the reaction vessel 20 detected by the pressure sensor 160 becomes about atmospheric pressure, the valves 90 and 91 are closed and the valve 139 is opened to cause the vacuum pump 149 to evacuate the nitrogen gas filling in the melt holding vessel 10 and the reaction vessel 20. In this case also, the melt holding vessel 10 and the reaction vessel 20 are evacuated down to a predetermined pressure (equal to or lower than 0.133 Pa) by the vacuum pump 149.

Then, the evacuation of the melt holding vessel 10 and the reaction vessel 20 and the supplying of the nitrogen gas into the melt holding vessel 10 and the reaction vessel 20 are alternately repeated several times.

Subsequently, after the melt holding vessel 10 and the reaction vessel 20 are evacuated down to the predetermined pressure by the vacuum pump 149, the valve 139 is closed and the valves 90 and 91 are opened to supply the nitrogen gas into the melt holding vessel 10 and the reaction vessel 20 with the pressure regulator 110 so that the pressures in the melt holding vessel 10 and the reaction vessel 20 become 10 through 50 times atmospheric pressure (step S3).

In this case, the metal Na between the melt holding vessel 10 and the reaction vessel 20 is a solid. Accordingly, the nitrogen gas is supplied from the space 31 in the pipe 30 to the space 21 in the reaction vessel 20 and the space 13 in the melt holding vessel 10 through the suppression/introduction stopper 40. Since the cover part 12 is just placed on the main body part 11 and so a gap is present between the main body part 11 and the cover part 12, the nitrogen gas supplied to the space 21 is supplied also into the space 13 in the melt holding vessel 10 through the gap. Then, the valve 90 is closed when the pressures in the space 21 detected by the pressure sensor 160 become 10 through 50 times atmospheric pressure. At this time, the pressure in the spaces 13, 21, and 31 becomes 10 through 50 times atmospheric pressure.

Subsequently, the melt holding vessel 10 and the reaction vessel 20 are heated to 800° C. by the heaters 50 and 60 (step S4). In this case, since the metal Na held between the melt holding vessel 10 and the reaction vessel 20 has a melting point of about 98° C., it is melted in the process of heating the melt holding vessel 10 and the reaction vessel 20 to 800° C. so as to be formed into the metal Na melt 170. As a result, two gas-liquid interfaces 1B and 2B are generated (see FIG. 52). The gas-liquid interface 1B is positioned at an interface between the metal Na melt 170 and the space 21 in the reaction vessel 20, and the gas-liquid interface 2B is positioned at an interface between the metal Na melt 170 and the suppression/introduction stopper 40.

Furthermore, when the temperatures of the melt holding vessel 10 and the reaction vessel 20 are raised to 800° C., the temperature of the suppression/introduction stopper 40 is 150° C. Accordingly, the vapor pressure of the metal Na melt 170 (metal Na melt) at the gas-liquid interface 2B is $7.6 \times 10^{-9}$ of atmospheric pressure, and the vaporization of the metal Na melt 170 (=metal Na melt) hardly occurs through the gaps 43 of the suppression/introduction stopper 40. As a result, the reduction of the metal Na melt 170 (=metal Na melt) hardly occurs.

Even if the temperature of the suppression/introduction stopper 40 is raised to either 900° C. or 400° C., the vapor pressures of the metal Na melt 170 (=metal Na melt) are $1.8 \times 10^{-5}$ of atmospheric pressure and $4.7 \times 10^{-4}$ of atmospheric pressure, respectively. Accordingly, the reduction of the metal Na melt 170 (=metal Na melt) is almost negligible in this degree of the vapor pressure.

As described above, in the crystal production apparatus 100M, the temperature of the suppression/introduction stopper 40 is set so that substantial reduction of the metal Na melt 170 (=metal Na melt) will not occur due to its vaporization.

Furthermore, when the temperatures of the melt holding vessel 10 and the reaction vessel 20 are raised to 800° C., the metal Na and the metal Ga in the melt holding vessel 10 also become liquid, thereby generating the mixed melt 780 of the metal Na and the metal Ga. Then, the nitrogen gas in the space 13 is taken into the mixed melt 780 to start growing GaN crystals in the mixed melt 780.

Subsequently, as the growth of GaN crystals progresses, the nitrogen gas in the space 13 is consumed to thereby reduce the nitrogen gas in the space 13. Then, the pressure P1 in the spaces 13 and 21 becomes lower than the pressure P2 in the space 31 in the pipe 30 (P1<P2) to generate a differential pressure between the spaces 13 and 21 and the space 31. As a result, the nitrogen gas in the space 31 is sequentially supplied to the spaces 21 and 13 through the suppression/introduction stopper 40 and metal Na melt 170 (step S5).

Subsequently, the temperatures of the melt holding vessel 10 and the reaction vessel 20 are kept at 800° C. for predetermined hours (several tens to several hundreds of hours) (step S6). Accordingly, large-sized GaN crystals are grown. The GaN crystals are column-shaped GaN crystals grown in the c-axis (<0001>) direction and are defect-free crystals.

Then, the temperatures of the melt holding vessel 10 and the reaction vessel 20 are lowered (step S7), thus completing and the production of CaN crystals.

Figure 56:
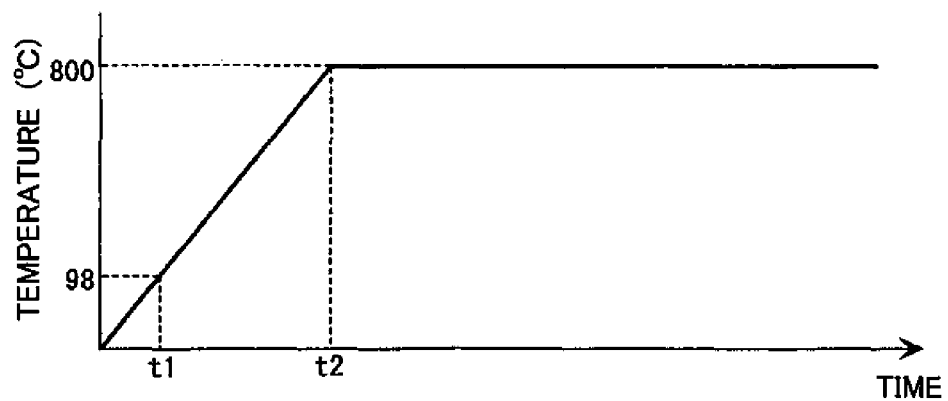
FIG. 56 is a timing chart of the temperature of the melt holding vessel and the reaction vessel.
Figure 57:
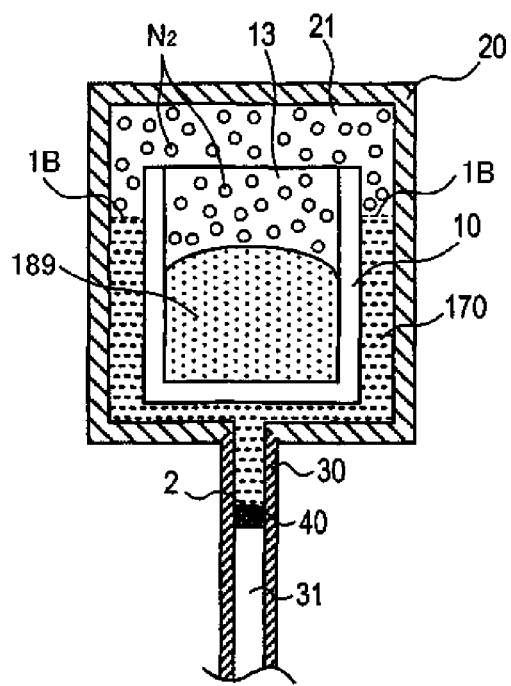
FIG. 57 is a drawing showing a state change in the melt holding vessel and the reaction vessel in timings t1 and t2 as shown in FIG. 56.
Figure 58:
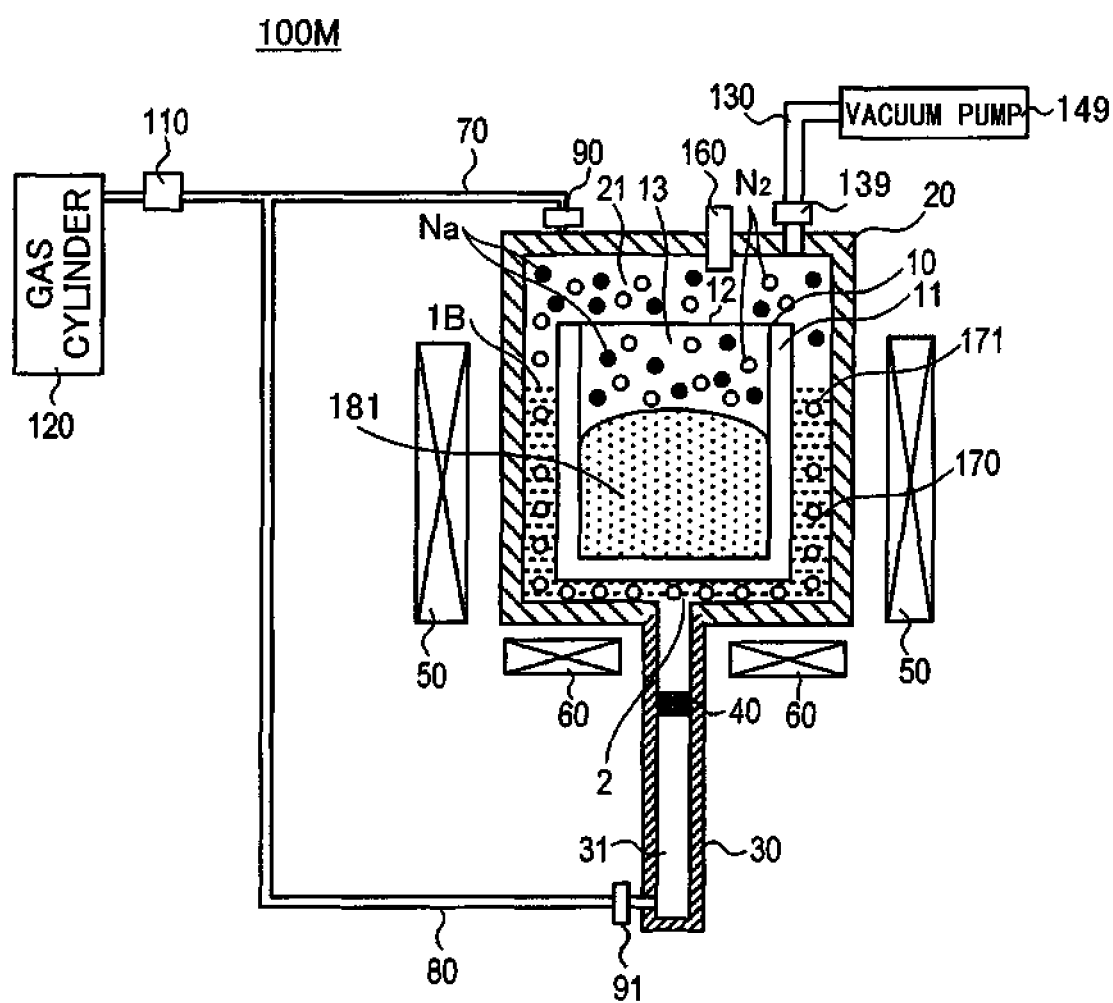
FIG. 58 is a drawing showing the melt holding vessel and the reaction vessel in step as shown in FIG. 55.

FIG. 56 is a timing chart showing the temperatures of the melt holding vessel 10 and the reaction vessel 20. Furthermore, FIG. 57 is a drawing showing the melt holding vessel 10 and the reaction vessel 20 in a period between the two timings t1 and t2 as shown in FIG. 56. Moreover, FIG. 58 is a drawing showing the melt holding vessel 10 and the reaction vessel 20 in step S5 as shown in FIG. 55.

As shown in FIG. 56, when the heating of the melt holding vessel 10 and the reaction vessel 20 is started by the heaters 50 and 60, the temperatures of the melt holding vessel 10 and the reaction vessel 20 start rising and reach 98° C. at the timing t1 and 800° C. at the timing t2.

Then, the metal Na held between the melt holding vessel 10 and the reaction vessel 20 is melted to be formed into the metal Na melt 170 (=metal Na melt). As a result, the nitrogen gas 3 in the spaces 13 and 21 cannot be diffused into the space 31 in the pipe 30 through the metal Na melt 170 (=metal Na melt) and the suppression/introduction stopper 40 and is confined in the spaces 13 and 21 (see FIG. 57).

As described above, the crystal production apparatus 100M is characterized in that the nitrogen gas 3 is confined in the spaces 13 and 21 in the melt holding vessel 10 and the reaction vessel 20 by the suppression/introduction stopper 40 and the metal Na melt 170 (=metal Na melt) to grow GaN crystals.

After the timing t2, the temperatures of the melt holding vessel 10 and the reaction vessel 20 are kept at 800° C., and the growth of GaN crystals progresses in the mixed melt 780. After the timing t1, the vaporization of the metal Na in the metal Na melt 170 and the mixed melt 780 is started, thus making the vapor pressure gradually high. After the timing t2, Na has a vapor pressure of 0.45 of atmospheric pressure at 800° C. As a result, the nitrogen gas 3 and the metal Na vapor Na are mixed together in the spaces 13 and 21.

Then, as the nitrogen gas 3 is consumed, the pressure P1 in the spaces 13 and 21 becomes lower than the pressure P2 in the space 31. As a result, the metal Na melt 170 is moved to the spaces 13 and 21 side, thereby raising the gas-liquid interfaces 1B and 2B of the metal Na melt 170.

In such a situation, the nitrogen gas is supplied from the space 31 in the pipe 30 to the metal Na melt 170 through the suppression/introduction stopper 40, moved in the metal Na melt 170 in a foamed state, and supplied from the gas-liquid interface 1B to the spaces 13 and 21. If the pressure P1 in the spaces 13 and 21 becomes almost the same as the pressure P2 in the space 31, the metal Na melt 170 is lowered to an initial position, thereby stopping the supply of the nitrogen gas from the space 31 in the pipe 30 to the melt holding vessel 10 and the reaction vessel 20 through the suppression/introduction stopper 40 and the metal Na melt 170.

As described above, the suppression/introduction stopper 40 allows the metal Na melt 170 to be held between the melt holding vessel 10 and the reaction vessel 20 by the surface tension of the metal Na melt 170 (=metal Na melt) and the nitrogen gas to be supplied from the space 31 to the melt holding vessel 10 and the reaction vessel 20. Accordingly, the suppression/introduction stopper 40 has a structure of preventing the passing of the metal Na melt 170.

Furthermore, the crystal production apparatus 100M is characterized in that GaN crystals are grown with the metal Na vapor Na confined in the spaces 13 and 21. With this characteristic, it is possible to suppress the vaporization of the metal Na from the mixed melt 780, keep the molar ratio of the metal Na to the metal Ga in the mixed melt 780 approximately constant, and grow large-sized and high-quality GaN crystals.

Moreover, in the crystal production apparatus 100M, the heaters 50 heat the melt holding vessel 10 and the reaction vessel 20 so that the temperature T1 at the gas-liquid interface 1B between the space 21 in the reaction vessel 21 communicating with the space 13 in the melt holding vessel 10 and the metal Na melt 170 or at a point near the gas-liquid interface 18 is approximately equalized to the temperature T2 at the gas-liquid interface 5B between the space 13 and the mixed melt 780 or at a point near the gas-liquid interface 5B.

In this manner, by making the temperature T1 at the gas-liquid interface 1B or at the point near the gas-liquid interface 1B approximately equalized to the temperature T2 at the gas-liquid interface 5B or at the point near the gas-liquid interface 5B, the metal Na vapor vaporized from the metal Na melt 170 and the metal Na vapor vaporized from the mixed melt 780 are in equilibrium with each other in the spaces 13 and 21, thus making it possible to suppress the diffusion of the metal Na vapor in the space 13 into the space 21. As a result, it is possible to reliably suppress the vaporization of the metal Na from the mixed melt 780 to stabilize the molar ratio of the metal Na to the metal Ga in the mixed melt 780 and stably produce large-sized GaN crystals.

Furthermore, in the crystal production apparatus 100M, the melt holding vessel 10 and the reaction vessel 20 may be heated so that the temperature T1 becomes higher than the temperature T2. In this case, heaters are further provided between the melt holding vessel 10 and the reaction vessel 20, the melt holding vessel 10 is heated by the heaters provided so that the temperature at the gas-liquid interface 5B or at the point near the gas-liquid interface 5B is raised to the temperature T2, and the temperature at the gas-liquid interface 18 or at the point near the gas-liquid interface 1B is raised to the temperature T1 by the heaters 50.

In this manner, by making the temperature T1 higher than the temperature T2, the vapor pressure of the metal Na at the gas-liquid interface 1B becomes higher than that of the metal Na at the gas-liquid interface 5B, thereby diffusing the metal Na vapor from the space 21 into the space 13. Accordingly, the concentration of the metal Na vapor in the space 13 becomes high, thus making it possible to further suppress the vaporization of the metal Na from the mixed melt 780. As a result, it is possible to reliably stabilize the molar ratio of the metal Na to the metal Ga in the mixed melt 780 and stably produce large-sized GaN crystals.

Accordingly, in the crystal production apparatus 100M, GaN crystals are preferably produced with the temperature T1 set equal to or higher than the temperature T2.

Although the height H of the convex parts 42 and the interval d of the plural convex parts 42 of the suppression/introduction stopper 40 are several tens of μm long in the above description, they may also be determined based on the temperature of the suppression/introduction stopper 40. In this case, if the temperature of the suppression/introduction stopper 40 is relatively high, the height H of the convex parts 42 is made relatively small and the interval d of the plural convex parts 42 is made relatively small. Furthermore, if the temperature of the suppression/introduction stopper 40 is relatively low, the height H of the convex part 42 is made relatively large and the interval d of the plural convex parts 42 is made relatively large. That is, if the temperature of the suppression/introduction stopper 40 is relatively high, the size of the gaps 43 between the suppression/introduction stopper 40 and the pipe 30 is made relatively small, and if the temperature of the suppression/introduction stopper 40 is relatively low, the size of the gaps 43 between the suppression/introduction stopper 40 and the pipe 30 is made relatively large.

The size of the gaps 43 is determined by the height H of the convex parts 42 and the interval d of the plural convex parts 42, and the size of the gaps 43 capable of holding the metal Na melt 170 by the surface tension of the metal Na melt 170 is varied by the temperature of the suppression/introduction stopper 40. Accordingly, the height H of the convex parts 42 and the interval d of the plural convex parts 42 are varied in accordance with the temperature of the suppression/introduction stopper 40, thereby making it possible to reliably hold the metal Na melt 170 by the surface tension of the metal Na melt 170.

The temperature of the suppression/introduction stopper 40 is controlled by the heaters 60. In other words, when the temperature of the suppression/introduction stopper 40 is raised to a temperature higher than 150° C., the suppression/introduction stopper 40 is heated by the heaters 60.

According to the embodiment 17, in the process of growing GaN crystals, since the metal Na vapor is confined in the spaces 13 and 21 by the metal Na melt 170 and the suppression/introduction stopper 40 and the nitrogen gas is stably supplied from the pipe 30 to the spaces 13 and 21, it is possible to stabilize the molar ratio of the metal Na to the metal Ga in the mixed melt 780 and stably supply the nitrogen gas to the mixed melt 780. As a result, it is possible to produce high-quality and large-sized GaN crystals.

Note that, in the embodiment 17, the temperature of the suppression/introduction stopper 40 may be controlled based on the distance between the suppression/introduction stopper 40 and the heaters 60. In this case, if the temperature of the suppression/introduction stopper 40 is made relatively high, the distance between the suppression/introduction stopper 40 and the heaters 60 is set relatively small, and if the temperature of the suppression/introduction stopper 40 is made relatively low, the distance between the suppression/introduction stopper 40 is set relatively large.

Furthermore, from the viewpoint of suppressing the vaporization of the metal Na from the mixed melt 780, the heaters 50 are separately arranged as two heaters 50A and 50B in the gravity directions. The heaters 50A are arranged at a position opposite to the upper part of the metal Na melt 170, while the heaters 50B are arranged at a position opposite to the lower part thereof. Then, the temperature of the upper part of the metal Na melt 170 is made relatively high by the heaters 50A, while the temperature of the lower part of the the metal Na melt 170 is made relatively low by the heaters 50B. Accordingly, it is possible to accelerate the vaporization of the metal Na from the metal Na melt 170 to the space 21 and make the concentration of the metal Na vapor in the space 21 higher than that of the metal Na vapor in the space 13. As a result, it is possible to further suppress the diffusion of the metal Na vapor from the space 13 to the space 21 and the vaporization of the metal Na from the mixed melt 780.

Moreover, in the embodiment 17, the suppression/introduction stopper 40 and the metal Na melt 170 constitute a "suppression/introduction vessel."

Furthermore, the suppression/introduction stopper 40 constitutes a "suppression/introduction member."

Furthermore, the pressure regulator 110 and the gas cylinder 121 constitute a "gas supply unit."

Furthermore, the suppression/introduction stopper 40 constitutes a "fitting member."

Embodiment 18

Figure 59:
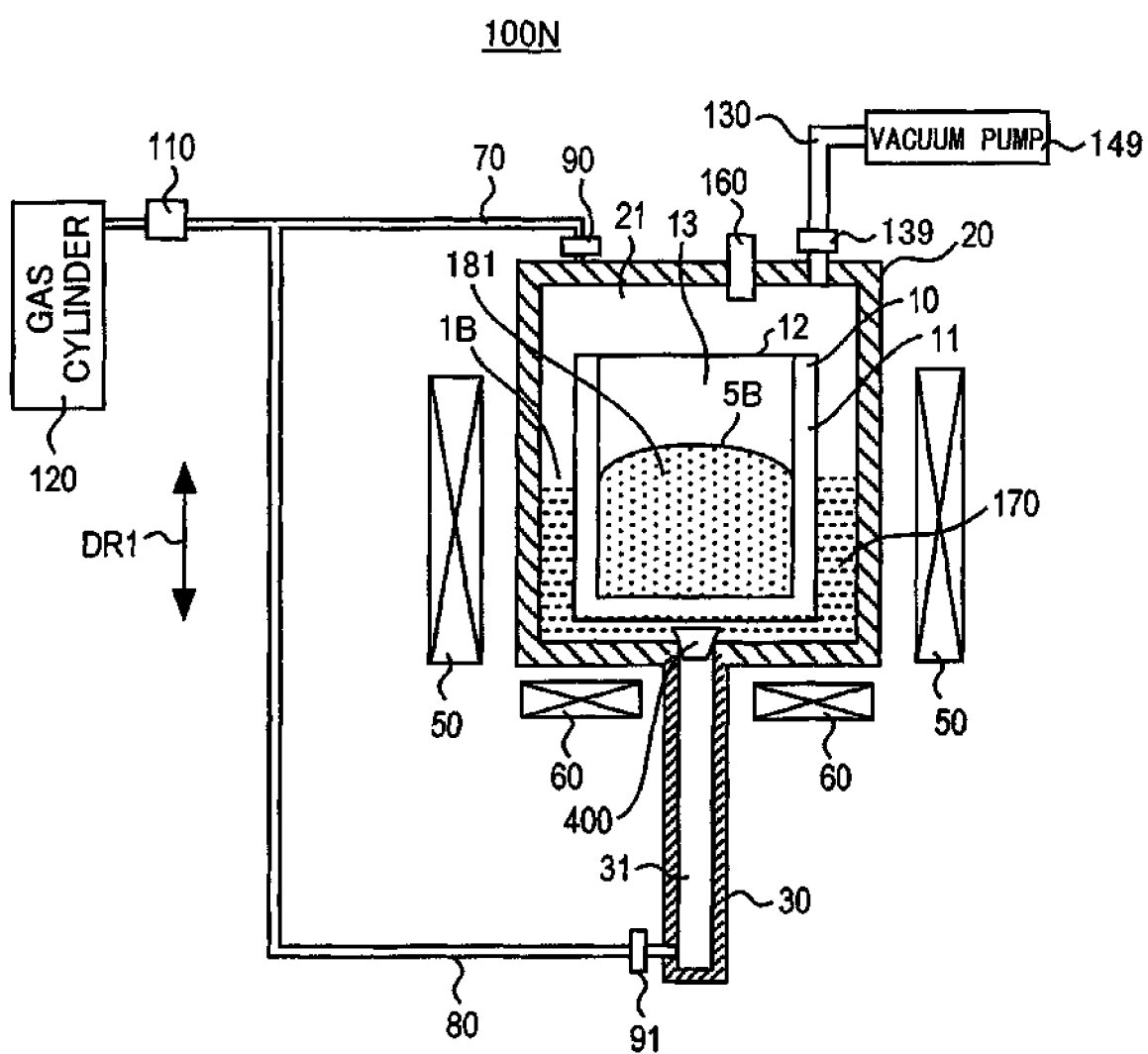
FIG. 59 is a schematic cross-sectional view of a crystal production apparatus of an embodiment 18.

FIG. 59 is a schematic cross-sectional view of a crystal production apparatus according to an embodiment 18.

As shown in FIG. 59, the crystal production apparatus 100N of the embodiment 18 is formed by replacing the suppression/introduction stopper 40 of the crystal production apparatus 100M as shown in FIG. 52 with a suppression/introduction stopper 400. Other components are the same as those of the crystal production apparatus 100M.

The suppression/introduction stopper 400 is made, for example, of a metal, ceramic, or the like and fixed at the connection between the reaction vessel 20 and the pipe 30.

The suppression/introduction stopper 400 supplies nitrogen gas from the space 31 in the pipe 30 to the spaces 21 and 13 in the melt holding vessel 10 and the reaction vessel 20 through the metal Na melt 170. Furthermore, the suppression/introduction stopper 400 holds the metal Na melt 170 between the melt holding vessel 10 and the reaction vessel 20 by the surface tension of the metal Na melt 170.

Note that, in the crystal production apparatus 100N, the heaters 60 are used, not to heat the melt holding vessel 10 and the reaction vessel 20 to 800° C., but to heat the melt holding vessel 10 and the reaction vessel 20 so as to set the temperature of the suppression/introduction stopper 400 at a temperature at which the metal Na melt 170 is not substantially vaporized through the suppression/introduction stopper 400.

Figure 60:
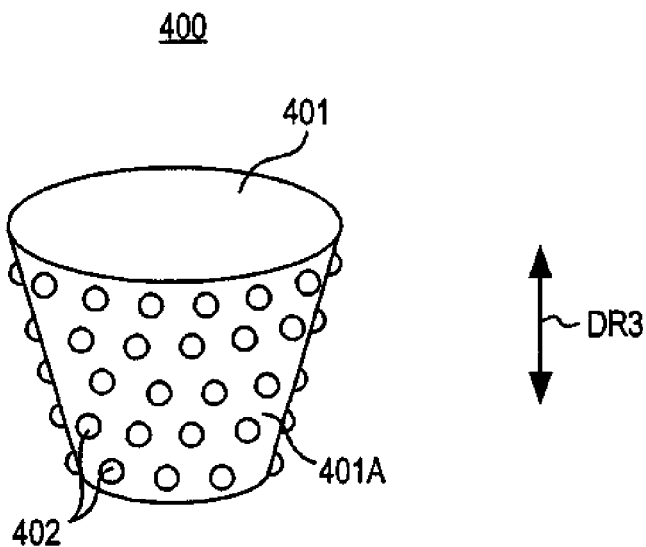
FIG. 60 is a perspective view of a suppression/introduction stopper as shown in FIG. 59.

FIG. 60 is a perspective view of the suppression/introduction stopper 400 as shown in FIG. 59. Furthermore, FIG. 61 is a cross-sectional view for describing a method of fixing the suppression/introduction stopper 400 as shown in FIG. 59.

As shown in FIG. 60, the suppression/introduction stopper 400 is composed of a stopper 401 and plural convex parts 402. The stopper 401 is of a column shape whose diameter is varied toward the length direction DR3. Each of the plural convex parts 402 is of a substantially semicircular shape and has a diameter of several tens of μm. The plural convex parts 402 are randomly formed on an outer peripheral-surface 401A of the stopper 401. Note, however, that an interval between the adjacent two convex parts 402 is set to several tens of μm.

Figure 61:
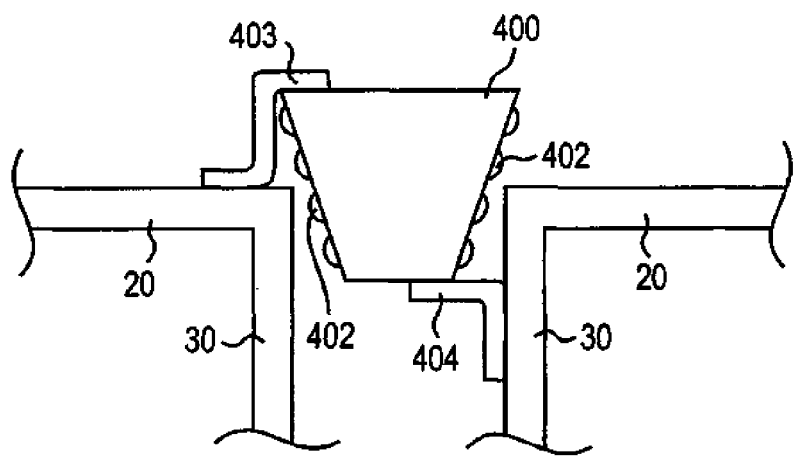
FIG. 61 is a cross-sectional view for describing a method of fixing the suppression/introduction stopper as shown in FIG. 59.

As shown in FIG. 61, the suppression/introduction stopper 400 is fixed at the connection between the reaction vessel 20 and the pipe 30 by supporting members 403 and 404. More specifically, the suppression/introduction stopper 400 is fixed with its one end held by the supporting member 403 fixed to the reaction vessel 20 and the other end held by the supporting member 404 fixed to the inner wall of the pipe 30.

In this case, the convex parts 402 may be or may not come in contact with the reaction vessel 20 and the pipe 30. Where the suppression/introduction stopper 400 is fixed so that the convex parts 402 do not come in contact with the reaction vessel 20 and the pipe 30, the suppression/introduction stopper 400 is fixed by the supporting members 403 and 404 so as to set the interval between the convex parts 402 and the reaction vessel 20 and the pipe 30 to an interval, which allows the metal Na melt 170 to be held by the surface tension of the metal Na melt 170.

Since the metal Na held between the melt holding vessel 10 and the reaction vessel 20 is a solid before the heating of the melt holding vessel 10 and the reaction vessel 20 are started, the nitrogen gas supplied from the gas cylinder 121 can be diffused between the space 21 in the reaction vessel 20 and the space 31 in the pipe 30 through the suppression/introduction stopper 400.

Then, when the heating of the melt holding vessel 10 and the reaction vessel 20 is started and the temperatures of the melt holding vessel 10 and the reaction vessel 20 are raised to a temperature equal to or higher than 98° C., the metal Na held between the melt holding vessel 10 and the reaction vessel 20 is melted to be formed into the metal Na melt 170, causing the nitrogen gas to be confined in the spaces 13 and 21.

Furthermore, the suppression/introduction stopper 400 holds the metal Na melt 170 by the surface tension of the metal Na melt 170 so as to prevent the metal Na melt 170 from outflowing from the inside of the reaction vessel 20 to the space 31 in the pipe 30.

Moreover, as the growth of GaN crystals progresses, the metal Na melt 170 and the suppression/introduction stopper 400 confine the nitrogen gas and the metal Na vapor vaporized from the metal Na melt 170 and the mixed melt 780 in the spaces 13 and 21. As a result, it is possible to suppress the vaporization of the metal Na from the mixed melt 780 and stabilize the molar ratio of the metal Na to the metal Ga in the mixed melt 780. Then, when the nitrogen gas in the space 13 is reduced as the growth of GaN crystals progresses, the pressure P1 in the space 13 becomes lower than the pressure P2 in the space 31 in the pipe 30, and the suppression/introduction stopper 400 causes the nitrogen gas in the space 31 to pass through in the direction of the reaction vessel 20 so as to be supplied to the spaces 21 and 13 through the metal Na melt 170.

As described above, the suppression/introduction stopper 400 functions in the same manner as the suppression/introduction stopper 40. Accordingly, the method of producing GaN crystals using the crystal production apparatus 100N is the same as the method of producing GaN crystals using the crystal production apparatus 100M and shown in the flowchart of FIG. 55.

Although the suppression/introduction stopper 400 includes the convex parts 402 in the above description, it may not include the same. In this case, the suppression/introduction stopper 400 is fixed by the supporting members so as to have the interval of several tens of μm between the stopper 41 and the reaction vessel 20 and the pipe 30.

The interval between the suppression/introduction stopper 400 (including both the type having the convex parts 402 and the type not having the convex parts 402. The same applies to the description below) may also be determined based on the temperature of the suppression/introduction stopper 400. In this case, if the temperature of the suppression/introduction stopper 400 is relatively high, an interval between the suppression/introduction stopper 400 and the reaction vessel 20 and the pipe 30 is made relatively small. Furthermore, if the temperature of the suppression/introduction stopper 400 is relatively low, the interval between the suppression/introduction stopper 400 and the reaction vessel 20 and the pipe 30 is made relatively large.

The interval between the suppression/introduction stopper 400 and the reaction vessel 20 and the pipe 30 capable of holding the metal Na melt 170 by the surface tension thereof is varied by the temperature of the suppression/introduction stopper 400. Accordingly, the interval between the suppression/introduction stopper 400 and the reaction vessel 20 and the pipe 300 is varied in accordance with the temperature of the suppression/introduction stopper 400, thereby making it possible to reliably hold the metal Na melt 170 by the surface tension of the metal Na melt 170.

The temperature of the suppression/introduction stopper 400 is controlled by the heaters 60. In other words, when the temperature of the suppression/introduction stopper 400 is raised to a temperature higher than 150° C., the suppression/introduction stopper 400 is heated by the heaters 60.

According to the embodiment 18, in the process of growing GaN crystals, since the metal Na vapor is confined in the spaces 13 and 21 by the metal Na melt 170 and the suppression/introduction stopper 400 and the nitrogen gas is stably supplied from the pipe 30 to the spaces 13 and 21, it is possible to stabilize the molar ratio of the metal Na to the metal Ga in the mixed melt 780 and stably supply the nitrogen gas to the mixed melt 780. As a result, it is possible to produce high-quality and large-sized GaN crystals.

Note that the suppression/introduction stopper 400 and the metal Na melt 170 constitute the "suppression/introduction vessel."

Furthermore, the suppression/introduction stopper 400 constitutes the "suppression/introduction member."

Moreover, the suppression/introduction stopper 400 constitutes a "gap forming member."

Other details are the same as those of the embodiment 17.

Embodiment 19

Figure 62:
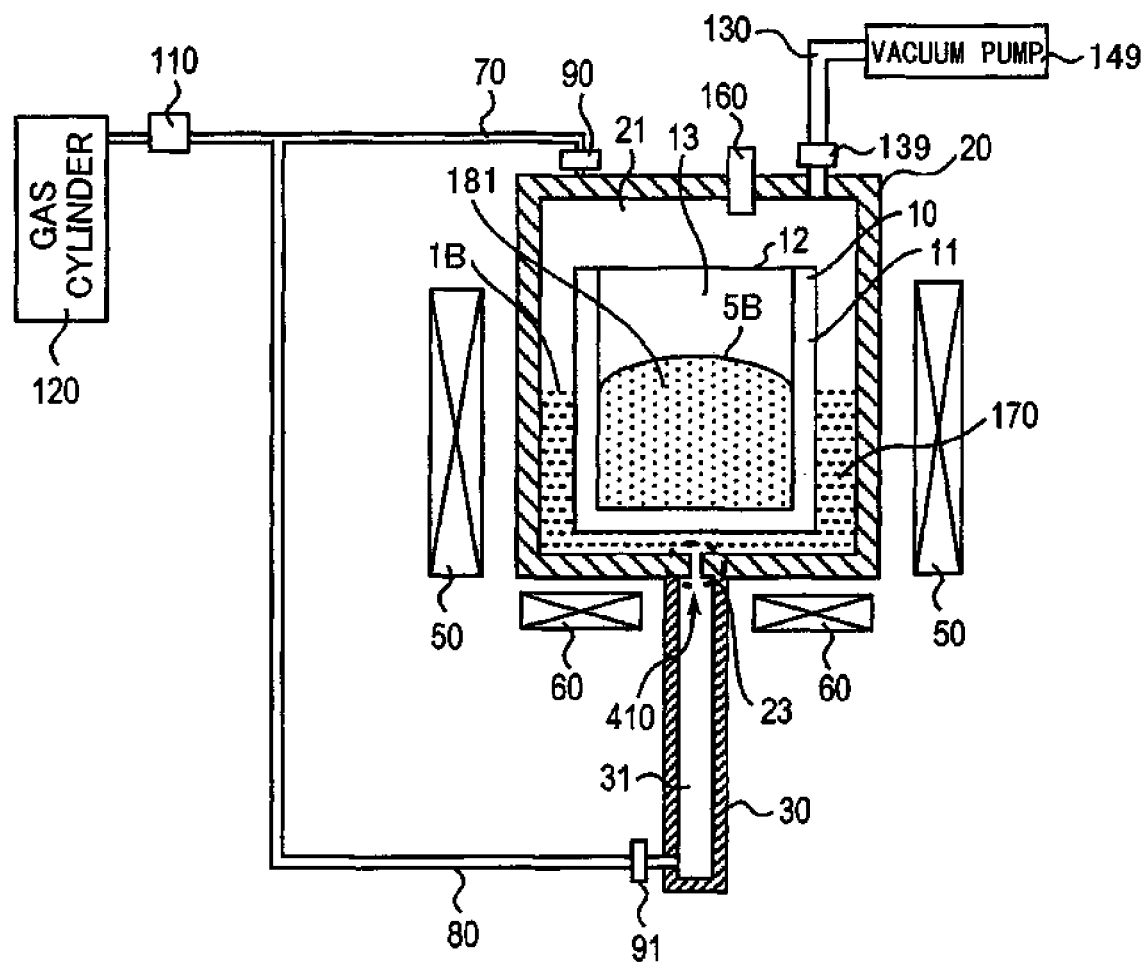
FIG. 62 is a schematic cross-sectional view of a crystal production apparatus of an embodiment 19.

FIG. 62 is a schematic cross-sectional view of a crystal production apparatus according to an embodiment 19.

As shown in FIG. 62, the crystal production apparatus 100O of the embodiment 19 is formed by replacing the suppression/introduction stopper 400 of the crystal production apparatus 100 as shown in FIG. 52 with a through-hole 410. Other components are the same as those of the crystal production apparatus 100.

The through-hole 410 is provided to the reaction vessel 20 at the connection between the reaction vessel 20 and the pipe 30. The through-hole 410 has a diameter of several tens of μm.

Note that, in the crystal production apparatus 100O, the heaters 60 are used, not to heat the melt holding vessel 10 and the reaction vessel 20 to 800° C., but to heat the melt holding vessel 10 and the reaction vessel 20 so as to set the temperature of the through-hole 410 at a temperature at which the metal Na melt 170 is not substantially vaporized through the metal Na melt 170.

Since the metal Na held between the melt holding vessel 10 and the reaction vessel 20 is a solid before the heating of the melt holding vessel 10 and the reaction vessel 20 are started, the nitrogen gas supplied from the gas cylinder 121 can be diffused between the space 21 in the reaction vessel 20 and the space 31 in the pipe 30 through the through-hole 410.

Then, when the heating of the melt holding vessel 10 and the reaction vessel 20 is started and the temperatures of the melt holding vessel 10 and the reaction vessel 20 are raised to a temperature equal to or higher than 98° C., the metal Na held between the melt holding vessel 10 and the reaction vessel 20 is melted to be formed into the metal Na melt 170, causing the nitrogen gas to be confined in the spaces 13 and 21.

Furthermore, the through-hole 410 holds the metal Na melt 170 by the surface tension of the metal Na melt 170 so as to prevent the outflow of the metal Na melt 170 from outflowing from the inside of the reaction vessel 20 to the space 31 in the pipe 30.

Moreover, as the growth of GaN crystals progresses, the metal Na melt 170 and the through-hole 410 confine the nitrogen gas and the metal Na vapor vaporized from the metal Na melt 170 and the mixed melt 780 in the spaces 13 and 21. As a result, it is possible to suppress the vaporization of the metal Na from the mixed melt 780 and stabilize the molar ratio of the metal Na to the metal Ga in the mixed melt 780. Then, when the nitrogen gas in the space 13 is reduced as the growth of GaN crystals progresses, the pressure P1 in the space 13 becomes lower than the pressure P2 in the space 31 in the pipe 30, and the through-hole 410 causes the nitrogen gas in the space 31 to pass through in the direction of the metal Na melt 170 so as to be supplied to the spaces 21 and 13 through the metal Na melt 170.

As described above, the through-hole 410 functions in the same manner as the suppression/introduction stopper 40. Accordingly, the method of producing GaN crystals using the crystal production apparatus 100O is the same as the method of producing GaN crystals using the crystal production apparatus 100 and shown in the flowchart of FIG. 55.

Note that, in the crystal production apparatus 100O, the diameter of the through-hole 410 may also be determined based on the temperature of an area 23 where the through-hole is provided. In this case, if the temperature of the area 23 is relatively high, the diameter of the through-hole 410 is made relatively small. Furthermore, if the temperature of the area 23 is relatively low, the diameter of the through-hole 410 is made relatively large.

The diameter of the through-hole 410 capable of holding the metal Na melt 170 by the surface tension of the metal Na melt 170 is varied by the temperature of the area. Accordingly, the diameter of the through-hole 410 is varied in accordance with the temperature of the area 23, thereby making it possible to reliably hold the metal Na melt 170 by the surface tension of the metal Na melt 170.

Then, the temperature of the area 23 is controlled by the heaters 60.

Figure 63A:
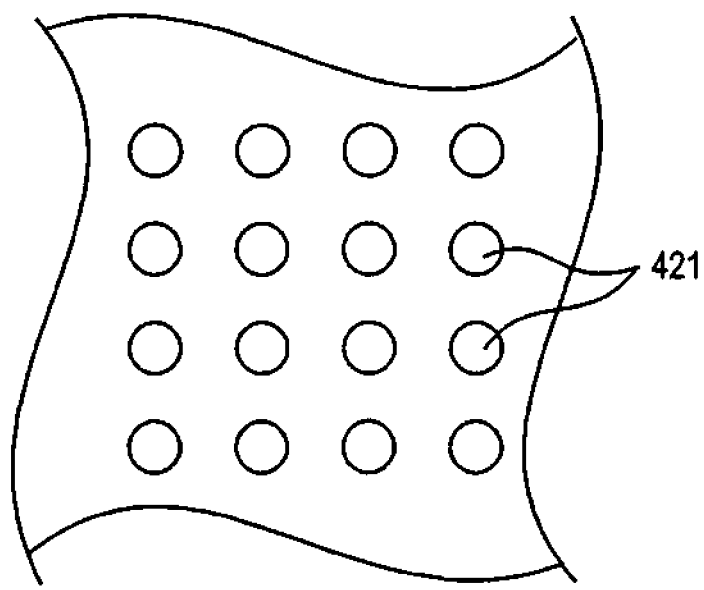
FIG. 63A is a plan view of a member substituting for a through-hole as shown in FIG. 62.
Figure 63B:
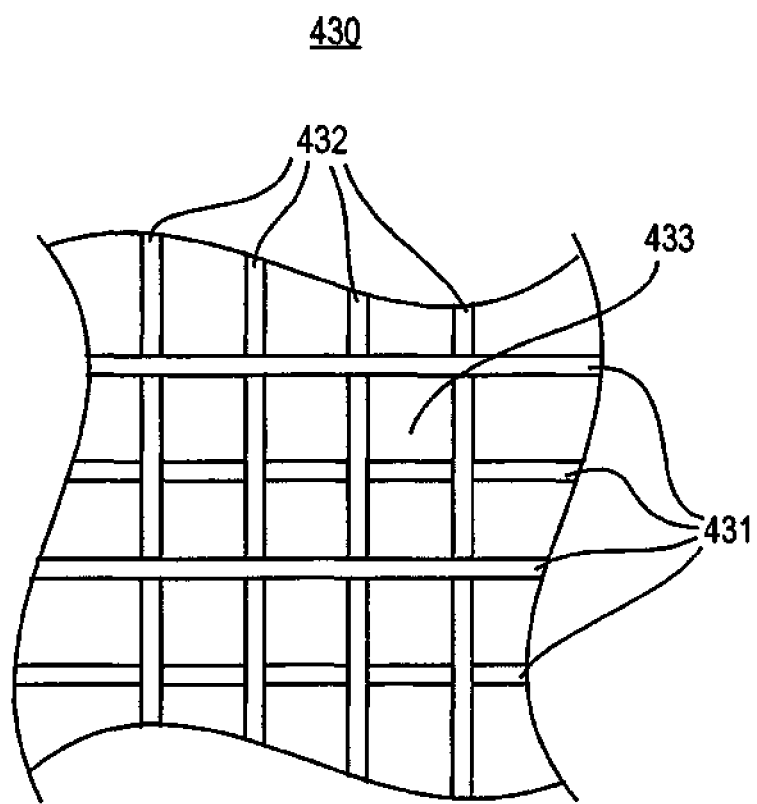
FIG. 63B is a plan view of a member substituting for a through-hole as shown in FIG. 62.

FIGS. 63A and 63B are plan views of members substitute for the through-hole 410 as shown in FIG. 62. Note, however, that FIG. 63A shows a porous member 420, and FIG. 63B shows a mesh member 430.

The porous member 420 is formed of plural holes 421 arranged on a grid. Each of the plural poles 421 has a diameter of several tens of μm.

The mesh member 430 has a structure in which plural wires 431 and plural wires 432 are woven in meshes. Meshes 433 are of a substantially rectangular shape having a length of several tens of μm.

Each of the porous member 420 and the mesh member 430 is arranged at the connection between the reaction vessel 20 and the pipe 30 instead of the through-hole 410.

When used instead of the through-hole 410, the porous member 420 or the mesh member 430 functions in the same manner as the through-hole 410. Accordingly, the method of producing GaN crystals using the porous member 420 or the mesh member 430 is the same as the method of producing GaN crystals using the through-hole 410 and shown in the flowchart of FIG. 4.

According to the embodiment 19, in the process of growing GaN crystals, since the metal Na vapor is confined in the spaces 13 and 21 by the metal Na melt 170 and the through-hole 410 and the nitrogen gas is stably supplied from the pipe 30 to the spaces 13 and 21, it is possible to stabilize the molar ratio of the metal Na to the metal Ga in the mixed melt 780 and stably supply the nitrogen gas to the mixed melt 780. As a result, it is possible to produce high-quality and large-sized GaN crystals.

Note that the plural holes 421 may be randomly arranged in the porous member 420.

Furthermore, the metal Na melt 170 and the through-hole 410 constitute the "suppression/introduction vessel."

Moreover, the metal Na melt 170 and the porous member 420 constitute the "suppression/introduction vessel."

Moreover, the metal Na melt 170 and the mesh member 430 constitute the "suppression/introduction vessel."

Moreover, the through-hole 410 constitutes the "suppression/introduction member."

Moreover, the porous member 420 constitutes the "suppression/introduction member."

Moreover, the mesh member 430 constitutes the "suppression/introduction member."

Other details are the same as those of the embodiment 17.

Embodiment 20

Figure 64:
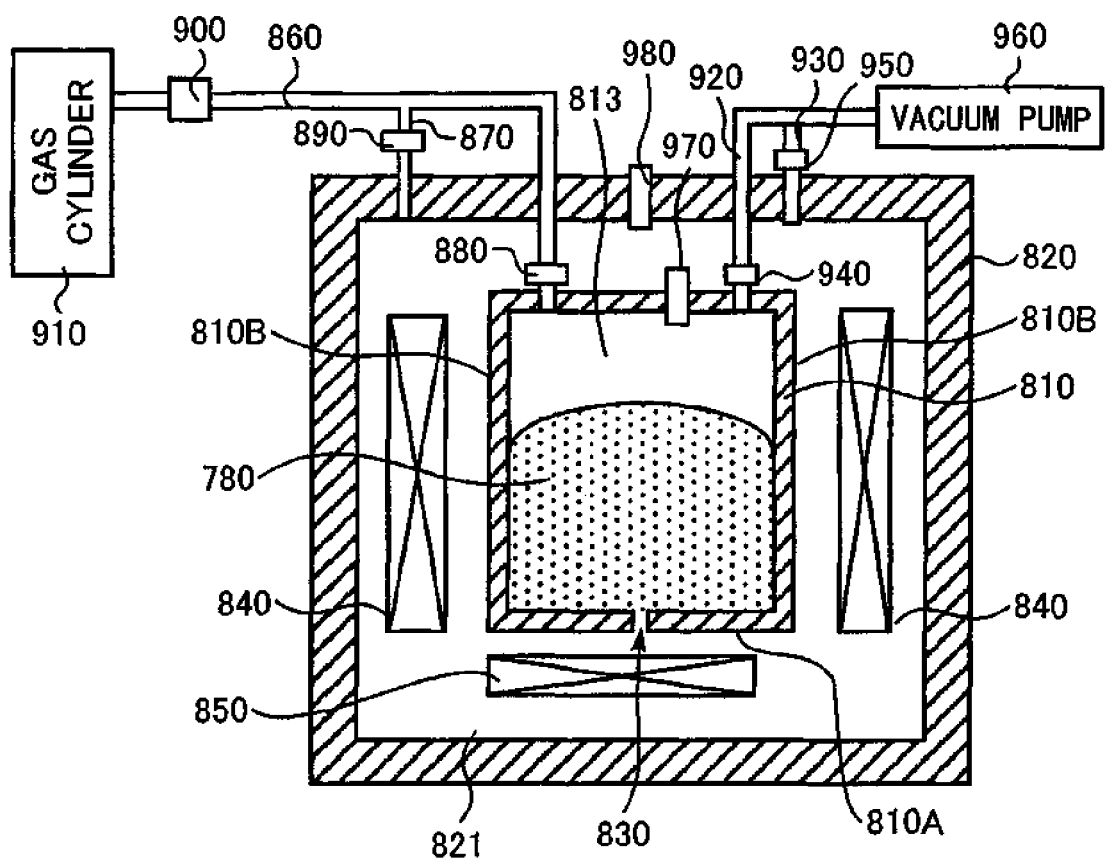
FIG. 64 is a schematic cross-sectional view of a crystal production apparatus of an embodiment 20.

FIG. 64 is a schematic cross-sectional view of a crystal production apparatus according to an embodiment 20.

As shown in FIG. 64, the crystal production apparatus 200E of the embodiment 20 is composed of a melt holding vessel 810, a reaction vessel 820, a through-hole 830, heaters 840 and 850, gas supply pipes 860 and 870, valves 880, 890, 940, and 950, a pressure regulator 900, a gas cylinder 910, exhaust pipes 920 and 930, a vacuum pump 960, and pressure sensors 970 and 980.

The melt holding vessel 810 is made of SUS316L and of a substantially column shape. The reaction vessel 820 is made of SUS316L and arranged on the periphery of the melt holding vessel 810 at a predetermined gap with the melt holding vessel 810. The through-hole 830 is provided at a bottom surface 810A of the reaction vessel 820 and has a diameter of several tens of μm.

The heaters 840 are arranged opposite to an outer peripheral surface 810B of the melt holding vessel 810 between the melt holding vessel 810 and the reaction vessel 820, and the heater 850 is arranged opposite to the bottom surface 810A of the melt holding vessel 810 between the melt holding vessel 810 and the reaction vessel 820.

The gas supply pipe 860 has one end connected to the melt holding vessel 810 through the valve 880 and the other end connected to the gas cylinder 910 through the pressure regulator 900. The gas supply pipe 870 has one end connected to the reaction vessel 820 through the valve 890 and the other end connected to the gas supply pipe 860.

The valve 880 is attached to the gas supply pipe 860 near the melt holding vessel 810. The valve 890 is attached to the gas supply pipe 870 near the reaction vessel 820. The pressure regulator 900 is attached to the gas supply pipe 860 near the gas cylinder 910. The gas cylinder 910 is connected to the gas supply pipe 860.

The exhaust pipe 920 has one end connected to the melt holding vessel 810 through the valve 940 and the other end connected to the vacuum pump 960. The exhaust pipe 930 has one end connected to the reaction vessel 820 through the valve 950 and the other end connected to the exhaust pipe 920. The valve 940 is attached to the exhaust pipe 920 near the metal holding vessel 810. The valve 950 is attached to the exhaust pipe 930 near the reaction vessel 820. The vacuum pump 960 is connected to the exhaust pipe 920.

The pressure sensor 970 is provided on the melt holding vessel 810, and the pressure sensor 980 is provided on the reaction vessel 820.

The melt holding vessel 810 holds the mixed melt 780 of the metal Na and the metal Ga. The through-hole 830 introduces nitrogen gas from the a space 821 in the reaction vessel 820 to a space 813 in the melt holding vessel 810 through the mixed melt 780 and holds the mixed melt 780 in the melt holding vessel 810 by the surface tension of the mixed melt 780.

The reaction vessel 820 covers the periphery of the melt holding vessel 810. The heaters 840 heat the melt holding vessel 810 from the outer peripheral surface 810B of the melt holding vessel 810. The heater 850 heats the melt holding vessel 810 from the bottom surface 810A of the melt holding vessel 810.

The gas supply pipe 860 supplies the nitrogen gas introduced from the gas cylinder 910 through the pressure regulator 900 to the melt holding vessel 810 through the valve 880. The gas supply pipe 870 supplies the nitrogen gas introduced from the gas cylinder 910 through the pressure regulator 900 to the reaction vessel 820 through the valve 890.

The valve 880 supplies the nitrogen gas in the gas supply pipe 860 to the melt holding vessel 810 or stops supplying the nitrogen gas thereto. The valve 890 supplies the nitrogen gas in the gas supply pipe 870 to the reaction vessel 820 or stops supplying the nitrogen gas thereto. The pressure regulator 900 supplies the nitrogen gas from the gas cylinder 910 to the gas supply pipes 860 and 870 after setting it at a predetermined pressure.

The gas cylinder 910 holds nitrogen gas. The exhaust pipe 920 allows the gas in the melt holding vessel 810 to pass through to the vacuum pump 960. The valve 940 causes the melt holding vessel 810 and the exhaust pipe 920 to be spatially connected or causes the melt holding vessel 810 and the exhaust pipe 920 to be spatially interrupted.

The exhaust pipe 930 allows the gas in the reaction vessel 820 to pass through to the vacuum pump 960. The valve 950 causes the reaction vessel 820 and the exhaust pipe 930 to be spatially connected or causes the reaction vessel 820 and the exhaust pipe 930 to be spatially interrupted.

The vacuum pump 960 evacuates the melt holding vessel 810 through the exhaust pipe 920 and the valve 940 and evacuates the reaction vessel 820 through the exhaust pipe 930 and the valve 950.

The pressure sensor 970 detects the pressure in the melt holding vessel 810, and the pressure sensor 980 detects the pressure in the reaction vessel 820.

In growing GaN crystals using the crystal production apparatus 200E, a glove box is used to put the metal Na and the metal Ga in the melt holding vessel 810 in an Ar-gas atmosphere, and the melt holding vessel 810 and the reaction vessel 820 are set in the crystal production apparatus 200E with the space 813 in the melt holding vessel 810 and the space 821 in the reaction vessel 820 filled with Ar gas.

Then, after the valves 940 and 950 are opened to cause the vacuum pump 960 to evacuate the melt holding vessel 810 and the reaction vessel 820 down to a predetermined pressure (equal to or lower than 0.133 Pa) through the exhaust pipes 920 and 930, the valves 940 and 950 are closed and the valves 880 and 890 are opened to supply the nitrogen gas from the gas cylinder 910 into the melt holding vessel 810 and the reaction vessel 820 through the gas supply pipes 860 and 870. In this case, the nitrogen gas is supplied to the melt holding vessel 810 and the reaction vessel 820 with the pressure regulator 900 so that the pressures in the melt holding vessel 810 and the reaction vessel 820 become about atmospheric pressure.

Then, when the pressures in the melt holding vessel 810 and the reaction vessel 120 detected by the pressure sensors 970 and 980 become about atmospheric pressure, the valves 880 and 890 are closed and the valves 940 and 950 are opened to cause the vacuum pump 960 to evacuate the nitrogen gas filling in the melt holding vessel 810 and the reaction vessel 820. In this case also, the melt holding vessel 810 and the reaction vessel 820 are evacuated down to a predetermined pressure (equal to or lower than 0.133 Pa) by the vacuum pump 960.

Then, the evacuation of the melt holding vessel 810 and the reaction vessel 820 and the supplying of the nitrogen gas into the melt holding vessel 810 and the reaction vessel 820 are alternately repeated several times.

Subsequently, after the melt holding vessel 810 and the reaction vessel 820 are evacuated down to the predetermined pressure by the vacuum-pump 960, the valves 940 and 950 are closed and the valves 880 and 890 are opened to supply the nitrogen gas into the melt holding vessel 810 and the reaction vessel 820 with the pressure regulator 900 so that the pressures in the melt holding vessel 810 and the reaction vessel 820 become 10 through 50 times atmospheric pressure.

Then, the valve 880 is closed when the pressure detected by the pressure sensors 970 and 980 becomes 10 through 50 times atmospheric pressure. At this time, since the temperatures of the melt holding vessel 810 and the reaction vessel 820 are room temperature, the metal Na and the metal Ga in the melt holding vessel 810 are a solid. Accordingly, the nitrogen gas filled in the reaction vessel 820 through the valve 890 is diffused also into the melt holding vessel 810 through the through-hole 830, causing the pressure in the melt holding vessel 810 to be easily equalized to the pressure in the reaction vessel 820.

When the supplying of the nitrogen gas into the melt holding vessel 810 and the reaction vessel 820 is completed, the melt holding vessel 810 is heated to 800° C. by the heaters 840 and 850. Then, the temperature of the melt holding vessel 810 is kept at 800° C. for several tens to several hundreds of hours.

The metal Na and the metal Ga put in the melt holding vessel 810 are melted in the process of heating the melt holding vessel 810, thereby generating the mixed melt 780 in the melt holding vessel 810. Then, the nitrogen gas present in the space 810 in the melt holding vessel 810 comes in contact with the mixed melt 780. Since the valve 880 is closed, the nitrogen gas is confined in the space 813.

Then, as the growth of GaN crystals progresses, the metal Na is vaporized from the mixed melt 780, and the metal Na vapor and the nitrogen gas are confined in the space 813. In this case, the pressure of the metal Na vapor in the space 813 is 0.45 of atmospheric pressure. Furthermore, as the growth of GaN crystals progresses, the nitrogen gas in the space 813 is consumed. If the pressure P3 in the melt holding vessel 810 becomes lower than the pressure P4 in the reaction vessel 820 (P3<P4), the nitrogen gas present in the space 821 in the reaction vessel 820 is introduced into the melt holding vessel 810 through the through-hole 830.

Figure 65:
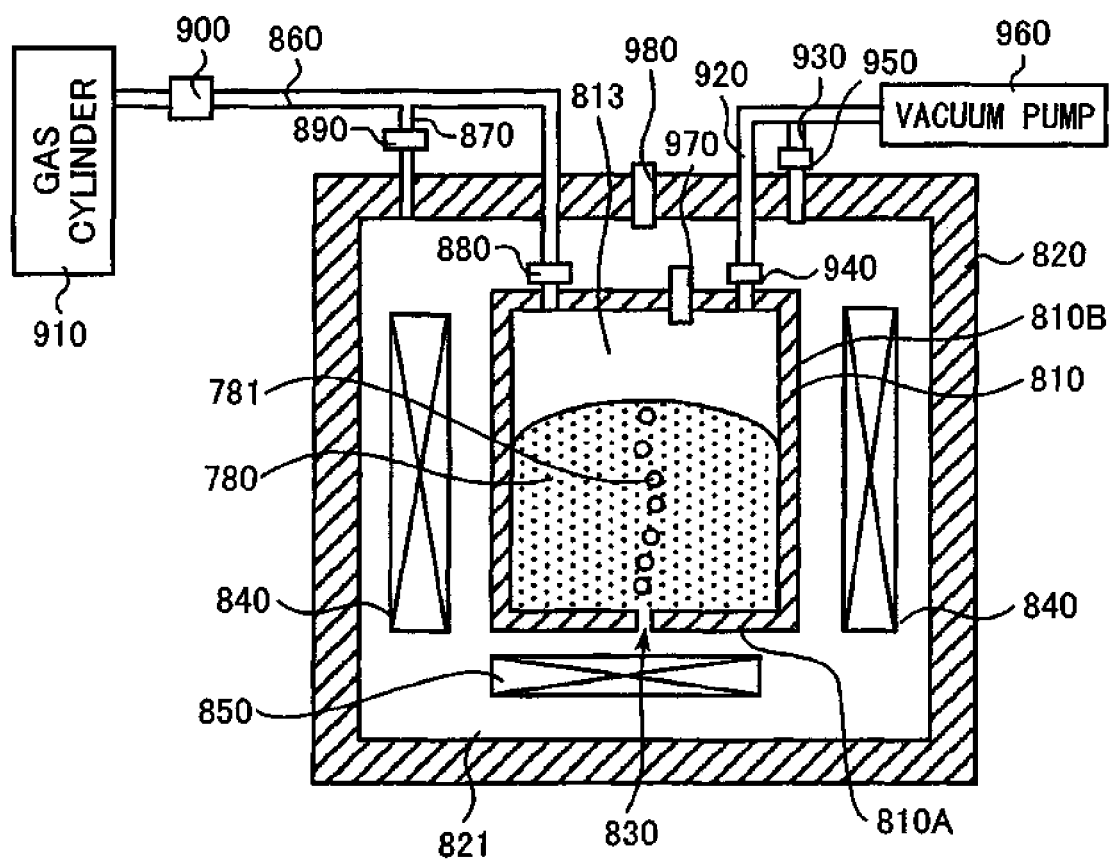
FIG. 65 is a diagram showing a process of growing GaN crystals in the crystal production apparatus as shown in FIG. 64.

FIG. 65 is a drawing showing a process of growing GaN crystals in the crystal production apparatus 200E as shown in FIG. 64. The nitrogen gas introduced from the space 821 to the melt holding vessel 810 through the through-hole 830 is moved in the mixed melt 780 in a foamed state and introduced into the space 813. Accordingly, the nitrogen gas is stably supplied to the space 813.

In the process of growing GaN crystals, the temperature of the through-hole 830 is 800° C. However, as described above, since the through-hole 830 has a diameter of several tens of μm, the mixed melt 780 is held in the melt holding vessel 810 by the surface tension of the mixed melt 780 to prevent the mixed melt 780 from outflowing from the melt holding vessel 810.

In this manner, the through-hole 830 is formed at the bottom surface of the melt holding vessel 810, and the mixed melt 780 is held in the melt holding vessel 810 by the surface tension of the mixed melt 780. Thus, it is possible to confine the nitrogen gas and the metal Na vapor in the space 813 in contact with the mixed melt 780.

As a result, it is possible to achieve high-quality, large-sized, and uniform GaN crystals as in the crystal production apparatus 100 as shown in FIG. 52.

Figure 66:
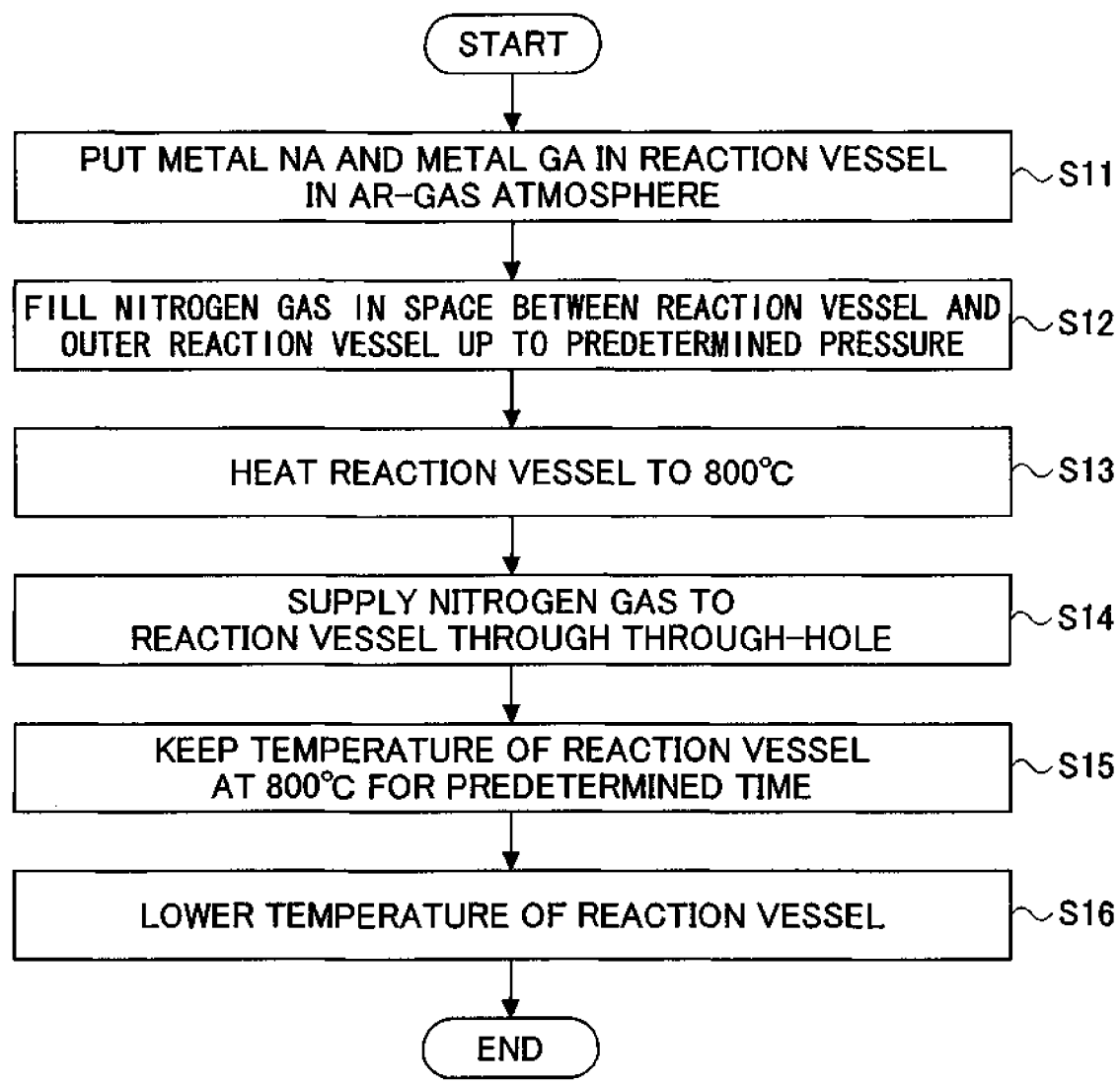
FIG. 66 is a flowchart of the embodiment 4 for describing a method of producing GaN crystals.

FIG. 66 is a flowchart of the embodiment 20 for describing a method of manufacturing GaN crystals.

As shown in FIG. 66, when a series of operations are started, the melt holding vessel 810 and the reaction vessel 820 are put in a glove box filled with Ar gas. Then, the metal Na and the metal Ga are put in the melt holding vessel 810 in an Ar-gas atmosphere (step S11). In this case, the metal Na and the metal Ga with the molar ratio of 5:5 are put in the melt holding vessel 810.

Then, the melt holding vessel 810 and the reaction vessel 820 are set in the crystal production apparatus 200E with the melt holding vessel 810 and the reaction vessel 820 filled with Ar gas.

Subsequently, the evacuation of the melt holding vessel 810 and the reaction vessel 820 and the supplying of the nitrogen gas into the melt holding vessel 810 and the reaction vessel 820 are alternately repeated several times by the above operations. After the melt holding vessel 810 and the reaction vessel 820 are evacuated down to a predetermined pressure (equal to or lower than 0.133 Pa) by the vacuum pump 960, the valves 940 and 950 are closed and the valves 880 and 890 are opened to supply the nitrogen gas from the gas cylinder 910 to the melt holding vessel 810 and the reaction vessel 820 through the gas supply pipes 860 and 870. Then, the nitrogen gas is supplied to the melt holding vessel 810 and the reaction vessel 820 with the pressure regulator 900 so that the pressures in the melt holding vessel 810 and the reaction vessel 820 become 10 through 50 times atmospheric pressure (step S12).

In this case, since the metal Na and the metal Ga put in the melt holding vessel 810 are a solid, the nitrogen gas is supplied to the space 813 in the melt holding vessel 810 also from the space 821 in the reaction vessel 820 through the throughhole 830 of the melt holding vessel 810. Then, the valve 880 is closed when the pressures in the spaces 813 and 821 detected by the pressure sensors 970 and 980 become 10 through 50 times atmospheric pressure.

Subsequently, the melt holding vessel 810 is heated up to 800° C. by the heaters 840 and 850 (step S13). Accordingly, the metal Na and the metal Ga in the melt holding vessel 810 are melted to generate the mixed melt 780 in the melt holding vessel 810. Then, when the temperature of the mixed melt 780 becomes 800° C., GaN crystals start growing in the mixed melt.

Note that when the melt holding vessel 810 is raised to 800° C., the melt holding vessel 810 is also raised to 800° C. However, since the through-hole 830 has a diameter of several tens of μm, it holds the mixed melt 780 in the melt holding vessel 810 by the surface tension of the mixed melt 780.

Furthermore, as the growth of GaN crystals progresses, the metal Na is vaporized from the mixed melt 780 to generate the metal Na vapor in the space 813. In this case, the pressure of the metal Na vapor is approximately 0.45 of atmospheric pressure at 800° C. Even if the metal Na vapor is generated in the space 813, it never flows from the space 813 in the melt holding vessel 810 since it comes only in contact with the mixed melt 780 and the melt holding vessel 810. As a result, the molar ration of the metal Na to the metal Ga in the mixed melt 780 becomes stable.

Moreover, as the growth of GaN crystals progresses, the nitrogen gas in the space 813 is consumed to thereby reduce the nitrogen gas in the space 813. Thus, the pressure P3 in the space 813 become lower than the pressure P4 in the pipe 821 (P3<P4) to generate the differential pressure between the space 813 and the space 821. As a result, the nitrogen gas in the space 821 is supplied to the space 813 through the through-hole 830 and the mixed melt 780 (step S14).

Subsequently, the temperature of the melt holding vessel 810 is kept at 800° C. for predetermined hours (several tens to several hundreds of hours) (step S15). Accordingly, largesized GaN crystals are grown. The GaN crystals are columnshaped GaN crystals grown in the c-axis (<0001>) direction and are defect-free crystals.

Then, the temperature of the melt holding vessel 810 is lowered (step S16), thus completing and the production of GaN crystals.

According to the embodiment 20, in the process of growing GaN crystals, since the metal Na vapor is confined in the space 813 by the mixed melt 780 and the through-hole 830 and the nitrogen gas is stably supplied from the space 821 in the reaction vessel 820 to the space 813, it is possible to stabilize the molar ratio of the metal Na to the metal Ga in the mixed melt 780 and stably supply the nitrogen gas to the mixed melt 780. As a result, it is possible to produce largesized GaN crystals.

Furthermore, when the crystal production apparatus 200E is used, it is not necessary to have the pipe 30 of the crystal production apparatus 100, thus making it possible to simplify the crystal production apparatus 200E in structure.

Moreover, in the crystal production apparatus 200E, the mixed melt 780 is used as a material of CaN crystals and used to confine the nitrogen gas and the metal Na vapor in the space 813 in the melt holding vessel 810. Therefore, the crystal production apparatus 200E does not need the metal Na melt 170 other than the mixed melt 780 like the crystal production apparatus 100 and uses a lesser amount of metal Na than the crystal production apparatus 100. As a result, it is possible to produce GaN crystals at low cost.

Note that, in the embodiment 20, the porous member 420 or the mesh member 430 as shown in FIGS. 63A and 63B may be used instead of the through-hole 830.

Furthermore, the mixed melt 780 and the through-hole 830 constitute the "suppression/introduction vessel."

Furthermore, the mixed melt 780 and the porous member 420 constitute the "suppression/introduction vessel."

Furthermore, the mixed melt 780 and the mesh member 430 constitute the "suppression/introduction vessel."

Furthermore, the pressure regulator 900 and the gas cylinder 910 constitute the "gas supply unit."

Other details are the same as those of the embodiments 17 and 18.

Embodiment 21

Figure 67:
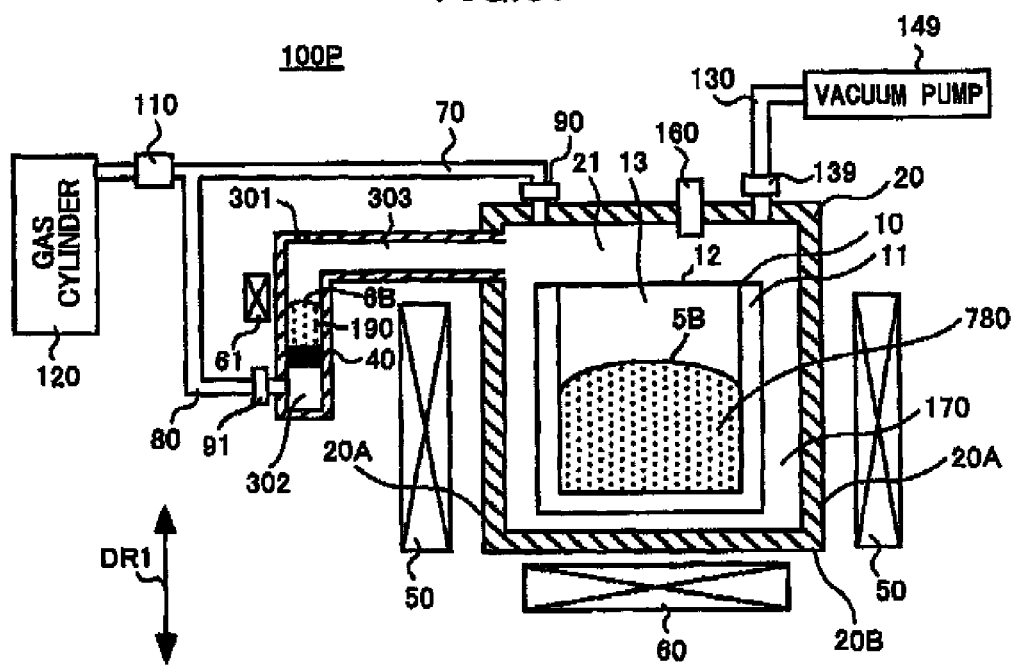
FIG. 67 is a schematic cross-sectional view of a crystal production apparatus according to an embodiment 21.

FIG. 67 is a schematic cross-sectional view of a crystal production apparatus according to an embodiment 21.

As shown in FIG. 67, the crystal production apparatus 100P of the embodiment 21 is formed by replacing the pipe 30 of the crystal production apparatus 100 as shown in FIG. 52 with a pipe 301, replacing the metal Na melt 170 with a metal Na melt 190, and adding a heater 61 thereto. Other components are the same as those of the crystal production apparatus 100.

In the crystal production apparatus 100P, the suppression/introduction stopper 40 is provided in the pipe 301, and the gas supply pipe 80 is connected to the space 302 in the pipe 301.

The pipe 301 is of a substantially L-shape and connected to the reaction vessel 20 near the cover part 12 of the melt holding vessel 10. The melt Na melt 190 is formed of a metal Na melt and held in the space 303 in the pipe 301 communicating with the space 21 in the reaction vessel 20 by the suppression/introduction stopper 40.

The heater 61 is arranged opposite to the pipe 301 and heats the gas-liquid interface 6B between the metal Na melt 190 and the space 303 to 800° C. In this case, the temperature of the suppression/introduction stopper 40 is set at a temperature at which the metal Na melt 190 is not substantially vaporized.

In growing GaN crystals using the crystal production apparatus 100P, a glove box is used to put the metal Na and the metal Ga in the melt holding vessel 810 in an Ar-gas atmosphere and put the metal Na in the space 301 in the pipe 301 in an Ar-gas atmosphere. Then, the melt holding vessel 10, the reaction vessel 20, and the pipe 301 are set in the crystal production apparatus 100P with the space 13 in the melt holding vessel 10, the space 21 in the reaction vessel 20, and the spaces 302 and 303 in the pipe 301 filled with Ar gas.

Subsequently, the evacuation of the melt holding vessel 10, the reaction vessel 20, and the pipe 301 and the supplying of the nitrogen gas into the melt holding vessel 10, the reaction vessel 20, and the pipe 301 are alternately repeated several times by the method described in the embodiment 17.

After the melt holding vessel 10, the reaction vessel 20, and the pipe 301 are evacuated down to a predetermined pressure by the vacuum pump 149, the valve 139 is closed and the valves 90 and 91 are opened to supply the nitrogen gas to the melt holding vessel 10, the reaction vessel 20, and the pipe 301 with the pressure regulator 110 so that the pressures in the melt holding vessel 10, the reaction vessel 20, and the pipe 301 become 10 through 50 times atmospheric pressure.

Then, the valve 90 is closed when the pressure detected by the pressure sensor 160 becomes 10 through 50 times atmospheric pressure. At this time, since the temperatures of the melt holding vessel 10, the reaction vessel 20, and the pipe 301 are room temperature, the metal Na in the pipe 301 is a solid. Accordingly, the nitrogen gas supplied to the space 301 in the pipe 301 is diffused also into the reaction vessel 20 and the melt holding vessel 10 through a gap 43 (see FIG. 3 by replacing reference numeral 30 with reference numeral 301) between the suppression/introduction stopper 40 and the inner wall 30A of the pipe 301, causing the pressures in the spaces 13, 21, 302, and 303 to be easily equalized to one another.

When the supplying of the nitrogen gas into the melt holding vessel 10, the reaction vessel 20, and the pipe 301 is completed, the melt holding vessel 10 and the reaction vessel 20 are heated to 800° C. by the heaters 50 and 60, and the gas-liquid interface 6B is heated to 800° C. by the heater 61. Then, the temperatures of the melt holding vessel 10, the reaction vessel 20, and the gas-liquid interface 6B are kept at 800° C. for several tens to several hundreds of hours.

The metal Na and the metal Ga put in the melt holding vessel 10 are melted in the process of heating the melt holding vessel 10, thereby generating the mixed melt 780 in the melt holding vessel 10. Furthermore, the metal Na in the pipe 301 is melted in the process of heating the pipe 301, thereby generating the metal Na melt 190 in the pipe 301. Since the nitrogen gases in the melt holding vessel 10, the reaction vessel 20, and the pipe 301 are not allowed to pass through the metal Na melt 190 because the valves 90 and 140 are closed, they are confined in the spaces 13, 21, and 303.

Then, as the growth of GaN crystals progresses, the metal Na is vaporized from the mixed melt 780 and the metal Na melt 190, and the metal Na vapor and the nitrogen gas are confined in the spaces 13, 21, and 303. In this case, the pressure of the metal Na vapor in the spaces 13, 21, and 303 is 0.45 of atmospheric pressure. Furthermore, as the growth of GaN crystals progresses, the nitrogen gas in the space 13 is consumed. If the pressure P1 in the melt holding vessel 10 becomes lower than the pressure P5 in the space 302 in the pipe 301 (P1<P5), the nitrogen gas present in the space 302 in the pipe 301 is introduced into the spaces 13, 21, and 303 through the suppression/introduction stopper 40 and the metal Na melt 190.

As a result, it is possible to achieve high-quality, large-sized, and uniform GaN crystals as in the crystal production apparatus 100 as shown in FIG. 52.

Note that a method of producing GaN crystals using the crystal production apparatus 100P has the same flowchart as the one as shown in FIG. 55. In this case, in step S2, the metal Na is put in the space 303 in the pipe 301 in an Ar-gas atmosphere. Furthermore, in step S3, the nitrogen gas is filled in the melt holding vessel 10, the reaction vessel 20, and the pipe 301 up to a predetermined pressure (10 through 50 times atmospheric pressure). Furthermore, the melt holding vessel 10, the reaction vessel 20, and the gas-liquid interface 6B are heated to 800° C. in step S4, the temperatures of the melt holding vessel 10, the reaction vessel 20, and the gas-liquid interface 6B are kept at 800° C. in step S6, and the temperatures of the melt holding vessel 10, the reaction vessel 20, and the pipe 301 are lowered in step S7.

Furthermore, in the crystal production apparatus 100P, the temperature T6 at the gas-liquid interface 6B between the space 303 and the metal Na melt 190 or at a point near the gas-liquid interface 6B is set equal to or higher than the temperature T2 at the gas-liquid interface 5B or at a point near the gas-liquid interface 5B to produce GaN crystals. The reason for setting the temperature T6 higher than the temperature T2 is the same as the reason for setting the temperature T1 higher than the temperature T2 in the embodiment 17.

Moreover, in the crystal production apparatus 100P, the heater 61 may heat the pipe 301 so that the metal Na in the pipe 301 becomes a liquid and the temperature at the gas-liquid interface 6B becomes lower than 800° C.

Moreover, in the crystal production apparatus 100P, the suppression/introduction stopper 400 may be used instead of the suppression/introduction stopper 40.

Figure 68:
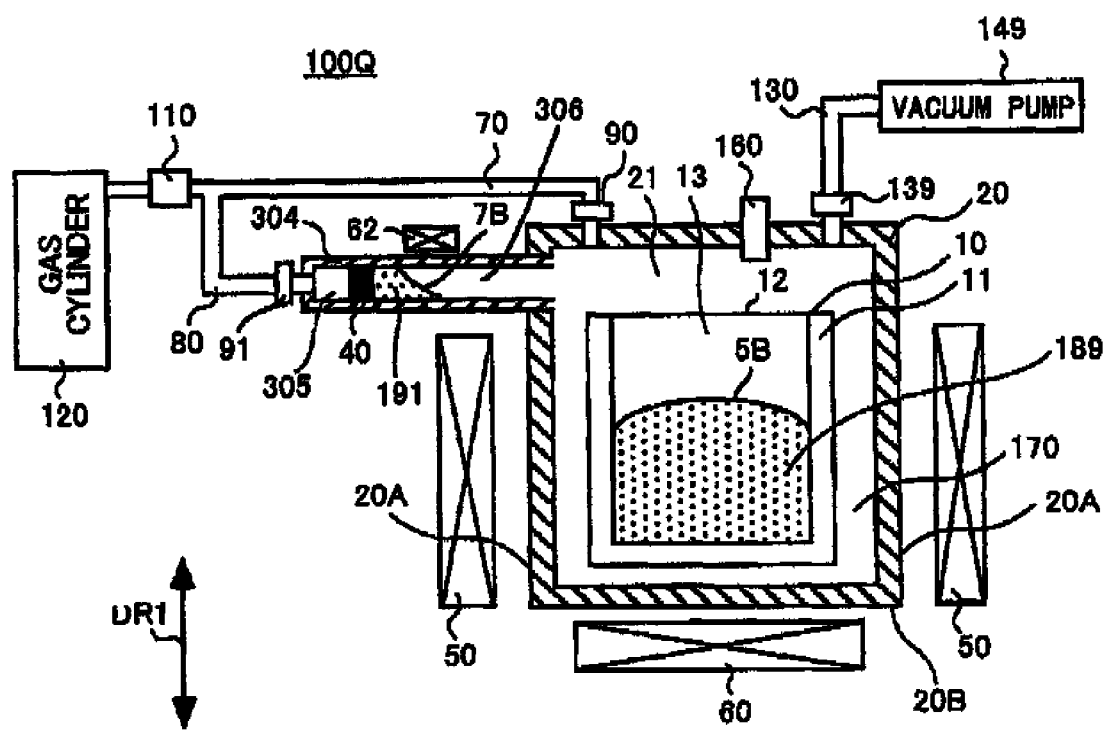
FIG. 68 is another schematic cross-sectional view of the crystal production apparatus of the embodiment 21.

FIG. 68 is another schematic cross-sectional view of the crystal production apparatus of the embodiment 21. The crystal production apparatus of the embodiment 21 may be replaced by the crystal production apparatus 100Q as shown in FIG. 68.

As shown in FIG. 68, the crystal production apparatus 100Q is formed by replacing the pipe 301 of the crystal production apparatus 100P as shown in FIG. 67 with a pipe 304 and replacing the heater 61 with a heater 62. Other components are the same as those of the crystal production apparatus 100P.

In the crystal production apparatus 100Q, the suppression/introduction stopper 40 is provided in the pipe 304, and the gas supply pipe 80 is connected to the space 305 in the pipe 304.

The pipe 304 is of a linear shape and connected to the reaction vessel 20 near the cover part 12 of the melt holding vessel 10. A metal melt 191 is formed of a metal Na melt and held in the space 306 in the pipe 304 communicating with the space 21 in the reaction vessel 20 by the suppression/introduction stopper 40.

The heater 62 is arranged opposite to the pipe 304 and heats the gas-liquid interface 7B between the metal melt 191 and the space 306 to 800° C. In this case, the temperature of the suppression/introduction stopper 40 is set at a temperature at which the metal melt 191 is not substantially vaporized.

In growing GaN crystals using the crystal production apparatus 100Q, a glove box is used to put the metal Na and the metal Ga in the melt holding vessel 10 in an Ar-gas atmosphere and put the metal Na in the space 306 in the pipe 304 in an Ar-gas atmosphere. Then, the melt holding vessel 10, the reaction vessel 20, and the pipe 304 are set in the crystal production apparatus 100Q with the space 13 in the melt holding vessel 10, the space 21 in the reaction vessel 20, and the spaces 305 and 306 in the pipe 304 filled with Ar gas.

Subsequently, the evacuation of the melt holding vessel 10, the reaction vessel 20, and the pipe 304 and the supplying of the nitrogen gas into the melt holding vessel 10, the reaction vessel 20, and the pipe 304 are alternately repeated several times by the method described in the embodiment 17.

After the melt holding vessel 10, the reaction vessel 20, and the pipe 304 are evacuated down to a predetermined pressure by the vacuum pump 149, the valve 139 is closed and the valves 90 and 91 are opened to supply the nitrogen gas to the melt holding vessel 10, the reaction vessel 20, and the pipe 304 with the pressure regulator 110 so that the pressures in the melt holding vessel 10, the reaction vessel 20, and the pipe 304 become 10 through 50 times atmospheric pressure.

Then, the valve 90 is closed when the pressure detected by the pressure sensor 160 becomes 10 through 50 times atmospheric pressure. At this time, since the temperatures of the melt holding vessel 10, the reaction vessel 20, and the pipe 304 are room temperature, the metal Na in the pipe 304 is a solid. Accordingly, the nitrogen gas supplied to the space 305 in the pipe 304 is diffused also into the reaction vessel 20 and the melt holding vessel 10 through a gap between the suppression/introduction stopper 40 and the inner wall of the pipe 304, causing the pressures in the spaces 13, 21, 305, and 306 to be easily equalized to one another.

When the supplying of the nitrogen gas into the melt holding vessel 10, the reaction vessel 20, and the pipe 304 is completed, the melt holding vessel 10 and the reaction vessel 20 are heated to 800° C. by the heaters 50 and 60, and the gas-liquid interface 7B is heated to 800° C. by the heater 62. Then, the temperatures of the melt holding vessel 10, the reaction vessel 20, and the gas-liquid interface 7B are kept at 800° C. for several tens to several hundreds of hours.

The metal Na and the metal Ga put in the melt holding vessel 10 are melted in the process of heating the melt holding vessel 10, thereby generating the mixed melt 780 in the melt holding vessel 10. Furthermore, the metal Na in the pipe 304 is melted in the process of heating the pipe 304, thereby generating the metal Na melt 191 in the pipe 304. Since the nitrogen gases in the melt holding vessel 10, the reaction vessel 20, and the pipe 304 are not allowed to pass through the metal Na melt 190 because the valves 90 and 140 are closed, they are confined in the spaces 13, 21, and 306.

Then, as the growth of GaN crystals progresses, the metal Na is vaporized from the mixed melt 780 and the metal melt 191, and the metal Na vapor and the nitrogen-gas are confined in the spaces 13, 21, and 306. In this case, the pressure of the metal Na vapor in the spaces 13, 21, and 306 is 0.45 of atmospheric pressure. Furthermore, as the growth of GaN crystals progresses, the nitrogen gas in the space 13 is consumed. If the pressure P1 in the melt holding vessel 10 becomes lower than the pressure P6 in the space 305 in the pipe 304 (P1<P6), the nitrogen gas present in the space 305 in the pipe 304 is introduced into the spaces 13, 21, and 306 through the suppression/introduction stopper 40 and the metal Na melt 191.

As a result, it is possible to achieve high-quality, large-sized, and uniform GaN crystals as in the crystal production apparatus 100P as shown in FIG. 67.

Note that a method of producing GaN crystals using the crystal production apparatus 100Q has the same flowchart as the one as shown in FIG. 55. In this case, in step S2, the metal Na is put in the space 306 in the pipe 304 in an Ar-gas atmosphere. Furthermore, in step S3, the nitrogen gas is tilled in the melt holding vessel 10, the reaction vessel 20, and the pipe 304 up to a predetermined pressure (10 through 50 times atmospheric pressure). Furthermore, the melt holding vessel 10, the reaction vessel 20, and the gas-liquid interface 7B are heated to 800° C. in step S4, the temperatures of the melt holding vessel 10, the reaction vessel 20, and the gas-liquid interface 7B are kept at 800° C. in step S6, and the temperatures of the melt holding vessel 10, the reaction vessel 20, and the pipe 304 are lowered in step S7.

Furthermore, in the crystal production apparatus 100Q, the temperature T7 at the gas-liquid interface 7B between the space 306 and the metal Na melt 191 or at a point near the gas-liquid interface 7B is set equal to or higher than the temperature T2 to produce GaN crystals. The reason for setting the temperature T7 equal to or higher than the temperature T2 is the same as the reason for setting the temperature T1 equal to or higher than the temperature T2 in the embodiment 17.

Moreover, in the crystal production apparatus 100Q, the heater 62 may heat the pipe 304 so that the metal Na in the pipe 304 becomes a liquid and the temperature at the gas-liquid interface 7B becomes lower than 800° C.

Moreover, in the crystal production apparatus 100Q, the suppression/introduction stopper 400 may be used instead of the suppression/introduction stopper 40.

Moreover, in the crystal production apparatus 100Q, part of the pipe 304 to which the suppression/introduction pipes 40 and 400 are provided may be formed narrower than other parts so that the metal melt 191 comes in contact with the whole area of the end surface on the space 306 side of the suppression/introduction stoppers 40 and 400.

Figure 69:
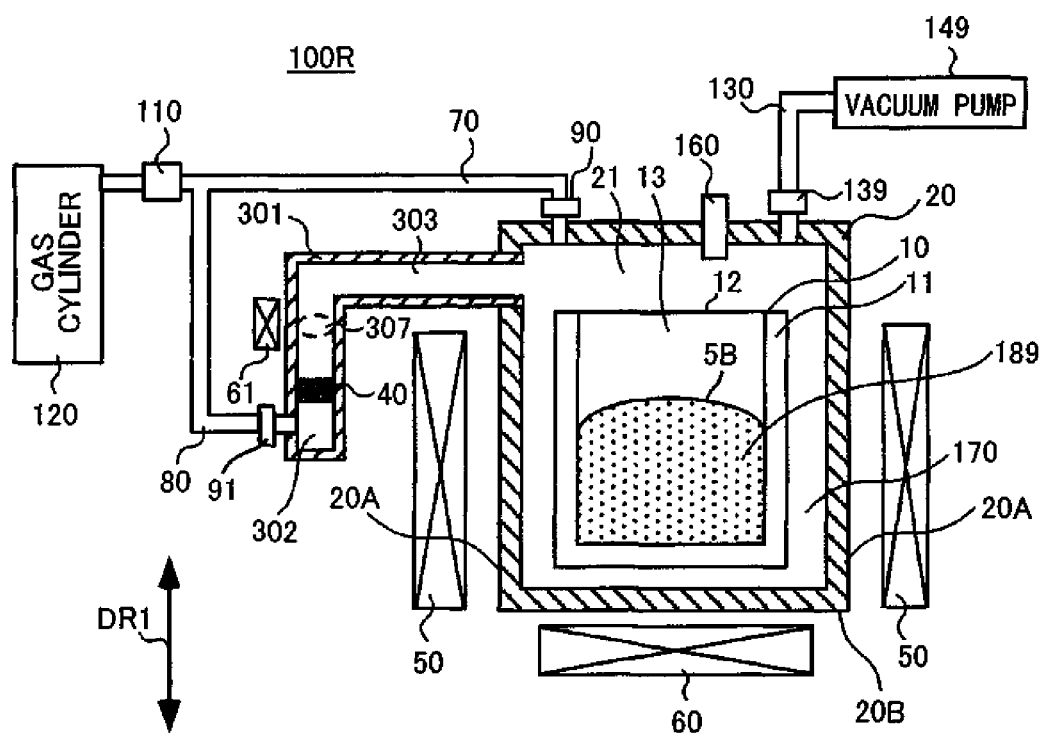
FIG. 69 is still another schematic cross-sectional view of the crystal production apparatus of the embodiment 21.

FIG. 69 is still another schematic cross-sectional view of the crystal production apparatus of the embodiment 21. The crystal production apparatus of the embodiment 21 may be replaced by the crystal production apparatus 100R as shown in FIG. 69.

As shown in FIG. 69, the crystal production apparatus 100R is formed by eliminating the metal Na melt 190 from the crystal production apparatus 100P as shown in FIG. 67. Other components are the same as those of the crystal production apparatus 100P.

In the crystal production apparatus 100R, the heater 61 heats an certain area 307 of the pipe 301 to 800° C. after the melt holding vessel 10 and the reaction vessel 20 are heated to 800° C. by the heaters 50 and 60.

Figure 70:
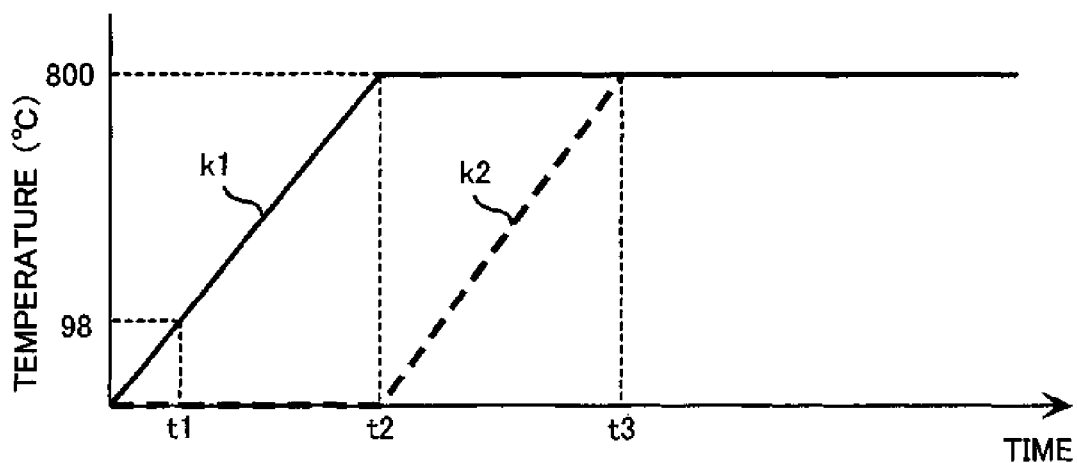
FIG. 70 is a diagram showing the temperature change of the melt holding vessel, the reaction vessel, and the certain area of the pipe as shown in FIG. 69.

FIG. 70 is a diagram showing the temperature change of the melt holding vessel 10, the reaction vessel 20, and the certain area 307 of the pipe 301 as shown in FIG. 69. In FIG. 70, the curved line k1 shows the temperature change of the melt holding vessel 10 and the reaction vessel 20, which is the same as the temperature change as shown in FIG. 56. Furthermore, the curved line k2 shows the temperature change of the certain area 307 of the pipe 301.

As shown in FIG. 70, at the timing t2 at which the melt holding vessel 10 and the reaction vessel 20 are heated to 800° C. by the heaters 50 and 60, the heater 61 starts heating the certain area 307 of the pipe 301 and heats the same to 800° C. at the timing t3. Then, the heater 61 keeps the certain area 307 of the pipe 301 at 800° C. after the timing t3 (see the curved line k2).

When the melt holding vessel 10 and the reaction vessel 20 are heated to 800° C. to make the temperature of the mixed melt 780 become 800° C., GaN crystals starts growing in the mixed melt 780 and the metal Na starts vaporizing from the mixed melt 780. Then, the amount of a metal Na vapor in the melt holding vessel 10 is increased, and the metal Na vapor in the space 13 is diffused into the spaces 21 and 303 through the gap between the main body part 11 and the cover part 12.

In this case, since the heater 61 has not heated the pipe 301, the temperature of the suppression/introduction stopper 40 is room temperature. Accordingly, the metal Na vapor diffused into the space 303 is cooled in the pipe 301 to be formed into a metal melt or a solid like the metal Na melt 190 as shown in FIG. 67 and accumulated on the suppression/introduction stopper 40. The diffusion of the metal Na vapor from the space 13 to the space 303 is continued until the metal Na vapors are in equilibrium with one another in the spaces 13, 21, and 303. Specifically, the diffusion of the metal Na vapor from the space 13 to the space 303 is continued until the temperature T2 at the gas-liquid interface 5B is approximately equalized to the temperature T6 at the gas-liquid interface 6B, namely, until the timing t3 at which the temperature T6 at the gas-liquid interface 6B is equalized to the temperature T2 at the gas-liquid interface 5B.

Then, when the metal Na vapors in the spaces 13, 21, and 303 are in equilibrium with one another after the timing t3, the vaporization of the metal Na from the mixed melt 780 is suppressed to grow large-sized GaN crystals in the mixed melt 780.

In growing GaN crystals using the crystal production apparatus 100R, a glove box is used to put the metal Na and the metal Ca in the melt holding vessel 10 in an Ar-gas atmosphere. Then, the melt holding vessel 10, the reaction vessel 20, and the pipe 301 are set in the crystal production apparatus 100R with the space 13 in the melt holding vessel 10, the space 21 in the reaction vessel 20, and the spaces 302 and 303 in the pipe 301 filled with Ar gas.

Subsequently, the evacuation of the melt holding vessel 101 the reaction vessel 20, and the pipe 301 and the supplying of the nitrogen gas into the melt holding vessel 10, the reaction vessel 20, and the pipe 301 are alternately repeated several times by the method described in the embodiment 17.

After the melt holding vessel 10, the reaction vessel 20, and the pipe 301 are evacuated down to a predetermined pressure by the vacuum pump 149, the valve 139 is closed and the valves 90 and 91 are opened to supply the nitrogen gas into the melt holding vessel 10, the reaction vessel 20, and the pipe 301 with the pressure regulator 110 so that the pressures in the melt holding vessel 10, the reaction vessel 20, and the pipe 301 become 10 through 50 times atmospheric pressure.

When the supplying of the nitrogen gas into the melt holding vessel 10, the reaction vessel 20, and the pipe 301 is completed, the melt holding vessel 10 and the reaction vessel 20 are heated to 800° C. by the heaters 50 and 60. When the melt holding vessel 10 and the reaction vessel 20 are heated to 800° C., the certain area 307 is heated to 800° C. by the heater 61. Then, the temperatures of the melt holding vessel 10, the reaction vessel 20, and the certain area 307 of the pipe 301 are kept at 800° C. for several tens to several hundreds of hours.

The metal Na and the metal Ga put in the melt holding vessel 10 are melted in the process of heating the melt holding vessel 10, thereby generating the mixed melt 780 in the melt holding vessel 10. Then, the metal Na is vaporized from the mixed melt 780 and diffused into the spaces 13, 21, and 303.

The metal Na vapor diffused into the space 303 is accumulated on the suppression/introduction stopper 40 as the metal Na melt 190 as described above. Then, when the gas-liquid interface GB in the pipe 301 becomes 800° C., the metal Na vapors in the spaces 13, 21, and 303 are in equilibrium with one another to stop the diffusion of the metal Na vapor from the space 13 to the space 303.

Since the nitrogen gases in the melt holding vessel 10, the reaction vessel 20, and the pipe 301 are not allowed to pass through the metal Na melt 190 because the valves 90 and 140 are closed, they are confined in the spaces 13, 21, and 303.

Then, as the growth of GaN crystals progresses, the metal Na is vaporized from the mixed melt 780 and the metal melt 191, and the metal Na vapor and the nitrogen gas are confined in the spaces 13, 21, and 303. In this case, the pressure of the metal Na vapor in the spaces 13, 21, and 303 is 0.45 of atmospheric pressure. Furthermore, as the growth of GaN crystals progresses, the nitrogen gas in the space 13 is consumed. If the pressure P1 in the melt holding vessel 10 becomes lower than the pressure P5 in the space 303 in the pipe 303 (P1<P5), the nitrogen gas present in the space 302 in the pipe 301 is introduced into the spaces 13, 21, and 303 through the suppression/introduction stopper 40 and the metal Na melt 190.

As a result, it is possible to achieve high-quality, large-sized, and uniform GaN crystals as in the crystal production apparatus 100 as shown in FIG. 52.

Note that a method of producing GaN crystals using the crystal production apparatus 100R has a flowchart in which step S2 is eliminated from the flowchart as shown in FIG. 55. In this case, in step S3, the nitrogen gas is filled in the melt holding vessel 10, the reaction vessel 20, and the pipe 301 up to a predetermined pressure (10 through 50 times atmospheric pressure). Furthermore, the melt holding vessel 10, the reaction vessel 20, and the gas-liquid interface 6B are heated to 800° C. in step S4, the temperatures of the melt holding vessel 10, the reaction vessel 20, and the gas-liquid interface GB are kept at 800° C. in step S6, and the temperatures of the melt holding vessel 10, the reaction vessel 20, and the pipe 301 are lowered in step S7.

Other details are the same as those of the crystal production apparatus 100P.

Figure 71:
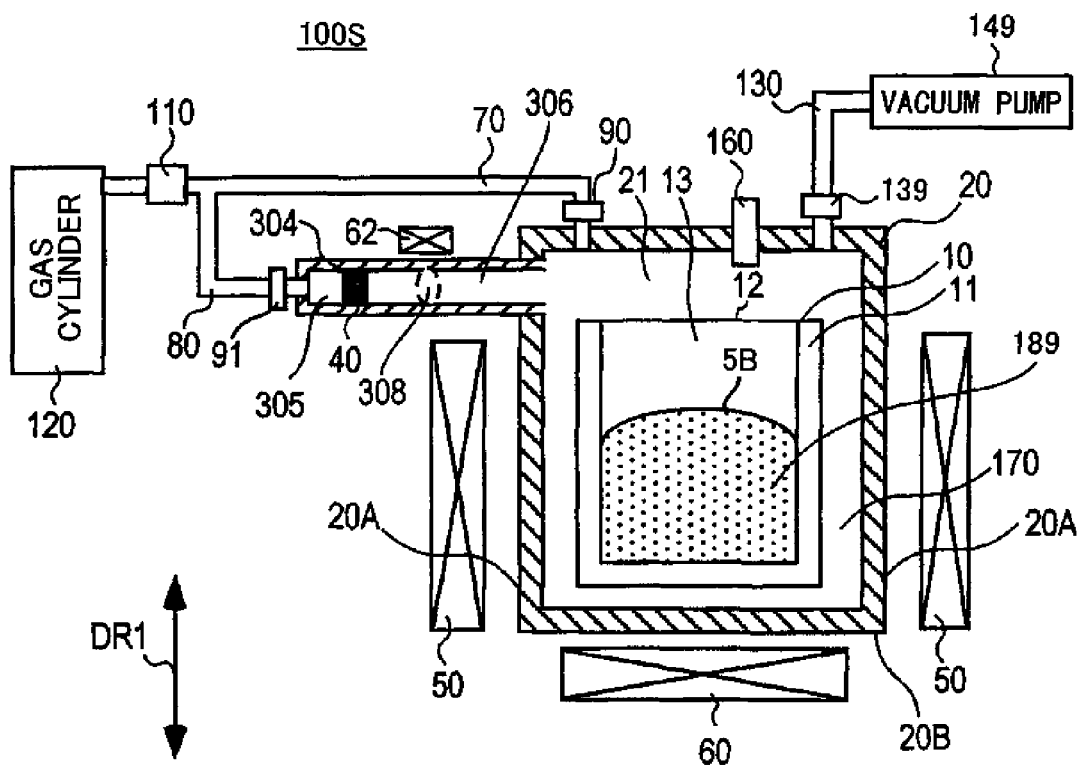
FIG. 71 is still another schematic cross-sectional view of the crystal production apparatus of the embodiment 21.

FIG. 71 is still another schematic cross-sectional view of the crystal production apparatus of the embodiment 21. The crystal production apparatus of the embodiment 21 may be replaced by the crystal production apparatus 100S as shown in FIG. 71.

As shown in FIG. 71, the crystal production apparatus 100S is formed by eliminating the metal melt 191 from the crystal production apparatus 100Q as shown in FIG. 68. Other components are the same as those of the crystal production apparatus 100Q.

In the crystal production apparatus 100S, the heater 62 heats an certain area 308 of the pipe 304 to 8000C after the melt holding vessel 10 and the reaction vessel 20 are heated to 800° C. by the heaters 50 and 60. In this case, the heater 62 heats the certain area 308 in accordance with the curved line k2 as shown in FIG. 70.

In growing CaN crystals using the crystal production apparatus 100S, a glove box is used to put the metal Na and the metal Ga in the melt holding vessel 10 in an Ar-gas atmosphere. Then, the melt holding vessel 10, the reaction vessel 20, and the pipe 304 are set in the crystal-production apparatus 100S with the space 13 in the melt holding vessel 10, the space 21 in the reaction vessel 20, and the spaces 305 and 306 in the pipe 304 filled with Ar gas.

Subsequently, the evacuation of the melt holding vessel 10, the reaction vessel 20, and the pipe 304 and the supplying of the nitrogen gas into the melt holding vessel 10, the reaction vessel 20, and the pipe 304 are alternately repeated several times by the method described in the embodiment 17.

After the melt holding vessel 10, the reaction vessel 20, and the pipe 304 are evacuated down to a predetermined pressure by the vacuum pump 149, the valve 139 is closed and the valves 90 and 91 are opened to supply the nitrogen gas into the melt holding vessel 10, the reaction vessel 20, and the pipe 304 with the pressure regulator 110 so that the pressures in the melt holding vessel 10, the reaction vessel 20, and the pipe 304 become 10 through 50 times atmospheric pressure.

When the supplying of the nitrogen gas into the melt holding vessel 10, the reaction vessel 20, and the pipe 304 is completed, the melt holding vessel 10 and the reaction vessel 20 are heated to 800° C. by the heaters 50 and 60. When the melt holding vessel 10 and the reaction vessel 20 are heated to 800° C., the certain area 308 of the pipe 304 is heated to 800° C. by the heater 62. Then, the temperatures of the melt holding vessel 10, the reaction vessel 20, and the certain area 308 are kept at 800° C. for several tens to several hundreds of hours.

The metal Na and the metal Ga put in the melt holding vessel 10 are melted in the process of heating the melt holding vessel 10, thereby generating the mixed melt 780 in the melt holding vessel 10. Then, the metal Na is vaporized from the mixed melt 780 and diffused into the spaces 13, 21, and 306.

The metal Na vapor diffused into the space 306 is formed into the metal melt 191 as described above and accumulated in the space 306 while being in contact with the suppression/introduction stopper 40. Then, when the gas-liquid interface 7B in the pipe 304 becomes 800° C., the metal Na vapors in the spaces 13, 21, and 306 are in equilibrium with one another to stop the diffusion of the metal Na vapor from the space 13 to the space 306.

Since the nitrogen gases in the melt holding vessel 10, the reaction vessel 20, and the pipe 304 are not allowed to pass through the metal Na melt 191 because the valves 90 and 140 are closed, they are confined in the spaces 13, 21, and 306.

Then, as the growth of GaN crystals progresses, the metal Na is vaporized from the mixed melt 780 and the metal melt 191, and the metal Na vapor and the nitrogen gas are confined in the spaces 13, 21, and 306. In this case, the pressure of the metal Na vapor in the spaces 13, 21, and 306 is 0.45 of atmospheric pressure. Furthermore, as the growth of GaN crystals progresses, the nitrogen gas in the space 13 is consumed. If the pressure P1 in the melt holding vessel 10 becomes lower than the pressure P6 in the space 306 in the pipe 304 (P1<P6), the nitrogen gas present in the space 305 in the pipe 304 is introduced into the spaces 13, 21, and 306 through the suppression/introduction stopper 40 and the metal Na melt 191.

As a result, it is possible to achieve high-quality, large-sized, and uniform CaN crystals as in the crystal production apparatus 100 as shown in FIG. 52.

Note that a method of producing GaN crystals using the crystal production apparatus 100S has a flowchart in which step S2 is eliminated from the flowchart as shown in FIG. 55. In this case, in step S3, the nitrogen gas is filled in the melt holding vessel 10, the reaction vessel 20, and the pipe 304 up to a predetermined pressure (10 through 50 times atmospheric pressure). Furthermore, the melt holding vessel 10, the reaction vessel 20, and the gas-liquid interface 7B are heated to 800° C. in step S4, the temperatures of the melt holding vessel 10, the reaction vessel 20, and the gas-liquid interface 7B are kept at 800° C. in step S6, and the temperatures of the melt holding vessel 10, the reaction vessel 20, and the pipe 304 are lowered in step S7.

Other details are the same as those of the crystal production apparatus 100Q.

Figure 72A:
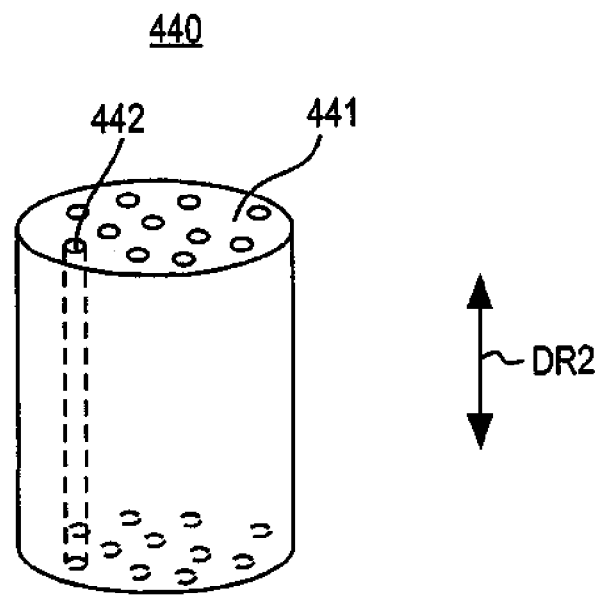
FIG. 72A is a perspective view of another suppression/introduction stopper.
Figure 72B:
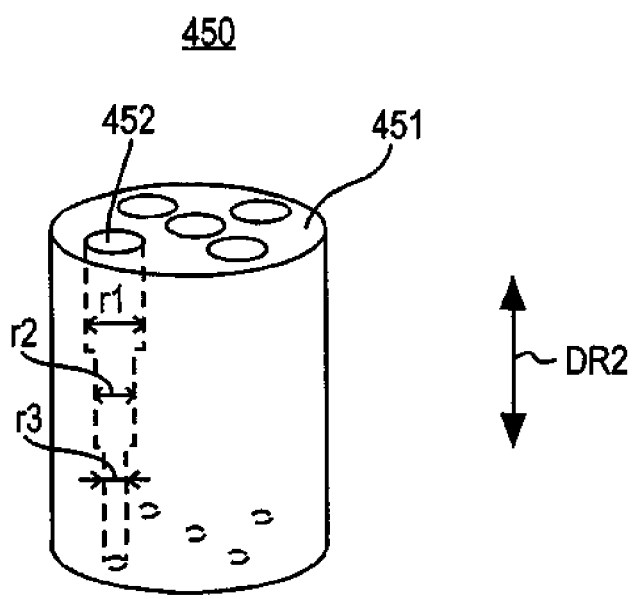
FIG. 72B is a perspective view of another suppression/introduction stopper.

FIGS. 72A and 72B are perspective views of another suppression/introduction stoppers.

As shown in FIGS. 72A and 72B, the suppression/introduction stopper 440 is formed of a stopper 441 having plural through-holes. The through-holes 442 are formed along the length directions DR2 of a stopper 441. Each of the plural suppression/introduction stopper 440 has a diameter of several tens of μm (see FIG. 72A).

Note that the suppression/introduction stopper 440 may have at least one through-hole 442.

Furthermore, a suppression/introduction stopper 450 is formed of a stopper 451 having plural through-holes 452. The plural through-holes 452 are formed along the length directions DR2 of the stopper 451. Each of the plural through-holes 452 has diameters r1, r2, and r3 forming plural different steps in the length direction DR2. Each of the diameters r1, r2, and r3 is determined within a range capable of holding the melt Na melt 170 by the surface tension, e.g., within a range from several to several tens of μm (see FIG. 72A).

Note that the suppression/introduction stopper 450 may have at least one through-hole 452. Furthermore, the diameter of the through-holes 452 may be formed into at least two. Moreover, the diameter of the through-holes 452 may be varied in a continuous form in the length direction DR2.

The suppression/introduction stopper 440 or 450 may is used instead of the suppression/introduction stopper 40 of the crystal production apparatuses 100, 100C, 100D, 100E, and 100F or the suppression/introduction stopper 400 of the crystal production apparatus 100N.

Particularly, when the suppression/introduction stopper 450 is used instead of the suppression/introduction stoppers 40 and 400, any one of the diameters forming plural different steps makes it possible to hold the metal Na melts 170, 190, and 191 by the surface tension without accurately controlling the temperature of the suppression/introduction stopper 450 in the crystal production apparatuses 100, 100A, 100O, 100D, 100E, and 100F. Therefore, it is possible to produce large-sized GaN crystals without accurately controlling the temperature of the suppression/introduction stopper 450.

When the suppression/introduction stopper 440 or 450 is used, the suppression/introduction stopper 440 and the metal Na melts 170, 190, and 191 constitute the "suppression/introduction vessel," and the suppression/introduction stopper 450 and the metal Na melts 170, 190, and 191 constitute the "suppression/introduction vessel." Furthermore, each of the suppression/introduction stoppers 440 and 450 constitutes the "suppression/introduction member."

Figure 73:
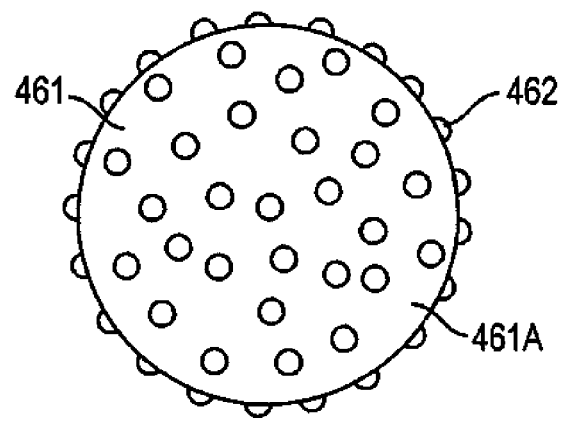
FIG. 73 is a perspective view of still another suppression/introduction stopper.

FIG. 73 is a perspective view of still another suppression/introduction stopper.

As shown in FIG. 73, a suppression/introduction stopper 460 includes a stopper 461 and plural convex parts 462. The stopper 461 is of a spherical shape. The plural convex parts 462 are randomly formed on a front surface 461A of the stopper 461.

The plural convex parts 462 are formed at an interval of several tens of μm. Furthermore, the convex parts 462 have a height of several tens of μm. The plural convex parts 462 of the suppression/introduction stopper 460 come in contact with the inner wall 30A of the pipe 30. Accordingly, the suppression/introduction stopper 460 is fit within the inner wall 30A of the pipe 30 in the same manner as the suppression/introduction stopper 40.

Since the convex parts 462 have the height of several tens of μm and are arranged on the front surface 461A of the stopper 461 at the interval of several tens of μm plural gaps having a diameter of approximately several tens of μm are formed between the suppression/introduction stopper 460 and the inner wall 30A of the pipe 30 with the suppression/introduction stopper 460 fit in the inner wall 30A of the pipe 30.

The gaps allow the nitrogen gas to pass through from the space 31 in the pipe 30 to the space 21 in the reaction vessel 20, hold the metal Na melt 170 by the surface tension of the metal Na melt 170, and prevent the metal Na melt 170 from passing through in the space 31 in the pipe 30.

Note that the suppression/introduction stopper 460 is used instead of the suppression/introduction stoppers 40 and 400 of the crystal production apparatuses 100, 100A, 100C, 100D, 100E, and 100F.

Furthermore, the suppression/introduction stopper 460 may not have the convex parts 462. In this case, the suppression/introduction stopper 460 is arranged to make the gaps of several tens of μm between the front surface 461A of the stopper 461 and the inner wall of the pipes 30, 301, and 403.

When the suppression/introduction stopper 460 is used, the suppression/introduction stopper 460 and the metal Na melts 170, 190, and 191 constitute the "suppression/introduction vessel," and the suppression/introduction stopper 460 constitutes the "suppression/introduction member."

Figure 74:
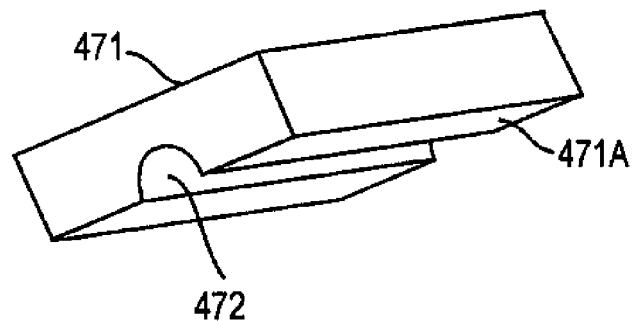
FIG. 74 is a perspective view of still another suppression/introduction stopper.

FIG. 74 is a perspective view of still another suppression/introduction stopper. As shown in FIG. 23, the suppression/introduction stopper 470 is formed of a main body part 471 and a groove 472. The main body part 471 is of a substantially rectangular shape. The groove 472 is linearly provided at a principal surface 471A of the main body part 471. The groove 472 is of a semicircular cross-sectional shape. In this case, the diameter of the groove 472 is, for example, several tens of µm long and generally has a value capable of holding the metal Na melt 170 by the surface tension of the metal Na melt 170.

Figure 75:
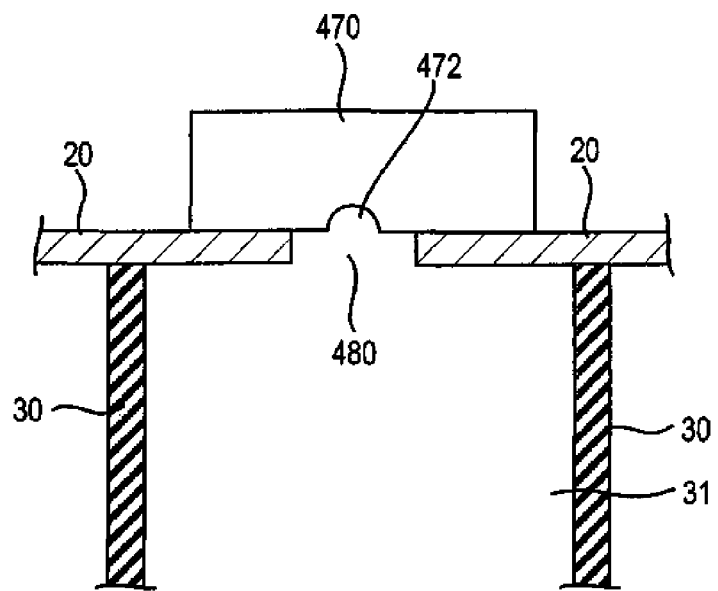
FIG. 75 is a first schematic cross-sectional view showing an arrangement state of the suppression/introduction stopper as shown in FIG. 74.
Figure 76:
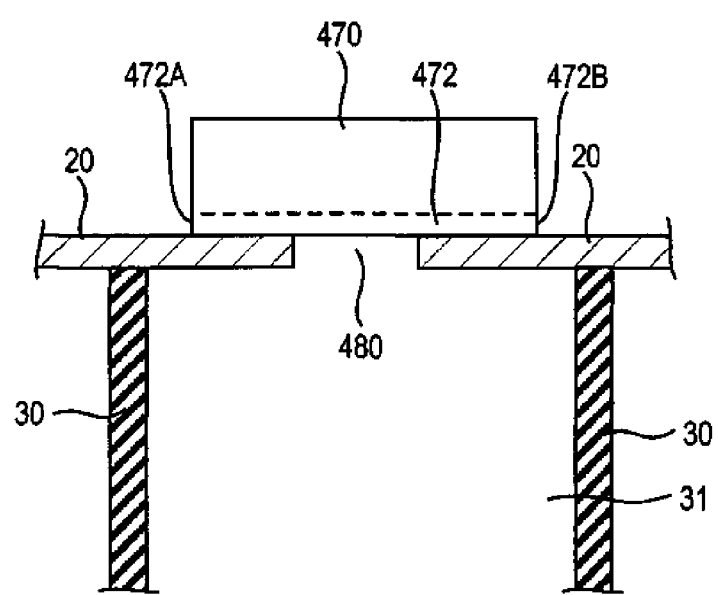
FIG. 76 is a second schematic cross-sectional view showing an arrangement state of the suppression/introduction stopper as shown in FIG. 74.

FIGS. 75 and 76 are first and second schematic cross-sectional views showing the arrangement state of the suppression/introduction stopper 470 as shown in FIG. 74. FIG. 75 shows the schematic cross-sectional view as seen from the direction in which the groove 472 of the suppression/introduction stopper 470 is extended, and FIG. 76 shows the schematic cross-sectional view as seen from the direction orthogonal to the direction in which the groove 472 of the suppression/introduction stopper 470 is extended.

As shown in FIGS. 75 and 76, the suppression/introduction stopper 470 as shown in FIG. 74 is used in the crystal production apparatus 100 instead of the suppression/introduction stopper 40. In this case, the reaction vessel 20 has a through-hole 480 at the connection between the reaction vessel 20 and the pipe 30. The through-hole 480 has a diameter which is larger than the groove 472 and is not capable of holding the metal Na melt 170 by the surface tension.

The suppression/introduction stopper 470 is provided at the inner surface of the reaction vessel 20 so as to cover the through-hole 480 of the reaction vessel 20 and make the groove 472 positioned above the through-hole 480.

When the metal Na melt 170 is held between the melt holding vessel 10 and the reaction vessel 20, end surfaces 472A and 472B of the groove 472 come in contact with the metal Na melt 170, and the suppression/introduction stopper 470 holds the metal Na melt 170 by the surface tension of the metal Na melt 170. As a result, the metal Na melt 170 is prevented from flowing in the space 31 in the pipe 30 through the groove 472 and the through-hole 480.

On the other hand, if the pressure of the space 13 in the melt holding vessel 10 becomes lower than that of the space 31 in the pipe 30, the nitrogen gas in the space 31 is introduced into the metal Na melt 170 through the through-hole 480 and the groove 472, moved in the metal Na melt 170 in a foamed state (see FIG. 58), and introduced into the spaces 21, 13.

As described above, the suppression/introduction stopper 470 holds the metal Na melt 170 by the surface tension and introduces the nitrogen gas in the pipe 30 into the spaces 21 and 13 through the metal Na melt 170.

Figure 77:
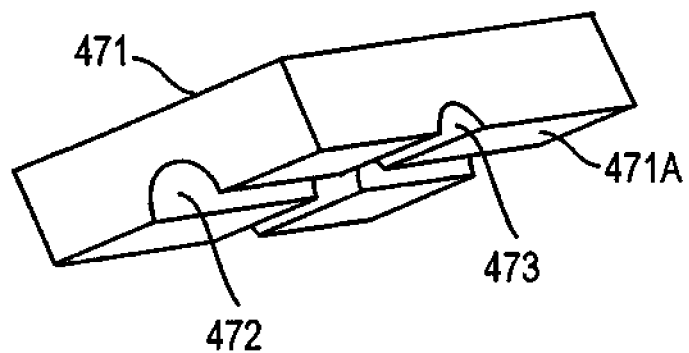
FIG. 77 is a perspective view showing a modified example of the suppression/introduction stopper as shown in FIG. 74.

FIG. 77 is a perspective view showing a modified example of the suppression/introduction stopper 470 as shown in FIG. 74.

As shown in FIG. 77, the suppression/introduction stopper 490 is formed by adding a groove 473 to the suppression/introduction stopper 470 as shown in FIG. 74. Other components are the same as those of the suppression/introduction stopper 470.

The groove 473 is linearly provided at a principal surface 471A so as to be orthogonal to the groove 472. The groove 473 is of a semicircular cross-sectional shape. In this case, the diameter of the groove 473 is, for example, several tens of µm long and generally has a value capable of holding the metal Na melt 170 by the surface tension.

The suppression/introduction stopper 490 is arranged at the connection between the reaction vessel 20 and the pipe 30 of the crystal production apparatus 100 in the same manner as the suppression/introduction stopper 470.

Note that, in the suppression/introduction stopper 490, the grooves 472 and 473 may have a different diameter and be crossed with each other at an angle other than 90 degrees. Furthermore, the grooves 472 and 473 may be of a polygonal shape such as a triangle, a quadrangle, and a pentagon. Furthermore, the grooves 472 and 473 may be a curved line instead of a straight line.

The suppression/introduction stoppers 470 and 490 may be used in the crystal production apparatus 100N instead of the suppression/introduction stopper 400.

When the suppression/introduction stoppers 470 and 490 are used in the crystal production apparatuses 100 and 10A, the suppression/introduction stopper 470 and the metal Na melt 170 constitute the "suppression/introduction vessel," the suppression/introduction stopper 490 and the metal Na melt 170 constitute the "suppression/introduction vessel," and the suppression/introduction stopper 470 or 490 constitutes the "suppression/introduction member."

Note that although the crystal growth temperature is set at 800° C. in the embodiments 17 through 21, the present invention is not limited to this. The crystal growth temperature may be equal to or higher than 600° C. Furthermore, the nitrogen gas pressure may be a pressure equal to or higher than several times atmospheric pressure by which crystals can be grown in a pressurized state using the crystal growth method of the present invention. Specifically, the upper limit of atmospheric pressure is not limited to 50 times atmospheric pressure and may be equal to or higher than 50 times atmospheric pressure.

Furthermore, although the metal Na and the metal Ga are put in the melt holding vessels 10 and 810 in an Ar-gas atmosphere and the metal Na is put between the melt holding vessels 10 and 810 and the reaction vessels 20 and 820 or in the pipes 301 and 304 in the above description, the present invention is not limited to this. Alternatively, the metal Na and the metal Ga may be put in the melt holding vessels 10 and 810 and the metal Na may be put between the melt holding vessels 10 and 810 and the reaction vessels 20 and 820 or in the pipes 301 and 304 in a gas other than Ar gas such as He, Ne, and Kr or a nitrogen gas atmosphere. In general, the metal Na and the metal Ga may be put in the melt holding vessels 10 and 810 and the metal Na may be put between the melt holding vessels 10 and 810 and the reaction vessels 20 and 820 or in the pipes 301 and 304 in an inert gas or a nitrogen gas atmosphere. In this case, the inert gas or the nitrogen gas has a water amount equal to or smaller than 10 ppm and an oxygen amount equal to or smaller than 10 ppm.

Moreover, although the metal with which the metal Ga is mixed is Na in the above description, the present invention is not limited to this. Alternatively, the metal Ga may be mixed with alkaline metals such as lithium (Li) and kalium (K) or alkaline earth metals such as magnesium (Mg), calcium (Ca), and strontium (Sr) to generate the mixed melt 780. The resultant substances after these alkaline metals are melted constitute an alkaline metal Na melt, and the resultant substances after these alkaline earth metals are melted constitute an alkaline earth metal Na melt.

In addition, compounds containing nitrogen such as sodium azide and ammonia as constituent elements may be used instead of nitrogen gas. These compounds constitute a nitrogen material gas.

In addition, group III metals such as boron (B), aluminum (Al), and indium (In) may be used instead of Ga.

Accordingly, the crystal production apparatus or the crystal production method according to the present invention may be, in general, one in which a mixed melt of alkaline metals or alkaline earth metals and group III metals (including boron) is used to produce group III nitride crystals.

The group III nitride crystals produced with the crystal production apparatus or the crystal production method according to the present invention are used for manufacturing group III nitride semiconductor devices such as light-emitting diodes, semiconductor lasers, photo diodes, and transistors.

The present invention is based upon and claims the benefit of priority of Japanese patent application No. 2005-139451, filed on May 12, 2005, Japanese patent application No. 2005-231877, filed on Aug. 10, 2005, and Japanese patent application No. 2005-231966, filed on Aug. 10, 2005, the entire contents of which are incorporated by reference.

The present invention is further based upon and claims the benefit of priority of Japanese Patent application No. 2006-119221, filed on Apr. 24, 2006, the entire contents of which are incorporated by reference.

INDUSTRIAL APPLICABILITY

The present invention is applied to a method of producing group III nitride crystals while preventing the vaporization of flux from a mixed melt to the outside. Furthermore, the present invention is applied to an apparatus for producing group III nitride crystals while preventing the vaporization of flux from a mixed melt. Moreover, the present invention is applied to group III nitride crystals produced by using the apparatus for producing group III nitride crystals while preventing the vaporization of flux from a mixed melt.

The invention claimed is:

1. A method of producing a group III nitride crystal in which a melt holding vessel where a melt containing a group III metal and flux is held is accommodated in a reaction vessel, a gas constituted by a substance containing nitrogen is supplied from outside the reaction vessel through a pipe, and a group III nitride crystal is produced as the gas constituted by the substance containing nitrogen is supplied from outside the reaction vessel, the method comprising:
   a step (a) of forming an accumulated part of a liquid in the pipe to thereby temporarily close the pipe, wherein the accumulated part of the liquid has at least two interfaces in contact with the gas, and the at least two interfaces are located in separate sections of the pipe and are substantially equal in height to each other;
   a step (b) of setting, out of the at least two interfaces, a temperature of one interface positioned closest to the melt holding vessel higher than a temperature of the other interface; and
   a step (c) of growing the group III nitride crystal in the melt holding vessel.

2. The method of producing a group III nitride crystal according to claim 1, further comprising:
   a step of setting, out of the at least two interfaces, the temperature of the at least one interface other than the interface positioned closest to the melt holding vessel at a temperature at which substantial vaporization of the liquid is suppressed.

3. The method of producing a group III nitride crystal according to claim 1, further comprising:
   a step of setting, out of the at least two interfaces, the temperature of the at least one interface other than the interface positioned closest to the melt holding vessel and a pressure of the gas in contact with the at least one interface at a temperature and a pressure, respectively, at which substantial vaporization of the liquid is suppressed.

4. The method of producing a group III nitride crystal according to claim 1, further comprising:
   a step of setting, out of the at least two interfaces, the temperature of the interface positioned closest to the melt holding vessel at a temperature at which reduction of the flux in the melt held in the melt holding vessel is prevented; and
   a step of setting, out of the at least two interfaces, the temperature of the at least one interface other than the interface positioned closest to the melt holding vessel at a temperature at which substantial vaporization of the liquid is suppressed.

5. The method of producing a group III nitride crystal according to claim 1, further comprising:
   a step of setting, out of the at least two interfaces, the temperature of the interface positioned closest to the melt holding vessel at a temperature at which a vapor pressure of flux vaporized from the accumulated part is approximately equalized to a vapor pressure of the flux vaporized from the melt held in the melt holding vessel; and
   a step of setting, out of the at least two interfaces, the temperature of the at least one interface other than the interface positioned closest to the melt holding vessel at a temperature at which substantial vaporization of the liquid is suppressed.

6. The method of producing a group III nitride crystal according to claim 1, wherein an alkaline metal is used as the liquid in the step (a).

7. The method of producing a group III nitride crystal according to claim 6, wherein the flux is an alkaline metal, and in the step of closing the pipe, some of the alkaline metal contained in the melt in the melt holding vessel is vaporized to be transferred to the pipe and liquidized in the pipe to form the accumulated part.

8. A production method for producing a group III nitride crystal using a crystal production apparatus, wherein the crystal production apparatus includes
   a melt holding vessel that holds a mixed melt of an alkaline metal and a group III metal; and
   a backflow prevention unit that suppresses an outflow of an alkali metal vapor in a vessel space in contact with the mixed melt in the melt holding vessel to a space outside the melt holding vessel, by a differential pressure between the vessel space and the outer space or by a weight of the backflow prevention unit, and introduces a nitrogen material gas supplied from outside the melt holding vessel by the differential pressure;
   the production method comprising:
   a first step of putting the alkaline metal and the group III metal in the melt holding vessel in an inert-gas or a nitrogen-gas atmosphere;
   a second step of supplying the nitrogen material gas into the vessel space;
   a third step of heating the melt holding vessel to a crystal growth temperature;
   a fourth step of keeping a temperature of the melt holding vessel at the crystal growth temperature for a predetermined time; and
   a fifth step of supplying the nitrogen material gas to the melt holding vessel through the backflow prevention unit so that a pressure in the vessel space is kept at a predetermined pressure.

9. The production method according to claim 8, wherein the crystal production unit further includes a reaction vessel that covers a periphery of the melt holding vessel, and the metal Na melt is arranged between the melt holding vessel and the reaction vessel;

the production method further comprising:

a sixth step of putting a metal for the metal melt between the melt holding vessel and the reaction vessel in the inert-gas or the nitrogen-gas atmosphere; and a seventh step of heating a place between the melt holding vessel and the reaction vessel to a temperature at which the metal for the metal melt becomes a liquid.

10. The production method according to claim 8, wherein the crystal production unit further includes a pipe connected to the melt holding vessel in communication with the vessel space in the melt holding vessel, and the backflow prevention unit further includes a closed vessel connected to the pipe on a side opposite to the vessel space;

a through-hole provided at a bottom surface of the closed vessel in a gravity direction;

a backflow prevention valve that slides along a side wall of the closed vessel between a position where the through-hole is closed and a position where the through-hole is opened by the differential pressure or the own weight;

an outer vessel connected to the pipe between the melt holding vessel and the closed vessel; and a metal melt held in the outer vessel;

the production method further comprising:

a sixth step of putting a metal for a metal Na melt in the outer vessel in the inert-gas or the nitrogen-gas atmosphere; and a seventh step of heating the outer vessel to a temperature at which the metal for the metal Na melt becomes a liquid.

11. The production method according to claim 9, further comprising:

an eighth step of raising a temperature of the backflow prevention unit to the crystal growth temperature.

12. The production method according to claim 9, wherein the metal Na melt is different from the mixed melt.

13. The production method according to claim 12, wherein the metal melt is an alkaline metal melt.

14. A production method for producing a group III nitride crystal using a crystal production apparatus, wherein the crystal production apparatus includes:

a melt holding vessel that holds a mixed melt of an alkaline metal and a group III metal;

a suppression/introduction vessel that suppresses an outflow of an alkali metal vapor in a vessel space in contact with the mixed melt in the melt holding vessel and introduces a nitrogen material gas supplied from outside the melt holding vessel by a differential pressure between the vessel space and the outer space;

the production method comprising:

a first step of putting the alkaline metal and the group III metal in the melt holding vessel in an inert-gas or a nitrogen-gas atmosphere;

a second step of supplying the nitrogen material gas into the vessel space;

a third step of heating the melt holding vessel to a crystal growth temperature;

a fourth step of keeping a temperature of the melt holding vessel at the crystal growth temperature for a predetermined time; and a fifth step of supplying the nitrogen material gas to the melt holding vessel through the suppression/introduction vessel so that a pressure in the vessel space is kept at a predetermined pressure.

15. The production method according to claim 14, wherein the crystal production unit further includes a reaction vessel that covers a periphery of the melt holding vessel, and a metal melt is arranged between the melt holding vessel and the reaction vessel;

the production method further comprising:

a sixth step of putting a metal for the metal melt between the melt holding vessel and the reaction vessel in the inert-gas or the nitrogen-gas atmosphere; and a seventh step of heating a place between the melt holding vessel and the reaction vessel to a temperature at which the metal for the metal melt becomes a liquid.

16. The production method according to claim 15, further comprising:

an eighth step of keeping a temperature of the suppression/introduction vessel at a temperature at which the metal melt is not substantially vaporized through the suppression/introduction vessel.

17. The production method according to claim 15, wherein the metal melt is different from the mixed melt.

18. The production method according to claim 17, wherein the metal melt is an alkaline metal melt.

* * * * *